US009099657B2

(12) United States Patent
Isobe et al.

(10) Patent No.: US 9,099,657 B2
(45) Date of Patent: Aug. 4, 2015

(54) PHOTOELECTRIC CONVERSION ELEMENT AND SOLAR CELL

(75) Inventors: Kazuya Isobe, Tokyo (JP); Kenichi Onaka, Tokyo (JP); Hidekazu Kawasaki, Tokyo (JP)

(73) Assignee: KONICA MINOLTA BUSINESS TECHNOLOGIES, INC., Tokyo (JP)

( * ) Notice: Subject to any disclaimer, the term of this patent is extended or adjusted under 35 U.S.C. 154(b) by 695 days.

(21) Appl. No.: 13/246,487

(22) Filed: Sep. 27, 2011

(65) Prior Publication Data

US 2012/0085411 A1 Apr. 12, 2012

(30) Foreign Application Priority Data

Oct. 8, 2010 (JP) ................................ 2010-228249

(51) Int. Cl.

*H01L 31/04* (2014.01)
*H01L 51/00* (2006.01)
*C09B 57/00* (2006.01)
*H01G 9/20* (2006.01)

(52) U.S. Cl.

CPC .......... *H01L 51/0064* (2013.01); *C09B 57/008* (2013.01); *H01G 9/2059* (2013.01); *H01G 9/2009* (2013.01); *H01G 9/2031* (2013.01); *H01L 51/0037* (2013.01); *Y02E 10/542* (2013.01); *Y02E 10/549* (2013.01)

(58) Field of Classification Search

CPC ....................................................... H01L 31/04
USPC ........... 136/263, 261, 252; 528/380, 377, 378
See application file for complete search history.

(56) References Cited

U.S. PATENT DOCUMENTS

2010/0263726 A1* 10/2010 Kawasaki et al. ............. 136/261

FOREIGN PATENT DOCUMENTS

JP 2003-264305 9/2003

OTHER PUBLICATIONS

Xia et al (Influence of Doped Anions on Poly(3,4-ethylenedioxythiophene) as Hole conductors for Iodine-Free Solid-State Dye Sensitized Solar Cells, J. Am. Chem. Soc. 2008, 130, 1258-1263).*

* cited by examiner

*Primary Examiner* — Wenwen Cai
(74) *Attorney, Agent, or Firm* — Lucas & Mercanti, LLP

(57) ABSTRACT

Provided is a photoelectric conversion element containing at least: a semiconductor layer containing a semiconductor and a dye which is supported by the semiconductor, and a hole transport layer containing a hole transport compound, wherein the dye is a compound represented by Formula (1), and the hole transport compound is a polymer made from 3,4-ethylenedioxythiophene:

Formula (1)

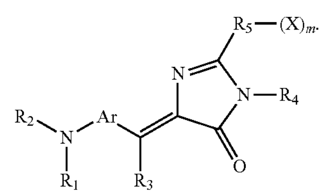

9 Claims, 1 Drawing Sheet

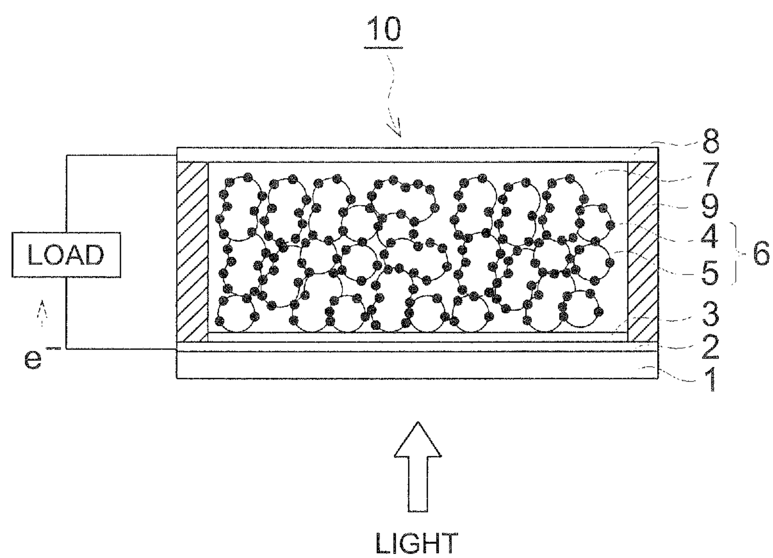
10
8
7
9
4
5
6
3
2
1
LOAD
e⁻
LIGHT

PHOTOELECTRIC CONVERSION ELEMENT AND SOLAR CELL

CROSS REFERENCE TO RELATED APPLICATIONS

This application is based on Japanese Patent Application Nos. 2010-228249 filed on Oct. 8, 2010 with Japan Patent Office, the entire content of which is hereby incorporated by reference.

TECHNICAL FIELD

The present invention relates to a photoelectric conversion element and a solar cell provided with the same photoelectric conversion element.

BACKGROUND

Effective utilization of sunlight, which does not depend on petroleum or atomic energy and produces infinite energy without generating a harmful substance, is one of the challenges which should be addressed by the whole mankind. For example, a photoelectric conversion element which changes sunlight into electric energy is one of the representative examples.

As an attempt which uses sunlight by employing a photoelectric conversion element, there can be cited at present time inorganic system solar cells, such as single crystal silicon, polycrystalline silicon, amorphous silicon, cadmium telluride and indium selenide copper. However, with respect to the silicon mainly applied for these solar cells, it is required highly pure silicon prepared by the advanced refining processes. And the manufacturing process of the solar cells is complicated has the number of steps of the process is large because of the multilayer structure of p-n junction, and the cost of the solar cells is high. Therefore, in order to spread the photoelectric conversion element by making use of sunlight, a development of an easy and simple manufacturing process for the photoelectric conversion element is waited for.

Although an investigation of a photoelectric conversion element using an inorganic material has been made, there has been made a steady investigation of the photoelectric conversion element using an organic material to realize a simpler element. For example, Tang and others reported in 1986 a p-n junction type organic photoelectric conversion element prepared by jointing a perylene tetracarboxylic acid derivative which is n type organic coloring matter and copper phthalocyanine which is p type organic coloring matter (refer to Non-patent document 1).

In order to improve the shortness of the exciton diffusion length and the thinness of the space charge layer which are considered to be a weak point in the organic photoelectric conversion element, there have been investigated several works to greatly increase the area of the p-n junction part prepared by lamination of an organic thin film and to fully secure the number of organic dye molecules which participate in charge separation. The results are coming out gradually. One of the works is an approach to per form charge separation in the whole film by extremely increasing the number of p-n junction portions by compounding the n-type electron conductive organic material and p-type hole conductive polymer in the film. Heerger and others have proposed in 1995 a photoelectric conversion element prepared by using a conjugate polymer as a p-type conductive polymer mixed with fullerene as an electronic conduction material (refer to Non-patent document 2). Although these photoelectric conversion elements are raising their characteristics gradually, they have not resulted in achieving the sate which operates stably with high conversion efficiency.

However, Gratzel has made a huge and detailed experimentation about the sensitized photocurrent of the dyes adsorbed on titanium oxide in 1991. He has succeeded in producing a photoelectric conversion element which achieved operational stability and exhibited high conversion efficiency by making the titanium oxide to be porous and fully securing the area of the charge separation (the number of molecules which contributes to charge separation) (refer to Non-patent document 3). In this photoelectric conversion element, iodine is used as a hole transporting agent, therefore, an electrolyte is required. This photoelectric conversion element has the stability of titanium oxide and also has excellent repeatability. As a result, the filed of research and development have been expanded greatly. This photoelectric conversion element is also called as a dye- sensitized solar cell, and this photoelectric conversion element is capturing big expectation and attention.

Although growing in size of a light receiving portion and production of an outdoor type module are indispensable for realizing the initial object of effectively using sunlight, the dye-sensitized solar cell will operate using an electrolyte as describe above, therefore, it is needed another mechanism which holds and prevents the flow and dissipation of the electrolyte or iodine. As representative examples of other electrochemical elements which have an electrolyte, a lead battery and a lithium battery are typical. Even these electrochemical elements prepared in a compact module cannot be recovered with 100% efficiency and recycled. When the dissipated chemical species are newly accumulated in an ambient, it is obvious that these species will induce a secondary problem.

There has been developed an all solid type dye-sensitized solar cell which avoided the problem of an electrolyte and succeeded the merit of the dye-sensitized solar cell. Although there are known the system using an amorphous organic hole transport agent (refer to Non-patent document 4) and the system using copper iodide as a hole transport agent (refer to Non-patent document 5) in this field, they have not achieved the level which operates stably with high conversion efficiency. Further, there is known an all solid type dye-sensitized solar cell which is provided with a bather layer between an electrode and a hole transport material layer to resolve the problem of the electric charge recombination between the electrode and the hole transport material layer which are the investigational work of all solid type dye-sensitized solar cell (refer to Patent document 1). However, it did not come to control the electric charge recombination between the titanium oxide and the hole transport material layer which was another route of electric charge recombination, and its efficiency was found to be low.

PRIOR ART DOCUMENTS

Patent document 1: Japanese Patent Application Publication (JP-A) No. 2003-264305

Non-patent document 1: C. W. Tang, Applied Physics Letters, 48,183 (1986)

Non-patent document 2: G. Yu, J. Gao, J. C. Humelen, F. Wudland and A. J. Heerger, Science, 270, 1789 (1996)

Non-patent document 3: B. O'Regan and M. Gratzel, Nature, 353,737 (1991)

Non-patent document 4: U. Bach, D. Lupo, P. Comte, J. E. Moser, F. Weissortel, J. Salbeck, H. Spreitzer and M. Gratzel, Nature, 395,584 (1989)

Non-patent document 5: G. R. A. Kumara, S. Kaneko, M. Okuya, A. Konno and K. Tennakone: Key Engineering Materials, 119, 228 (2002)

SUMMARY

The present invention was achieved to resolve the above-described problems. An object of the present invention is to provide a solid type dye-sensitized photoelectric conversion element which can be prepare at low cost, and which enables to control efficiently recombination of the charge between titanium oxide and a hole transport layer to result in excellent in photoelectric conversion efficiency, and an object of the present invention is to provide a solar cell using the aforesaid photoelectric conversion element.

The above-described problems of the present invention can be achieved by the following embodiments.

1. One of the embodiments of the present invention is a photoelectric conversion element comprising at least:

a semiconductor layer containing a semiconductor and a dye which is supported by the semiconductor; and a hole transport layer containing a hole transport compound, wherein the dye is a compound represented by Formula (1), and the hole transport compound is a polymer made from 3,4-ethylenedioxythiophene.

Formula (1)

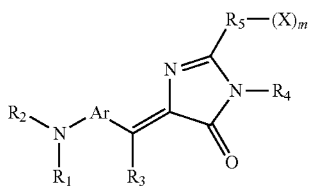

In Formula (1), Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ and $R_4$ each independently represents a hydrogen atom, a cyano group, a substituted or unsubstituted alkyl, alkenyl, alkynyl, aryl, amino, or heterocyclic group; $R_5$ represents a substituted or unsubstituted alkyl, alkenyl, alkynyl, alkoxy, alkylthio, alkylseleno, amino, aryl or heterocyclic group, provided that $R_5$ is substituted with X; X is an acid group; m represents an integer of 1 or more, provided that when m≥2, a plurality of Xs may be the same or different; provided that a cis form and a trans form with respect to a carbon to carbon double bond are included in Formula (1). A pair of $R_3$ and N in an imidazolone ring may be a cis position or a trans position with respect to a carbon to carbon double bond.

2. Another embodiment of the present invention is a photoelectric conversion element of the above-described item 1, wherein at least one of $R_1$ and $R_2$ in a compound represented by Formula (1) is further represented by Formula (2).

Formula (2)

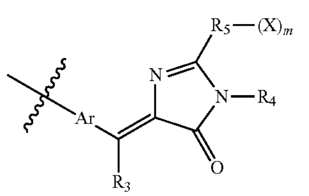

In Formula (2), Ar represents a substituted or unsubstituted arylene or heterocyclic group; $R_3$ and $R_4$ each independently represents a hydrogen atom, a substituted or unsubstituted alkyl, alkenyl, alkynyl, aryl, amino, cyano or heterocyclic group; $R_5$ represents a substituted or unsubstituted alkyl, alkenyl, alkynyl, alkoxy, alkylthio, alkylseleno, amino, aryl or heterocyclic group, provided that $R_5$ is substituted with X; X is an acid group; m represents an integer of 1 or more, provided that when m≥2, a plurality of Xs may be the same or different; provided that a cis form and a trans form with respect to a carbon to carbon double bond are included in Formula (2).

3. Another embodiment of the present invention is a photoelectric conversion element of the above-described items 1 or 2, wherein a compound represented by Formula (2) is further represented by Formula (3).

Formula (3)

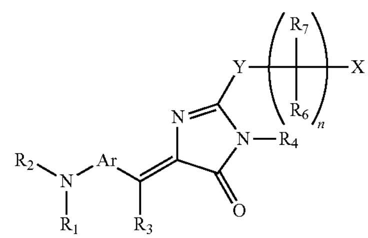

In Formula (3), Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ and $R_4$ each independently represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; Y represents a sulfur atom, an oxygen atom or a selenium atom; X is an acid group; provided that a cis form and a trans form with respect to a carbon to carbon double bond are included in Formula (3).

4. Another embodiment of the present invention is a photoelectric conversion element of the above-described item 3, wherein a compound represented by Formula (3) is further represented by Formula (4).

Formula (4)

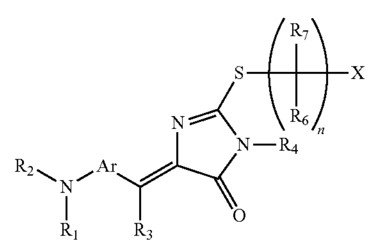

In Formula (4), Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ and $R_4$ each independently represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (4).

5. Another embodiment of the present invention is a photoelectric conversion element of the above-described item 4, wherein a compound represented by Formula (4) is further represented by Formula (5).

Formula (5)

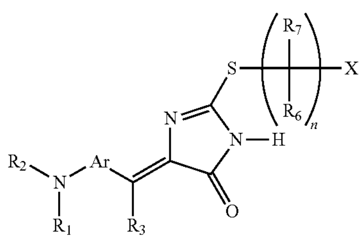

In Formula (5), Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n is an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (5).

6. Another embodiment of the present invention is a photoelectric conversion element of the above-described item 5, wherein a compound represented by Formula (5) is further represented by Formula (6).

Formula (6)

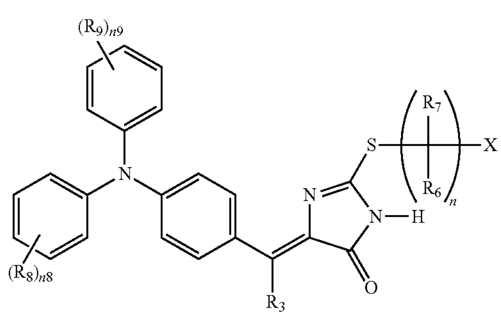

In Formula (6), $R_8$ and $R_9$ each independently represents a halogen atom, a substituted or unsubstituted alkyl, alkenyl, alkynyl, alkoxy, alkylthio, alkylseleno, aryl or heterocyclic group, n8 and n9 each represents an integer of 1 to 5, provided that when n8≥2, and n9≥2, a plurality of $R_8$s and a plurality of $R_9$s each may be the same or different; $R_3$ represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (6).

7. Another embodiment of the present invention is a photoelectric conversion element of the above-described item 5, wherein a compound represented by Formula (5) is further represented by Formula (7).

Formula (7)

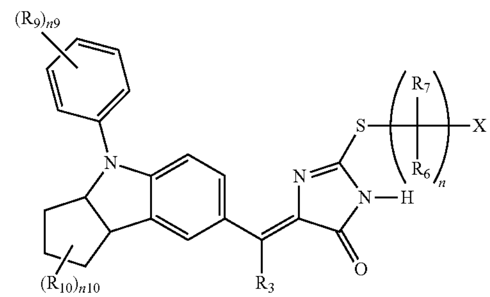

In Formula (7), $R_9$ and $R_{10}$ each independently represents a halogen atom, a substituted or unsubstituted alkyl, alkenyl, alkynyl, alkoxy, alkylthio, alkylseleno, aryl or heterocyclic group, n9 and n10 each respectively represents an integer of 1 to 5 and an integer of 1 to 8, provided that when n9≥2, and n10≥2, a plurality of $R_9$s and a plurality of $R_{10}$s each may be the same or different; $R_3$ represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (7).

8. Another embodiment of the present invention is a photoelectric conversion element of any one of the above-described items 1 to 7, wherein the semiconductor contained in the semiconductor layer is titanium oxide.

9. Mother embodiment of the present invention is a solar cell containing the photoelectric conversion element of any one of the above-described items 1 to 8.

It was achieved by the present invention to provide a photoelectric conversion element and a solar cell excellent in photoelectric conversion efficiency by realizing a small amount of recombination of the charges.

BRIEF DESCRIPTION OF THE DRAWING

FIG. 1 is a schematic cross-sectional view showing an example of a photoelectric conversion element of the present invention.

DESCRIPTION OF THE PREFERRED EMBODIMENTS

The embodiments for carrying out the present invention will be described in detail, however, the present invention is not limited by them.

As mentioned above, it is demanded that an all solid type dye-sensitized solar cell will further improve the photoelectric conversion efficiency by retardation of electric charge recombination. The present inventors examined the compound which has the amine structure containing an imidazolone skeleton to find out that the photoelectric conversion element using this exhibited high photoelectric conversion efficiency. Since this new dye has a high electronegativity at the electron acceptor part (imidazolone skeletal part) in a dye molecule, the nucleophilicity of acidic group (X) of a dye molecule becomes strong, and it is thought that the dye easily makes bond or coordination with a metal atom on the surface of titanium oxide. Moreover, it is presumed the followings that: the dye molecules developed aggregation by an intermolecular interaction to result in a long-wave shift of an absorption wavelength; and that the dye molecule was able to cover the surface of titanium oxide closely; and, this enabled to control the electric charge recombination between titanium oxide and the hole transport material layer to improve its photoelectric conversion efficiency. Further, in the present invention, it was found that by using a compound having an amine structure containing an imidazolone skeleton as a sensitizing dye, and a polymer made from 3,4-ethylenedioxythiophene as a hole transport material, it was possible to control the electric charge recombination between titanium oxide and the hole transport material layer to improve largely the photoelectric conversion efficiency.

The photoelectric conversion element of the present invention is characterized in that it is an all solid type dye-sensitized photoelectric conversion element comprising at least: a semiconductor layer containing a dye which is supported by a semiconductor, and a hole transport layer containing a hole transport compound, wherein the aforesaid dye is represented by Formula (1), and the aforesaid hole transport compound is a polymer made from 3,4-ethylenedioxythiophene.

(Photoelectric Conversion Element)

In the following, the photoelectric conversion element of the present invention will be described by referring to FIG. 1.

FIG. 1 is a schematic cross-sectional view showing an example of a photoelectric conversion element of the present invention. As illustrated in FIG. 1, photoelectric conversion element 10 is composed of substrate 1, first electrode 2, photoelectric conversion layer 6, hole transport layer 7, second electrode 8 and partition wall 9. The photoelectric conversion layer 6 contains semiconductor 5 and dye 4. It is preferable to arrange barrier layer 3 between the first electrode 2 and the photoelectric conversion layer 6 for the purpose of preventing short-circuit and sealing. The sunlight will enter from the arrow direction shown in the lower part of the figure.

A production example of a photoelectric conversion element of the present invention will be shown below.

After adhering and forming the bather layer 3 on the substrate 1 which is provided with the first electrode 2, a semiconductor layer composed of a semiconductor is formed on the barrier layer 3, a dye is adsorbed on the surface of the semiconductor, and the photoelectric conversion layer 6 is formed. Then, the hole transporting layer 7 is formed on the photoelectric conversion layer 6.

The hole transport layer 7 penetrates into the photoelectric conversion layer composed of a semiconductor which supports the dye, and it exists on it, and the second electrode 8 has adhered on this hole transport layer. By attaching a terminal to the first electrode 2 and the second electrode 8 respectively, an electric current can be taken out.

(Hole Transport Layer)

A hole transport layer is a layer which bears the function to reduce promptly the oxidized dye after carrying out light absorption and pouring an electron into a semiconductor, and to convey the hole which was poured in at the interface with the dye to the second electrode.

The hole transport layer which constitutes the photoelectric conversion element of the present invention contains the polymer obtained by reacting 3,4-ethylenedioxythiophene which is a hole transport compound of the present invention. As for 3,4-ethylenedioxythiophene corresponding to the repeating unit of the polymer, it is desirable to use compound of a multimer such as a dimer or trimer (or oligomer) before polymerization. In addition, by using a multimer such as a dimer, the oxidation potential of formed polymer becomes small and the polymerization speed is large to shorten the preparation compared with the case using a monomer. And it is desirable.

(Polymerizing Method of the Polymer Concerning the Present of the Invention)

As a polymerizing method, there can be cited the followings: a chemical polymerization method using a polymerization catalyst; an electrolytic polymerization method using a working electrode and a counter electrode and impressing voltage between both electrodes to react the raw material; a single photopolymerization method; and a photopolymerization method combing light irradiation with a polymerization catalyst, heating or electrolysis. Among these, a polymerizing method using an electrolytic polymerization is preferable.

When obtaining a polymer by an electrolytic polymerization method, a synthesis of a polymer leads to formation of the above-mentioned hole transport layer directly. That is, the following electrolytic polymerization method is performed on the present invention.

3,4-ethylenedioxythiophene or its dimer is dissolved in a solvent such as acetonitrile, tetrahydrofuran, propylene carbonate, dichloromethane, o-dichlorobenzene, or dimethylformamide, and to this solution is added a salt such as lithium perchlorate, lithium tetrafluoroborate, tetrabutyl ammonium perchlorate, or $Li[(CF_3SO_2)_2N]$ as a supporting electrolyte, thus an electrolytic polymerization liquid is produced.

As a solvent, it will not be limited in particular as long as it can dissolve a supporting electrolyte and the above-mentioned monomer, or its dimer. As a supporting electrolyte, the material which can carry out ionic dissociation is used, and it is not limited in particular. The material having high solubility and hardly oxidized or reduced is suitable used. Subsequently, the substrate 1 in which the first electrode 2, the barrier layer 3, and the photoelectric conversion layer 6 have been formed is dipped in this electrolytic polymerization liquid. And polymerization is carried out by the way of a direct-current electrolysis using the photoelectric conversion layer 6 as a working electrode, Ag/AgCl as a reference electrode, for example, and a platinum board as a counter electrode, for example. The concentration of the monomer or the dimer in the aforesaid electrolytic polymerization liquid is suitable to be about 0.1 to 1,000 mmol/l, and the concentration of the supporting electrolyte is suitable to be about 0.1 to 2 mol/l. Moreover, an applied current density is preferably in the range of 0.0 $\mu A \cdot cm^{-2}$ to 1,000 $\mu A \cdot cm^{-2}$, and especially, it is more preferably in the range of 1 $\mu A \cdot cm^{-2}$ to 500 $\mu A \cdot cm^{-2}$. The range of temperature of the electrolytic polymerization liquid is preferably in the range where the solvent will not be solidified or will not bumped, it is generally from −30° C. to 80° C. The requirements of electrolytic voltage, electrolytic current, electrolysis time and temperature will be influenced by the material to be used, they can be suitably chosen according to the required thickness of the product.

On the other hand, in performing chemical polymerization using a polymerization catalyst, 3,4-ethylenedioxythiophene or its dimer is polymerized using the following polymerization catalysts. Examples of a polymerization catalyst are: iron(III) chloride, iron(III) tris-p-toluenesulfonate, iron(III) p-dodecylbenzenesulfonate, iron(III) methanesulfonate, iron (III) p-ethylbenzenesulfonate te, iron(III) naphthalenesulfonate, and their hydrate.

As a polymerization rate regulator used in chemical polymerization, there will be no restriction in particular as long as it is a weak complexing agent to the trivalent iron in the above-mentioned polymerization catalyst, and it can reduce a polymerization rate so that a membrane can be formed. When the polymerization catalyst is iron(III) chloride or its hydrate, an aromatic oxysulfonic acid such as 5-sulfosalicylic acid is cited. Further, when the polymerization catalyst is iron(III) tris-p-toluenesulfonate, iron(III) p-dodecylbenzenesulfonate, iron(III) methanesulfonate, iron(III) p-ethylbenzenesulfonate, iron (III) naphthalenesulfonate, or their hydrate, imidazole is cited as a polymerization rate regulator.

The prepared polymer may be provided on a photoelectric conversion layer with a coating liquid containing the prepared polymer. However, the preferred embodiment is to polymerize on the photoelectric conversion layer so as to form a hole transport layer.

In that case, it is used a solution for forming a hole transport layer, which contains 3,4-ethylenedioxythiophene or its dimer, the aforesaid polymerization catalyst, the aforesaid polymerization rate regulator and other additive, in order to prepare a polymer. The concentration of the sum of each ingredient described above in the solution for forming a hole transport layer will be changed depending on 3,4-ethylenedioxythiophene or its dimer, the kind of the aforesaid polymerization catalyst, the aforesaid polymerization rate regulator and other additive, the amount ratio, the coating condition, the required thickness of the prepared polymer. The mass concentration of the total ingredient in the solution is in the range of 1 to 50% in general.

After applying the above-mentioned solution for forming a hole transport layer on a photoelectric conversion layer by a coating method, or while immersing a photoelectric conversion layer into the above-mentioned solution for forming a hole transport layer, polymerization is performed.

The condition of polymerization will be changed depending on 3,4-ethylenedioxythiophene or its dimer, the kind of the aforesaid polymerization catalyst, the aforesaid polymerization rate regulator and other additive, the amount ratio, the concentration, the coating thickness of the solution and the required polymerization speed thickness of the prepared polymer. However, suitable polymerization conditions in the case of air heating are: heating temperature of 25 to 120° C. and heating time of 1 minute to 24 hours.

When forming a hole transport layer by application, the above-mentioned solution for forming a hole transport layer is used. Examples of an organic solvent for this solution are: a polar solvent such as tetrahydrofuran (THF), butyleneoxide, chloroform, cyclohexanone, chlorobenzene, acetone and various alcohols; and an aprotic solvent such as dimethylformamide (DMF), acetonitrile, dimethoxyethane, dimethyl sufoxide, and hexamethylphosphoric triamide. One of these solvents or a mixture of two or more solvents can be sued.

It may be added various additives, such as $N(PhBr)_3$ $SbCl_6$ and $Li[(CF_3SO_2)_2N]$, in a hole transport layer if needed.

As a way of applying, it can be used various applying methods, such as a dipping method, a dropping method, a doctor blade coating, a spin coating, a brush coating, a spray painting and a roll coater coating. Moreover, a scanning of such application is repeated to produce laminate layers.

As for the content of a polymer which has a 3,4-ethylenedioxythiophene repeating unit in a hole transport layer, it is preferable that it is 50 to 100 mass %, and more preferably it is 90 to 100 mass %.

In order to raise the conductivity of the hole transporting layer of the present invention, it is needed to be doped with a hole dope and it is preferable that the amount of the hole dope per a unit of 3,4-ethylenedioxythiophene repeating unit is 0.15 to 0.66 (piece).

In the electrolytic polymerization, a hole dope can be performed by oxidizing with applying an electric field to the polymer which has a 3,4-ethylenedioxythiophene repeating unit.

It is preferable to irradiate a light to polymerize in the electrolytic polymerization. This is because a polymer can be closely formed on a surface of titanium oxide.

Moreover, in order to reduce an oxidized dye in a photoelectric conversion layer, it is required for the polymer concerning the present invention to have a smaller ionization potential than that of an electrode adsorbed with a dye. Therefore, although the preferable range of ionization potential of the polymer concerning the present invention will be changed depending on the dye to be used, it is preferably in the range of 4.5 eV to 5.5 eV in the state where this polymer was doped, more preferably, it is in the range of 4.7 eV to 5.3 eV.

(Substrate)

A substrate is formed at the side into which a light enters. From the viewpoint of the photoelectric conversion efficiency of the photoelectric conversion element, the optical transmittance of the substrate is preferably 10% or more. More preferably, the optical transmittance is 50% or more, and still more preferably, the optical transmittance is 80 to 100%.

In the present invention, "transparent" indicates a property which exhibits the total optical transmittance in the visible wavelength range of 60% or more when it is measured by the method based on "The test method of the total optical transmittance of a plastic transparent material" of JIS K 7361-1 (it corresponds to ISO 13468-1).

The substrates preferably employed in the present invention are not particularly limited, and their materials, shape, structure and thickness may be selected from those known in the art. However, it is preferable to exhibit high optical transmittance as described above.

Examples of the substrates which can be used are: polyester resin film (e.g., polyethylene terephthalate (PET) resin film, polyethylene naphthalate resin film and modified polyester resin film), polyolefin resin film (e.g., polyethylene (PE) resin film, polypropylene (PP) resin film, polystyrene resin film, cycloolefin resin film), vinyl resin film (e. g., polyvinyl chloride resin film, polyvinylidene chloride resin film); polyvinyl acetal resin film such as polyvinyl butyral resin film, polyether ether ketone (PEEK) resin film, polysulfone (PSF) resin film, polyethersulfone (PES) resin film, polycarbonate (PC) resin film, polyamide resin film, polyimide resin film, acrylic resin film, and triacetyl cellulose (TAC) resin film. In addition to these resin films, inorganic glass films may be used as a substrate.

If the resin films have the transmittance of 80% or more in the visible wavelength (380-780 nm), they are preferably applicable to the substrate of the present invention. It is especially preferable that they are a biaxially-drawn polyethylene terephthalate film, a biaxially-drawn polyethylene naphthalate film, a polyethersulfone film, and a polycarbonate film from a viewpoint of transparency, heat resistance, easy handling, strength and cost. Furthermore, it is more preferable that they are biaxially-drawn polyethylene terephthalate film and a biaxially-drawn polyethylene naphthalate film.

In order to secure the wettability and adhesion property of a coating solution, surface treatment can be performed and an adhesion assisting layer may be provided on the transparent substrate used for the present invention.

A well-known technique can be used conventionally with respect to surface treatment or an adhesion assisting layer. Examples of surface treatment include: surface activating treatment such as: corona discharge treatment, flame treatment, ultraviolet treatment, high-frequency wave treatment, glow discharge process, active plasma treatment and laser treatment.

Examples of materials for an adhesion assisting layer include: polyester, polyamide, polyurethane, vinyl copolymer, butadiene copolymer, acrylic copolymer, vinylidene copolymer and epoxy copolymer.

It is preferable that the substrate has a thickness of 1 to 1,000 μm, and more preferably has a thickness of 1 to 100 μm.

(First Electrode)

The first electrode is arranged between a substrate and a photoelectric conversion layer.

As the first electrode, it is preferably used an electrode having an optical transmittance of 80% or more, more preferably, having an optical transmittance of 90% or more. The definition of an optical transmittance is the same as described for the substrate.

The first electrode is provided on one surface of the substrate opposite the other surface of the substrate to which an incident light enters.

Examples of the material which forms the first electrode are cited as: a metal (for example, platinum, gold, silver copper, aluminium, rhodium and indium); and a metal oxide (for example, $SnO_2$, CdO, ZnO, a CTO system ($CdSnO_3$, $Cd_2SnO_4$ and $CdSnO_4$), $In_2O_3$ and $CdIn_2O_4$.

A preferable metal is silver. In order to give an optical transmittance, it is preferably used a film with opening of grid patterning, or a film coated with a dispersion of particles or nanowires.

Examples of a preferable metal oxide are a composite (doped) material prepared from the aforesaid metal oxide doped with one or plural species selected from Sn, Sb, F and Al.

The more preferable are conductive metal oxides such as: $In_2O_3$ doped with Sn (ITO), $SnO_2$ doped with Sb and $SnO_2$ doped with F (FTO). FTO is the most preferable from the viewpoint of heat resistant property.

The substrate having the first electrode on the surface thereof is called here a conductive substrate.

A thickness of a conductive substrate is preferably in the range of 0.1 mm to 5 mm.

A surface resistivity of a conductive substrate is preferably 50 $\Omega/cm^2$ or less, and more preferably it is 10 $\Omega/cm^2$ or less.

A preferable range of an optical transmittance for a conductive substrate is the same as a preferable range of an optical transmittance for the above-mentioned substrate.

(Barrier Layer)

It is preferable that the photoelectric conversion element of the present invention has a barrier layer located between the first electrode and the semiconductor layer. The barrier layer forms a film structure (a layer structure) and is effective for prevention of short-circuit.

A preferable embodiment of a barrier layer and a photoelectric conversion layer is porous as described later. In this case, when a porosity of a barrier layer is set to C (%) and a porosity of a semiconductor layer is set to D (%), it is preferable that D/C is about 1.1 or more, for example, and more preferably D/C is about 5 or more, and still more preferably D/C is about 10 or more.

Thereby, the barrier layer and the semiconductor layer can exhibit their respective functions more suitably. More specifically, a porosity of a bather layer C is preferably to be about 20% or less, for example, more preferably to be about 5% or less, and still more preferably to be about 2% or less. That is, as for a barrier layer, it is preferable that it is a dense layer. Thereby, the above-mentioned effect can be improved more.

As an average thickness (film thickness) of a barrier layer, it is preferable to be about 0.01 to 10 μm, for example, and it is more preferable to be about 0.03 to 0.5 μm. Thereby, the above-mentioned effect can be improved more.

The constituting materials for this barrier layer are not particularly limited. Examples of the materials are: zinc, niobium, tin, titanium, vanadium, indium, tungsten, tantalum, zirconium, molybdenum, manganese, iron, copper, nickel, iridium, rhodium, chromium, ruthenium and their oxide; perovskite compound such as strontium titanate, calcium titanate, barium titanate, magnesium titanate and strontium niobate and their composite oxide or mixture of oxide; a metal compound such as CdS, CdSe, TiC, Si3N4, SiC and BN, and their mixture of two or more kinds.

At this time, it is possible to raise the electronic transition efficiency from the porous semiconductor layer (photoelectric conversion layer) to a barrier layer by choosing an oxide.

Among them, it is preferable that it has electrical conductivity equivalent to a semiconductor layer (photoelectric conversion layer), and especially, it is especially preferable that the materials is mainly composed of titanium oxide.

(Photoelectric Conversion Layer)

A photoelectric conversion layer is composed of a semiconductor layer which contains a semiconductor and a dye and the aforesaid semiconductor supports the aforesaid dye.

(Semiconductor)

Usable examples of the semiconductor employed in the semiconductor of the present invention include: an elemental substance such as silicon or germanium; a compound containing an element in Groups 3-5 and Groups 13-15 of the periodic table (referred to also as the element periodic table); a metal chalcogenide such as oxide, sulfide, or selenide; and a metal nitride.

Preferable examples of a metal chalcogenide include: an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; and a telluride of cadmium. Examples of other compound-semiconductors include: a phosphide of zinc, gallium, indium, or cadmium; a selenide of gallium-arsenic or copper-indium; a sulfide of copper-indium; and a nitride of titanium.

Specific examples include: $TiO_2$, $SnO_2$, $Fe_2O_3$, $WO_3$, ZnO, $Nb_2O_5$, CdS, ZnS, PbS, $Bi_2S_3$, CdSe, CdTe, GaP, Inp, GaAs, $CuInS_2$, $CuInSe_2$, $Ti_3N_4$ and so forth. Of these, $TiO_2$, ZnO, $SnO_2$, $Fe_2O_3$, $WO_3$, $Nb_2O_5$, CdS and PbS are preferably usable, $TiO_2$ and $Nb_2O_5$ are more preferably usable, and $TiO_2$ is most preferably usable.

As a semiconductor employed for a semiconductor layer, the above-described plural semiconductors may be used in combination.

For example, several kinds of the above-described metal oxide or metal sulfide may be used in combination, and 20% by weight of titanium nitride ($Ti_3N_4$) may be mixed in titanium oxide semiconductor to be used.

The zinc oxide/tin oxide composite described in J. Chem. Soc., Chem. Commun., 15 (1999) may also be applied. In this case, when a component other than metal oxide or metal sulfide is added as a semiconductor, a content of such the addition component is preferably 30% by weight with respect to the metal oxide or metal sulfide semiconductor.

A semiconductor utilized for the present invention may be subjected to a surface treatment employing an organic base. Preferable examples of the foregoing organic base include diarylamine, triarylamine, pyridine, 4-t-butylpyridine, polyvinylpyridine, quinoline, piperidine and amidine. Among them, pyridine, 4-t-butylpyridine and polyvinylpyridine are preferable.

When the above-described organic base is liquid, it can be used as it is. When the organic base is solid, a solution dissolved in an organic solvent is prepared, and a surface treatment can be conducted by immersing a semiconductor of the present invention in liquid amine or an amine solution.

(Preparation of Semiconductor Layer)

A method of preparing a semiconductor layer of the present invention will be described.

When a semiconductor in the semiconductor layer of the present invention is in the form of a particle, the semiconductor is preferably prepared by coating or spraying particles onto a conductive support. Further, when the semiconductor of the present invention is in the form of a film, and is not supported on the conductive support, the semiconductor is preferably attached onto the conductive support to prepare the semiconductor layer.

As a preferable embodiment of a semiconductor layer of the present invention, there is provided a method of forming via calcination employing semiconductor particles on the above-described conductive support.

When a semiconductor of the present invention is prepared via calcination, the semiconductor is preferably subjected to a sensitization (adsorption, filling in a porous layer, and so forth) treatment employing a sensitizing dye after calcination. After the calcination, specifically, the adsorption treatment of the dye compound to the semiconductor is preferably done without delay before water is adsorbed to the semiconductor.

Next, a method of forming a photoelectrode via calcination employing semiconductor particles, which is preferably utilized in the present invention, will be described in detail.

(Preparation of Semiconductor Powder-containing Coating Solution)

First, a semiconductor powder-containing coating solution is prepared. The primary particle diameter of this semiconductor powder is preferably as fine as possible. The semiconductor powder preferably has a primary particle diameter of 1-5,000 nm, and more preferably has a primary particle diameter of 2-100 mn. The coating solution containing the semiconductor powder can be prepared by dispersing the semiconductor powder in a solvent.

The semiconductor powder dispersed in the solvent is dispersed in the form of the primary particle. The solvent is not specifically limited as long as it can disperse the semiconductor powder.

As the foregoing solvent, water, an organic solvent, and a mixture of water and an organic solvent are included. As the organic solvent, the following solvents are usable: alcohol such as methanol, or ethanol; ketone such as methyl ethyl ketone, acetone, or acetylacetone; and hydrocarbon such as hexane, or cyclohexane. A surfactant and a viscosity controlling agent (polyhydric alcohol such as polyethylene glycol) can be added into a coating solution, if desired. The content of the semiconductor powder in the solvent is preferably 0.1 to 70 mass %, and more preferably 0.1 to 30 mass %.

(Coating of Semiconductor Powder-containing Coating Solution and Calcination Treatment of Formed Semiconductor Layer)

The semiconductor powder-containing coating solution obtained as described above is coated or sprayed onto the conductive support, followed by drying, and then heated in air or inactive gas to form a semiconductor layer (referred to also as a semiconductor film) on the conductive support.

The layer formed via coating the semiconductor powder-containing coating solution onto the conductive support, followed by drying is composed of an aggregate of semiconductor particles, and the particle diameter corresponds to the primary particle diameter of the utilized semiconductor powder.

The semiconductor particle layer formed on a conductive layer of the conductive support as described above is subjected to a calcination treatment in order to increase mechanical strength and to produce a semiconductor layer firmly attached to a substrate, since the semiconductor particle layer exhibits bonding force with the conductive support, as well as bonding force between particles, and also exhibits weak mechanical strength.

In the present invention, this semiconductor layer may have any structure, but a porous structure layer (referred to also as a porous layer possessing pores) is preferable.

When the semiconductor layer is a porous structure, it is a preferable embodiment of the present invention that the hole transport material in the hole transport layer is incorporated in this vacant space.

The semiconductor layer of the present invention preferably has a porosity of 1 to 90 volume %, more preferably has a porosity of 10 to 80 volume %, and most preferably has a porosity of 20 to 70 volume %. In addition, the porosity of the semiconductor layer means a through-hole porosity in the direction of thickness of a dielectric, and it can be measured by a commercially available device such as a mercury porosimeter (Shimadzu Poresize Analyzer 9220 type).

A semiconductor layer as a calcined film having a porous structure preferably has a thickness of at least 10 nm, and more preferably has a thickness of 500-30,000 nm.

A calcination temperature of 1,000° C. or less is preferable, a calcination temperature of 200 to 800° C. is more preferable, and a calcination temperature of 300 to 800° C. is still more preferable in view of acquisition of a calcined film having the above-described porosity by suitably preparing real surface area of the calcined film during calcination treatment.

Moreover, when the substrate has inferior heating stability by using a plastic, it is possible to adhere particles with each other or to adhere particles to the substrate by applying pressure without calcining the substrate at of 200° C or more, or it is possible to heat-treat only a semiconductor layer by a microwave.

Further, a ratio of the real surface area to the apparent surface area can be controlled by a diameter and specific surface area of the semiconductor particle, the calcination temperature and so forth.

After conducting a heat treatment, chemical plating employing an aqueous solution of titanium tetrachloride or electrochemical plating employing an aqueous solution of titanium trichloride may be conducted in order to increase the surface area of a semiconductor particle and purity in the vicinity of the semiconductor particle, and to increase an electron injection efficiency from a dye to a semiconductor particle.

(Dye)

The dye according to the present invention is a compound represented by Formula (1). It is supported by the semiconductor via the sensitization treatment to the semiconductor as described later. It will generate electricity when excited with light irradiation.

<<Compound Represented by Formula (1)>>

The compound represented by Formula (1) will be described below.

Formula (1)

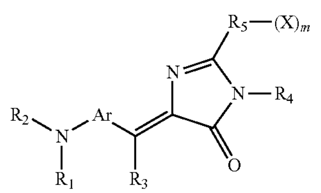

In Formula (1), Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ and $R_4$ each independently represents a hydrogen atom, a cyano group, a substituted or unsubstituted alkyl, alkenyl, alkynyl, aryl, amino, or heterocyclic group; $R_5$ represents a substituted or unsubstituted alkyl, alkenyl, alkynyl, alkoxy, alkylthio, alkylseleno, amino, aryl or heterocyclic group, provided that $R_5$ is substituted with X; X is an acid group; m represents an integer of 1 or more, provided that when m≥2, a plurality of Xs may be the same or different; provided that a cis form and a trans form with respect to a carbon to carbon double bond are included in Formula (1).

As an arylene group represented by Ar, a phenylene group and a tolylene group are cited; and as a heterocyclic, a furanyl group, a thienyl group, an imidazolyl group, a thiazolyl group and a morphonyl group are cited.

As an alkyl group represented by $R_1$ and $R_2$, a methyl group, an ethyl group, a propyl group, an isopropyl group, a tett-butyl group, a pentyl group, a hexyl group, an octyl group, a dodecyl group, a tridecyl group, a tetradecyl group, a pentadecyl group, a cyclopentyl group and a cyclohexyl group are cited; as an alkenyl group, a vinyl group, 1-propenyl group, 2-propenyl group, 2-butenyl group and an allyl group are cited; as an alkynyl group, a propargyl group and 3-pentynyl group are cited; as an aryl group, a phenyl group, a naphthyl group and an anthracenyl group are cited; as a heterocyclic group, a furanyl group, a thienyl group, an imidazolyl group, a thiazolyl group and a morphonyl group are cited.

As a halogen atom represented by $R_3$, a chlorine atom, a bromine atom and a fluorine atom are cited; as an alkoxy group, a methoxy group, an ethoxy group, a propoxy group and a butoxy group are cited; as an amino group, an amino group, an ethylamino group, a dimethylamino group, a butylamino group and a cyclopenthylamino group are cited.

An alkyl, alkenyl, alkynyl, alkoxy, aryl, and heterocyclic group represented by $R_3$, $R_4$ and $R_5$ are synonymous with the groups cited for $R_1$ and $R_2$.

As an alkoxy group represented by $R_5$, a methoxy group, an ethoxy group, a propoxy group and a butoxy group are cited; as an alkylthio group, a methylthio group, an ethylthio group, a propylthio group, an isopropylthio group, a butylthio group, a tert-butylthio group and a hexylthio group are cited; as an alkylseleno group, a methylseleno group, an ethylseleno group, a propylseleno group, a butylseleno group and a hexylseleno group are cited; and as an amino group, an amino group, an ethylamino group, a dimethylamino group, a butylamino group and a cyclopenthylamino group are cited. X is substituted on the above-described alkyl group, alkenyl group, alkynyl group, alkoxy group, alkylthio group, alkylseleno group, amino group, aryl group and heterocylic group.

X is an acid group. Examples thereof are: a carboxyl group, a sulfo group, a sulfino group, a suffinyl group, a phosphoryl group, a phosphinyl group, a phosphono group, a phosphonyl group, sulfonyl groups and those salts. Among them, a carboxyl group and a sulfonyl group are preferable.

As a substituent for the above-mentioned groups, there are cited as follows: alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, a cyclopentyl group and a cyclohexyl group); alkenyl groups (for example, a vinyl group, 1-propenyl group, 2-propenyl group, 2-butenyl group and an allyl group); aryl groups (for example, a phenyl group, a naphthyl group and an anthracenyl group); a hydroxyl group, an amino group, a thiol group, a cyano group; halogen atoms (for example, a chlorine atom, a bromine atom and a fluorine atom); and heterocyclic groups (for example, a pyrrolidyl group, an imidazolydyl group, the morpholyl group, the oxazolydyl group, 2-tetrahydro furanyl group, 2-tetrahydro thienyl group, 2-tetrahydropyranyl group and 3-tetrahydro pyranyl group). Moreover, a plurality of these substituents may be combined to form a ring.

<<Compound represented by Formula (2)>>

Among the compounds represented by Formula (1), the compounds having at least one of $R_1$ and $R_2$ which is represented by Formula (2) are preferable since they exhibit high photoelectric conversion efficiency.

Formula (2)

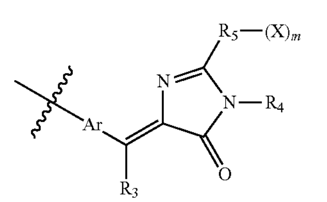

In Formula (2), Ar, $R_3$, $R_3$, $R_5$ and X are synonymous with Ar, $R_3$, $R_3$, $R_5$ and X in Formula (1). And m represents an integer of 1 or more.

<<Compound Represented by Formula (3)>>

Among the compounds represented by Formula (1), the compounds represented by Formula (3) are preferable since they exhibit high photoelectric conversion efficiency.

Formula (3)

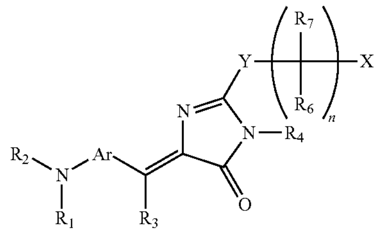

In Formula (3), Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ and $R_4$ each independently represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; Y represents a sulfur atom, an oxygen atom or a selenium atom; X is an acid group; provided that a cis form and a trans form with respect to a carbon to carbon double bond are included in Formula (3).

As a halogen atom represented by $R_6$ and $R_7$, a chlorine atom, a bromine atom and a fluorine atom are cited. A substituted or unsubstituted alkyl, alkenyl, alkynyl, alkoxy, aryl, and heterocyclic group represented by $R_6$ and $R_7$ are synonymous with the groups cited for Formula (1).

In Formula (3), Ar, $R_1$, $R_2$, $R_3$, $R_4$, and X are synonymous with Ar, $R_1$, $R_2$, $R_3$, $R_4$, and X in Formula (1).

<<Compound Represented by Formula (4)>>

The compounds represented by Formula (4), which correspond to the compounds represented by Formula (3) having a sulfur atom as Y, are preferable since they exhibit high photoelectric conversion efficiency.

Formula (4)

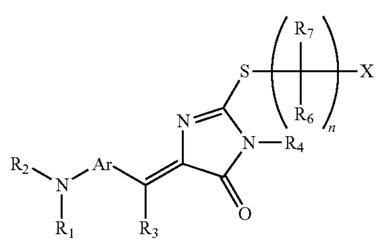

In Formula (4), Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ and $R_4$ each independently represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (4).

In Formula (4), Ar, $R_1$, $R_2$, $R_3$, $R_4$, $R_6$, $R_7$ and X are synonymous with Ar, $R_1$, $R_2$, $R_3$, $R_4$, $R_6$, $R_7$ and X in Formula (3).

<<Compound Represented by Formula (5)>>

The compounds represented by Formula (5), which correspond to the compounds represented by Formula (4) having a hydrogen atom as $R_4$, are preferable since they exhibit high photoelectric conversion efficiency.

Formula (5)

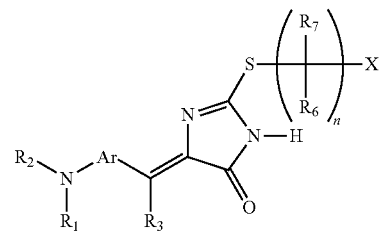

In Formula (5), Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n is an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (5).

In Formula (5), Ar, $R_1$, $R_2$, $R_3$, $R_6$, $R_7$ and X are synonymous with Ar, $R_1$, $R_2$, $R_3$, $R_6$, $R_7$ and X in Formula (4).

<<Compound Represented by Formula (6)>>

Among compounds represented by Formula (5), the compounds represented by Formula (6) are more preferable.

Formula (6)

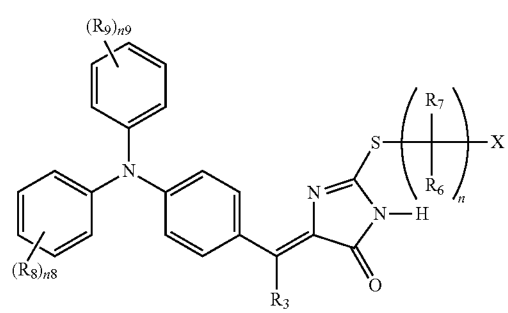

In Formula (6), $R_8$ and $R_9$ each independently represents a halogen atom, a substituted or unsubstituted alkyl, alkenyl, alkynyl, alkoxy, alkylthio, alkylseleno, aryl or heterocyclic group, n8 and n9 each represents an integer of 1 to 5, provided that when n8≥2, and n9≥2, a plurality of $R_8$s and a plurality of $R_9$s each may be the same or different; $R_3$ represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (6).

A halogen atom, a substituted or unsubstituted alkyl, alkenyl, alkynyl, alkoxy, aryl, and heterocyclic group represented by $R_8$ and $R_9$ in Formula (6) are synonymous with the groups cited for in Formula (5).

<<Compound Represented by Formula (7)

Among compounds represented by Formula (6), the compounds represented by Formula (7) are more preferable.

Formula (7)

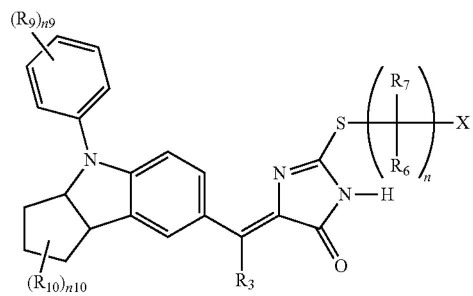

In Formula (7), $R_9$ and $R_{10}$ each independently represents a halogen atom, a substituted or unsubstituted alkyl, alkenyl, alkynyl, alkoxy, alkylthio, alkylseleno, aryl or heterocyclic group, n9 and n10 each respectively represents an integer of 1 to 5 and an integer of 1 to 8, provided that when n9≥2, and n10≥2, a plurality of $R_9$s and a plurality of $R_{10}$s each may be the same or different; $R_3$ represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (7).

A halogen atom, a substituted or unsubstituted alkyl, alkenyl, alkynyl, alkoxy, aryl, and heterocyclic group represented by $R_9$ and $R_{10}$ in Formula (7) are synonymous with the groups cited for Formula (6). An alkylthio and alkylseleno group represented by $R_9$ and $R_{10}$ in Formula (7) are synonymous with an alkylthio and alkylseleno group in Formula (1).

Specific example compounds represented by Formulas (1) to (7) of the present invention are shown below, however, the present invention is not limited to these. In the table, the partial structure in which a wavy line is shown indicates the linking site of in Formulas (1) to (7).

| Dye | $R_1$ | $R_2$ | $R_3$ | $R_4$ | Ar |  $-R_5-(X)_m$ |
|---|---|---|---|---|---|---|
| 1 | 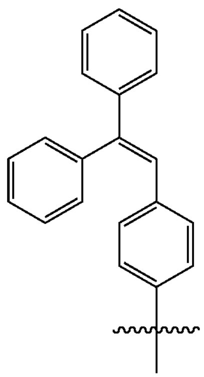 [SMILES: *c1ccc(C=C(c2ccccc2)c2ccccc2)cc1] | 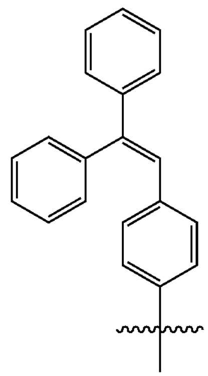 [SMILES: *c1ccc(C=C(c2ccccc2)c2ccccc2)cc1] | H | H | 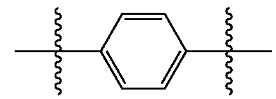 | 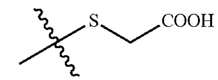 [SMILES: *SCC(=O)O] |
| 2 | 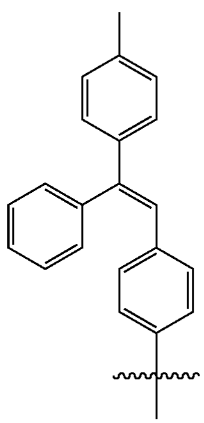 | 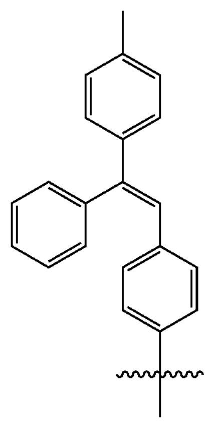 [SMILES: *c1ccc(/C=C(\c2ccccc2)c2ccc(C)cc2)cc1] | H | H | 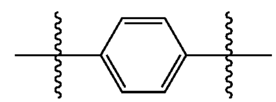 [SMILES: *c1ccc(*)cc1] | 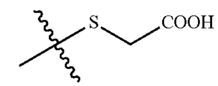 |

-continued
| | | | | | | |
|---|---|---|---|---|---|---|
| 3 | 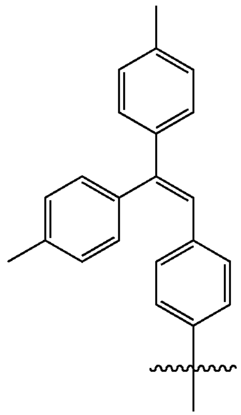 [SMILES: *c1ccc(C=C(c2ccc(C)cc2)c2ccc(C)cc2)cc1] | 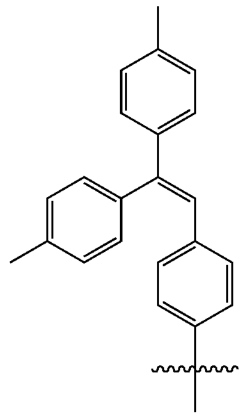 [SMILES: *c1ccc(C=C(c2ccc(C)cc2)c2ccc(C)cc2)cc1] | H | H | 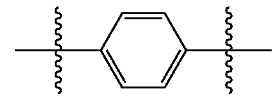 | 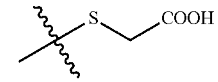 |
| 4 | 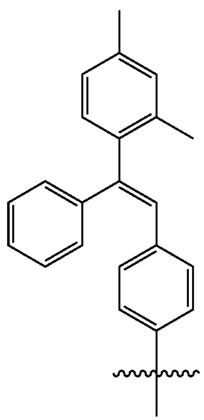 [SMILES: *c1ccc(/C=C(\c2ccccc2)c2ccc(C)cc2C)cc1] | 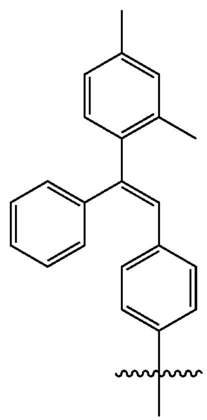 [SMILES: *c1ccc(/C=C(\c2ccccc2)c2ccc(C)cc2C)cc1] | H | H | 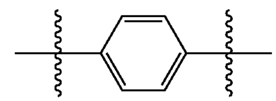 [SMILES: *c1ccc(*)cc1] | 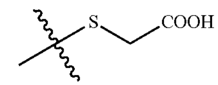 [SMILES: *SCC(=O)O] |

-continued
| | | | | | | |
|---|---|---|---|---|---|---|
| 5 | 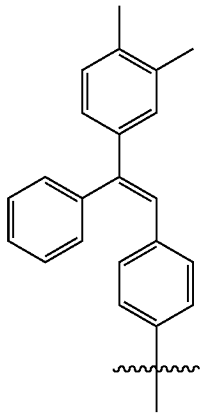 | 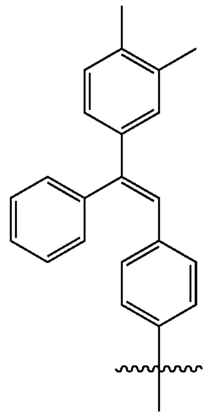 [SMILES: *c1ccc(/C=C(\c2ccccc2)c2ccc(C)c(C)c2)cc1] | H | H | 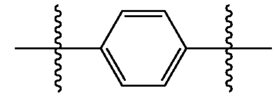 | 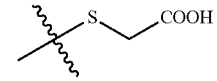 |
| 6 | 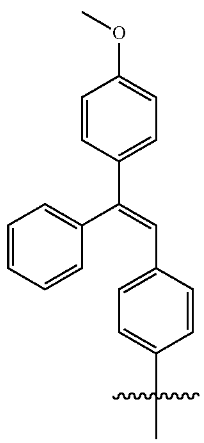 [SMILES: *c1ccc(/C=C(\c2ccccc2)c2ccc(OC)cc2)cc1] | 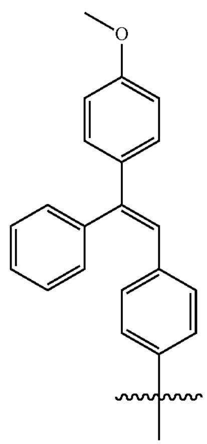 [SMILES: *c1ccc(/C=C(\c2ccccc2)c2ccc(OC)cc2)cc1] | H | H | 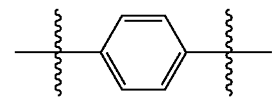 [SMILES: *c1ccc(*)cc1] | 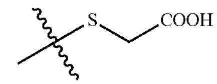 [SMILES: *SCC(=O)O] |

-continued
| | | | | | | |
|---|---|---|---|---|---|---|
| 7 | 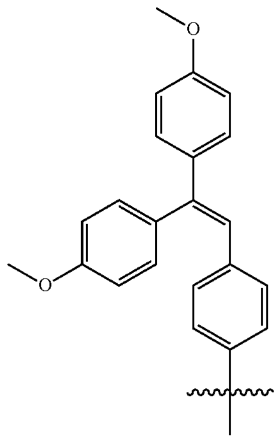 [SMILES: *c1ccc(C=C(c2ccc(OC)cc2)c2ccc(OC)cc2)cc1] | 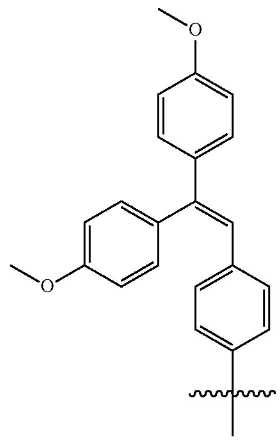 [SMILES: *c1ccc(C=C(c2ccc(OC)cc2)c2ccc(OC)cc2)cc1] | H | H | 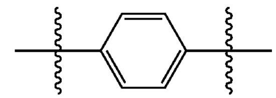 [SMILES: *c1ccc(*)cc1] | 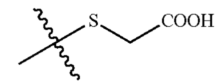 |
| 8 | 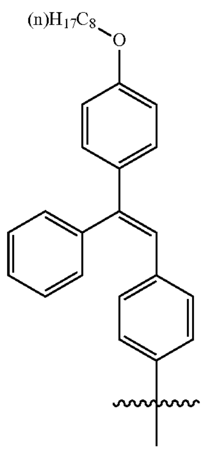 | 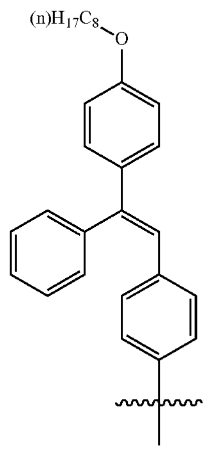 | H | H | 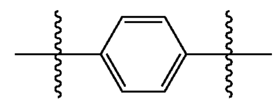 | 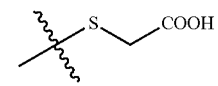 |

-continued
| | | | | | | |
|---|---|---|---|---|---|---|
| 9 | 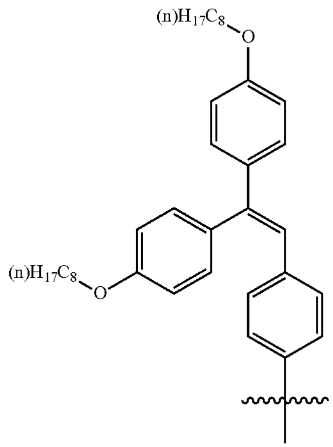 | 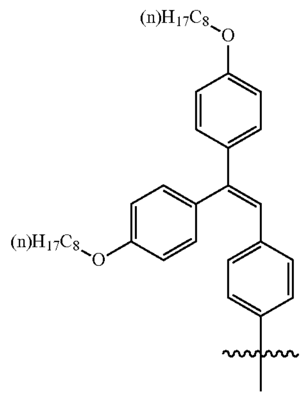 | H | H | 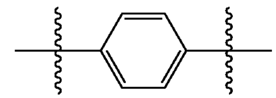 [SMILES: *c1ccc(*)cc1] | 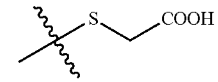 |
| 10 | 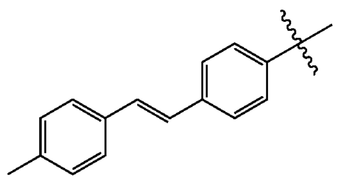 [SMILES: *c1ccc(/C=C/c2ccc(C)cc2)cc1] | 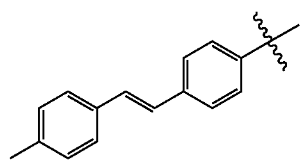 [SMILES: *c1ccc(/C=C/c2ccc(C)cc2)cc1] | H | H | 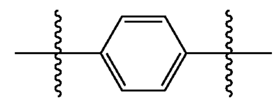 | 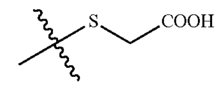 |
| 11 | 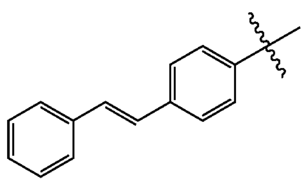 [SMILES: *c1ccc(/C=C/c2ccccc2)cc1] | 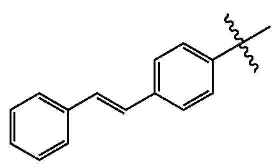 [SMILES: *c1ccc(/C=C/c2ccccc2)cc1] | H | H | 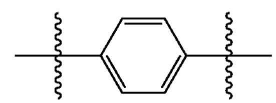 | 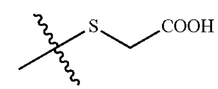 |
| 12 | 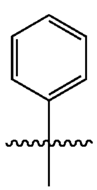 [SMILES: *c1ccccc1] | 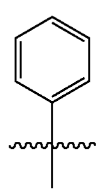 [SMILES: *c1ccccc1] | H | H | 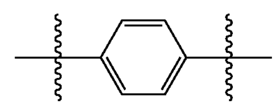 | 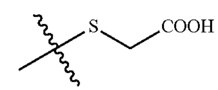 [SMILES: *SCC(=O)O] |

-continued
| | | | | | | |
|---|---|---|---|---|---|---|
| 13 | 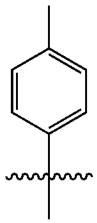 [SMILES: *c1ccc(C)cc1] | 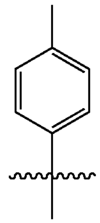 [SMILES: *c1ccc(C)cc1] | H | H | 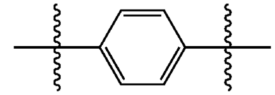 [SMILES: *c1ccc(*)cc1] | 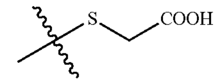 |
| 14 | 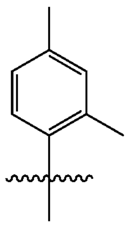 [SMILES: *c1ccc(C)cc1C] | 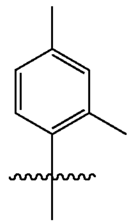 [SMILES: *c1ccc(C)cc1C] | H | H | 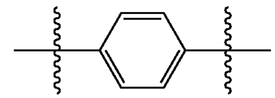 | 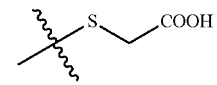 |
| 15 | 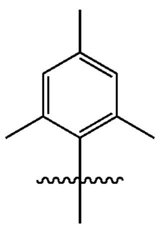 | 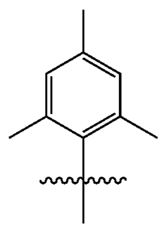 | H | H | 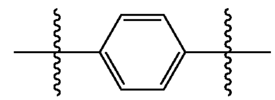 | 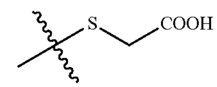 [SMILES: *SCC(=O)O] |
| 16 | 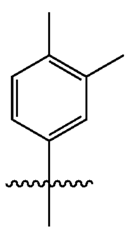 | 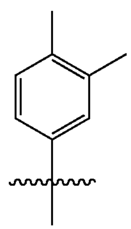 [SMILES: *c1ccc(C)c(C)c1] | H | H | 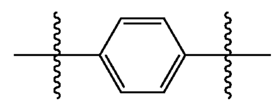 [SMILES: *c1ccc(*)cc1] | 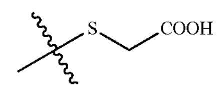 |

-continued
| | | | | | | |
|---|---|---|---|---|---|---|
| 17 | 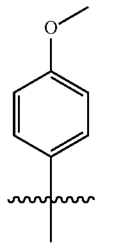 [SMILES: *c1ccc(OC)cc1] | 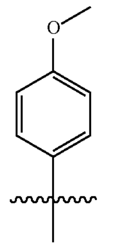 [SMILES: *c1ccc(OC)cc1] | H | H | 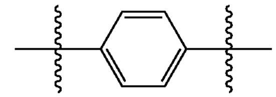 [SMILES: *c1ccc(*)cc1] | 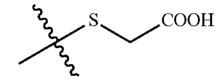 [SMILES: *SCC(=O)O] |
| 18 | 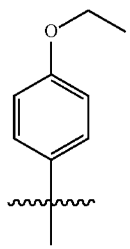 | 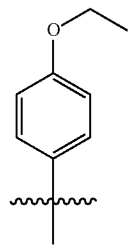 [SMILES: *c1ccc(OCC)cc1] | H | H | 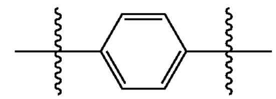 [SMILES: *c1ccc(*)cc1] | 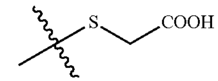 |
| 19 | 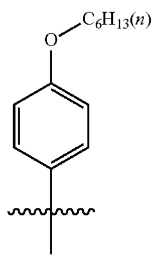 | 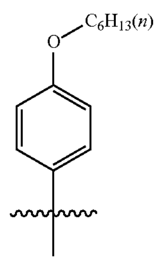 | H | H | 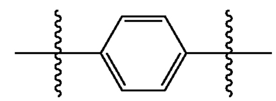 | 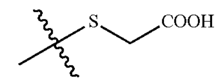 |
| 20 | 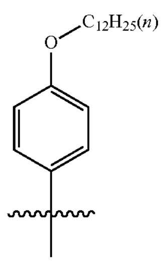 | 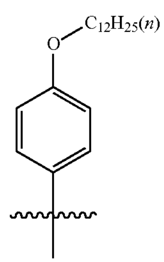 | H | H | 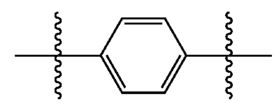 [SMILES: *c1ccc(*)cc1] | 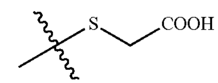 |

-continued
| | | | | | | |
|---|---|---|---|---|---|---|
| 21 | 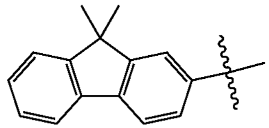 [SMILES: *c1ccc2c(c1)C(C)(C)c1ccccc1-2] | 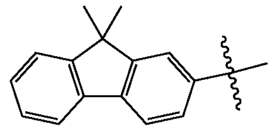 [SMILES: *c1ccc2c(c1)C(C)(C)c1ccccc1-2] | H | H | 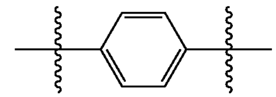 | 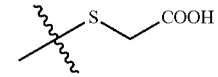 |
| 22 | 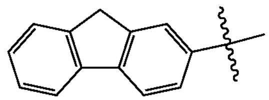 [SMILES: *c1ccc2c(c1)Cc1ccccc1-2] | 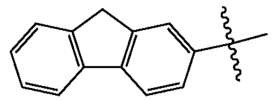 [SMILES: *c1ccc2c(c1)Cc1ccccc1-2] | H | H | 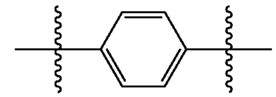 [SMILES: *c1ccc(*)cc1] | 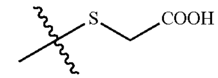 |
| 23 | 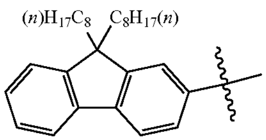 | 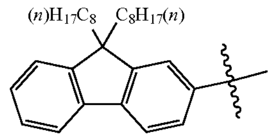 | H | H | 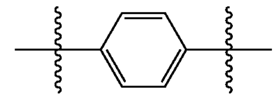 [SMILES: *c1ccc(*)cc1] | 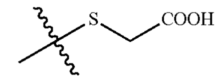 [SMILES: *SCC(=O)O] |
| 24 | 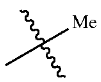 | 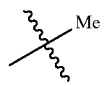 | H | H | 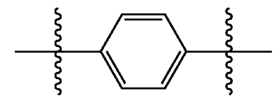 | 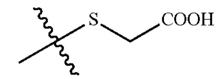 [SMILES: *SCC(=O)O] |
| 25 | 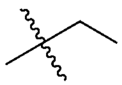 | 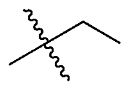 [SMILES: *CC] | H | H | 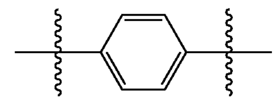 | 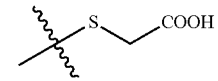 |
| 26 | 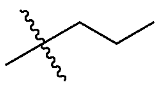 [SMILES: *CCC] | 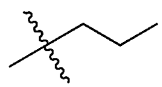 [SMILES: *CCC] | H | H | 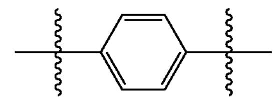 | 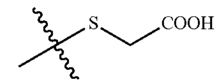 |
| 27 | 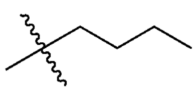 [SMILES: *CCCC] | 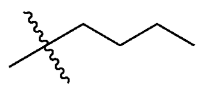 [SMILES: *CCCC] | H | H | 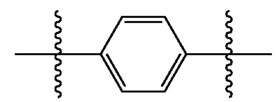 | 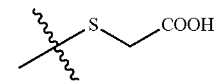 |
| 28 | 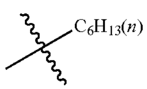 | 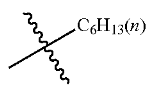 | H | H | 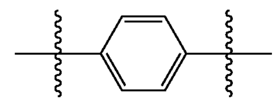 | 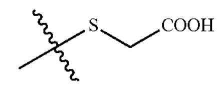 |
| 29 | 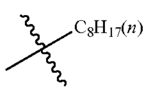 | 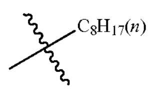 | H | H | 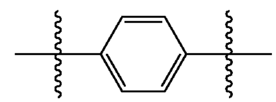 [SMILES: *c1ccc(*)cc1] | 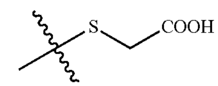 [SMILES: *SCC(=O)O] |

-continued
| | | | | | | |
|---|---|---|---|---|---|---|
| 30 | 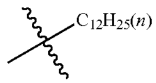 | 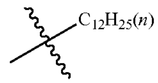 | H | H | 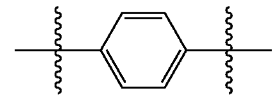 | 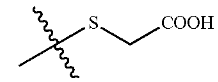 |
| 31 | 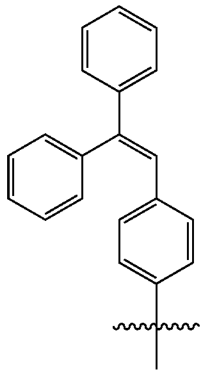 [SMILES: *c1ccc(C=C(c2ccccc2)c2ccccc2)cc1] | 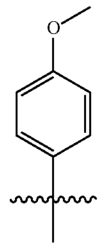 [SMILES: *c1ccc(OC)cc1] | H | H | 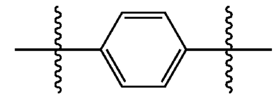 | 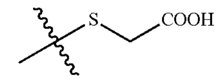 [SMILES: *SCC(=O)O] |
| 32 | 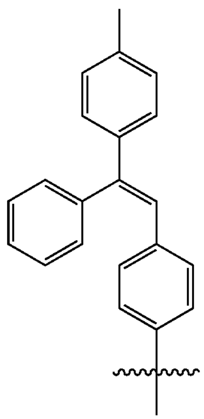 [SMILES: *c1ccc(/C=C(\c2ccccc2)c2ccc(C)cc2)cc1] | 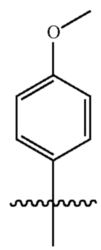 [SMILES: *c1ccc(OC)cc1] | H | H | 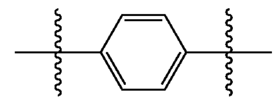 | 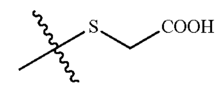 [SMILES: *SCC(=O)O] |

-continued
| | | | | | | |
|---|---|---|---|---|---|---|
| 33 | 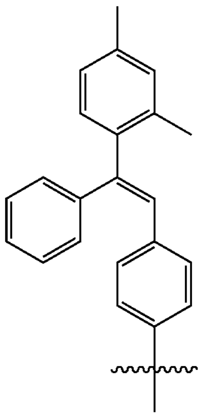 [SMILES: *c1ccc(/C=C(\c2ccccc2)c2ccc(C)cc2C)cc1] | 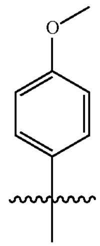 [SMILES: *c1ccc(OC)cc1] | H | H | 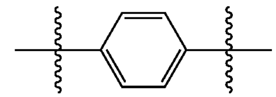 [SMILES: *c1ccc(*)cc1] | 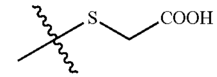 |
| 34 | 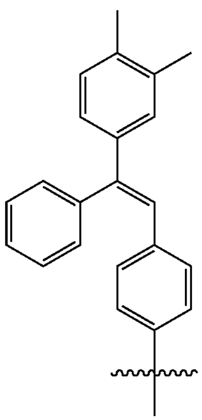 [SMILES: *c1ccc(/C=C(\c2ccccc2)c2ccc(C)c(C)c2)cc1] | 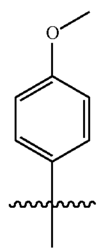 [SMILES: *c1ccc(OC)cc1] | H | H | 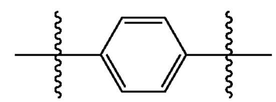 [SMILES: *c1ccc(*)cc1] | 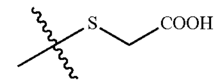 [SMILES: *SCC(=O)O] |

-continued
| | | | | | | |
|---|---|---|---|---|---|---|
| 35 | 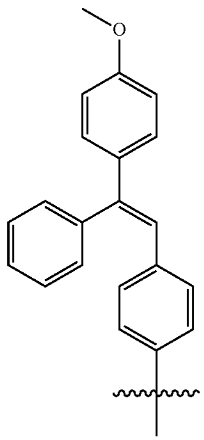 [SMILES: *c1ccc(/C=C(\c2ccccc2)c2ccc(OC)cc2)cc1] | 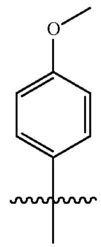 [SMILES: *c1ccc(OC)cc1] | H | H | 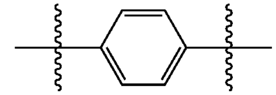 | 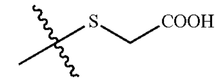 [SMILES: *SCC(=O)O] |
| 36 | 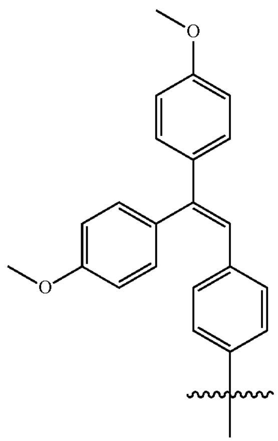 [SMILES: *c1ccc(C=C(c2ccc(OC)cc2)c2ccc(OC)cc2)cc1] | 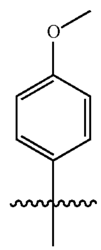 [SMILES: *c1ccc(OC)cc1] | H | H | 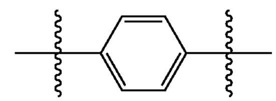 [SMILES: *c1ccc(*)cc1] | 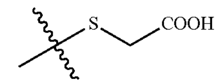 |

-continued
| | | | | | | |
|---|---|---|---|---|---|---|
| 37 | 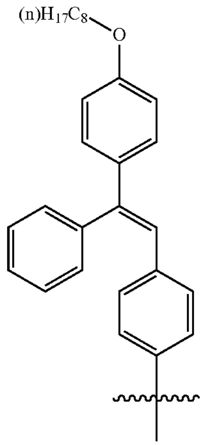 | 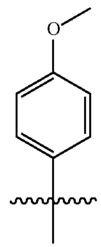 [SMILES: *c1ccc(OC)cc1] | H | H | 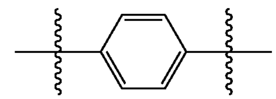 | 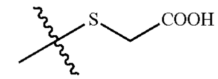 |
| 38 | 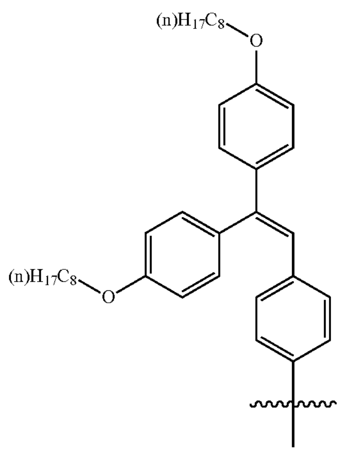 | 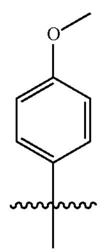 [SMILES: *c1ccc(OC)cc1] | H | H | 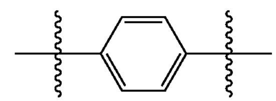 [SMILES: *c1ccc(*)cc1] | 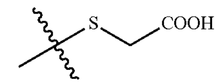 [SMILES: *SCC(=O)O] |

-continued
| | | | | | | |
|---|---|---|---|---|---|---|
| 39 | 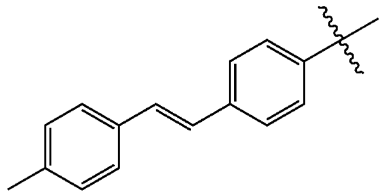 [SMILES: *c1ccc(/C=C/c2ccc(C)cc2)cc1] | 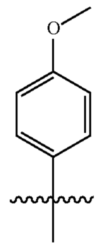 [SMILES: *c1ccc(OC)cc1] | H | H | 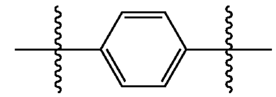 | 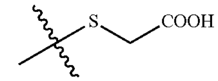 |
| 40 | 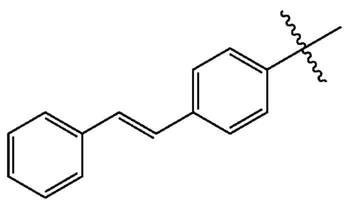 [SMILES: *c1ccc(/C=C/c2ccccc2)cc1] | 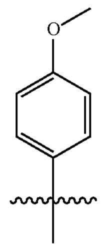 | H | H | 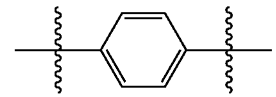 [SMILES: *c1ccc(*)cc1] | 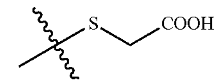 |
| 41 | 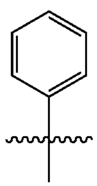 [SMILES: *c1ccccc1] | 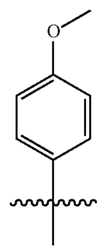 [SMILES: *c1ccc(OC)cc1] | H | H | 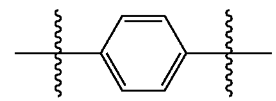 | 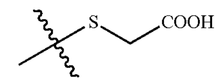 |
| 42 | 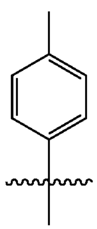 | 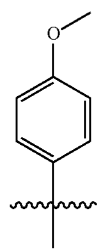 [SMILES: *c1ccc(OC)cc1] | H | H | 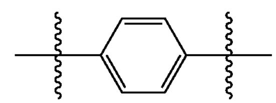 | 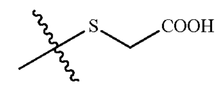 [SMILES: *SCC(=O)O] |

-continued
| | | | | | | |
|---|---|---|---|---|---|---|
| 43 | 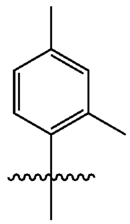 | 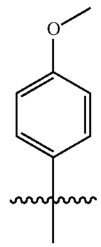 [SMILES: *c1ccc(OC)cc1] | H | H | 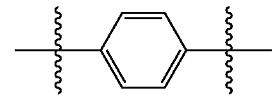 | 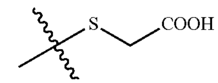 [SMILES: *SCC(=O)O] |
| 44 | 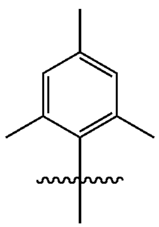 | 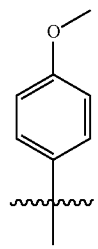 [SMILES: *c1ccc(OC)cc1] | H | H | 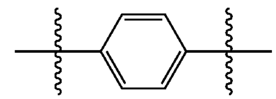 | 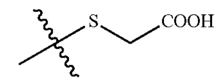 |
| 45 | 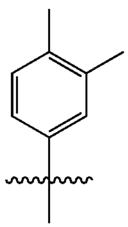 [SMILES: *c1ccc(C)c(C)c1] | 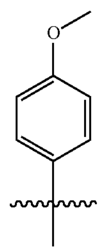 | H | H | 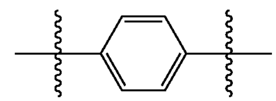 | 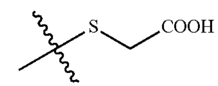 [SMILES: *SCC(=O)O] |
| 46 | 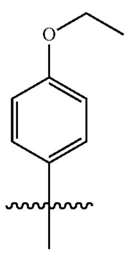 | 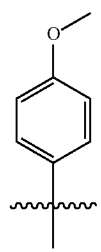 | H | H | 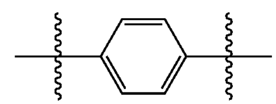 | 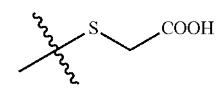 |

-continued
| | | | | | | |
|---|---|---|---|---|---|---|
| 47 | 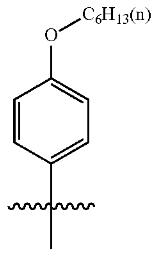 | 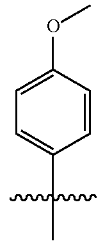 [SMILES: *c1ccc(OC)cc1] | H | H | 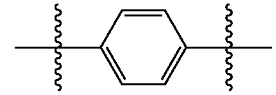 | 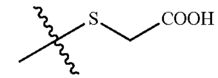 [SMILES: *SCC(=O)O] |
| 48 | 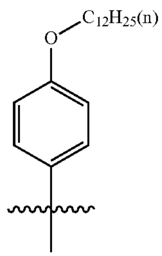 | 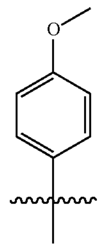 [SMILES: *c1ccc(OC)cc1] | H | H | 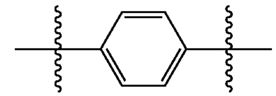 [SMILES: *c1ccc(*)cc1] | 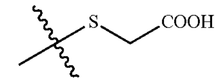 [SMILES: *SCC(=O)O] |
| 49 | 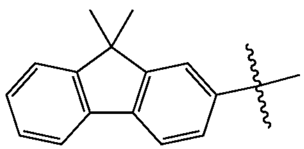 [SMILES: *c1ccc2c(c1)C(C)(C)c1ccccc1-2] | 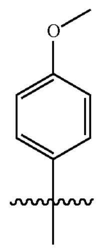 [SMILES: *c1ccc(OC)cc1] | H | H | 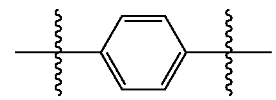 [SMILES: *c1ccc(*)cc1] | 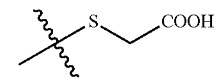 [SMILES: *SCC(=O)O] |
| 50 | 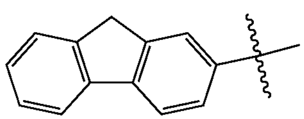 [SMILES: *c1ccc2c(c1)Cc1ccccc1-2] | 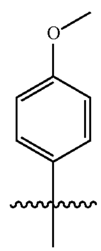 [SMILES: *c1ccc(OC)cc1] | H | H | 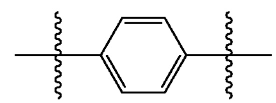 | 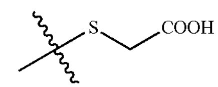 [SMILES: *SCC(=O)O] |

-continued
| | | | | | | |
|---|---|---|---|---|---|---|
| 51 | 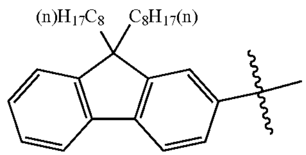 | 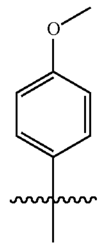 [SMILES: *c1ccc(OC)cc1] | H | H | 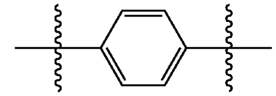 [SMILES: *c1ccc(*)cc1] | 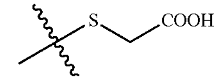 [SMILES: *SCC(=O)O] |
| 52 | 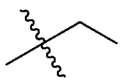 [SMILES: *CC] | 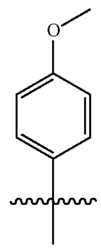 | H | H | 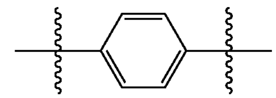 | 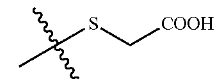 [SMILES: *SCC(=O)O] |
| 53 | 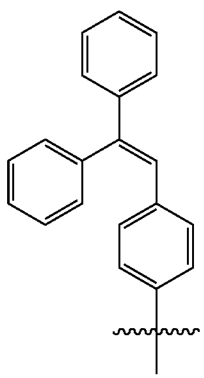 [SMILES: *c1ccc(C=C(c2ccccc2)c2ccccc2)cc1] | 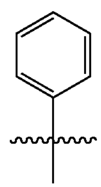 [SMILES: *c1ccccc1] | H | H | 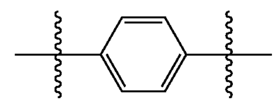 | 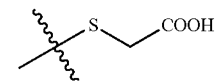 [SMILES: *SCC(=O)O] |

-continued
| | | | | | | |
|---|---|---|---|---|---|---|
| 54 | 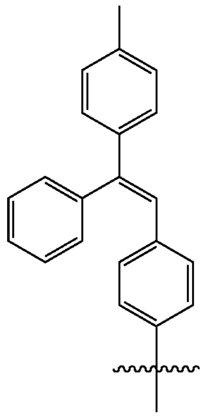 [SMILES: *c1ccc(/C=C(\c2ccccc2)c2ccc(C)cc2)cc1] | 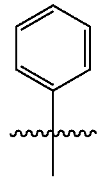 [SMILES: *c1ccccc1] | H | H | 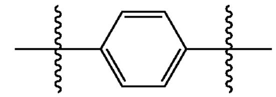 [SMILES: *c1ccc(*)cc1] | 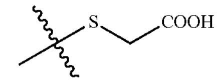 |
| 55 | 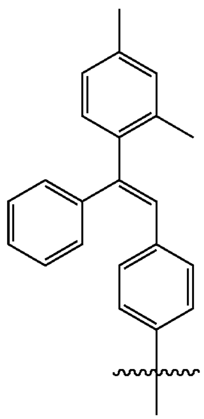 [SMILES: *c1ccc(/C=C(\c2ccccc2)c2ccc(C)cc2C)cc1] | 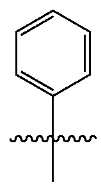 [SMILES: *c1ccccc1] | H | H | 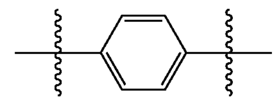 [SMILES: *c1ccc(*)cc1] | 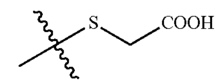 [SMILES: *SCC(=O)O] |

-continued
| | | | | | | |
|---|---|---|---|---|---|---|
| 56 | 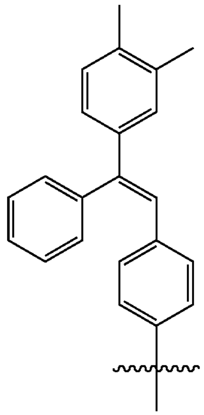 [SMILES: *c1ccc(/C=C(\c2ccccc2)c2ccc(C)c(C)c2)cc1] | 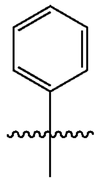 [SMILES: *c1ccccc1] | H | H | 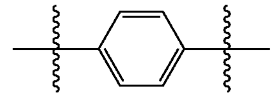 [SMILES: *c1ccc(*)cc1] | 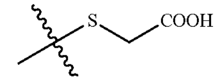 [SMILES: *SCC(=O)O] |
| 57 | 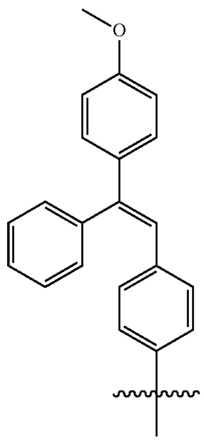 [SMILES: *c1ccc(/C=C(\c2ccccc2)c2ccc(OC)cc2)cc1] | 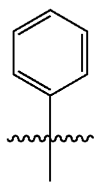 [SMILES: *c1ccccc1] | H | H | 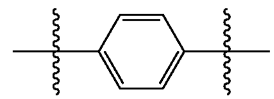 | 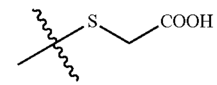 |

-continued
| | | | | | | |
|---|---|---|---|---|---|---|
| 58 | 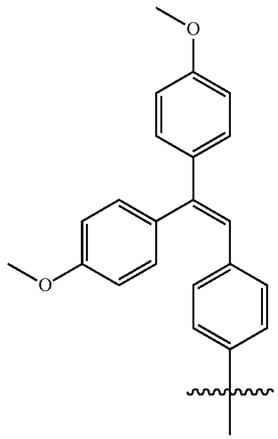 [SMILES: *c1ccc(C=C(c2ccc(OC)cc2)c2ccc(OC)cc2)cc1] | 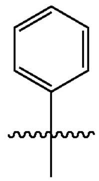 [SMILES: *c1ccccc1] | H | H | 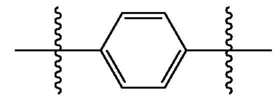 | 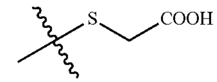 [SMILES: *SCC(=O)O] |
| 59 | 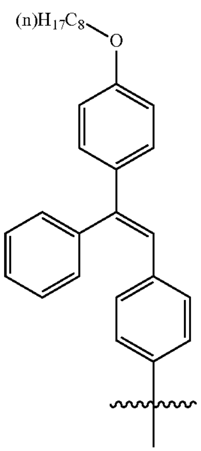 | 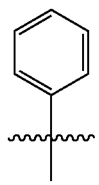 [SMILES: *c1ccccc1] | H | H | 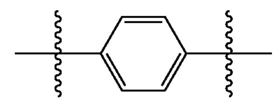 | 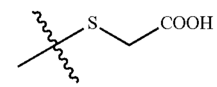 [SMILES: *SCC(=O)O] |

-continued
| | | | | | | |
|---|---|---|---|---|---|---|
| 60 | 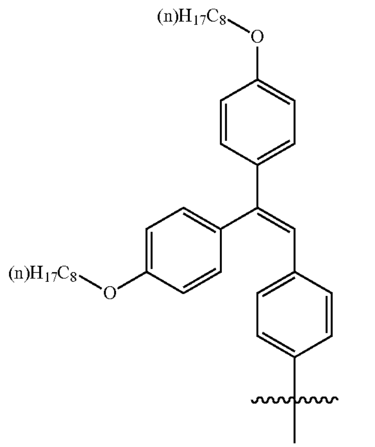 | 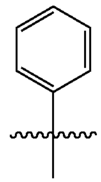 [SMILES: *c1ccccc1] | H | H | 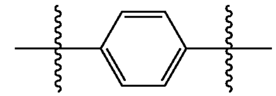 [SMILES: *c1ccc(*)cc1] | 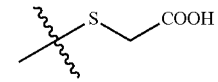 [SMILES: *SCC(=O)O] |
| 61 | 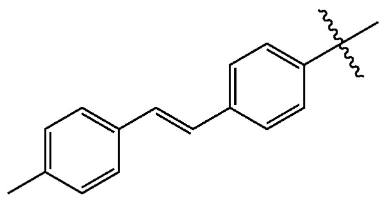 [SMILES: *c1ccc(/C=C/c2ccc(C)cc2)cc1] | 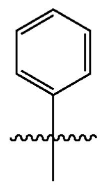 [SMILES: *c1ccccc1] | H | H | 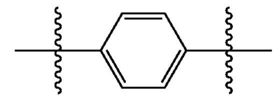 | 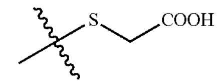 [SMILES: *SCC(=O)O] |
| 62 | 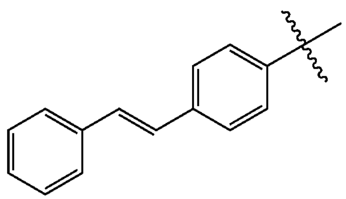 [SMILES: *c1ccc(/C=C/c2ccccc2)cc1] | 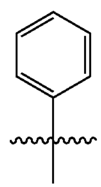 | H | H | 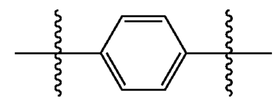 [SMILES: *c1ccc(*)cc1] | 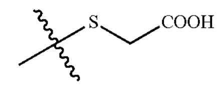 |
| 63 | 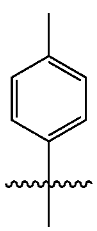 | 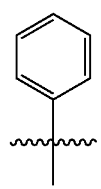 [SMILES: *c1ccccc1] | H | H | 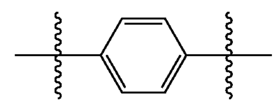 | 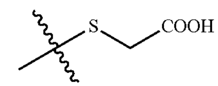 [SMILES: *SCC(=O)O] |

-continued
| | | | | | | |
|---|---|---|---|---|---|---|
| 64 | 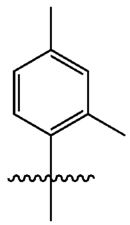 | 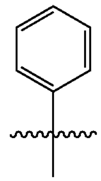 [SMILES: *c1ccccc1] | H | H | 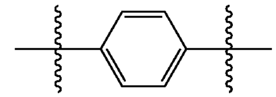 [SMILES: *c1ccc(*)cc1] | 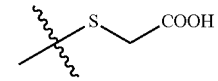 |
| 65 | 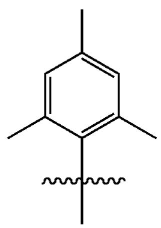 | 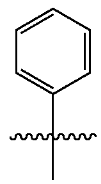 [SMILES: *c1ccccc1] | H | H | 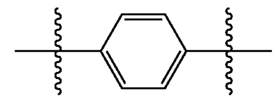 | 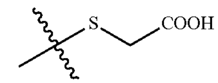 |
| 66 | 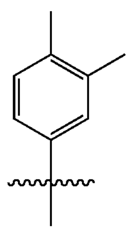 [SMILES: *c1ccc(C)c(C)c1] | 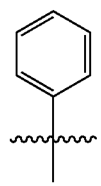 [SMILES: *c1ccccc1] | H | H | 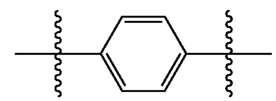 | 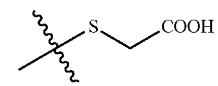 [SMILES: *SCC(=O)O] |
| 67 | 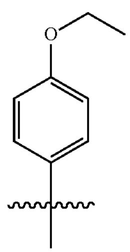 [SMILES: *c1ccc(OCC)cc1] | 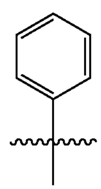 [SMILES: *c1ccccc1] | H | H | 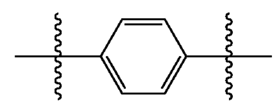 [SMILES: *c1ccc(*)cc1] | 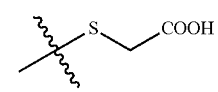 [SMILES: *SCC(=O)O] |

-continued
| | | | | | |
|---|---|---|---|---|---|
| 68 | 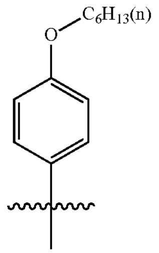 | 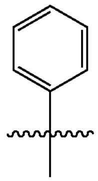 [SMILES: *c1ccccc1] | H | H | 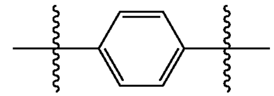 [SMILES: *c1ccc(*)cc1] | 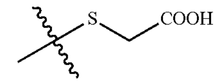 [SMILES: *SCC(=O)O] |
| 69 | 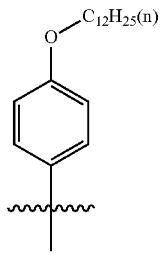 | 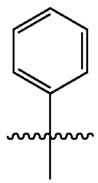 [SMILES: *c1ccccc1] | H | H | 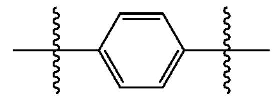 | 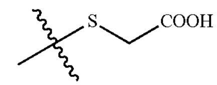 [SMILES: *SCC(=O)O] |
| 70 | 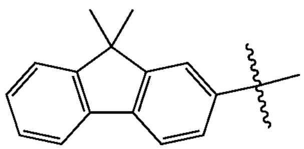 [SMILES: *c1ccc2c(c1)C(C)(C)c1ccccc1-2] | 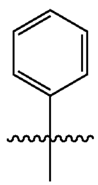 [SMILES: *c1ccccc1] | H | H | 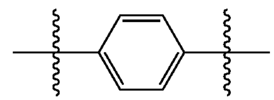 | 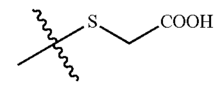 |
| 71 | 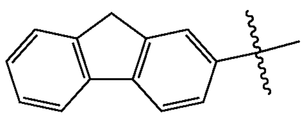 [SMILES: *c1ccc2c(c1)Cc1ccccc1-2] | 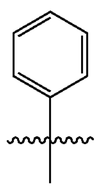 [SMILES: *c1ccccc1] | H | H | 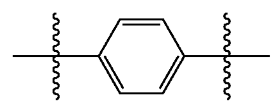 [SMILES: *c1ccc(*)cc1] | 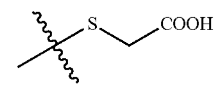 |
| 72 | 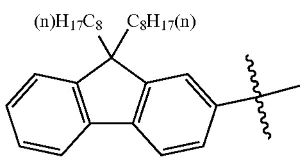 | 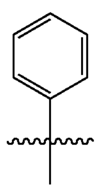 [SMILES: *c1ccccc1] | H | H | 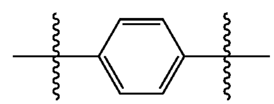 | 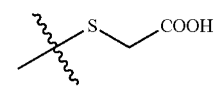 |

-continued
| | | | | | | |
|---|---|---|---|---|---|---|
| 73 | 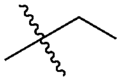 [SMILES: *CC] | 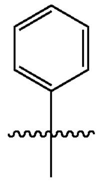 [SMILES: *c1ccccc1] | H | H | 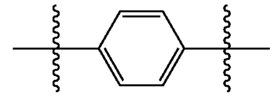 | 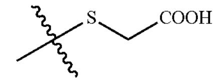 |
| 74 | 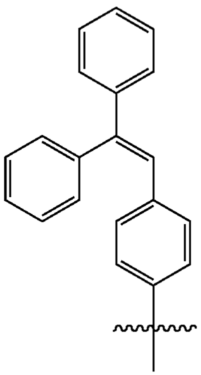 [SMILES: *c1ccc(C=C(c2ccccc2)c2ccccc2)cc1] | 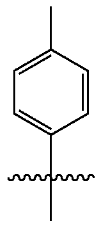 | H | H | 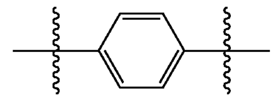 | 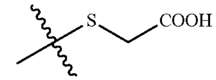 [SMILES: *SCC(=O)O] |
| 75 | 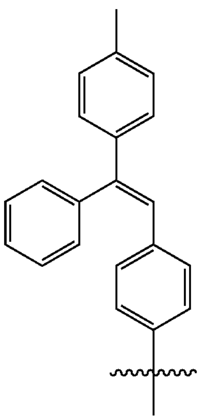 [SMILES: *c1ccc(/C=C(\c2ccccc2)c2ccc(C)cc2)cc1] | 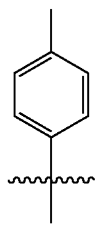 | H | H | 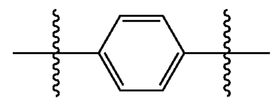 [SMILES: *c1ccc(*)cc1] | 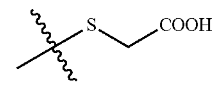 |

-continued
| | | | | | | |
|---|---|---|---|---|---|---|
| 76 | 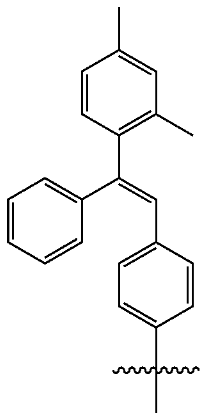 [SMILES: *c1ccc(/C=C(\c2ccccc2)c2ccc(C)cc2C)cc1] | 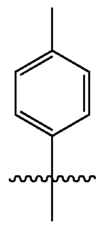 [SMILES: *c1ccc(C)cc1] | H | H | 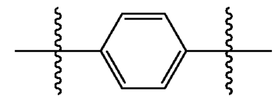 [SMILES: *c1ccc(*)cc1] | 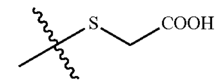 |
| 77 | 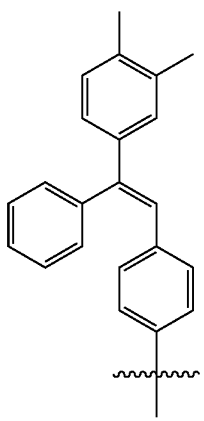 [SMILES: *c1ccc(/C=C(\c2ccccc2)c2ccc(C)c(C)c2)cc1] | 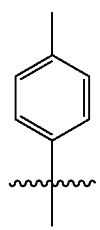 [SMILES: *c1ccc(C)cc1] | H | H | 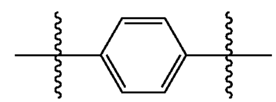 | 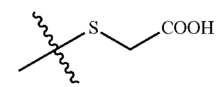 [SMILES: *SCC(=O)O] |

-continued
| | | | | | | |
|---|---|---|---|---|---|---|
| 78 | 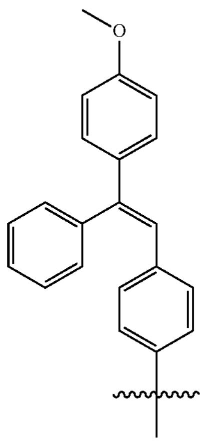 [SMILES: *c1ccc(/C=C(\c2ccccc2)c2ccc(OC)cc2)cc1] | 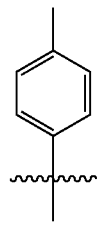 [SMILES: *c1ccc(C)cc1] | H | H | 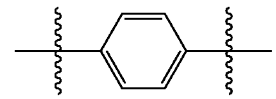 [SMILES: *c1ccc(*)cc1] | 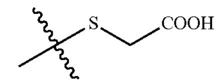 |
| 79 | 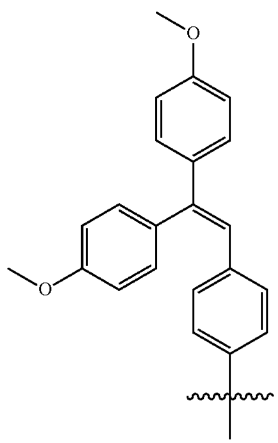 [SMILES: *c1ccc(C=C(c2ccc(OC)cc2)c2ccc(OC)cc2)cc1] | 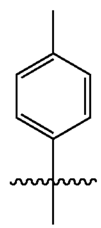 [SMILES: *c1ccc(C)cc1] | H | H | 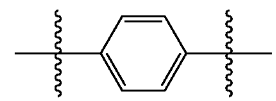 | 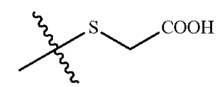 [SMILES: *SCC(=O)O] |

-continued
| | | | | | | |
|---|---|---|---|---|---|---|
| 80 | 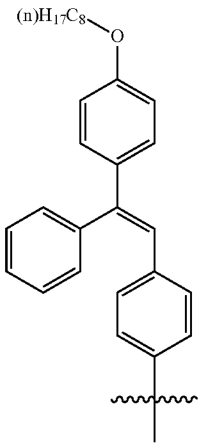 | 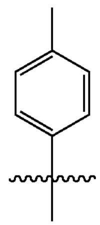 [SMILES: *c1ccc(C)cc1] | H | H | 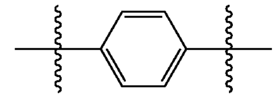 [SMILES: *c1ccc(*)cc1] | 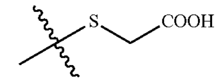 |
| 81 | 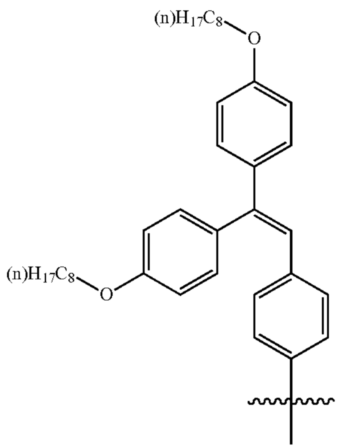 | 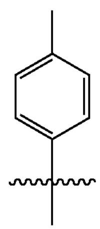 [SMILES: *c1ccc(C)cc1] | H | H | 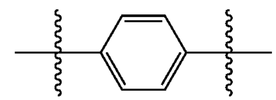 [SMILES: *c1ccc(*)cc1] | 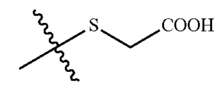 |

-continued
| | | | | | | |
|---|---|---|---|---|---|---|
| 82 | 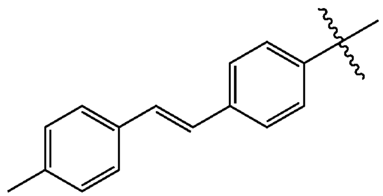 [SMILES: *c1ccc(/C=C/c2ccc(C)cc2)cc1] | 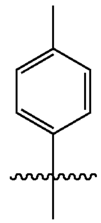 [SMILES: *c1ccc(C)cc1] | H | H | 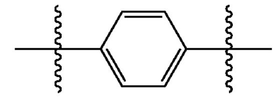 [SMILES: *c1ccc(*)cc1] | 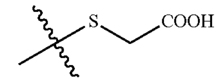 |
| 83 | 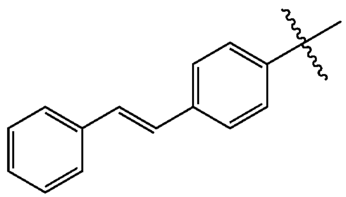 [SMILES: *c1ccc(/C=C/c2ccccc2)cc1] | 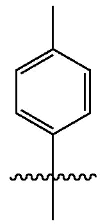 [SMILES: *c1ccc(C)cc1] | H | H | 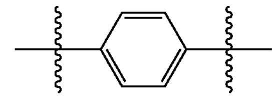 | 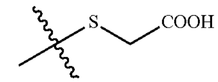 |
| 84 | 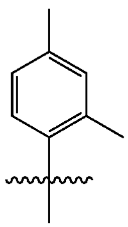 | 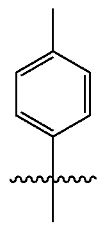 [SMILES: *c1ccc(C)cc1] | H | H | 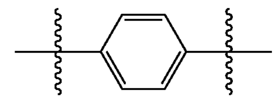 | 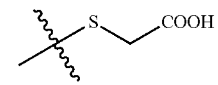 |
| 85 | 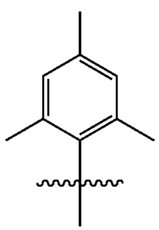 | 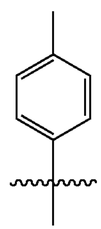 [SMILES: *c1ccc(C)cc1] | H | H | 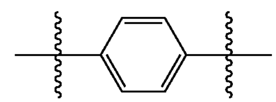 | 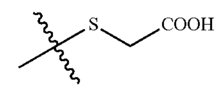 [SMILES: *SCC(=O)O] |

-continued
| | | | | | | |
|---|---|---|---|---|---|---|
| 86 | 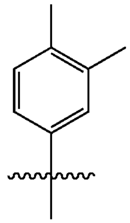 [SMILES: *c1ccc(C)c(C)c1] | 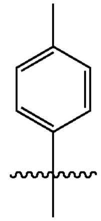 [SMILES: *c1ccc(C)cc1] | H | H | 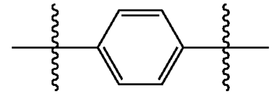 | 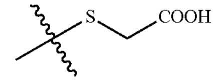 |
| 87 | 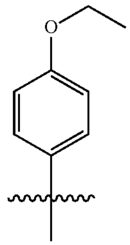 [SMILES: *c1ccc(OCC)cc1] | 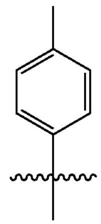 | H | H | 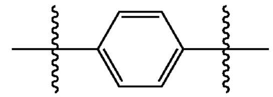 [SMILES: *c1ccc(*)cc1] | 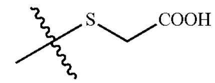 |
| 88 | 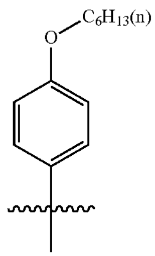 | 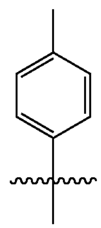 | H | H | 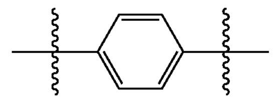 | 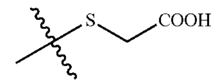 [SMILES: *SCC(=O)O] |
| 89 | 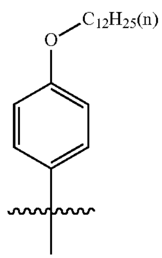 | 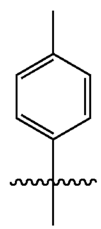 | H | H | 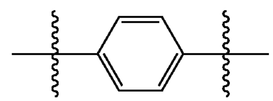 | 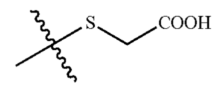 [SMILES: *SCC(=O)O] |

-continued
| | | | | | | |
|---|---|---|---|---|---|---|
| 90 | 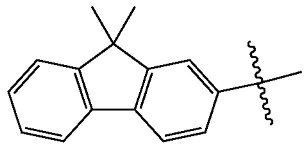 [SMILES: *c1ccc2c(c1)C(C)(C)c1ccccc1-2] | 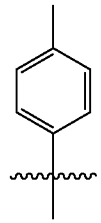 | H | H | 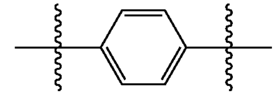 | 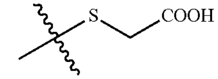 [SMILES: *SCC(=O)O]  |
| 91 | 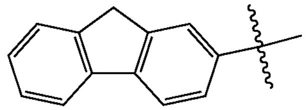 [SMILES: *c1ccc2c(c1)Cc1ccccc1-2] | 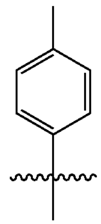 | H | H | 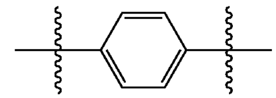 [SMILES: *c1ccc(*)cc1] | 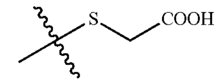  |
| 92 | 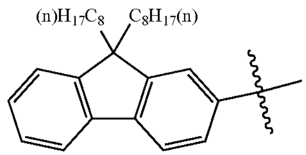  | 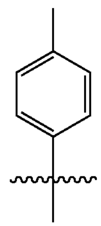 | H | H | 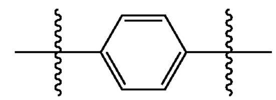 | 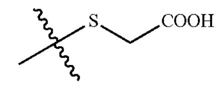  |
| 93 | 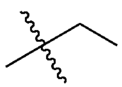 [SMILES: *CC] | 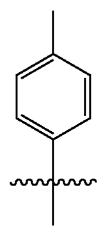 | H | H | 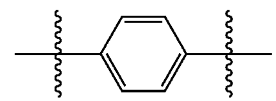 | 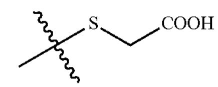 [SMILES: *SCC(=O)O]  |

-continued
| | | | | | | |
|---|---|---|---|---|---|---|
| 94 | 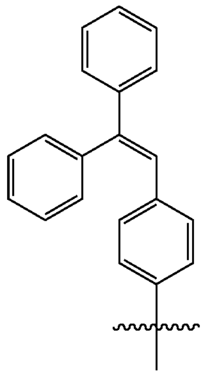 [SMILES: *c1ccc(C=C(c2ccccc2)c2ccccc2)cc1] | 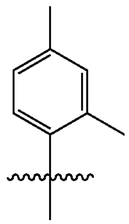 [SMILES: *c1ccc(C)cc1C] | H | H | 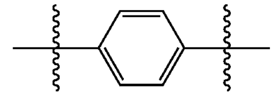 [SMILES: *c1ccc(*)cc1] | 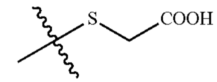 [SMILES: *SCC(=O)O] |
| 95 | 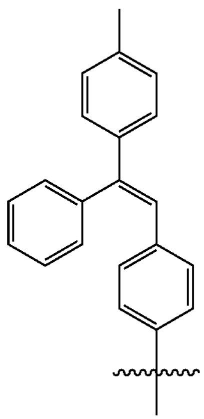 [SMILES: *c1ccc(/C=C(\c2ccccc2)c2ccc(C)cc2)cc1] | 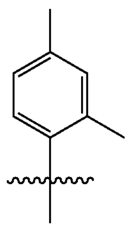 [SMILES: *c1ccc(C)cc1C] | H | H | 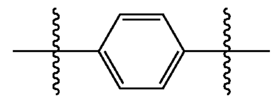 | 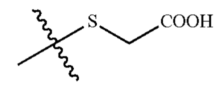 [SMILES: *SCC(=O)O] |

-continued
| | | | | | | |
|---|---|---|---|---|---|---|
| 96 | 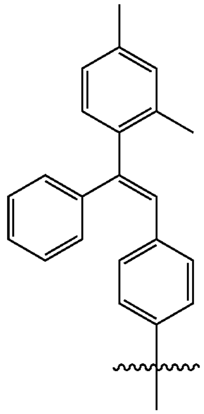 [SMILES: *c1ccc(/C=C(\c2ccccc2)c2ccc(C)cc2C)cc1] | 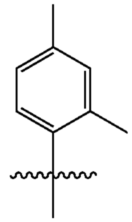 [SMILES: *c1ccc(C)cc1C] | H | H | 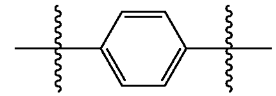 [SMILES: *c1ccc(*)cc1] | 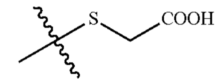 [SMILES: *SCC(=O)O] |
| 97 | 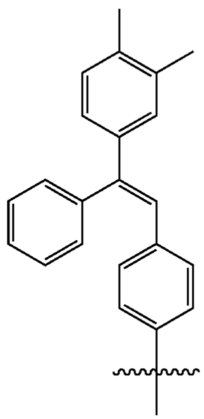 [SMILES: *c1ccc(/C=C(\c2ccccc2)c2ccc(C)c(C)c2)cc1] | 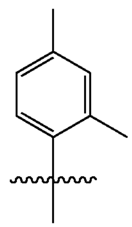 [SMILES: *c1ccc(C)cc1C] | H | H | 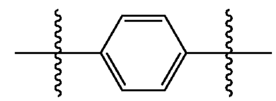 [SMILES: *c1ccc(*)cc1] | 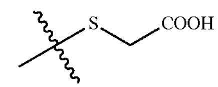 |

-continued
| | | | | | | |
|---|---|---|---|---|---|---|
| 98 | 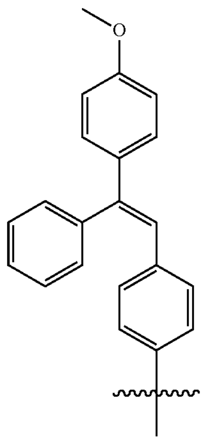 [SMILES: *c1ccc(/C=C(\c2ccccc2)c2ccc(OC)cc2)cc1] | 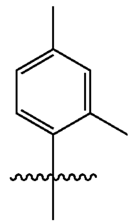 [SMILES: *c1ccc(C)cc1C] | H | H | 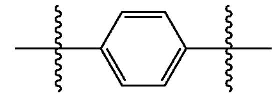 [SMILES: *c1ccc(*)cc1] | 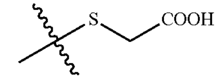 |
| 99 | 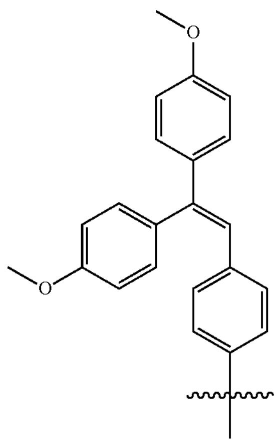 [SMILES: *c1ccc(C=C(c2ccc(OC)cc2)c2ccc(OC)cc2)cc1] | 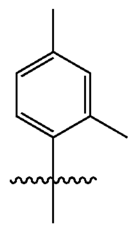 [SMILES: *c1ccc(C)cc1C] | H | H | 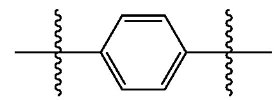 [SMILES: *c1ccc(*)cc1] | 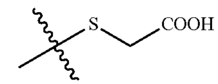 [SMILES: *SCC(=O)O] |

-continued
| | | | | | | |
|---|---|---|---|---|---|---|
| 100 | 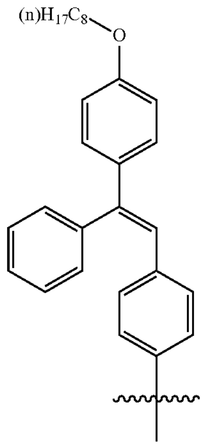 | 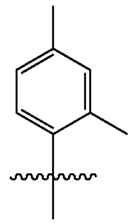 [SMILES: *c1ccc(C)cc1C] | H | H | 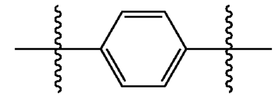 [SMILES: *c1ccc(*)cc1] | 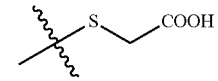 |
| 101 | 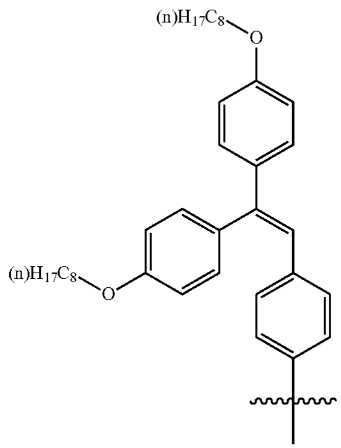 | 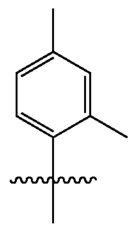 [SMILES: *c1ccc(C)cc1C] | H | H | 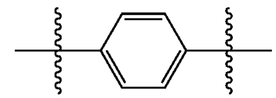 [SMILES: *c1ccc(*)cc1] | 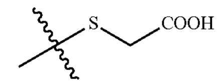 |

-continued
| | | | | | | |
|---|---|---|---|---|---|---|
| 102 | 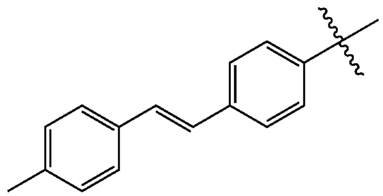 [SMILES: *c1ccc(/C=C/c2ccc(C)cc2)cc1] | 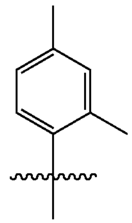 [SMILES: *c1ccc(C)cc1C] | H | H | 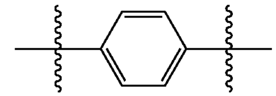 [SMILES: *c1ccc(*)cc1] | 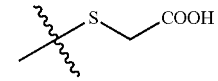 [SMILES: *SCC(=O)O] |
| 103 | 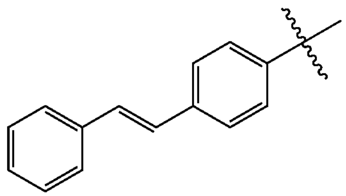 [SMILES: *c1ccc(/C=C/c2ccccc2)cc1] | 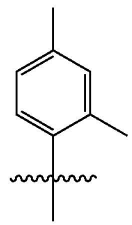 [SMILES: *c1ccc(C)cc1C] | H | H | 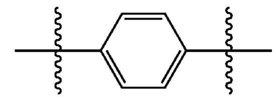 [SMILES: *c1ccc(*)cc1] | 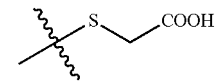 |
| 104 | 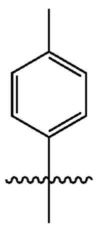 | 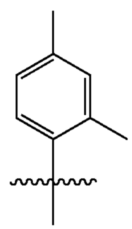 [SMILES: *c1ccc(C)cc1C] | H | H | 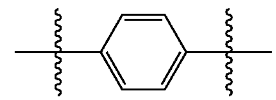 [SMILES: *c1ccc(*)cc1] | 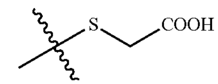 [SMILES: *SCC(=O)O] |
| 105 | 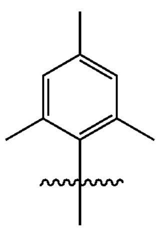 | 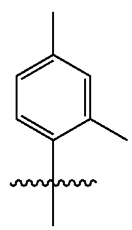 [SMILES: *c1ccc(C)cc1C] | H | H | 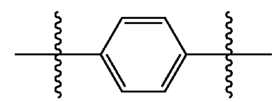 | 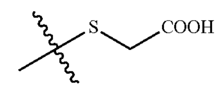 |

-continued
| | | | | | | |
|---|---|---|---|---|---|---|
| 106 | 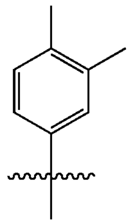 [SMILES: *c1ccc(C)c(C)c1] | 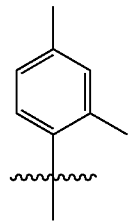 [SMILES: *c1ccc(C)cc1C] | H | H | 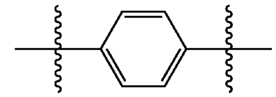 [SMILES: *c1ccc(*)cc1] | 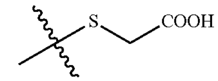 |
| 107 | 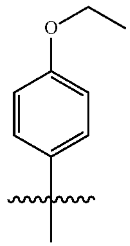 [SMILES: *c1ccc(OCC)cc1] | 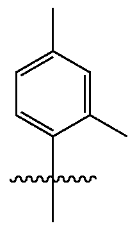 [SMILES: *c1ccc(C)cc1C] | H | H | 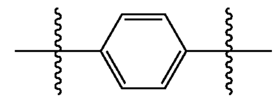 | 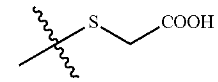 |
| 108 | 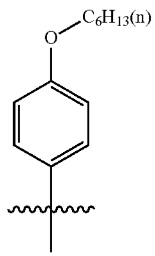 | 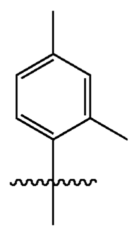 [SMILES: *c1ccc(C)cc1C] | H | H | 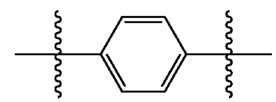 | 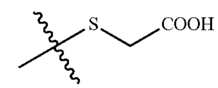 [SMILES: *SCC(=O)O] |
| 109 | 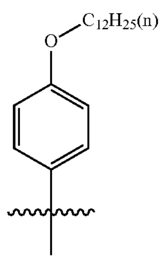 | 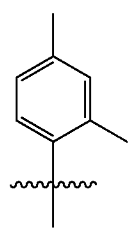 [SMILES: *c1ccc(C)cc1C] | H | H | 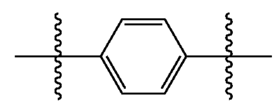 | 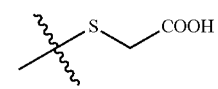 |

-continued
| | | | | | | |
|---|---|---|---|---|---|---|
| 110 | 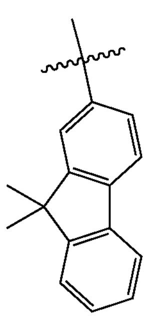 | 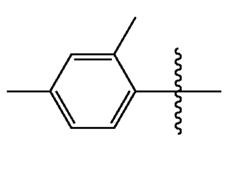 | H | H | 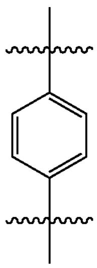 | 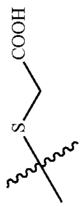 |
| 111 | 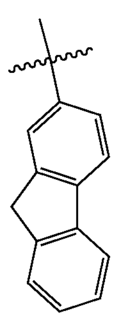 | 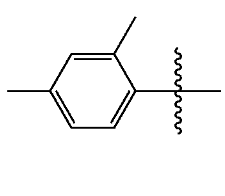 | H | H | 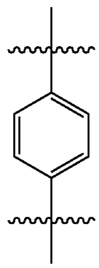 | 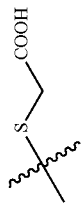 |
| 112 | 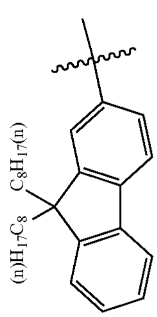 | 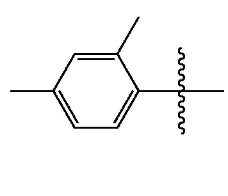 | H | H | 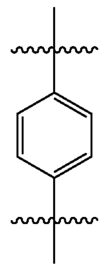 | 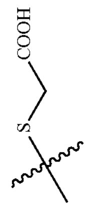 |
| 113 | 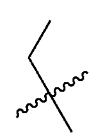 | 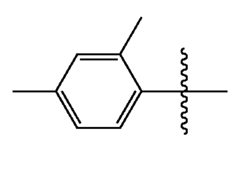 | H | H | 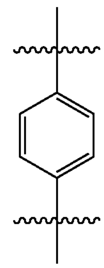 | 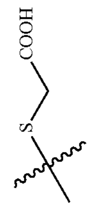 |

-continued
| | | | | | | |
|---|---|---|---|---|---|---|
| 114 | 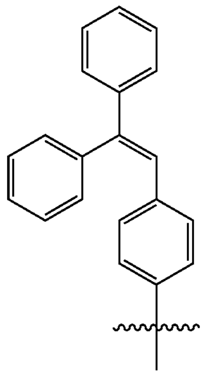 [SMILES: *c1ccc(C=C(c2ccccc2)c2ccccc2)cc1] | 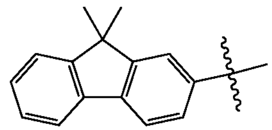 [SMILES: *c1ccc2c(c1)C(C)(C)c1ccccc1-2] | H | H | 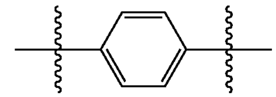 | 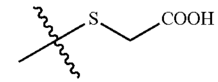 |
| 115 | 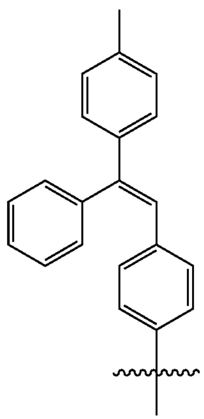 [SMILES: *c1ccc(/C=C(\c2ccccc2)c2ccc(C)cc2)cc1] | 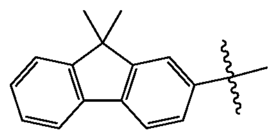 [SMILES: *c1ccc2c(c1)C(C)(C)c1ccccc1-2] | H | H | 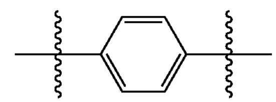 | 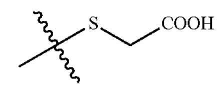 [SMILES: *SCC(=O)O] |

-continued
| | | | | | | |
|---|---|---|---|---|---|---|
| 116 | 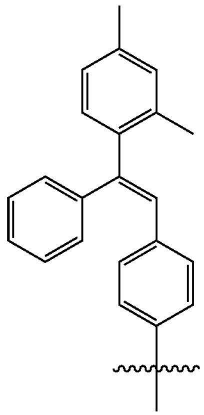 [SMILES: *c1ccc(/C=C(\c2ccccc2)c2ccc(C)cc2C)cc1] | 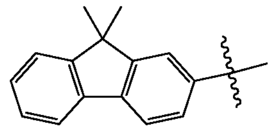 [SMILES: *c1ccc2c(c1)C(C)(C)c1ccccc1-2] | H | H | 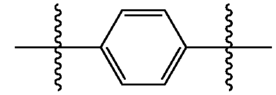 [SMILES: *c1ccc(*)cc1] | 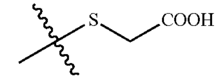 [SMILES: *SCC(=O)O] |
| 117 | 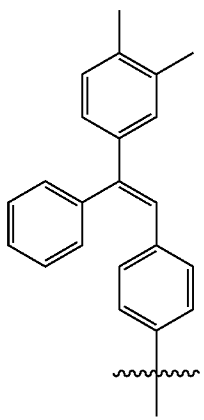 [SMILES: *c1ccc(/C=C(\c2ccccc2)c2ccc(C)c(C)c2)cc1] | 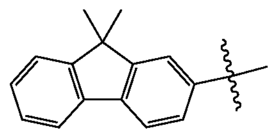 [SMILES: *c1ccc2c(c1)C(C)(C)c1ccccc1-2] | H | H | 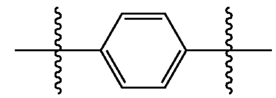 [SMILES: *c1ccc(*)cc1] | 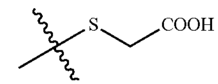 |

-continued
| | | | | | | |
|---|---|---|---|---|---|---|
| 118 | 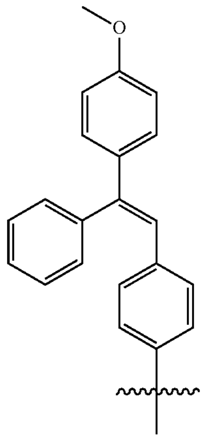 [SMILES: *c1ccc(/C=C(\c2ccccc2)c2ccc(OC)cc2)cc1] | 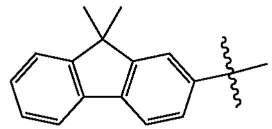 [SMILES: *c1ccc2c(c1)C(C)(C)c1ccccc1-2] | H | H | 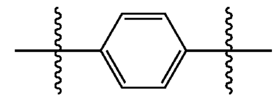 | 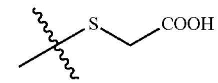 [SMILES: *SCC(=O)O] |
| 119 | 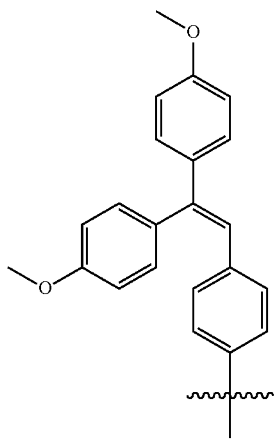 [SMILES: *c1ccc(C=C(c2ccc(OC)cc2)c2ccc(OC)cc2)cc1] | 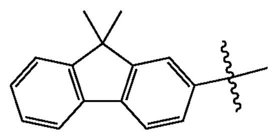 [SMILES: *c1ccc2c(c1)C(C)(C)c1ccccc1-2] | H | H | 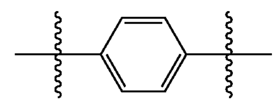 [SMILES: *c1ccc(*)cc1] | 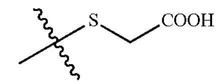 [SMILES: *SCC(=O)O] |

-continued
| | | | | | | |
|---|---|---|---|---|---|---|
| 120 | 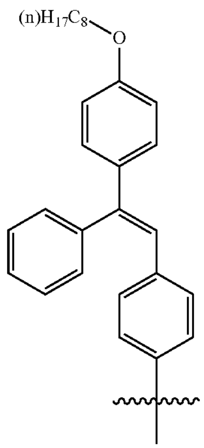 | 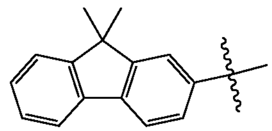 [SMILES: *c1ccc2c(c1)C(C)(C)c1ccccc1-2] | H | H | 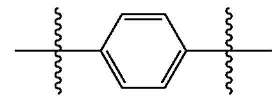 [SMILES: *c1ccc(*)cc1] | 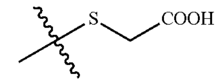 [SMILES: *SCC(=O)O] |
| 121 | 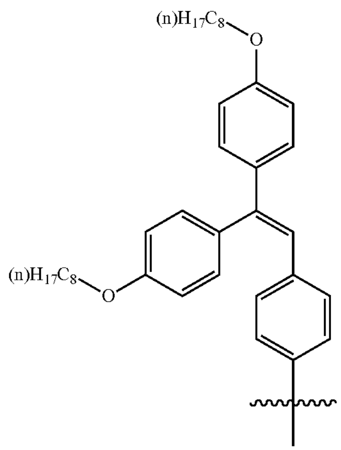 | 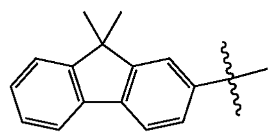 [SMILES: *c1ccc2c(c1)C(C)(C)c1ccccc1-2] | H | H | 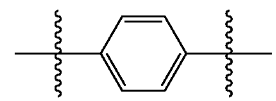 | 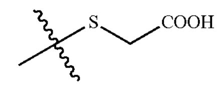 |
| 122 | 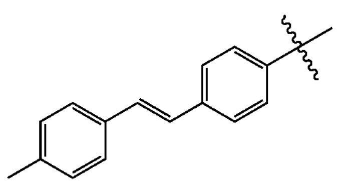 [SMILES: *c1ccc(/C=C/c2ccc(C)cc2)cc1] | 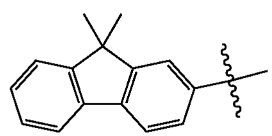 [SMILES: *c1ccc2c(c1)C(C)(C)c1ccccc1-2] | H | H | 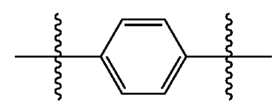 | 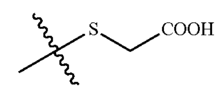 |

-continued
| | | | | | | |
|---|---|---|---|---|---|---|
| 123 | 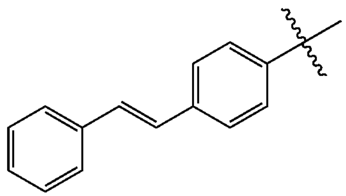 [SMILES: *c1ccc(/C=C/c2ccccc2)cc1] | 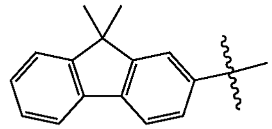 [SMILES: *c1ccc2c(c1)C(C)(C)c1ccccc1-2] | H | H | 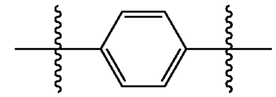 [SMILES: *c1ccc(*)cc1] | 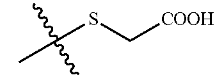 |
| 124 | 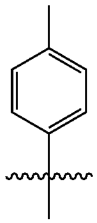 [SMILES: *c1ccc(C)cc1] | 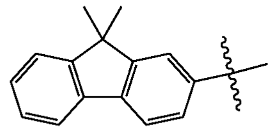 [SMILES: *c1ccc2c(c1)C(C)(C)c1ccccc1-2] | H | H | 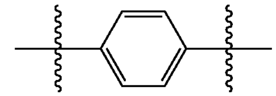 | 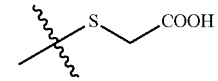 [SMILES: *SCC(=O)O] |
| 125 | 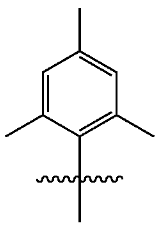 | 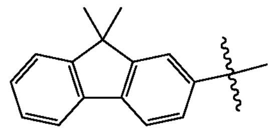 [SMILES: *c1ccc2c(c1)C(C)(C)c1ccccc1-2] | H | H | 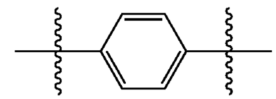 | 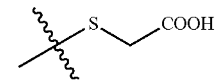 [SMILES: *SCC(=O)O] |
| 126 | 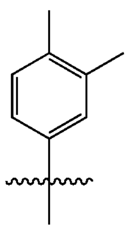 | 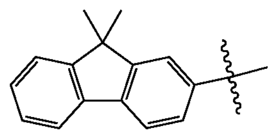 [SMILES: *c1ccc2c(c1)C(C)(C)c1ccccc1-2] | H | H | 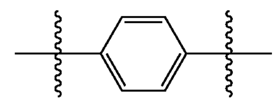 | 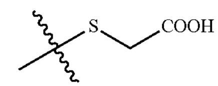 [SMILES: *SCC(=O)O] |

-continued
| | | | | | |
|---|---|---|---|---|---|
| 127 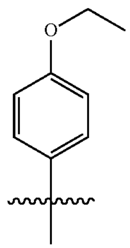 | 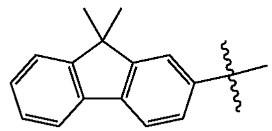 [SMILES: *c1ccc2c(c1)C(C)(C)c1ccccc1-2] | H | H | 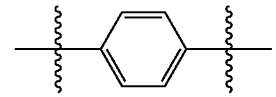 [SMILES: *c1ccc(*)cc1] | 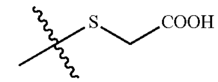 [SMILES: *SCC(=O)O] |
| 128 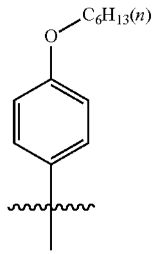 | 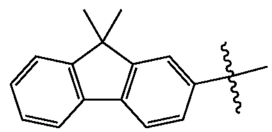 [SMILES: *c1ccc2c(c1)C(C)(C)c1ccccc1-2] | H | H | 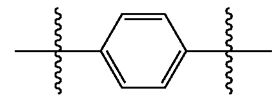 [SMILES: *c1ccc(*)cc1] | 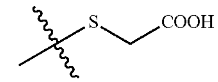 |
| 129 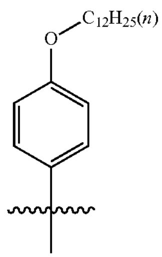 | 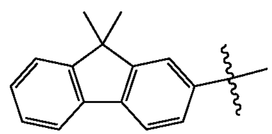 [SMILES: *c1ccc2c(c1)C(C)(C)c1ccccc1-2] | H | H | 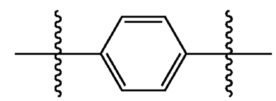 | 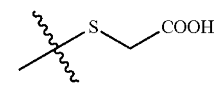 |
| 130 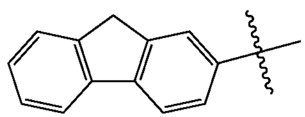 [SMILES: *c1ccc2c(c1)Cc1ccccc1-2] | 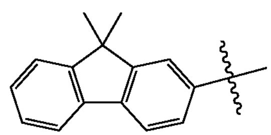 [SMILES: *c1ccc2c(c1)C(C)(C)c1ccccc1-2] | H | H | 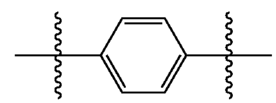 | 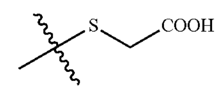 |
| 131 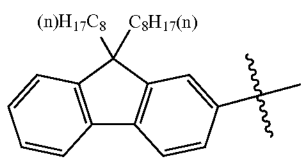 | 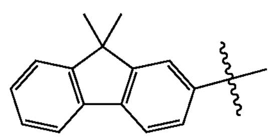 | H | H | 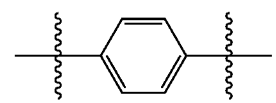 | 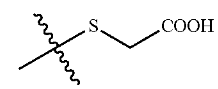 |

-continued
| | | | | | | |
|---|---|---|---|---|---|---|
| 132 | 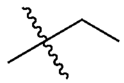 [SMILES: *CC] | 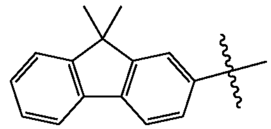 [SMILES: *c1ccc2c(c1)C(C)(C)c1ccccc1-2] | H | H | 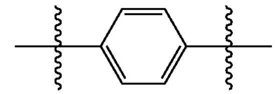 [SMILES: *c1ccc(*)cc1] | 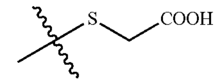 [SMILES: *SCC(=O)O] |
| 133 | 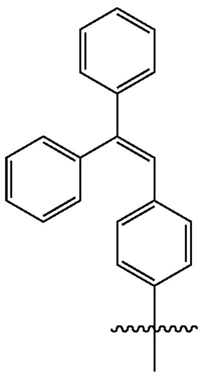 [SMILES: *c1ccc(C=C(c2ccccc2)c2ccccc2)cc1] | 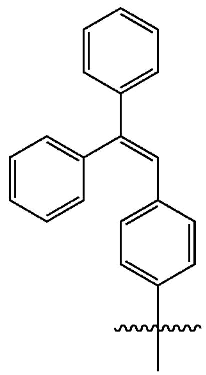 [SMILES: *c1ccc(C=C(c2ccccc2)c2ccccc2)cc1] | H | H | 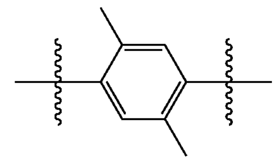 [SMILES: *c1cc(C)c(*)cc1C] | 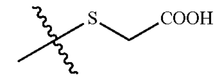 [SMILES: *SCC(=O)O] |
| 134 | 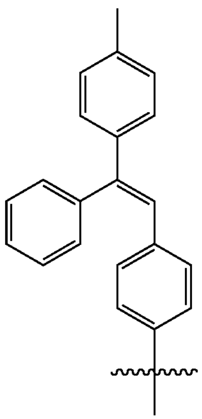 | 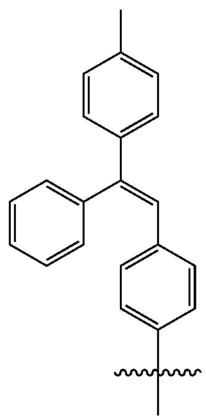 | H | H | 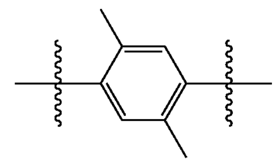 [SMILES: *c1cc(C)c(*)cc1C] | 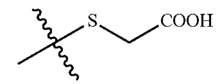 |

-continued
| | | | | | | |
|---|---|---|---|---|---|---|
| 135 | 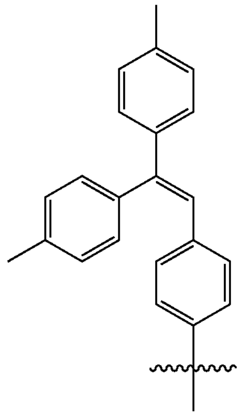 [SMILES: *c1ccc(C=C(c2ccc(C)cc2)c2ccc(C)cc2)cc1] | 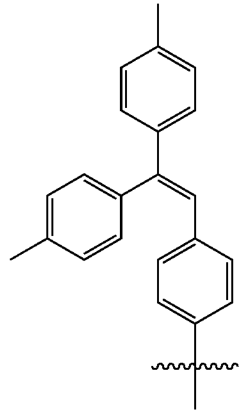 [SMILES: *c1ccc(C=C(c2ccc(C)cc2)c2ccc(C)cc2)cc1] | H | H | 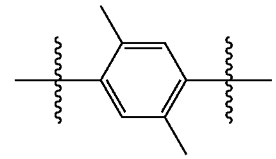 [SMILES: *c1cc(C)c(*)cc1C] | 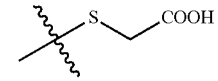 |
| 136 | 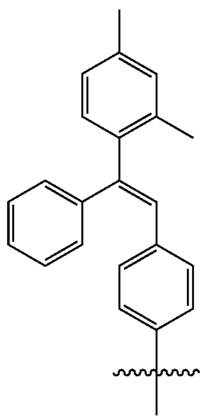 [SMILES: *c1ccc(/C=C(\c2ccccc2)c2ccc(C)cc2C)cc1] | 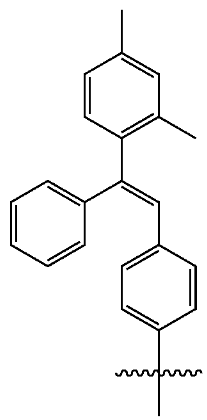 | H | H | 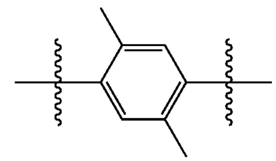 [SMILES: *c1cc(C)c(*)cc1C] | 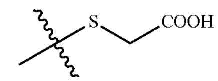 |

-continued
| | | | | | |
|---|---|---|---|---|---|
| 137 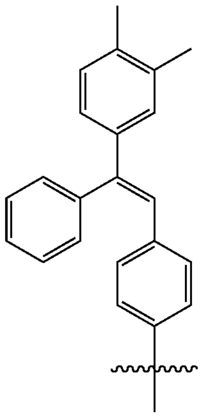 | 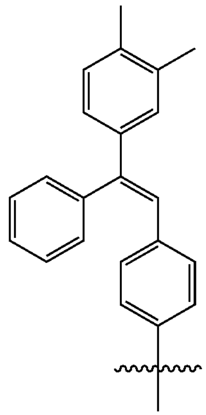 [SMILES: *c1ccc(/C=C(\c2ccccc2)c2ccc(C)c(C)c2)cc1] | H | H | 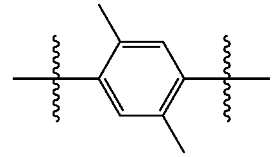 [SMILES: *c1cc(C)c(*)cc1C] | 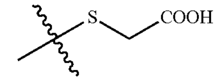 [SMILES: *SCC(=O)O]  |
| 138 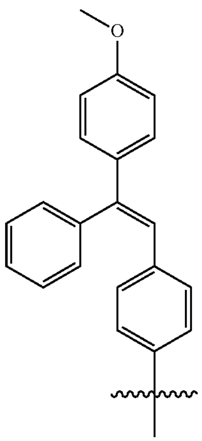 [SMILES: *c1ccc(/C=C(\c2ccccc2)c2ccc(OC)cc2)cc1]  | 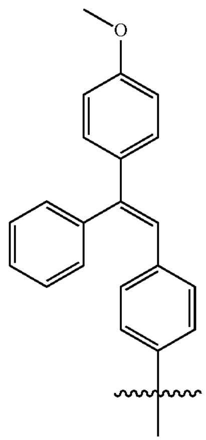 [SMILES: *c1ccc(/C=C(\c2ccccc2)c2ccc(OC)cc2)cc1]  | H | H | 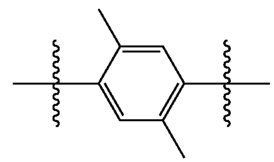 [SMILES: *c1cc(C)c(*)cc1C] | 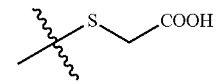 [SMILES: *SCC(=O)O]  |

-continued
| | | | | | | |
|---|---|---|---|---|---|---|
| 139 | 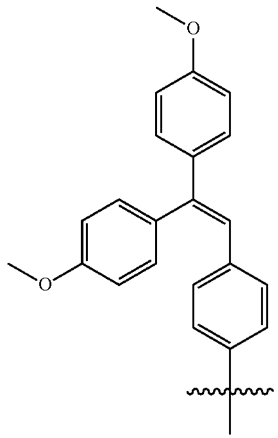 [SMILES: *c1ccc(C=C(c2ccc(OC)cc2)c2ccc(OC)cc2)cc1] | 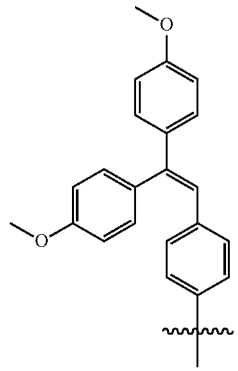 [SMILES: *c1ccc(C=C(c2ccc(OC)cc2)c2ccc(OC)cc2)cc1] | H | H | 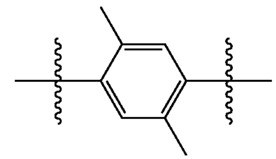 [SMILES: *c1cc(C)c(*)cc1C] | 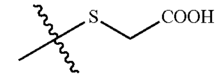 |
| 140 | 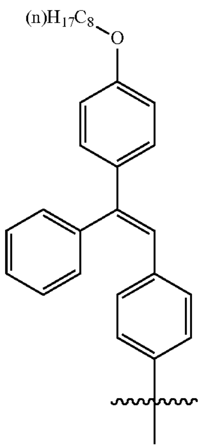 | 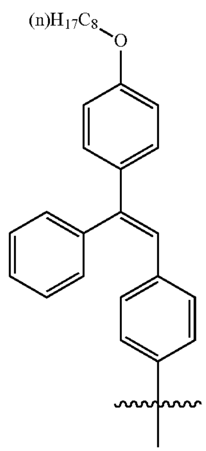 | H | H | 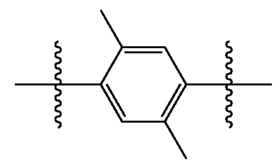 [SMILES: *c1cc(C)c(*)cc1C] | 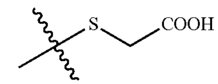 |

-continued
| | | | | | | |
|---|---|---|---|---|---|---|
| 141 | 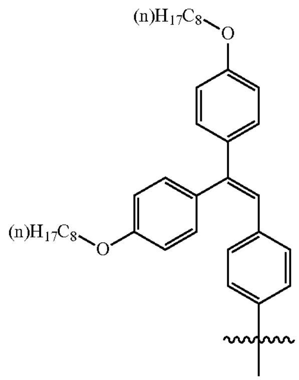 | 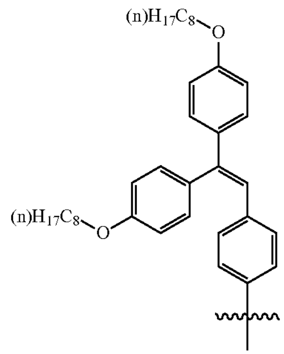 | H | H | 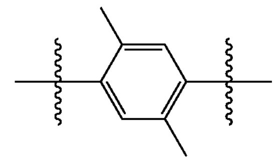 [SMILES: *c1cc(C)c(*)cc1C] | 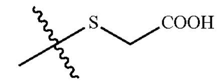 |
| 142 | 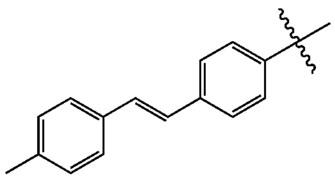 [SMILES: *c1ccc(/C=C/c2ccc(C)cc2)cc1] | 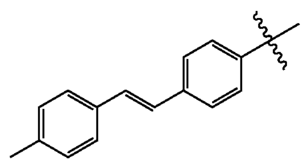 [SMILES: *c1ccc(/C=C/c2ccc(C)cc2)cc1] | H | H | 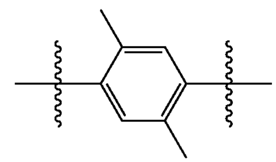 [SMILES: *c1cc(C)c(*)cc1C] | 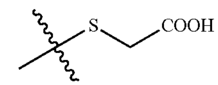 |
| 143 | 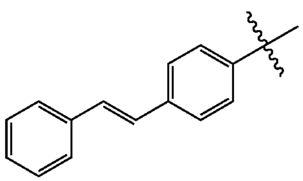 [SMILES: *c1ccc(/C=C/c2ccccc2)cc1] | 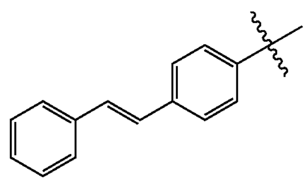 [SMILES: *c1ccc(/C=C/c2ccccc2)cc1] | H | H | 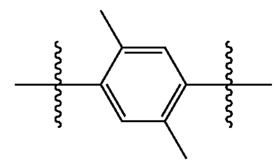 [SMILES: *c1cc(C)c(*)cc1C] | 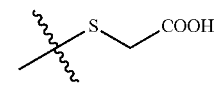 |
| 144 | 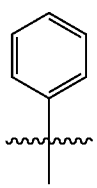 [SMILES: *c1ccccc1] | 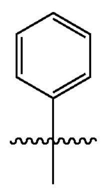 [SMILES: *c1ccccc1] | H | H | 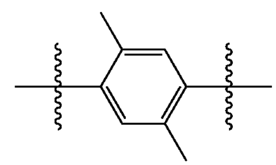 [SMILES: *c1cc(C)c(*)cc1C] | 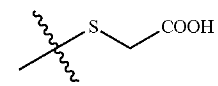 |

-continued
| | | | | | | |
|---|---|---|---|---|---|---|
| 145 | 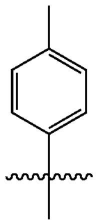 | 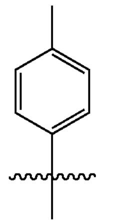 | H | H | 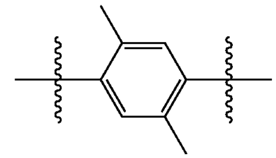 [SMILES: *c1cc(C)c(*)cc1C] | 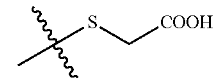 |
| 146 | 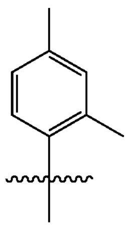 [SMILES: *c1ccc(C)cc1C] | 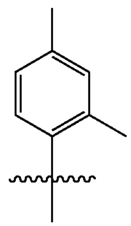 [SMILES: *c1ccc(C)cc1C] | H | H | 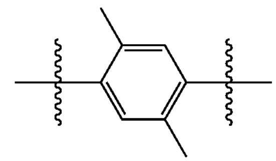 [SMILES: *c1cc(C)c(*)cc1C] | 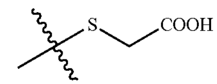 [SMILES: *SCC(=O)O] |
| 147 | 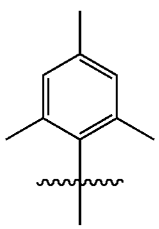 | 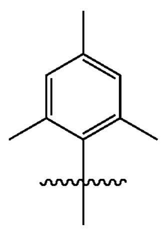 | H | H | 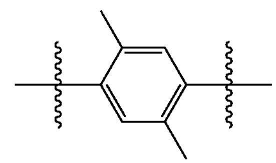 [SMILES: *c1cc(C)c(*)cc1C] | 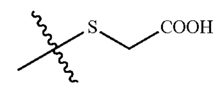 |
| 148 | 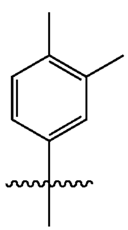 | 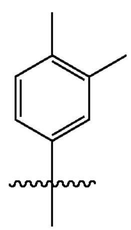 [SMILES: *c1ccc(C)c(C)c1] | H | H | 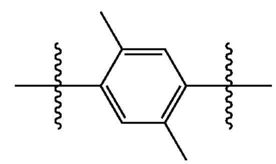 [SMILES: *c1cc(C)c(*)cc1C] | 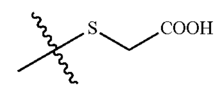 |

-continued
| | | | | | | |
|---|---|---|---|---|---|---|
| 149 | 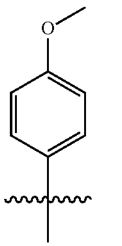 [SMILES: *c1ccc(OC)cc1] | 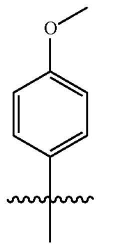 [SMILES: *c1ccc(OC)cc1] | H | H | 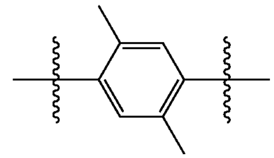 [SMILES: *c1cc(C)c(*)cc1C] | 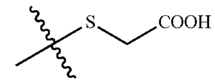 |
| 150 | 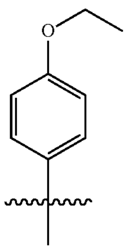 [SMILES: *c1ccc(OCC)cc1] | 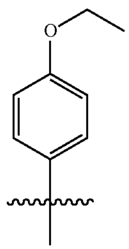 [SMILES: *c1ccc(OCC)cc1] | H | H | 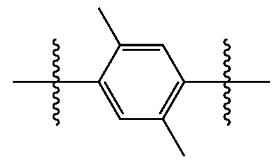 [SMILES: *c1cc(C)c(*)cc1C] | 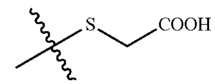 |
| 151 | 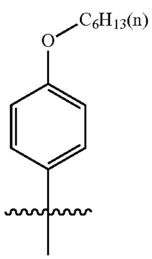 | 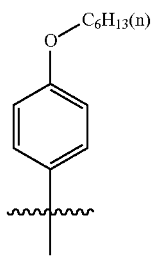 | H | H | 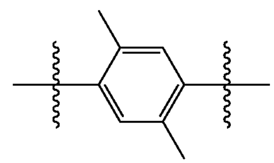 [SMILES: *c1cc(C)c(*)cc1C] | 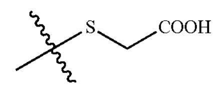 [SMILES: *SCC(=O)O] |
| 152 | 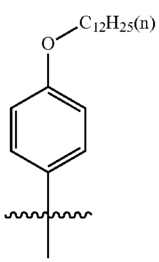 | 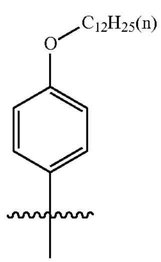 | H | H | 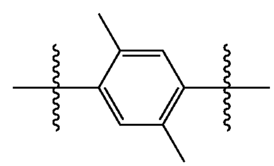 [SMILES: *c1cc(C)c(*)cc1C] | 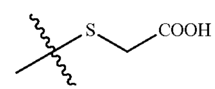 |

-continued
| | | | | | | |
|---|---|---|---|---|---|---|
| 153 | 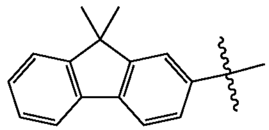 [SMILES: *c1ccc2c(c1)C(C)(C)c1ccccc1-2] | 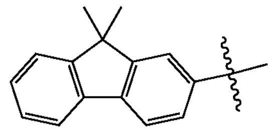 [SMILES: *c1ccc2c(c1)C(C)(C)c1ccccc1-2] | H | H | 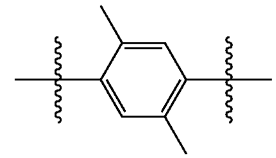 [SMILES: *c1cc(C)c(*)cc1C] | 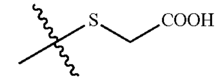 |
| 154 | 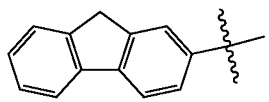 | 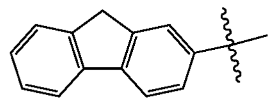 [SMILES: *c1ccc2c(c1)Cc1ccccc1-2] | H | H | 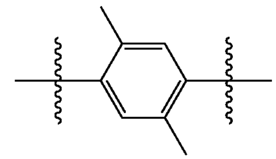 [SMILES: *c1cc(C)c(*)cc1C] | 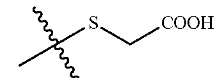 |
| 155 | 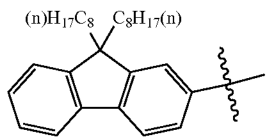 | 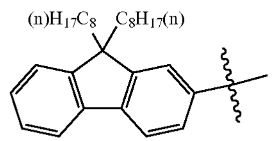 | H | H | 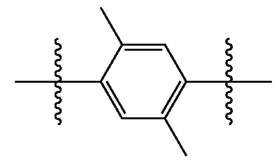 [SMILES: *c1cc(C)c(*)cc1C] | 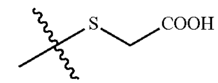 |
| 156 | 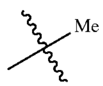 | 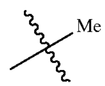 | H | H | 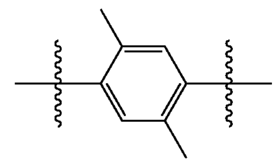 [SMILES: *c1cc(C)c(*)cc1C] | 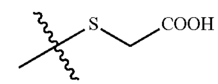 |
| 157 | 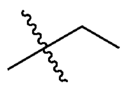 [SMILES: *CC] | 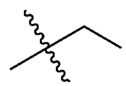 [SMILES: *CC] | H | H | 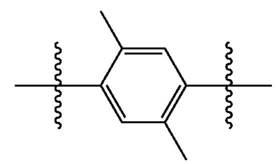 [SMILES: *c1cc(C)c(*)cc1C] | 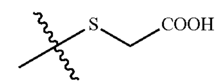 [SMILES: *SCC(=O)O] |
| 158 | 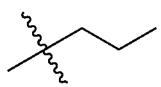 [SMILES: *CCC] | 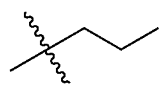 [SMILES: *CCC] | H | H | 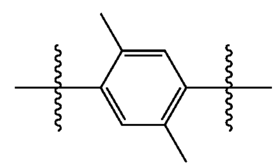 [SMILES: *c1cc(C)c(*)cc1C] | 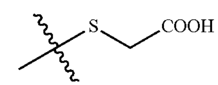 [SMILES: *SCC(=O)O] |

-continued
| | | | | | | |
|---|---|---|---|---|---|---|
| 159 | 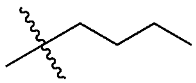 [SMILES: *CCCC] | 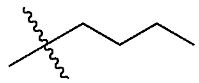 [SMILES: *CCCC] | H | H | 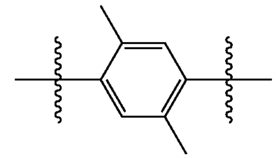 | 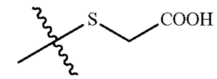 |
| 160 | 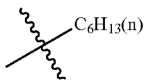 | 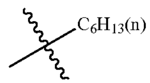 | H | H | 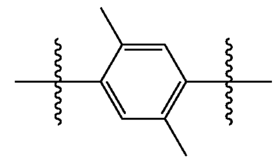 [SMILES: *c1cc(C)c(*)cc1C] | 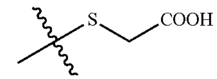 |
| 161 | 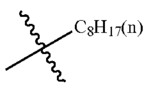 | 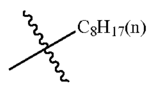 | H | H | 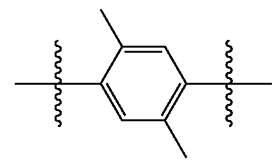 [SMILES: *c1cc(C)c(*)cc1C] | 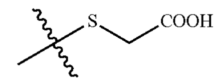 |
| 162 | 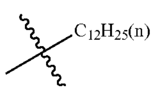 | 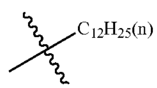 | H | H | 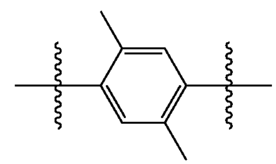 [SMILES: *c1cc(C)c(*)cc1C] | 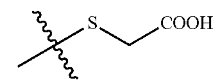 |
| 163 | 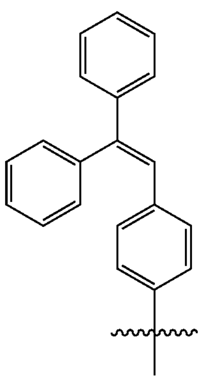 [SMILES: *c1ccc(C=C(c2ccccc2)c2ccccc2)cc1] | 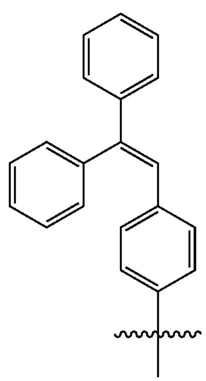 [SMILES: *c1ccc(C=C(c2ccccc2)c2ccccc2)cc1] | H | H | 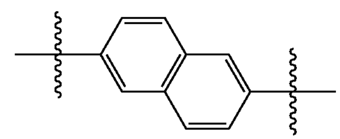 [SMILES: *c1ccc2cc(*)ccc2c1] | 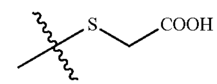 |

-continued
| | | | | | | |
|---|---|---|---|---|---|---|
| 164 | 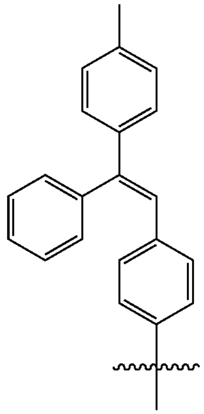 [SMILES: *c1ccc(/C=C(\c2ccccc2)c2ccc(C)cc2)cc1] | 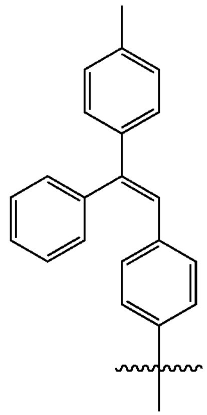 [SMILES: *c1ccc(/C=C(\c2ccccc2)c2ccc(C)cc2)cc1] | H | H | 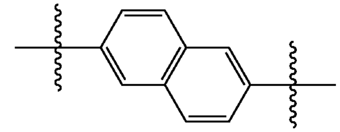 [SMILES: *c1ccc2cc(*)ccc2c1] | 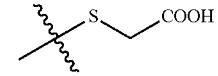 [SMILES: *SCC(=O)O] |
| 165 | 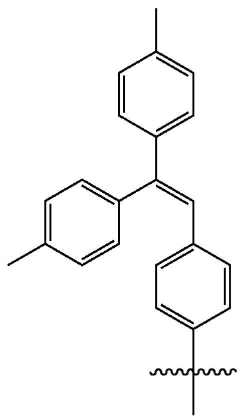 | 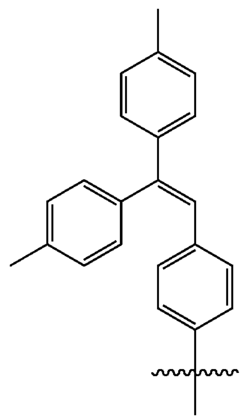 [SMILES: *c1ccc(C=C(c2ccc(C)cc2)c2ccc(C)cc2)cc1] | H | H | 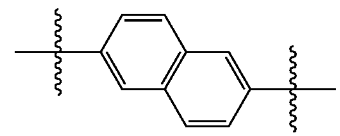 [SMILES: *c1ccc2cc(*)ccc2c1] | 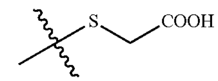 |

-continued
| | | | | | | |
|---|---|---|---|---|---|---|
| 166 | 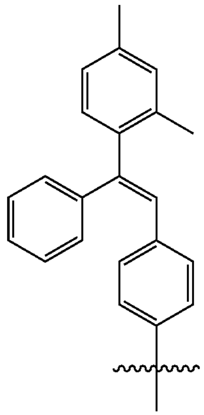 [SMILES: *c1ccc(/C=C(\c2ccccc2)c2ccc(C)cc2C)cc1] | 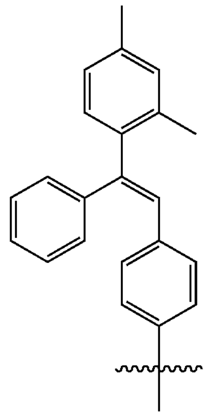 [SMILES: *c1ccc(/C=C(\c2ccccc2)c2ccc(C)cc2C)cc1] | H | H | 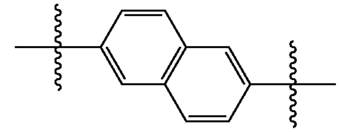 [SMILES: *c1ccc2cc(*)ccc2c1] | 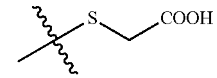 |
| 167 | 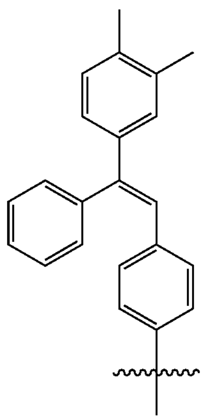 [SMILES: *c1ccc(/C=C(\c2ccccc2)c2ccc(C)c(C)c2)cc1] | 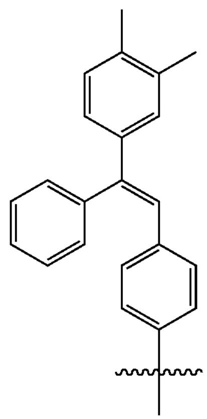 [SMILES: *c1ccc(/C=C(\c2ccccc2)c2ccc(C)c(C)c2)cc1] | H | H | 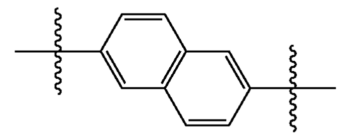 [SMILES: *c1ccc2cc(*)ccc2c1] | 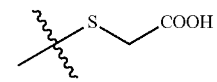 [SMILES: *SCC(=O)O] |

-continued
| | | | | | | |
|---|---|---|---|---|---|---|
| 168 | 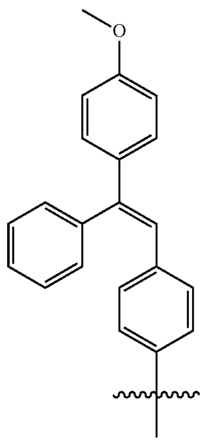 [SMILES: *c1ccc(/C=C(\c2ccccc2)c2ccc(OC)cc2)cc1] | 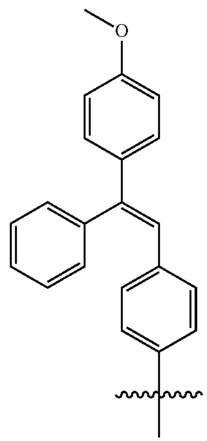 [SMILES: *c1ccc(/C=C(\c2ccccc2)c2ccc(OC)cc2)cc1] | H | H | 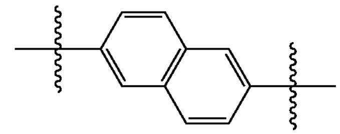 [SMILES: *c1ccc2cc(*)ccc2c1] | 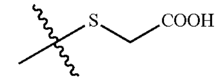 |
| 169 | 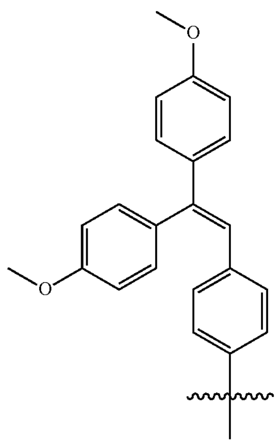 [SMILES: *c1ccc(C=C(c2ccc(OC)cc2)c2ccc(OC)cc2)cc1] | 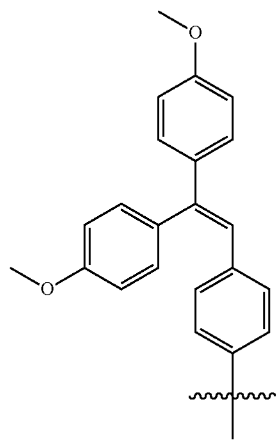 [SMILES: *c1ccc(C=C(c2ccc(OC)cc2)c2ccc(OC)cc2)cc1] | H | H | 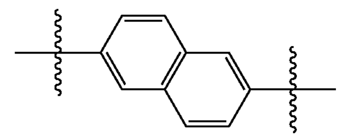 [SMILES: *c1ccc2cc(*)ccc2c1] | 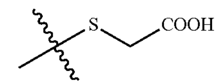 [SMILES: *SCC(=O)O] |

-continued
| | | | | | | |
|---|---|---|---|---|---|---|
| 170 | 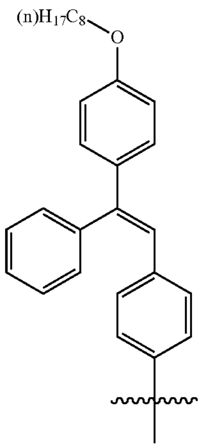 | 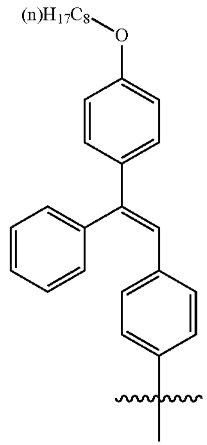 | H | H | 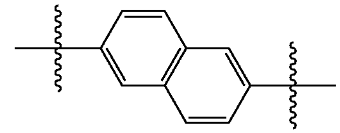 [SMILES: *c1ccc2cc(*)ccc2c1] | 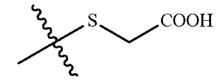 [SMILES: *SCC(=O)O] |
| 171 | 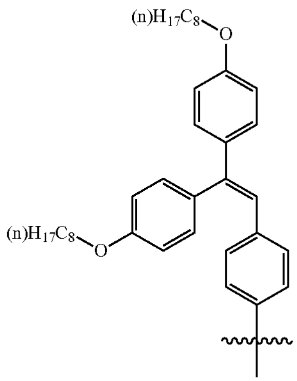 | 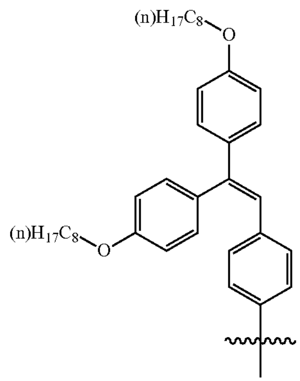 | H | H | 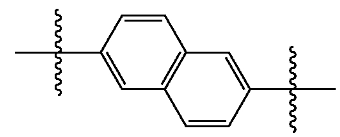 [SMILES: *c1ccc2cc(*)ccc2c1] | 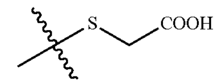 [SMILES: *SCC(=O)O] |
| 172 | 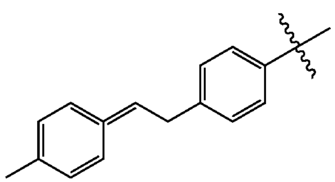 | 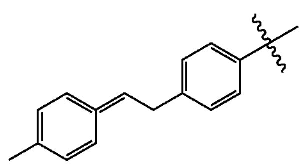 | H | H | 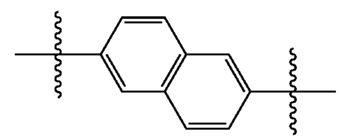 [SMILES: *c1ccc2cc(*)ccc2c1] | 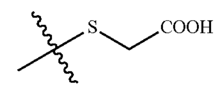 |

-continued
| | | | | | | |
|---|---|---|---|---|---|---|
| 173 | 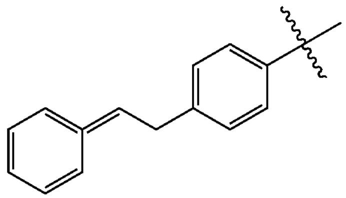 | 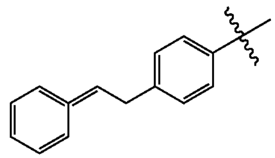 | H | H | 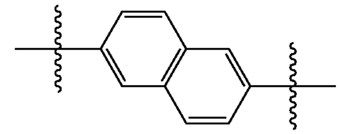 [SMILES: *c1ccc2cc(*)ccc2c1] | 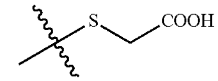 [SMILES: *SCC(=O)O] |
| 174 | 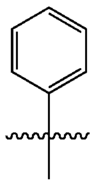 [SMILES: *c1ccccc1] | 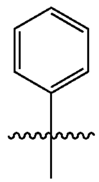 [SMILES: *c1ccccc1] | H | H | 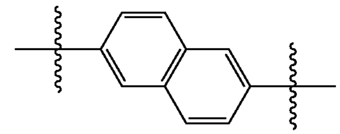 [SMILES: *c1ccc2cc(*)ccc2c1] | 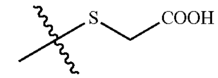 |
| 175 | 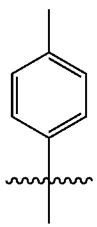 [SMILES: *c1ccc(C)cc1] | 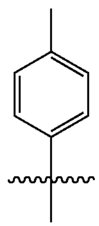 | H | H | 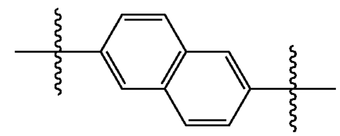 [SMILES: *c1ccc2cc(*)ccc2c1] | 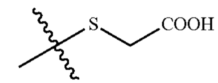 [SMILES: *SCC(=O)O] |
| 176 | 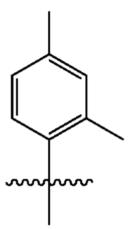 | 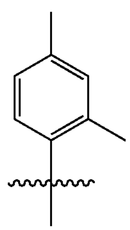 [SMILES: *c1ccc(C)cc1C] | H | H | 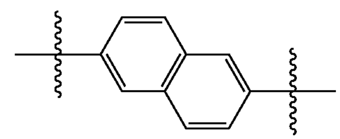 [SMILES: *c1ccc2cc(*)ccc2c1] | 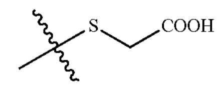 [SMILES: *SCC(=O)O] |
| 177 | 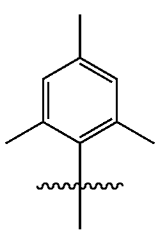 | 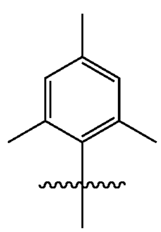 | H | H | 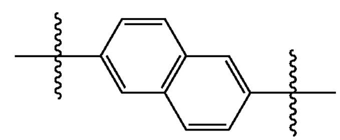 [SMILES: *c1ccc2cc(*)ccc2c1] | 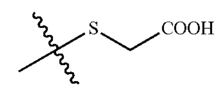 |

-continued
| | | | | | | |
|---|---|---|---|---|---|---|
| 178 | 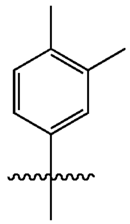 | 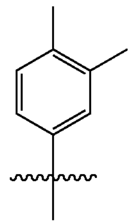 [SMILES: *c1ccc(C)c(C)c1] | H | H | 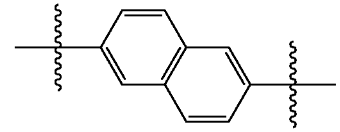 [SMILES: *c1ccc2cc(*)ccc2c1] | 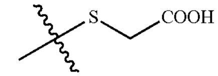 |
| 179 | 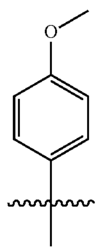 [SMILES: *c1ccc(OC)cc1] | 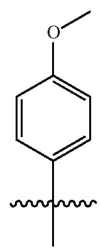 | H | H | 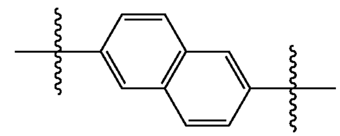 [SMILES: *c1ccc2cc(*)ccc2c1] | 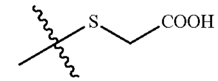 |
| 180 | 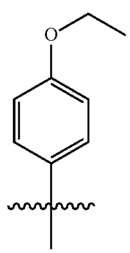 [SMILES: *c1ccc(OCC)cc1] | 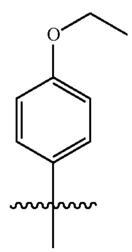 [SMILES: *c1ccc(OCC)cc1] | H | H | 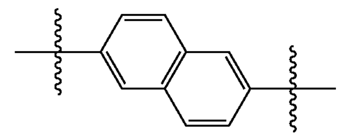 [SMILES: *c1ccc2cc(*)ccc2c1] | 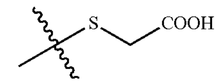 [SMILES: *SCC(=O)O] |
| 181 | 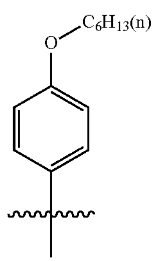 | 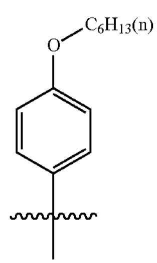 | H | H | 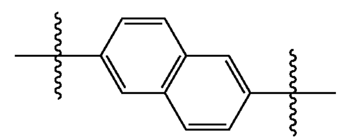 [SMILES: *c1ccc2cc(*)ccc2c1] | 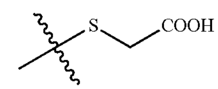 |

-continued
| | | | | | | |
|---|---|---|---|---|---|---|
| 182 | 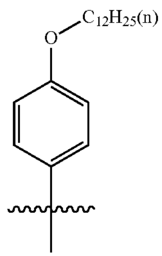 | 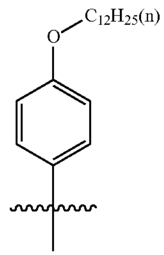 | H | H | 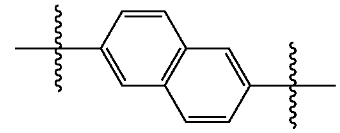 [SMILES: *c1ccc2cc(*)ccc2c1] | 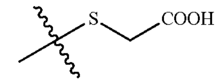 [SMILES: *SCC(=O)O] |
| 183 | 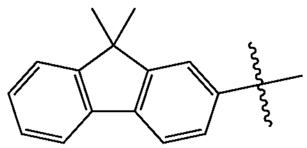 | 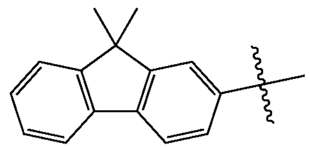 [SMILES: *c1ccc2c(c1)C(C)(C)c1ccccc1-2] | H | H | 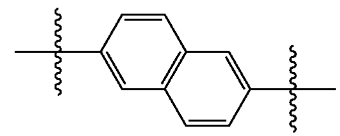 [SMILES: *c1ccc2cc(*)ccc2c1] | 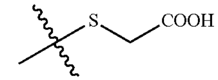 |
| 184 | 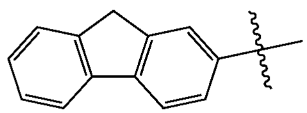 [SMILES: *c1ccc2c(c1)Cc1ccccc1-2] | 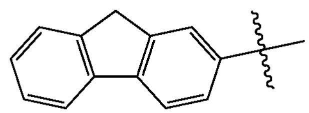 [SMILES: *c1ccc2c(c1)Cc1ccccc1-2] | H | H | 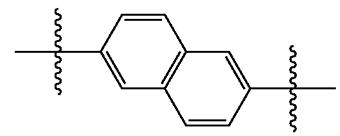 [SMILES: *c1ccc2cc(*)ccc2c1] | 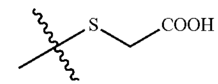 |
| 185 | 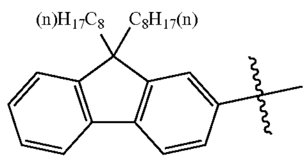 | 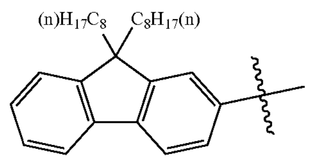 | H | H | 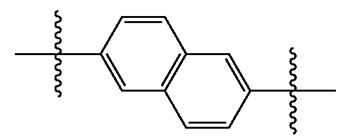 [SMILES: *c1ccc2cc(*)ccc2c1] | 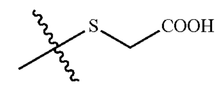 [SMILES: *SCC(=O)O] |
| 186 | 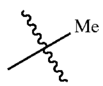 | 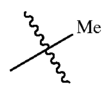 | H | H | 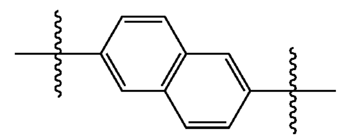 [SMILES: *c1ccc2cc(*)ccc2c1] | 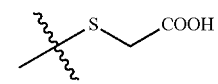 |
| 187 | 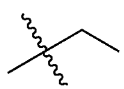 [SMILES: *CC] | 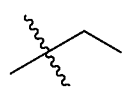 [SMILES: *CC] | H | H | 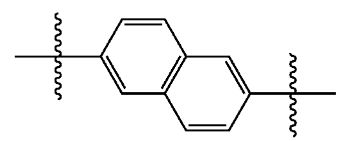 [SMILES: *c1ccc2cc(*)ccc2c1] | 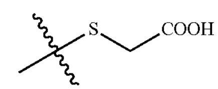 |

-continued
| | | | | | | |
|---|---|---|---|---|---|---|
| 188 | 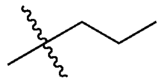 [SMILES: *CCC] |  | H | H | 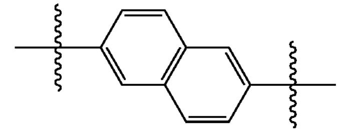 [SMILES: *c1ccc2cc(*)ccc2c1] | 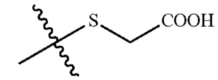 |
| 189 | 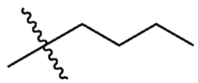 [SMILES: *CCCC] | 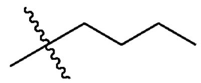 [SMILES: *CCCC] | H | H | 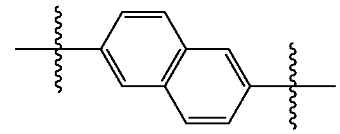 [SMILES: *c1ccc2cc(*)ccc2c1] | 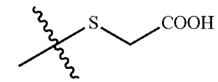 [SMILES: *SCC(=O)O] |
| 190 | 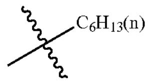 | 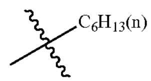 | H | H | 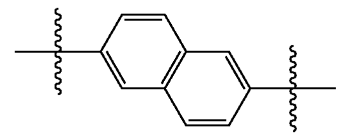 [SMILES: *c1ccc2cc(*)ccc2c1] | 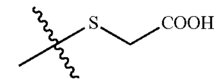 [SMILES: *SCC(=O)O] |
| 191 | 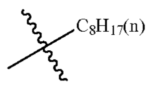 | 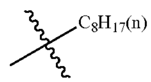 | H | H | 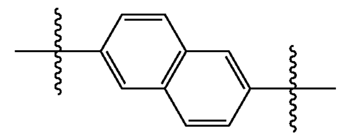 [SMILES: *c1ccc2cc(*)ccc2c1] | 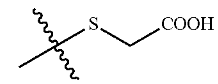 [SMILES: *SCC(=O)O] |
| 192 | 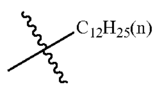 | 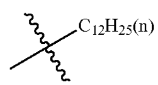 | H | H | 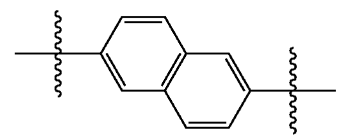 [SMILES: *c1ccc2cc(*)ccc2c1] | 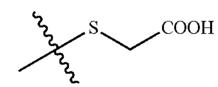 [SMILES: *SCC(=O)O] |
| 193 | 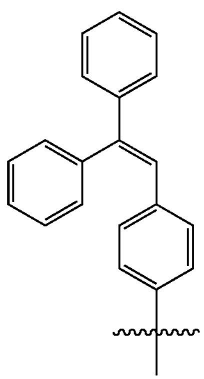 [SMILES: *c1ccc(C=C(c2ccccc2)c2ccccc2)cc1] | 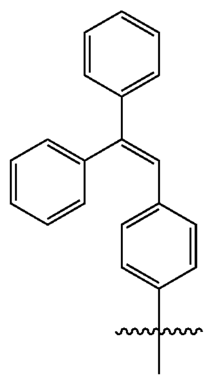 [SMILES: *c1ccc(C=C(c2ccccc2)c2ccccc2)cc1] | H | H | 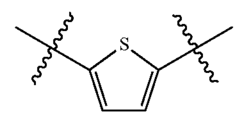 [SMILES: *c1ccc(*)s1] | 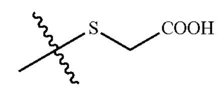 [SMILES: *SCC(=O)O] |

-continued
| | | | | | | |
|---|---|---|---|---|---|---|
| 194 | 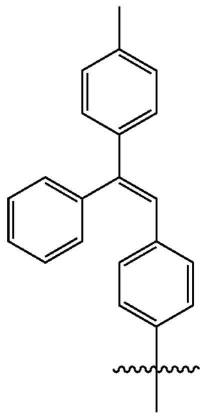 [SMILES: *c1ccc(/C=C(\c2ccccc2)c2ccc(C)cc2)cc1] | 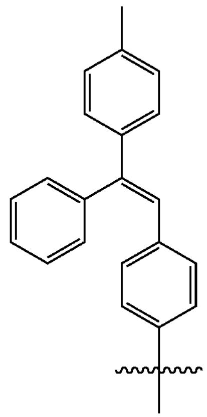 [SMILES: *c1ccc(/C=C(\c2ccccc2)c2ccc(C)cc2)cc1] | H | H | 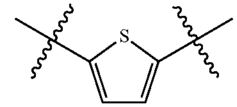 [SMILES: *c1ccc(*)s1] | 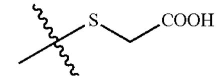 |
| 195 | 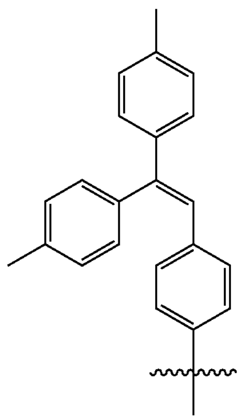 | 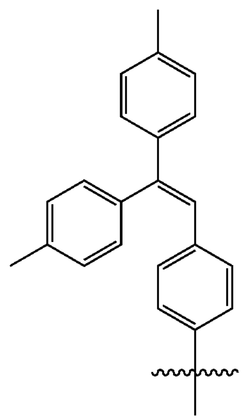 [SMILES: *c1ccc(C=C(c2ccc(C)cc2)c2ccc(C)cc2)cc1] | H | H | 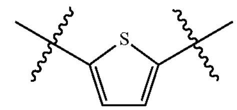 [SMILES: *c1ccc(*)s1] | 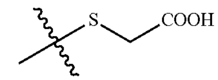 [SMILES: *SCC(=O)O] |

-continued
| | | | | | | |
|---|---|---|---|---|---|---|
| 196 | 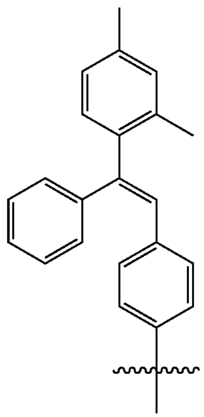 [SMILES: *c1ccc(/C=C(\c2ccccc2)c2ccc(C)cc2C)cc1] | 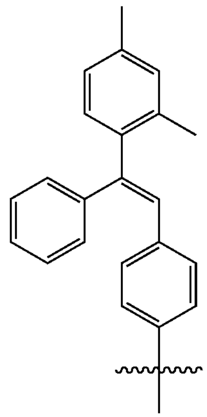 [SMILES: *c1ccc(/C=C(\c2ccccc2)c2ccc(C)cc2C)cc1] | H | H | 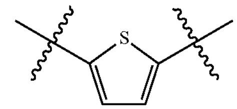 [SMILES: *c1ccc(*)s1] | 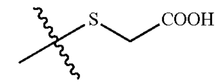 [SMILES: *SCC(=O)O] |
| 197 | 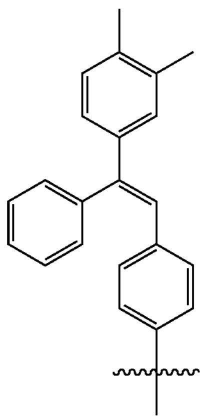 [SMILES: *c1ccc(/C=C(\c2ccccc2)c2ccc(C)c(C)c2)cc1] | 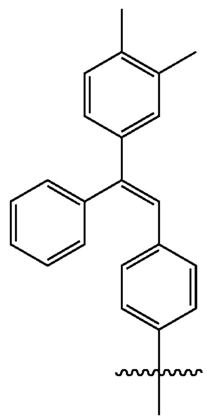 [SMILES: *c1ccc(/C=C(\c2ccccc2)c2ccc(C)c(C)c2)cc1] | H | H | 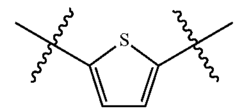 [SMILES: *c1ccc(*)s1] | 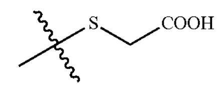 [SMILES: *SCC(=O)O] |

-continued
| | | | | | | |
|---|---|---|---|---|---|---|
| 198 | 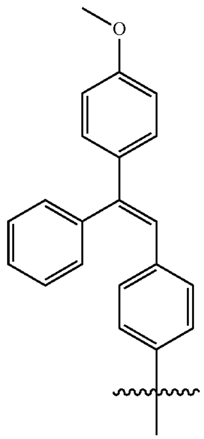 [SMILES: *c1ccc(/C=C(\c2ccccc2)c2ccc(OC)cc2)cc1] | 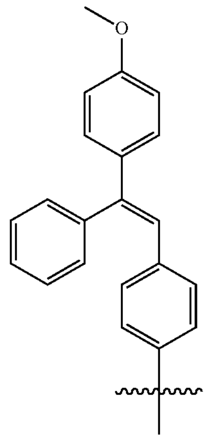 [SMILES: *c1ccc(/C=C(\c2ccccc2)c2ccc(OC)cc2)cc1] | H | H | 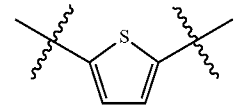 [SMILES: *c1ccc(*)s1] | 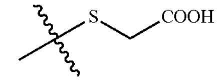 |
| 199 | 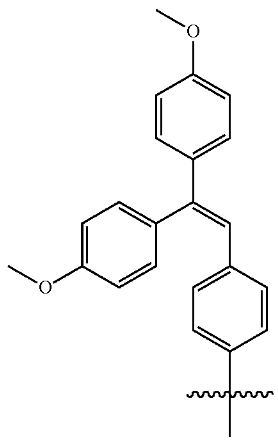 [SMILES: *c1ccc(C=C(c2ccc(OC)cc2)c2ccc(OC)cc2)cc1] | 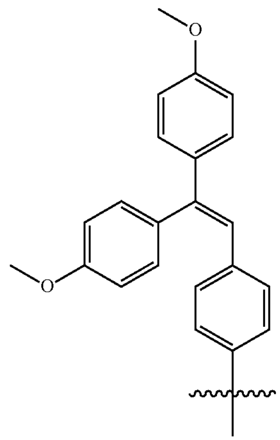 [SMILES: *c1ccc(C=C(c2ccc(OC)cc2)c2ccc(OC)cc2)cc1] | H | H | 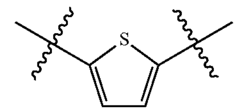 [SMILES: *c1ccc(*)s1] | 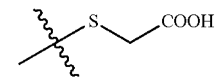 |

-continued
| | | | | | | |
|---|---|---|---|---|---|---|
| 200 | 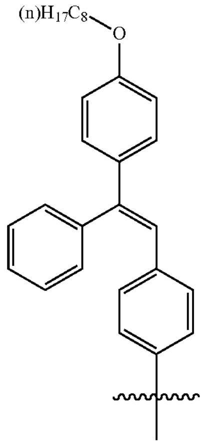 | 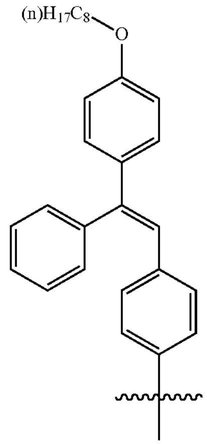 | H | H | 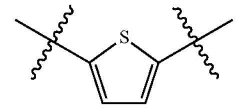 [SMILES: *c1ccc(*)s1] | 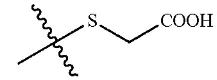 [SMILES: *SCC(=O)O] |
| 201 | 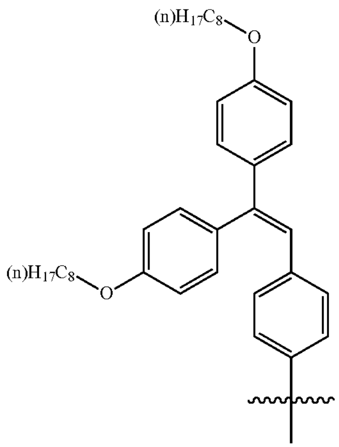 | 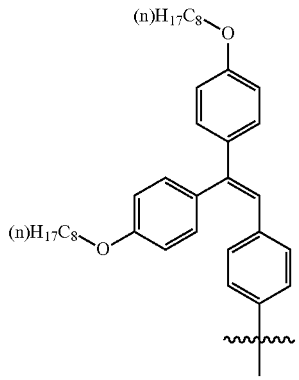 | H | H | 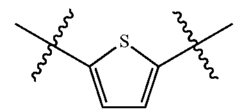 [SMILES: *c1ccc(*)s1] | 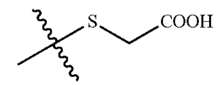 [SMILES: *SCC(=O)O] |
| 202 | 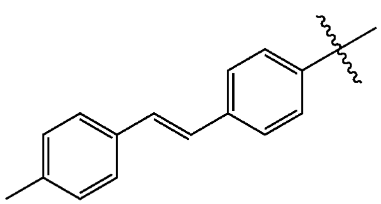 [SMILES: *c1ccc(/C=C/c2ccc(C)cc2)cc1] | 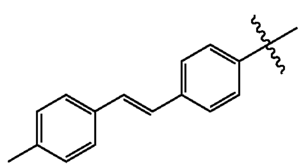 [SMILES: *c1ccc(/C=C/c2ccc(C)cc2)cc1] | H | H | 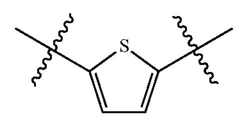 [SMILES: *c1ccc(*)s1] | 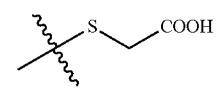 [SMILES: *SCC(=O)O] |

-continued
| | | | | | | |
|---|---|---|---|---|---|---|
| 203 | 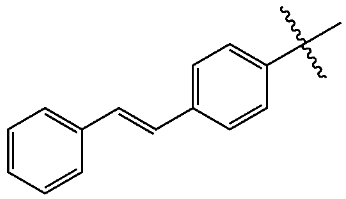 [SMILES: *c1ccc(/C=C/c2ccccc2)cc1] | 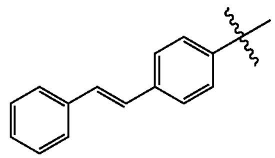 [SMILES: *c1ccc(/C=C/c2ccccc2)cc1] | H | H | 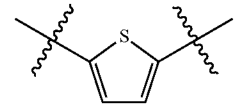 [SMILES: *c1ccc(*)s1] | 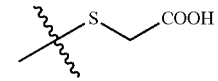 |
| 204 | 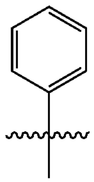 [SMILES: *c1ccccc1] | 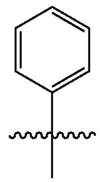 [SMILES: *c1ccccc1] | H | H | 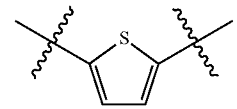 [SMILES: *c1ccc(*)s1] | 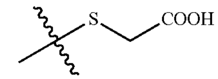 [SMILES: *SCC(=O)O] |
| 205 | 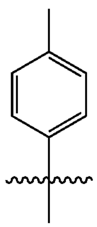 | 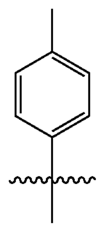 | H | H | 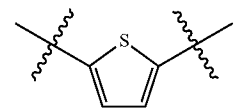 [SMILES: *c1ccc(*)s1] | 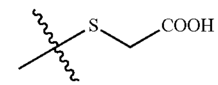 [SMILES: *SCC(=O)O] |
| 206 | 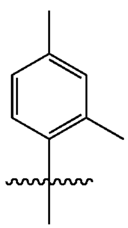 | 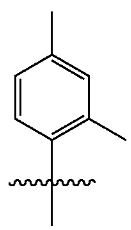 [SMILES: *c1ccc(C)cc1C] | H | H | 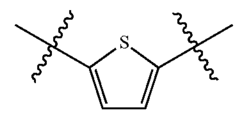 [SMILES: *c1ccc(*)s1] | 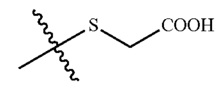 |

-continued
| | | | | | | |
|---|---|---|---|---|---|---|
| 207 | 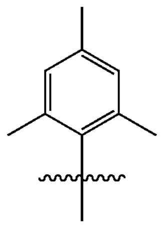 | 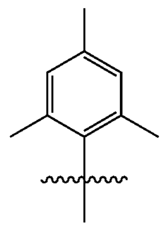 | H | H | 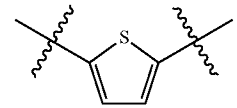 [SMILES: *c1ccc(*)s1] | 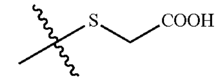 |
| 208 | 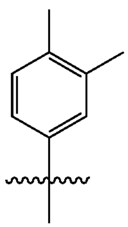 | 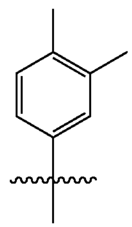 [SMILES: *c1ccc(C)c(C)c1] | H | H | 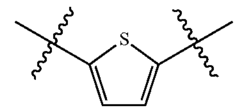 [SMILES: *c1ccc(*)s1] | 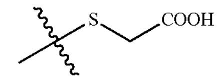 |
| 209 | 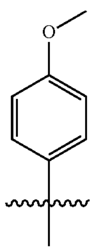 [SMILES: *c1ccc(OC)cc1] | 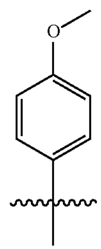 [SMILES: *c1ccc(OC)cc1] | H | H | 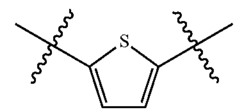 [SMILES: *c1ccc(*)s1] | 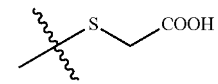 |
| 210 | 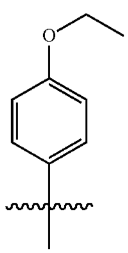 [SMILES: *c1ccc(OCC)cc1] | 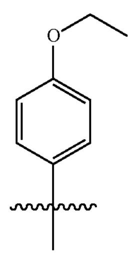 [SMILES: *c1ccc(OCC)cc1] | H | H | 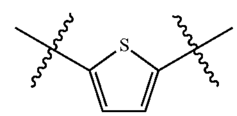 [SMILES: *c1ccc(*)s1] | 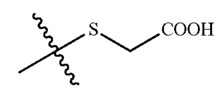 |

-continued
| | | | | | | |
|---|---|---|---|---|---|---|
| 211 | 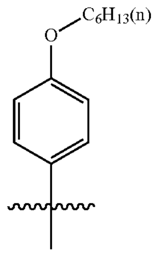 | 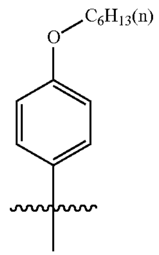 | H | H | 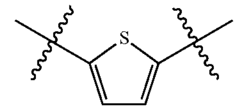 [SMILES: *c1ccc(*)s1] | 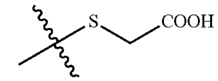 |
| 212 | 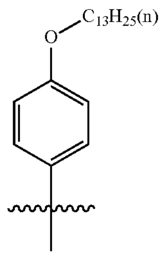 | 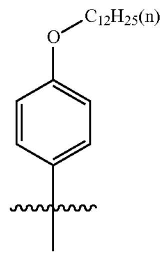 | H | H | 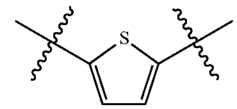 [SMILES: *c1ccc(*)s1] | 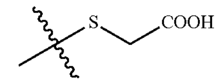 [SMILES: *SCC(=O)O] |
| 213 | 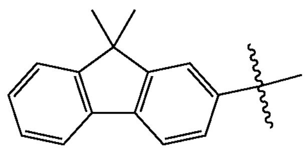 [SMILES: *c1ccc2c(c1)C(C)(C)c1ccccc1-2] | 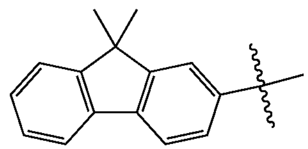 [SMILES: *c1ccc2c(c1)C(C)(C)c1ccccc1-2] | H | H | 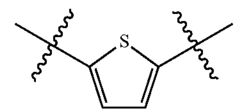 [SMILES: *c1ccc(*)s1] | 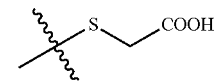 |
| 214 | 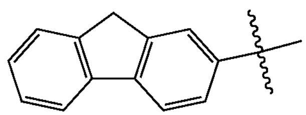 [SMILES: *c1ccc2c(c1)Cc1ccccc1-2] | 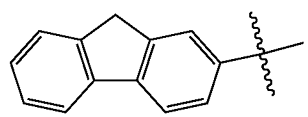 [SMILES: *c1ccc2c(c1)Cc1ccccc1-2] | H | H | 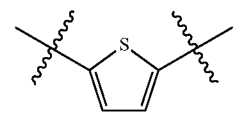 [SMILES: *c1ccc(*)s1] | 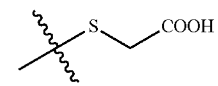 |
| 215 | 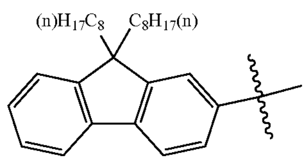 | 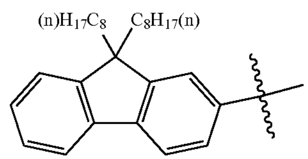 | H | H | 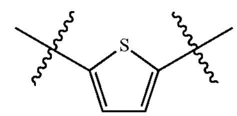 [SMILES: *c1ccc(*)s1] | 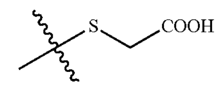 |
| 216 | 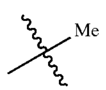 | 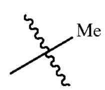 | H | H | 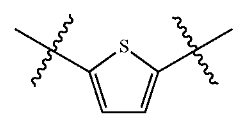 [SMILES: *c1ccc(*)s1] | 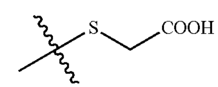 |

-continued
| | | | | | | |
|---|---|---|---|---|---|---|
| 217 | 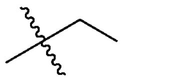 [SMILES: *CC] | 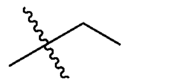 [SMILES: *CC] | H | H | 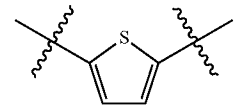 [SMILES: *c1ccc(*)s1] | 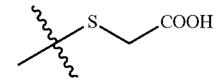 [SMILES: *SCC(=O)O] |
| 218 | 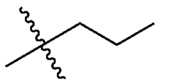 | 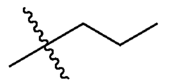 [SMILES: *CCC] | H | H | 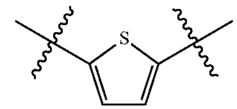 [SMILES: *c1ccc(*)s1] | 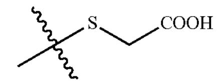 |
| 219 | 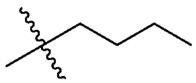 [SMILES: *CCCC] | 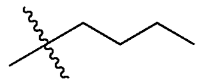 [SMILES: *CCCC] | H | H | 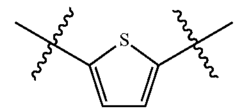 [SMILES: *c1ccc(*)s1] | 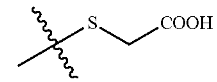 |
| 220 | 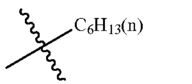 | 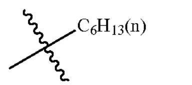 | H | H | 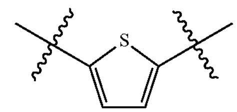 [SMILES: *c1ccc(*)s1] | 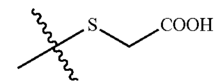 [SMILES: *SCC(=O)O] |
| 221 | 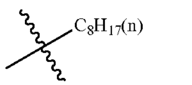 | 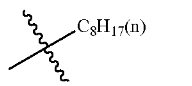 | H | H | 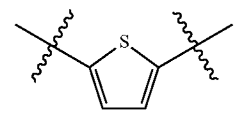 [SMILES: *c1ccc(*)s1] | 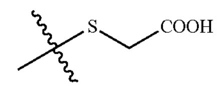 [SMILES: *SCC(=O)O] |
| 222 | 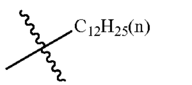 | 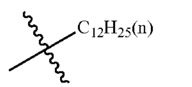 | H | H | 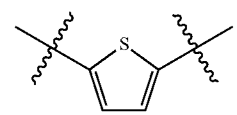 [SMILES: *c1ccc(*)s1] | 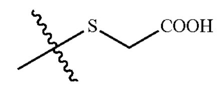 |

-continued
| | | | | | | |
|---|---|---|---|---|---|---|
| 223 | 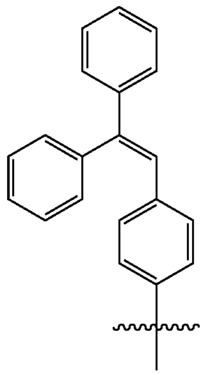 [SMILES: *c1ccc(C=C(c2ccccc2)c2ccccc2)cc1] | 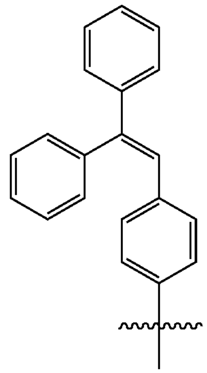 [SMILES: *c1ccc(C=C(c2ccccc2)c2ccccc2)cc1] |  | H | 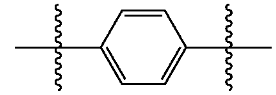 | 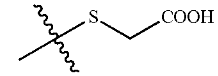 [SMILES: *SCC(=O)O] |
| 224 | 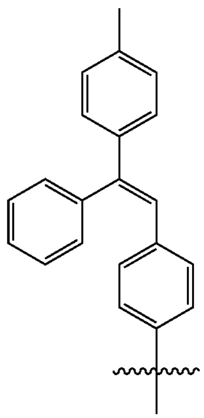 [SMILES: *c1ccc(/C=C(\c2ccccc2)c2ccc(C)cc2)cc1] | 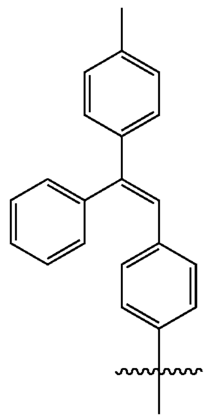 | 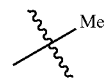 | H | 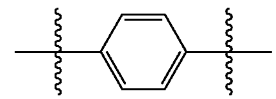 [SMILES: *c1ccc(*)cc1] | 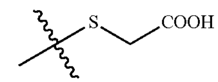 [SMILES: *SCC(=O)O] |

-continued
| | | | | | | |
|---|---|---|---|---|---|---|
| 225 | 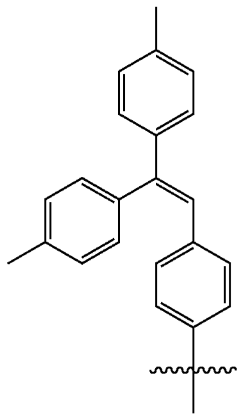 [SMILES: *c1ccc(C=C(c2ccc(C)cc2)c2ccc(C)cc2)cc1] | 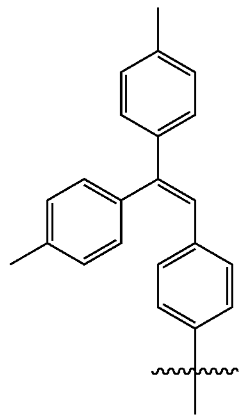 [SMILES: *c1ccc(C=C(c2ccc(C)cc2)c2ccc(C)cc2)cc1] | 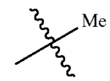 | H | 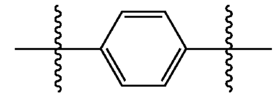 [SMILES: *c1ccc(*)cc1] | 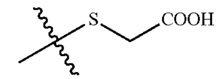 [SMILES: *SCC(=O)O] |
| 226 | 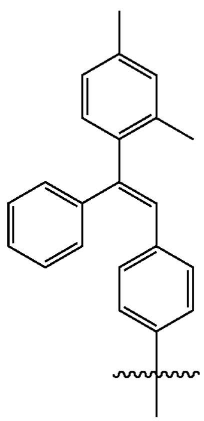 [SMILES: *c1ccc(/C=C(\c2ccccc2)c2ccc(C)cc2C)cc1] | 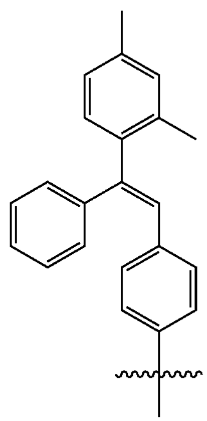 | 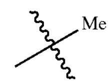 | H | 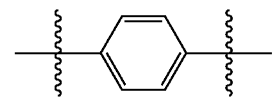 | 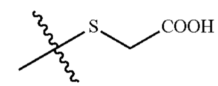 |

-continued
| | | | | | | |
|---|---|---|---|---|---|---|
| 227 | 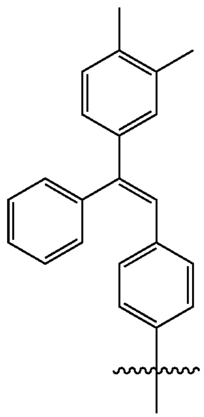 | 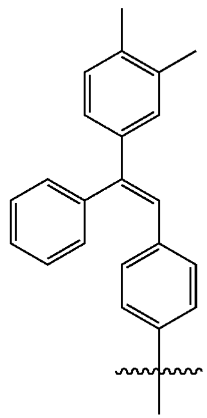 [SMILES: *c1ccc(/C=C(\c2ccccc2)c2ccc(C)c(C)c2)cc1] | 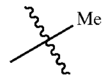 | H | 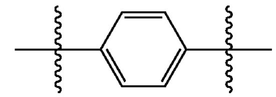 | 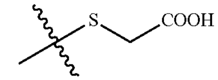 [SMILES: *SCC(=O)O] |
| 228 | 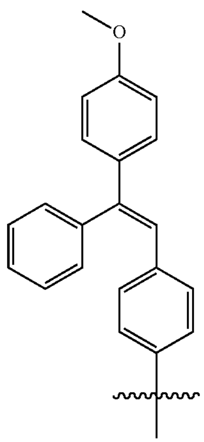 [SMILES: *c1ccc(/C=C(\c2ccccc2)c2ccc(OC)cc2)cc1] | 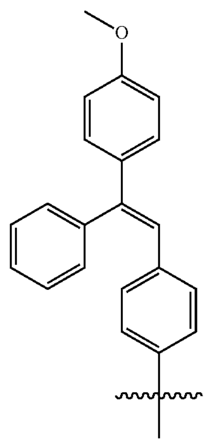 [SMILES: *c1ccc(/C=C(\c2ccccc2)c2ccc(OC)cc2)cc1] | 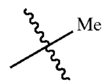 | H | 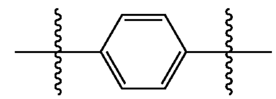 | 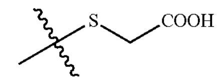 |

-continued
| | | | | | | |
|---|---|---|---|---|---|---|
| 229 | 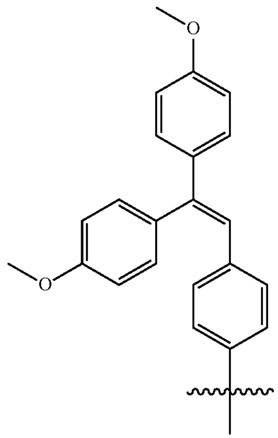 [SMILES: *c1ccc(C=C(c2ccc(OC)cc2)c2ccc(OC)cc2)cc1] | 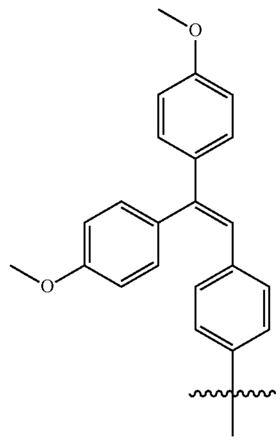 [SMILES: *c1ccc(C=C(c2ccc(OC)cc2)c2ccc(OC)cc2)cc1] | 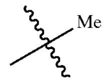 | H | 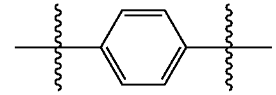 | 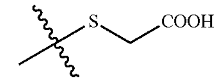 [SMILES: *SCC(=O)O] |
| 230 | 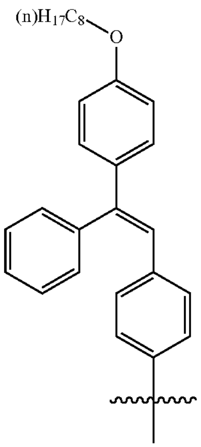 | 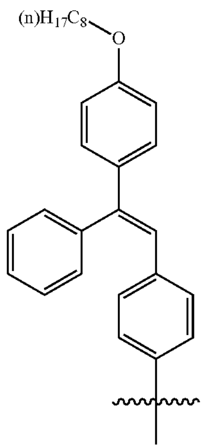 | 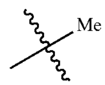 | H | 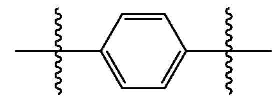 [SMILES: *c1ccc(*)cc1] | 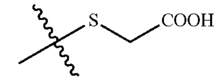 |

-continued
| | | | | | | |
|---|---|---|---|---|---|---|
| 231 | 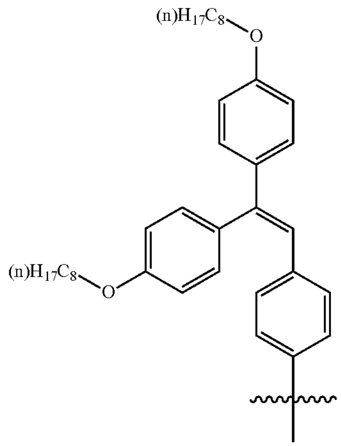 | 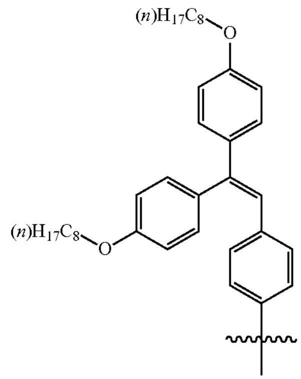 | 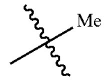 | H | 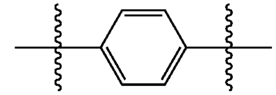 [SMILES: *c1ccc(*)cc1] | 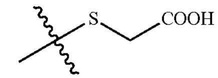 [SMILES: *SCC(=O)O] |
| 232 | 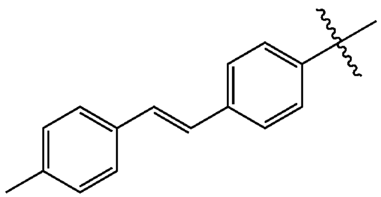 [SMILES: *c1ccc(/C=C/c2ccc(C)cc2)cc1] | 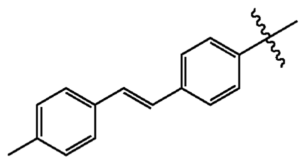 [SMILES: *c1ccc(/C=C/c2ccc(C)cc2)cc1] | 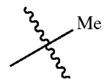 | H | 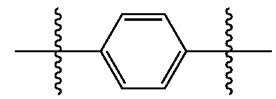 [SMILES: *c1ccc(*)cc1] | 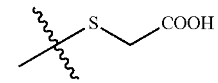 |
| 233 | 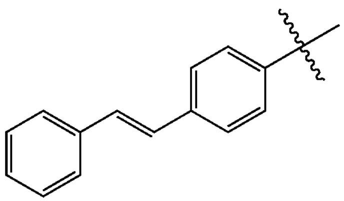 [SMILES: *c1ccc(/C=C/c2ccccc2)cc1] | 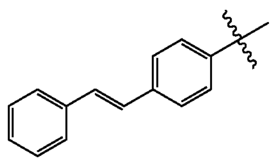 [SMILES: *c1ccc(/C=C/c2ccccc2)cc1] | 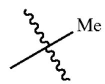 | H | 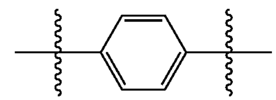 | 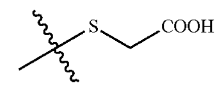 [SMILES: *SCC(=O)O] |
| 234 | 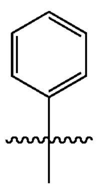 | 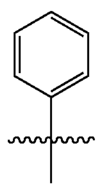 [SMILES: *c1ccccc1] | 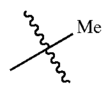 | H | 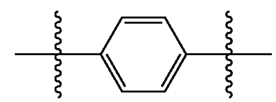 | 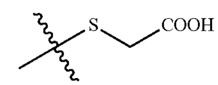 [SMILES: *SCC(=O)O] |

-continued
| | | | | | | |
|---|---|---|---|---|---|---|
| 235 | 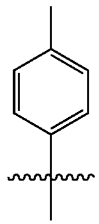 [SMILES: *c1ccc(C)cc1] | 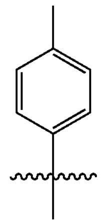 [SMILES: *c1ccc(C)cc1] | 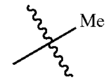 | H | 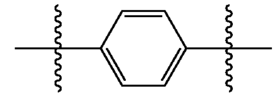 | 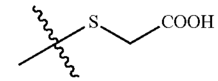 |
| 236 | 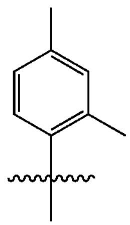 | 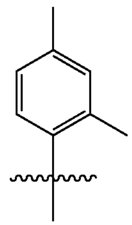 [SMILES: *c1ccc(C)cc1C] | 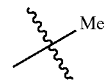 | H | 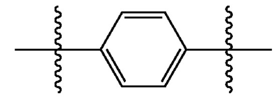 | 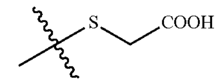 |
| 237 | 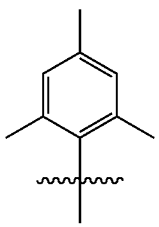 | 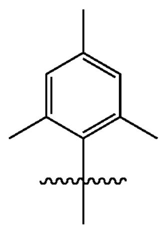 | 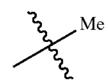 | H | 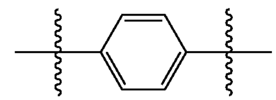 | 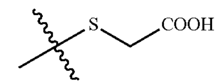 |
| 238 | 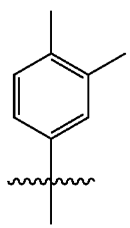 | 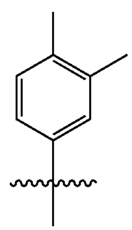 | 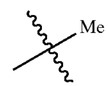 | H | 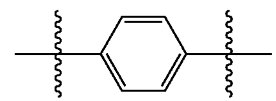 [SMILES: *c1ccc(*)cc1] | 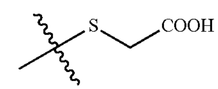 [SMILES: *SCC(=O)O] |

-continued
| | | | | | | |
|---|---|---|---|---|---|---|
| 239 | 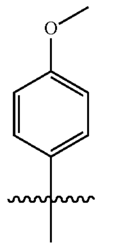 [SMILES: *c1ccc(OC)cc1] | 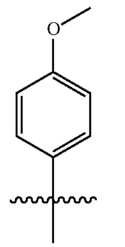 | 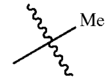 | H | 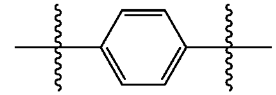 [SMILES: *c1ccc(*)cc1] | 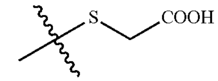 [SMILES: *SCC(=O)O] |
| 240 | 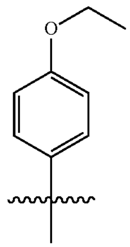 [SMILES: *c1ccc(OCC)cc1] | 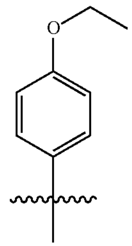 [SMILES: *c1ccc(OCC)cc1] | 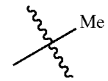 | H | 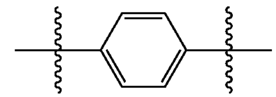 | 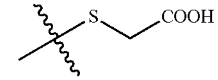 |
| 241 | 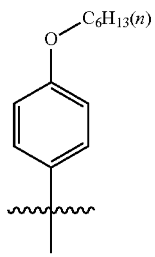 | 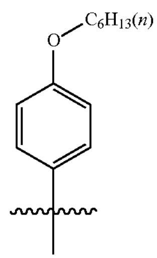 | 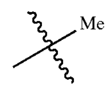 | H | 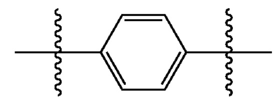 | 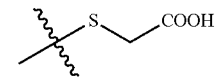 [SMILES: *SCC(=O)O] |
| 242 | 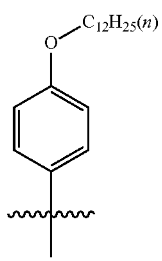 | 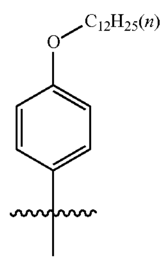 | 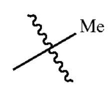 | H | 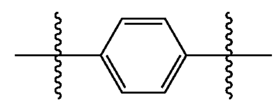 [SMILES: *c1ccc(*)cc1] | 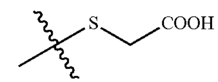 [SMILES: *SCC(=O)O] |

-continued
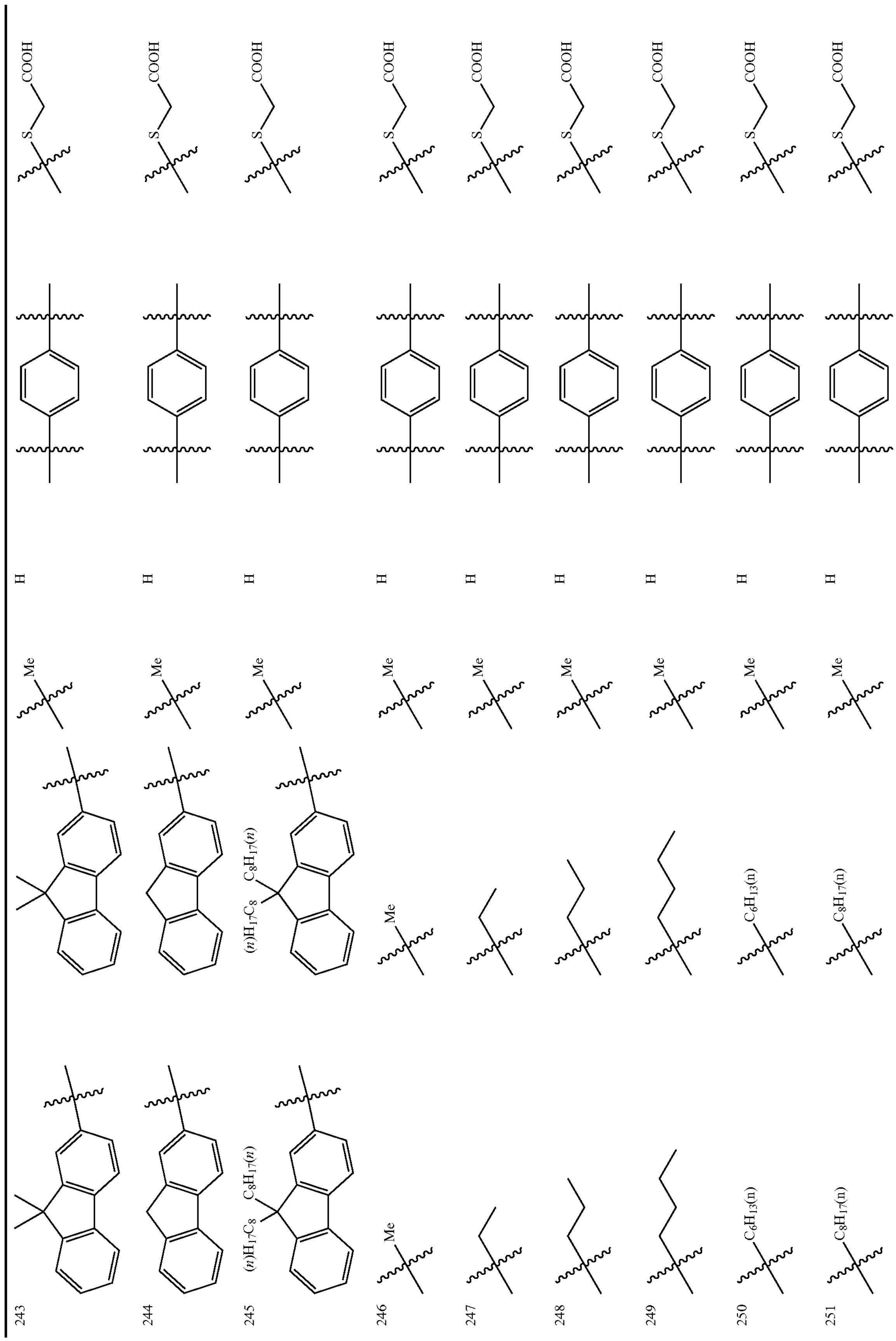

-continued
| | | | | | | |
|---|---|---|---|---|---|---|
| 252 | 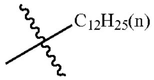  | 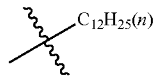  | 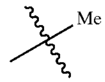  | H | 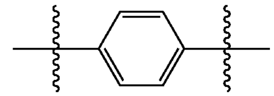 [SMILES: *c1ccc(*)cc1] | 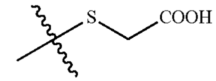  |
| 253 | 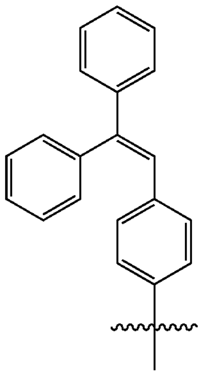 [SMILES: *c1ccc(C=C(c2ccccc2)c2ccccc2)cc1] | 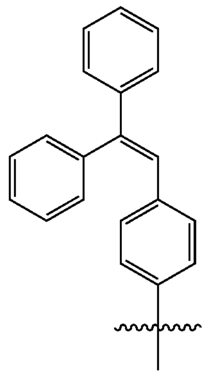 [SMILES: *c1ccc(C=C(c2ccccc2)c2ccccc2)cc1] | H | 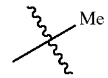  | 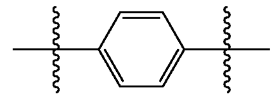 [SMILES: *c1ccc(*)cc1] | 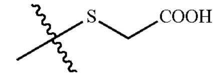  |
| 254 | 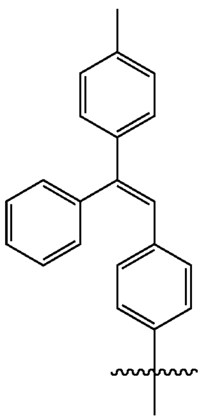 [SMILES: *c1ccc(/C=C(\c2ccccc2)c2ccc(C)cc2)cc1] | 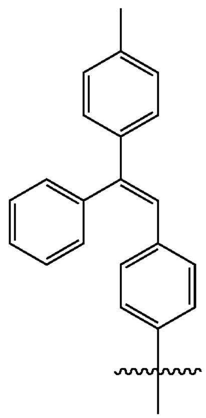 | H | 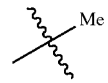  | 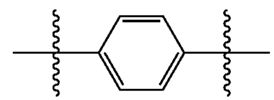 [SMILES: *c1ccc(*)cc1] | 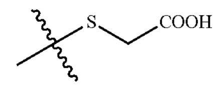 [SMILES: *SCC(=O)O]  |

-continued
| | | | | | | |
|---|---|---|---|---|---|---|
| 255 | 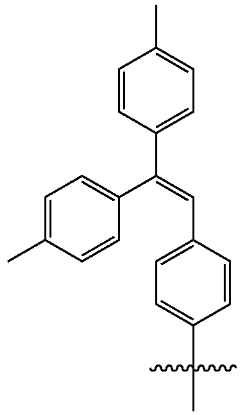 [SMILES: *c1ccc(C=C(c2ccc(C)cc2)c2ccc(C)cc2)cc1] | 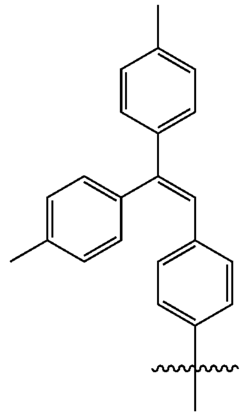 [SMILES: *c1ccc(C=C(c2ccc(C)cc2)c2ccc(C)cc2)cc1] | H | 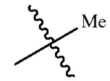 | 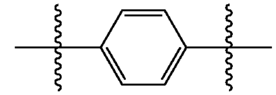 | 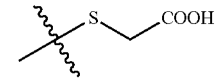 [SMILES: *SCC(=O)O] |
| 256 | 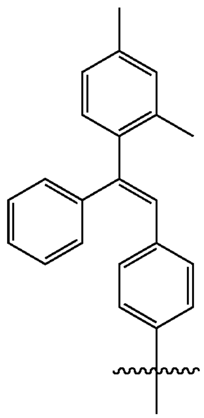 [SMILES: *c1ccc(/C=C(\c2ccccc2)c2ccc(C)cc2C)cc1] | 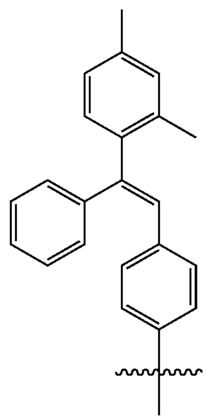 | H | 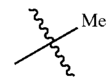 | 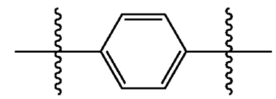 [SMILES: *c1ccc(*)cc1] | 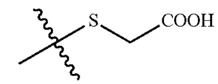 |

-continued
| | | | | | | |
|---|---|---|---|---|---|---|
| 257 | 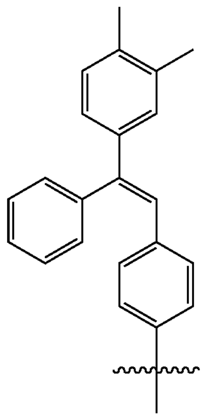 [SMILES: *c1ccc(/C=C(\c2ccccc2)c2ccc(C)c(C)c2)cc1] | 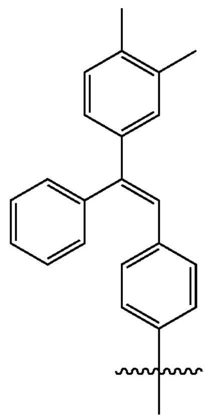 [SMILES: *c1ccc(/C=C(\c2ccccc2)c2ccc(C)c(C)c2)cc1] | H |  | 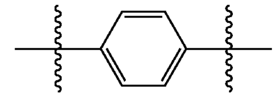 [SMILES: *c1ccc(*)cc1] | 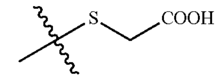 |
| 258 | 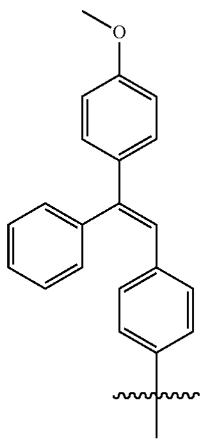 [SMILES: *c1ccc(/C=C(\c2ccccc2)c2ccc(OC)cc2)cc1] | 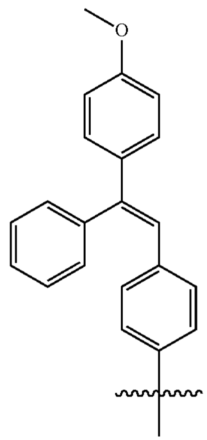 [SMILES: *c1ccc(/C=C(\c2ccccc2)c2ccc(OC)cc2)cc1] | H | 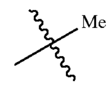 | 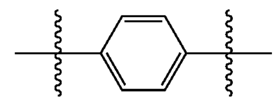 | 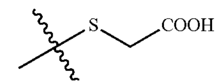 |

-continued
| | | | | | | |
|---|---|---|---|---|---|---|
| 259 | 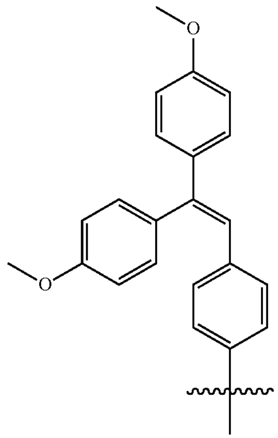 [SMILES: *c1ccc(C=C(c2ccc(OC)cc2)c2ccc(OC)cc2)cc1] | 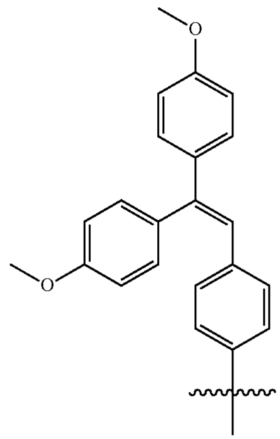 [SMILES: *c1ccc(C=C(c2ccc(OC)cc2)c2ccc(OC)cc2)cc1] | H |  | 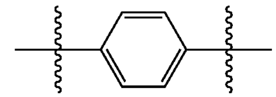 | 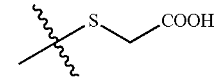 [SMILES: *SCC(=O)O] |
| 260 | 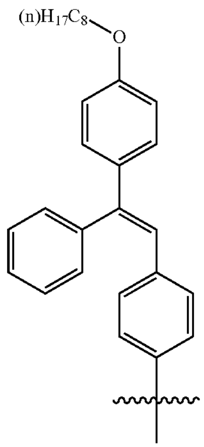 | 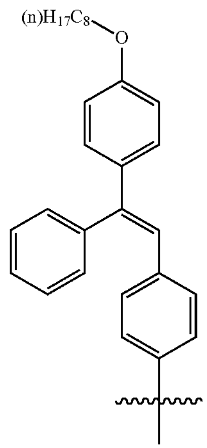 | H | 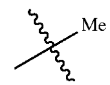 | 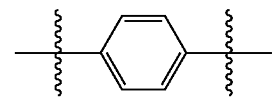 | 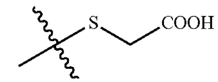 |

-continued
| | | | | | | |
|---|---|---|---|---|---|---|
| 261 | 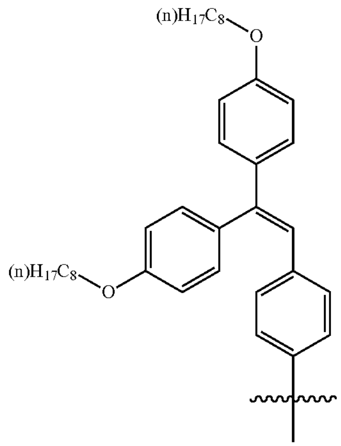 | 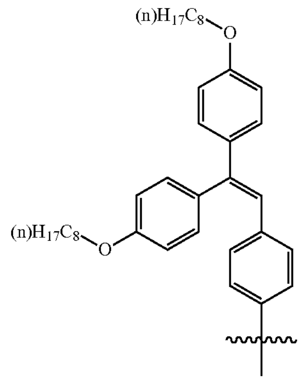 | H |  | 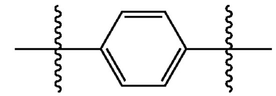 [SMILES: *c1ccc(*)cc1] | 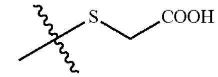 [SMILES: *SCC(=O)O] |
| 262 | 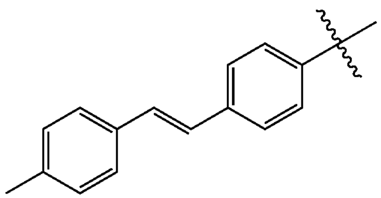 [SMILES: *c1ccc(/C=C/c2ccc(C)cc2)cc1] | 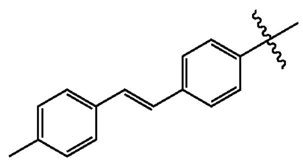 [SMILES: *c1ccc(/C=C/c2ccc(C)cc2)cc1] | H | 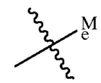 | 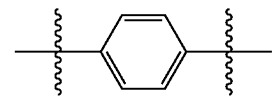 [SMILES: *c1ccc(*)cc1] | 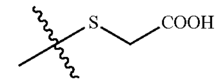 |
| 263 | 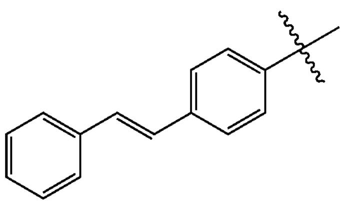 [SMILES: *c1ccc(/C=C/c2ccccc2)cc1] | 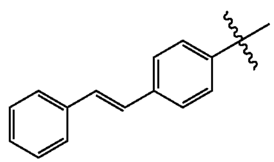 [SMILES: *c1ccc(/C=C/c2ccccc2)cc1] | H | 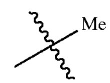 | 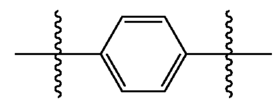 [SMILES: *c1ccc(*)cc1] | 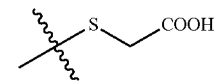 |
| 264 | 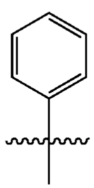 [SMILES: *c1ccccc1] | 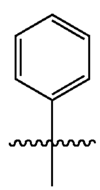 | H | 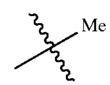 | 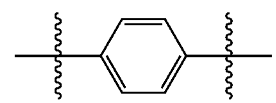 | 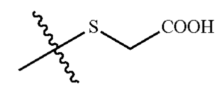 |

-continued
| | | | | | | |
|---|---|---|---|---|---|---|
| 265 | 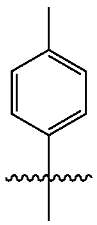 [SMILES: *c1ccc(C)cc1] | 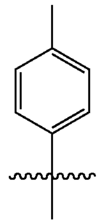 | H |  | 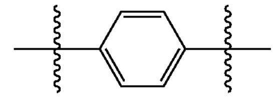 [SMILES: *c1ccc(*)cc1] | 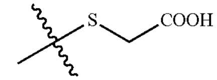 |
| 266 | 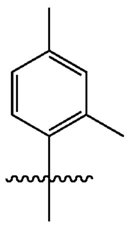 | 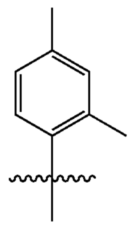 [SMILES: *c1ccc(C)cc1C] | H |  | 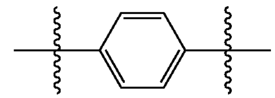 | 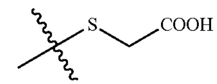 |
| 267 | 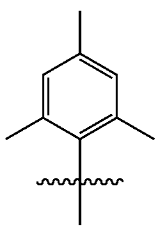 | 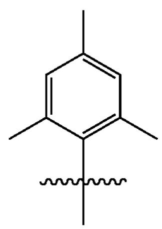 | H | 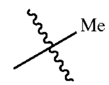 | 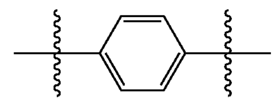 [SMILES: *c1ccc(*)cc1] | 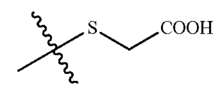 [SMILES: *SCC(=O)O] |
| 268 | 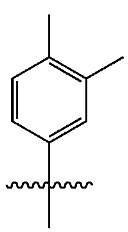 | 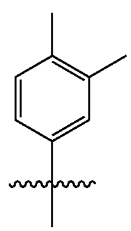 [SMILES: *c1ccc(C)c(C)c1] | H | 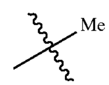 | 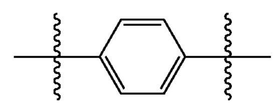 [SMILES: *c1ccc(*)cc1] | 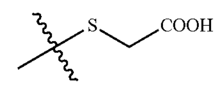 [SMILES: *SCC(=O)O] |

-continued
| | | | | | | |
|---|---|---|---|---|---|---|
| 269 | 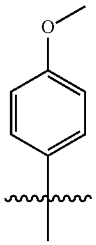 [SMILES: *c1ccc(OC)cc1] | 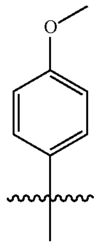 | H | 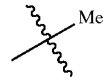 | 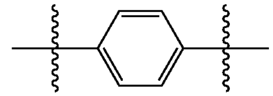 | 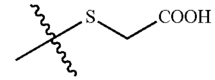 |
| 270 | 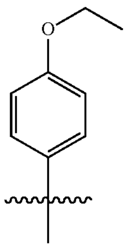 [SMILES: *c1ccc(OCC)cc1] | 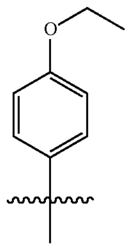 [SMILES: *c1ccc(OCC)cc1] | H | 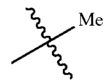 | 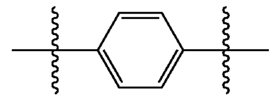 | 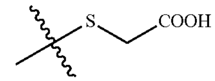 |
| 271 | 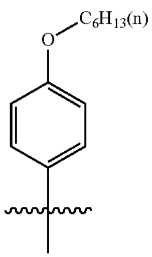 | 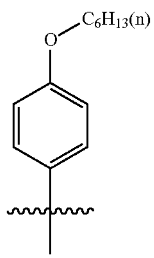 | H |  | 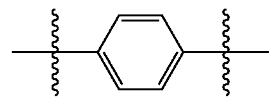 [SMILES: *c1ccc(*)cc1] | 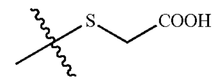 |
| 272 | 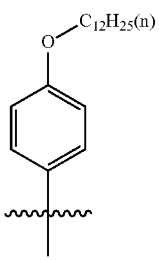 | 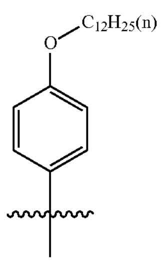 | H | 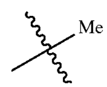 | 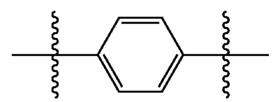 [SMILES: *c1ccc(*)cc1] | 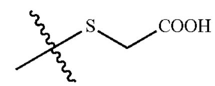 |

-continued
| | | | | | | |
|---|---|---|---|---|---|---|
| 273 | 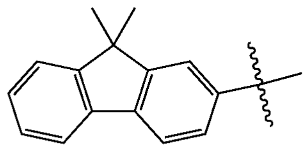 [SMILES: *c1ccc2c(c1)C(C)(C)c1ccccc1-2] | 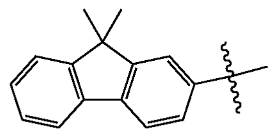 [SMILES: *c1ccc2c(c1)C(C)(C)c1ccccc1-2] | H |  | 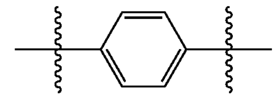 [SMILES: *c1ccc(*)cc1] | 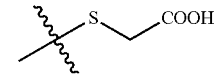 |
| 274 | 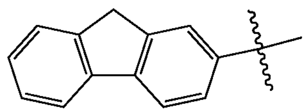 | 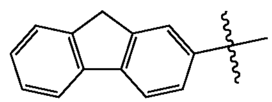 [SMILES: *c1ccc2c(c1)Cc1ccccc1-2] | H |  | 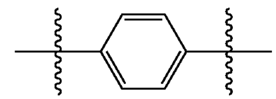 | 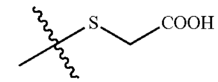 [SMILES: *SCC(=O)O] |
| 275 | 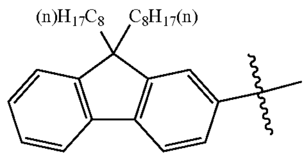 | 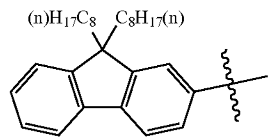 | H | 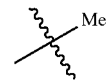 | 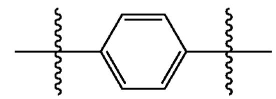 [SMILES: *c1ccc(*)cc1] | 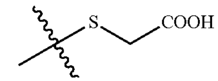 [SMILES: *SCC(=O)O] |
| 276 | 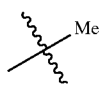 | 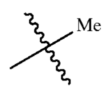 | H | 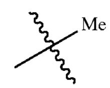 | 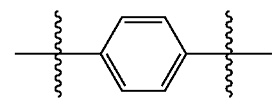 [SMILES: *c1ccc(*)cc1] | 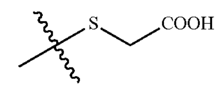 [SMILES: *SCC(=O)O] |
| 277 | 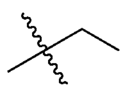 [SMILES: *CC] | 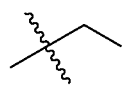 [SMILES: *CC] | H | 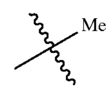 | 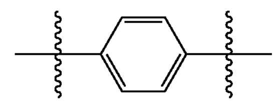 [SMILES: *c1ccc(*)cc1] | 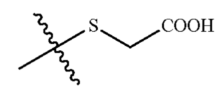 |
| 278 | 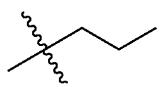 [SMILES: *CCC] | 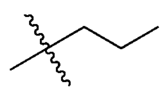 | H | 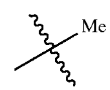 | 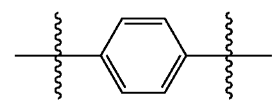 | 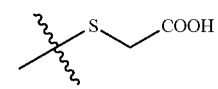 |
| 279 | 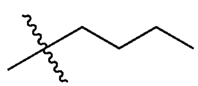 [SMILES: *CCCC] | 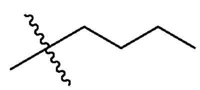 [SMILES: *CCCC] | H | 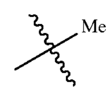 | 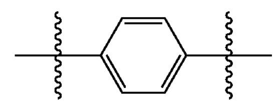 [SMILES: *c1ccc(*)cc1] | 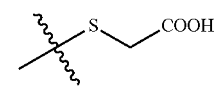 [SMILES: *SCC(=O)O] |
| 280 | 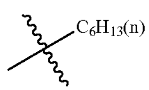 | 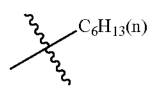 | H | 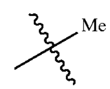 | 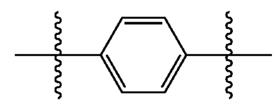 [SMILES: *c1ccc(*)cc1] | 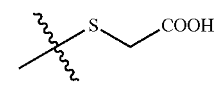 |

-continued
| | | | | | | |
|---|---|---|---|---|---|---|
| 281 | 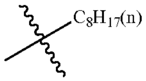 | 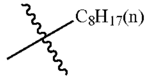 | H |  | 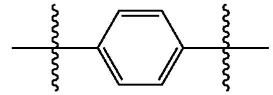 [SMILES: *c1ccc(*)cc1] | 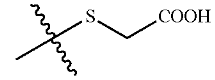 |
| 282 | 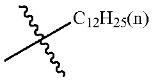 | 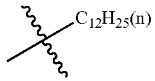 | H |  | 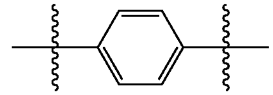 | 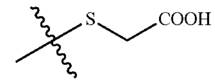 [SMILES: *SCC(=O)O] |
| 283 | 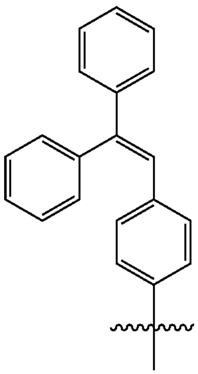 [SMILES: *c1ccc(C=C(c2ccccc2)c2ccccc2)cc1] | 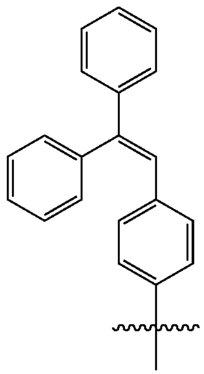 [SMILES: *c1ccc(C=C(c2ccccc2)c2ccccc2)cc1] | 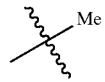 | 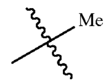 | 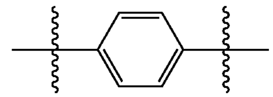 [SMILES: *c1ccc(*)cc1] | 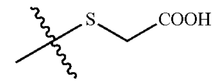 [SMILES: *SCC(=O)O] |
| 284 | 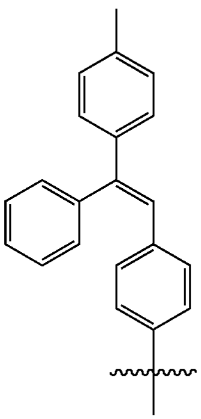 [SMILES: *c1ccc(/C=C(\c2ccccc2)c2ccc(C)cc2)cc1] | 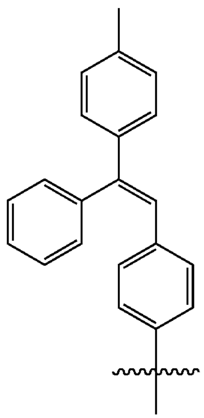 [SMILES: *c1ccc(/C=C(\c2ccccc2)c2ccc(C)cc2)cc1] | 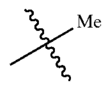 | 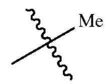 | 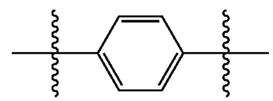 [SMILES: *c1ccc(*)cc1] | 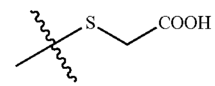 |

-continued
285
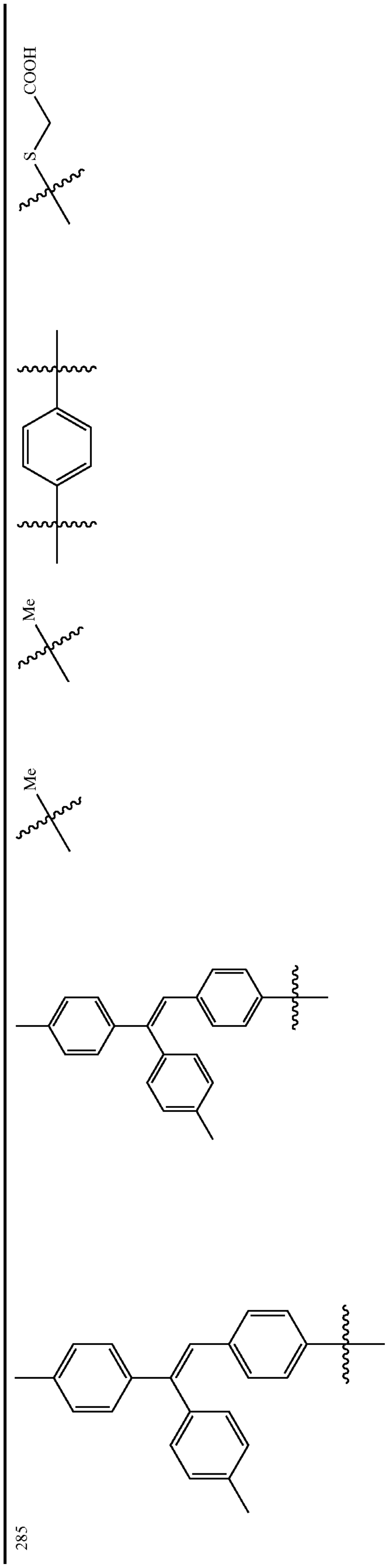
286
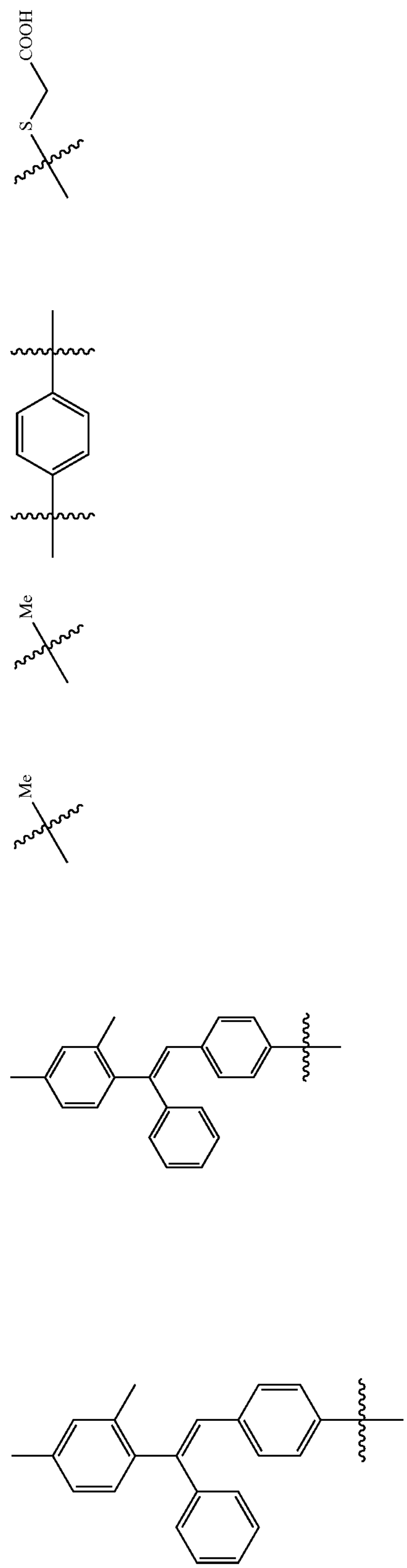

-continued
| | |
|---|---|
| 287 | 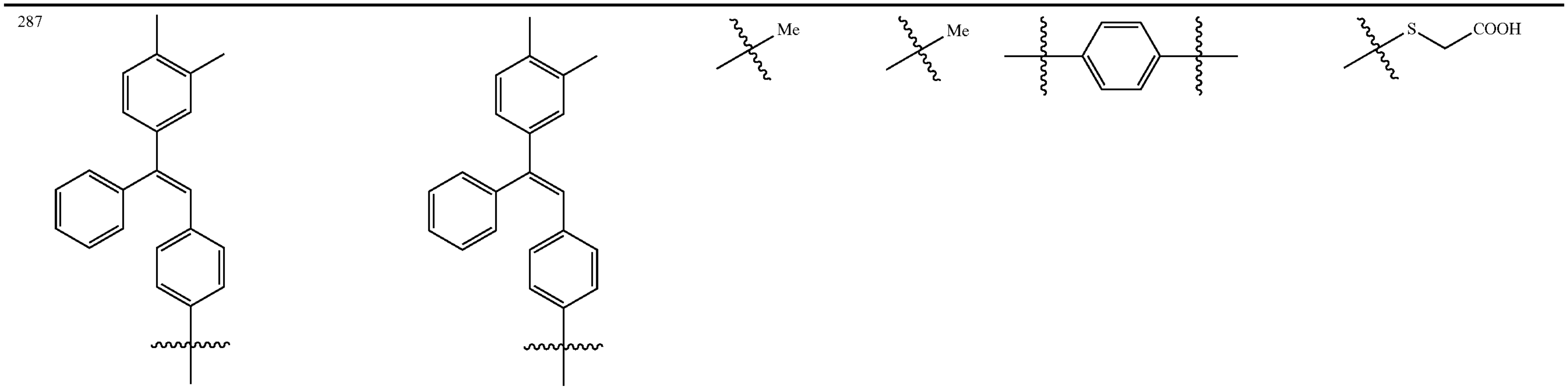 |
| 288 | 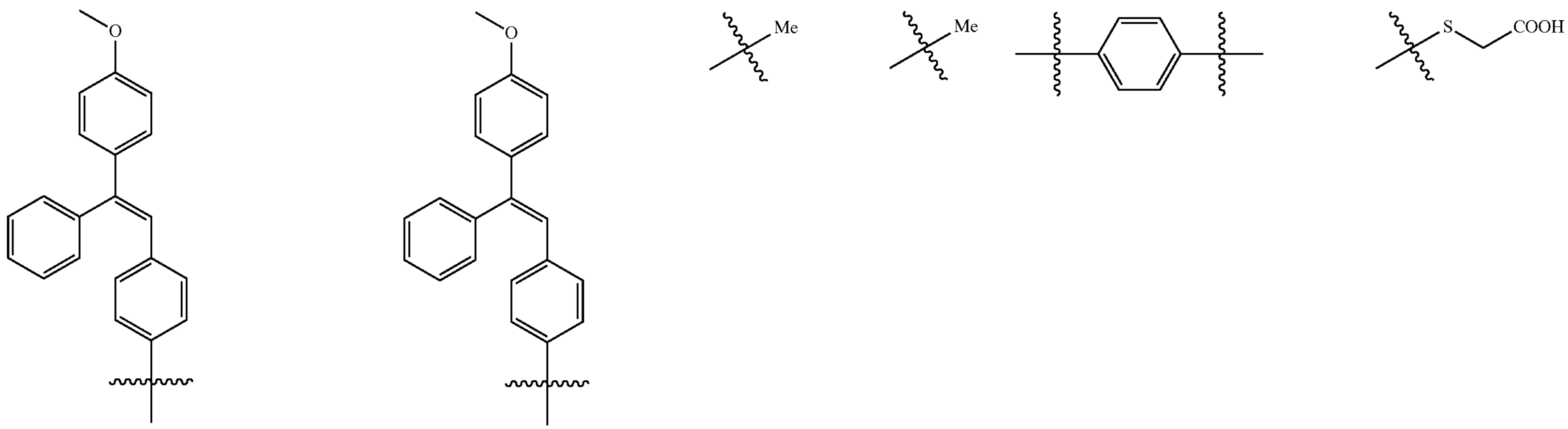 |

-continued
289
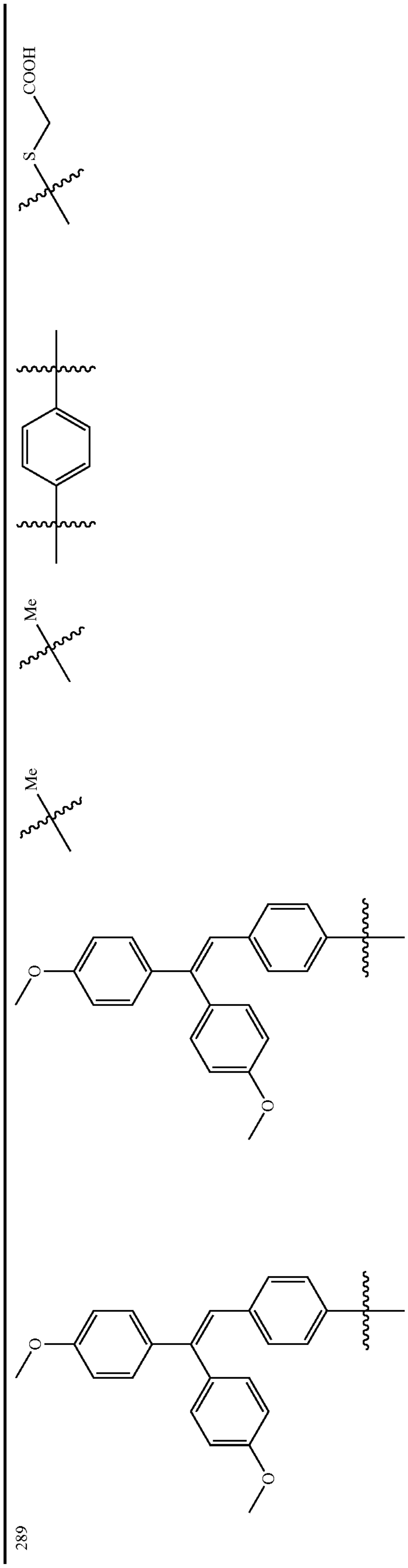
290
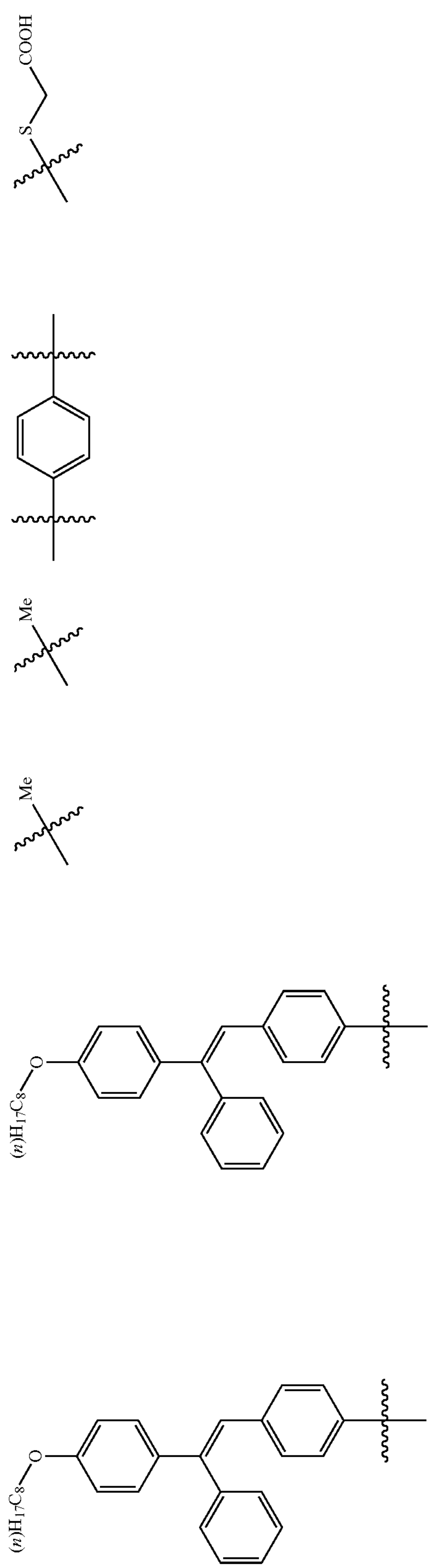

-continued
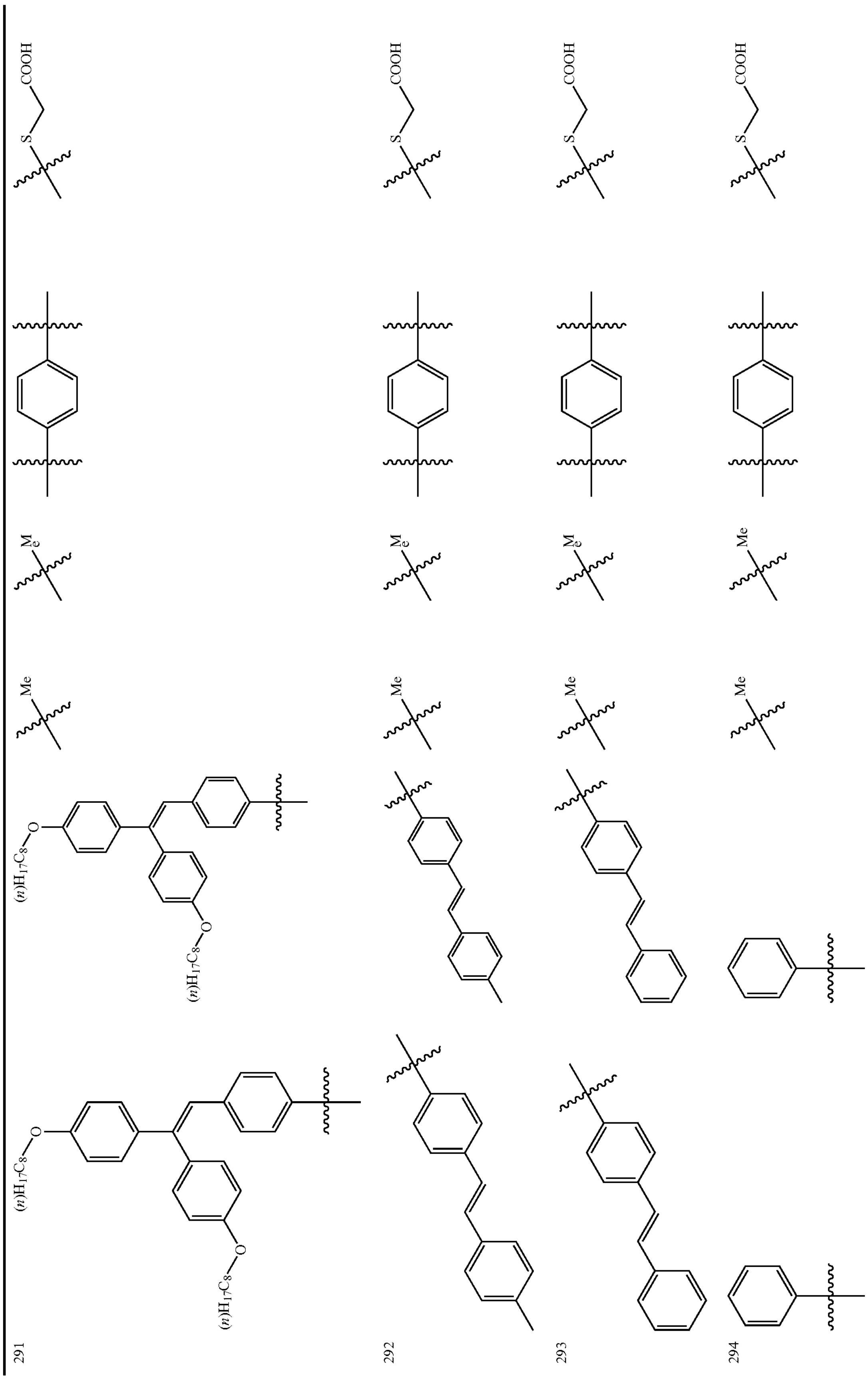
291
292
293
294

-continued
| | |
|---|---|
| 295 | 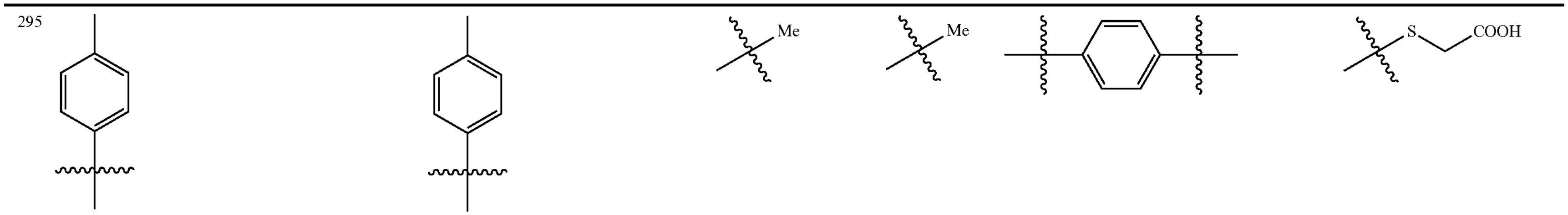 |
| 296 | 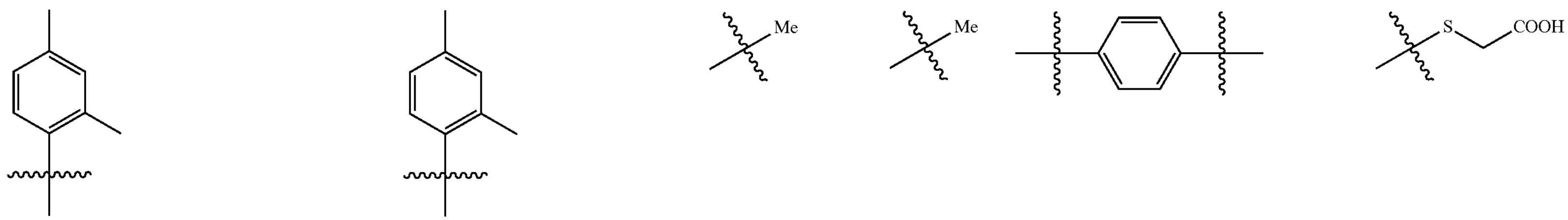 |
| 297 | 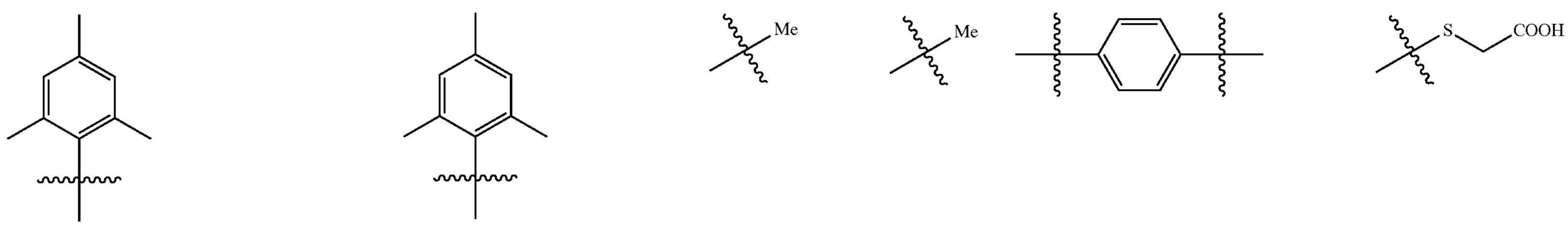 |
| 298 | 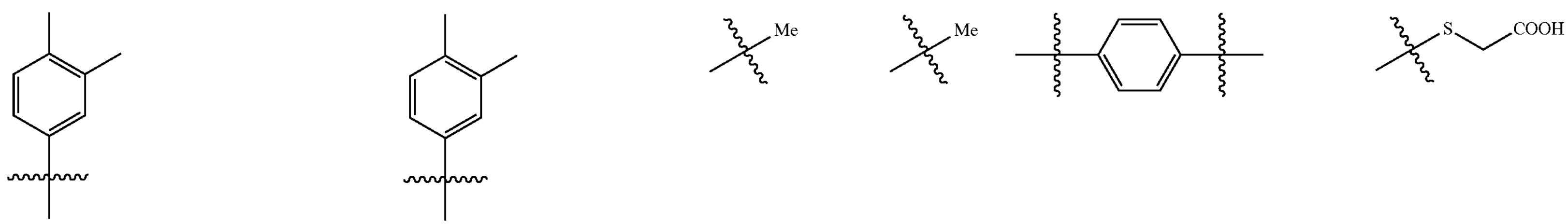 |

-continued
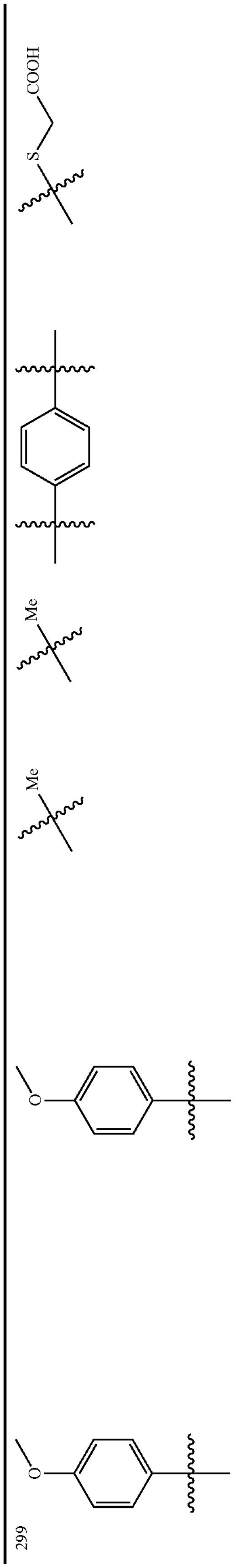
299
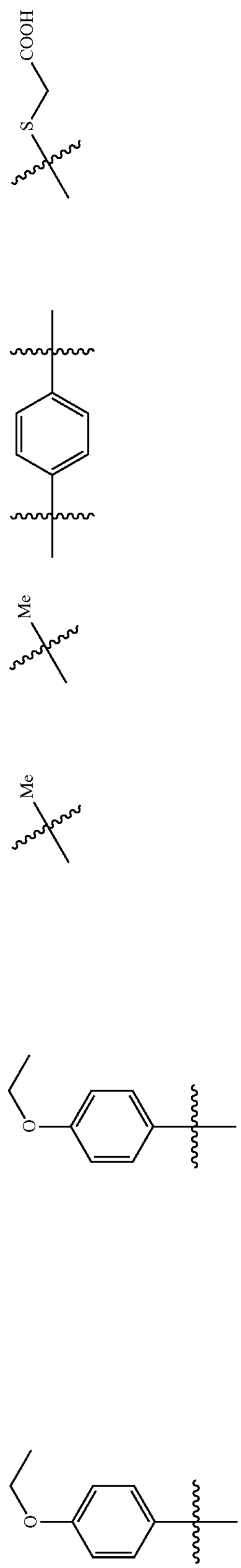
300
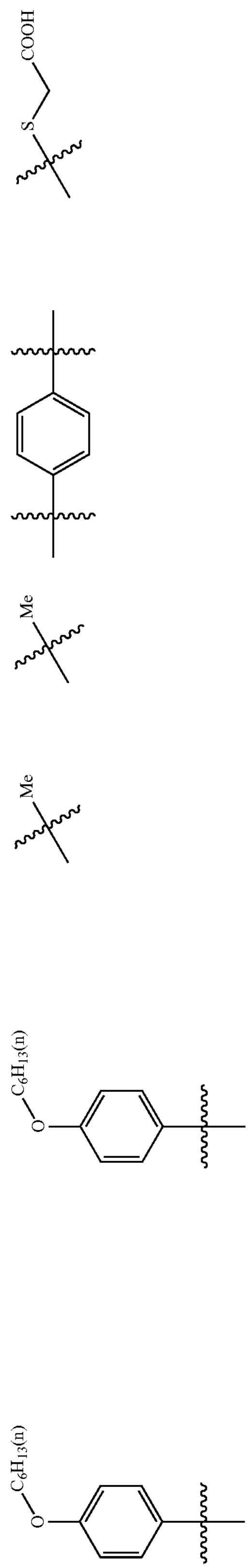
301
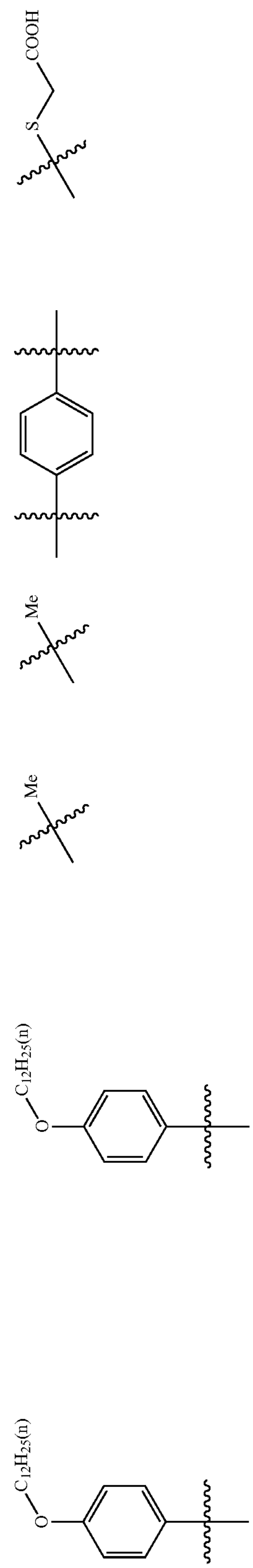
302

-continued
303
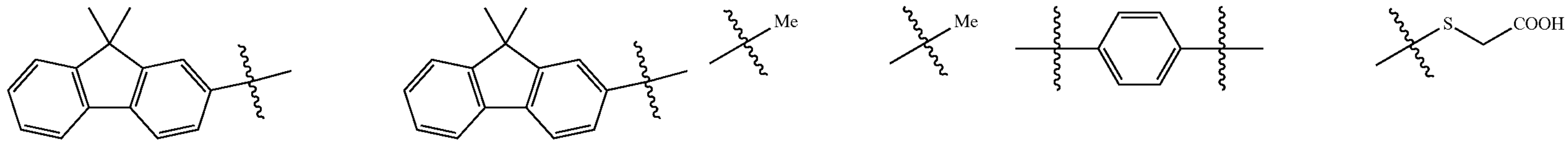
304
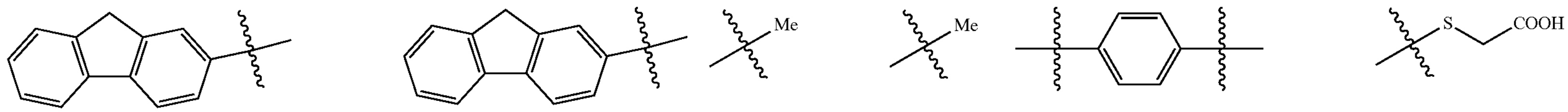
305
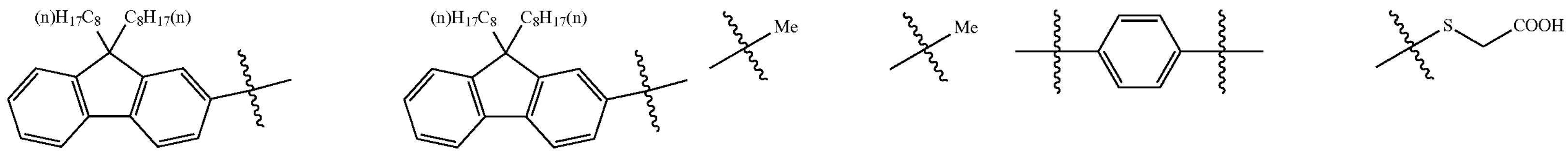
306
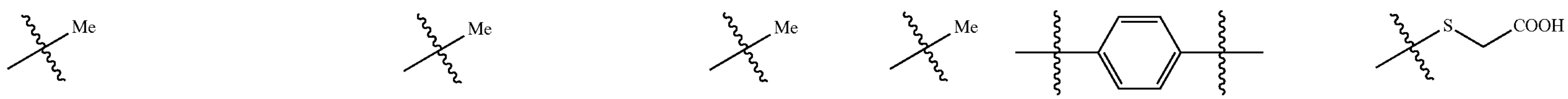
307
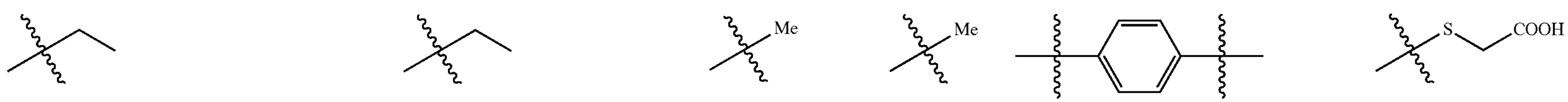
308
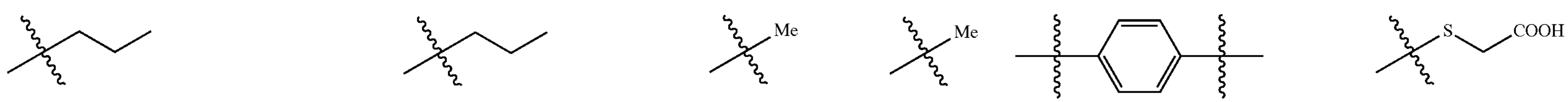
309
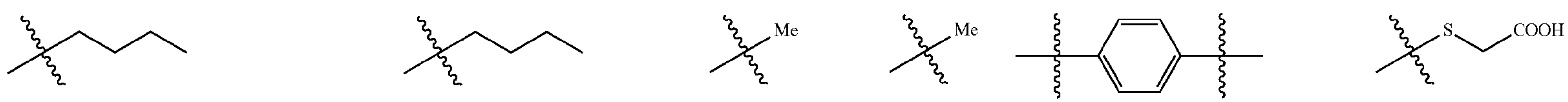
310
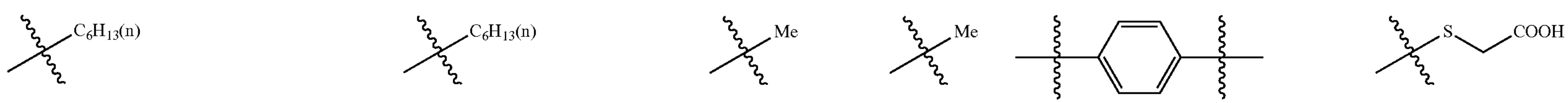
311
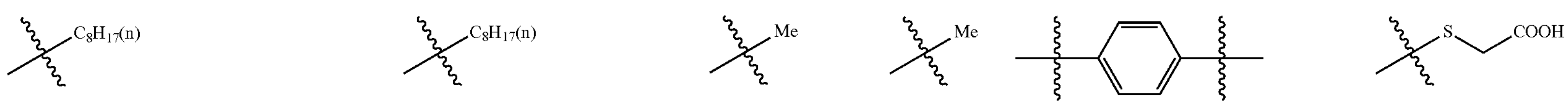

-continued
312 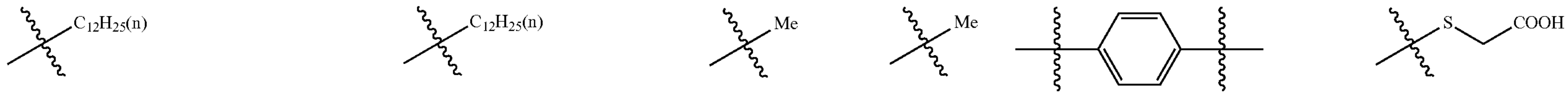
313 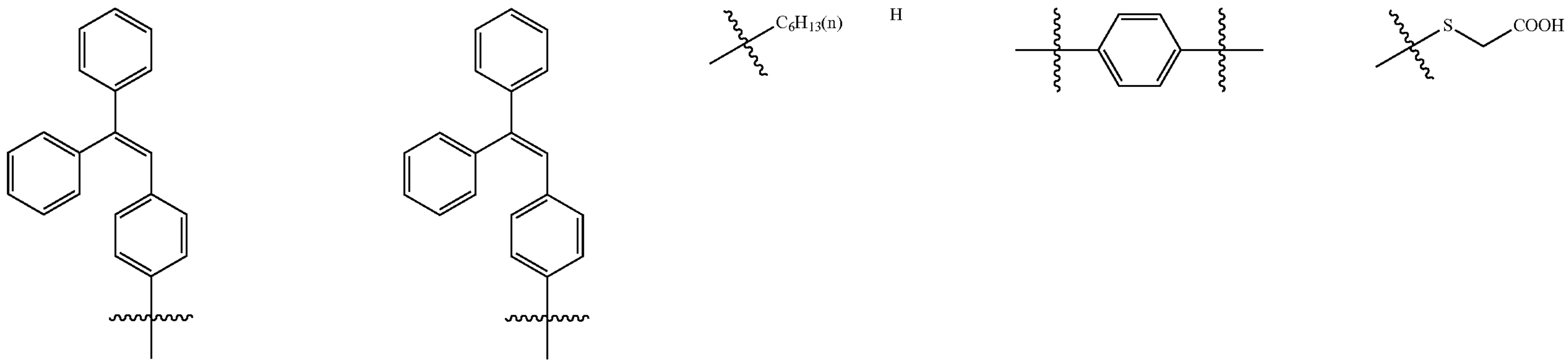
314 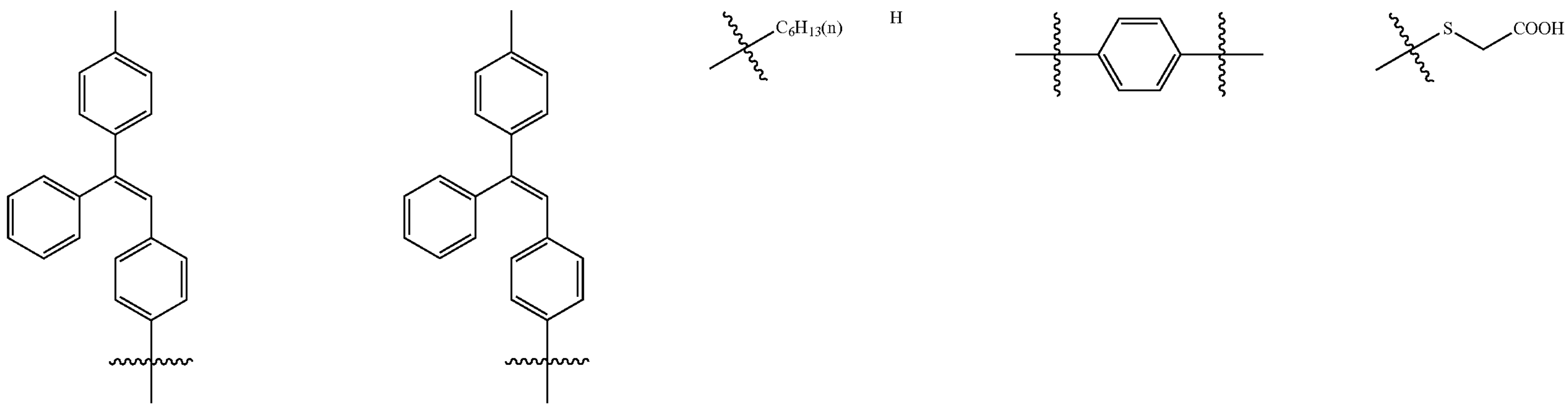

-continued
| | | | | | | |
|---|---|---|---|---|---|---|
| 315 | 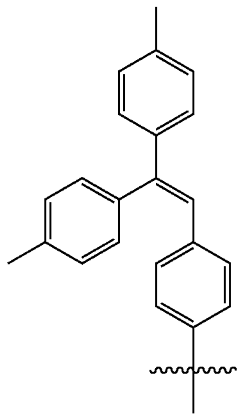 | 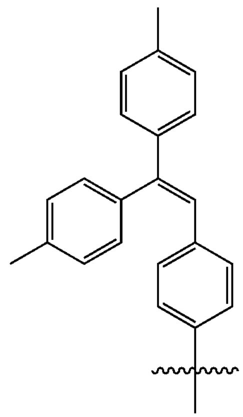 | 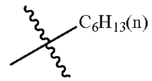 | H | 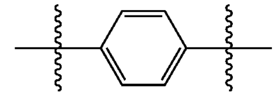 [SMILES: *c1ccc(*)cc1] | 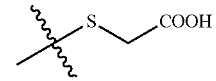 |
| 316 | 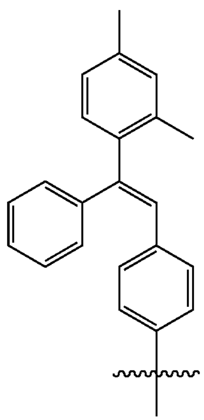 [SMILES: *c1ccc(/C=C(\c2ccccc2)c2ccc(C)cc2C)cc1] | 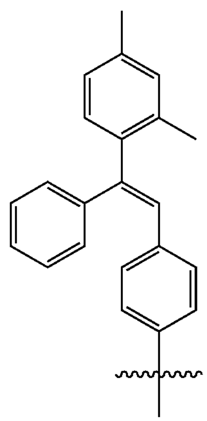 [SMILES: *c1ccc(/C=C(\c2ccccc2)c2ccc(C)cc2C)cc1] | 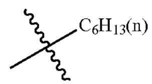 | H | 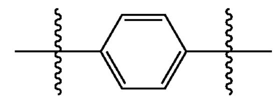 | 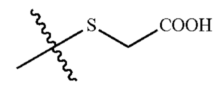 [SMILES: *SCC(=O)O] |

-continued
| | | | | | | |
|---|---|---|---|---|---|---|
| 317 | 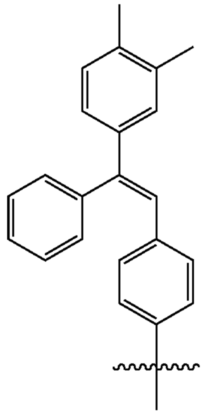 [SMILES: *c1ccc(/C=C(\c2ccccc2)c2ccc(C)c(C)c2)cc1] | 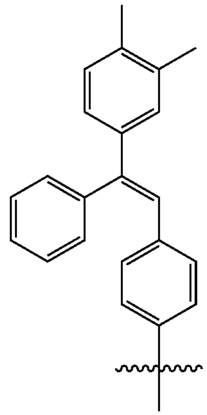 [SMILES: *c1ccc(/C=C(\c2ccccc2)c2ccc(C)c(C)c2)cc1] | 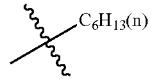 | H | 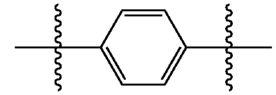 | 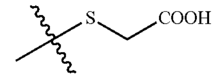 |
| 318 | 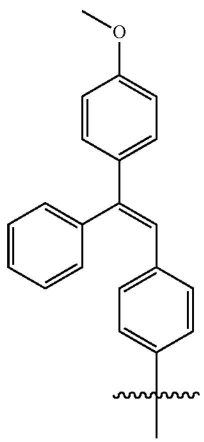 [SMILES: *c1ccc(/C=C(\c2ccccc2)c2ccc(OC)cc2)cc1] | 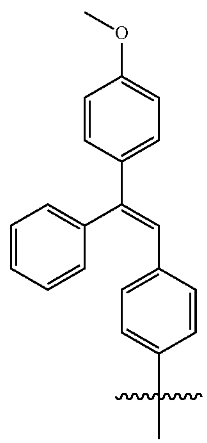 [SMILES: *c1ccc(/C=C(\c2ccccc2)c2ccc(OC)cc2)cc1] | 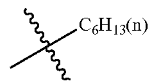 | H | 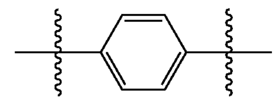 | 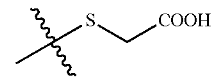 [SMILES: *SCC(=O)O] |

-continued
| | | | | | | |
|---|---|---|---|---|---|---|
| 319 | 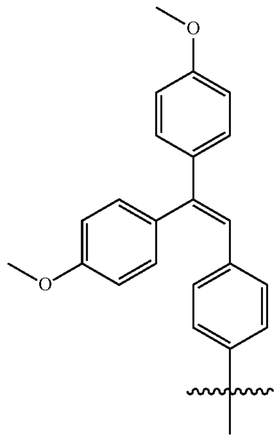 [SMILES: *c1ccc(C=C(c2ccc(OC)cc2)c2ccc(OC)cc2)cc1] | 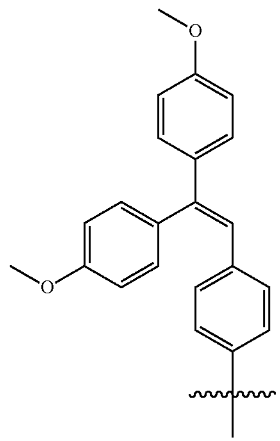 [SMILES: *c1ccc(C=C(c2ccc(OC)cc2)c2ccc(OC)cc2)cc1] | 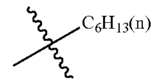 | H | 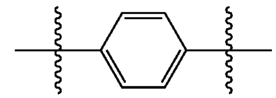 | 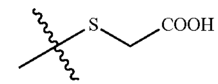 [SMILES: *SCC(=O)O] |
| 320 | 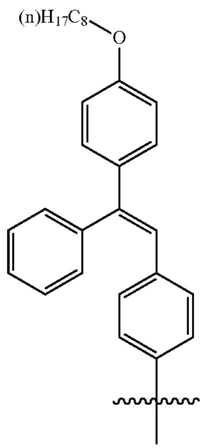 | 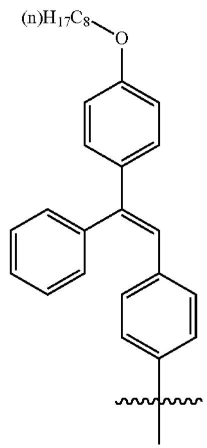 | 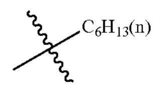 | H | 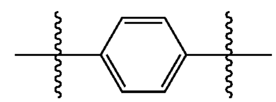 | 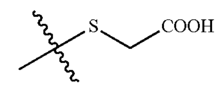 [SMILES: *SCC(=O)O] |

-continued
| | | | | | | |
|---|---|---|---|---|---|---|
| 321 | 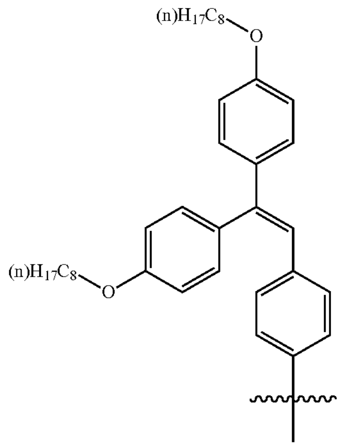 | 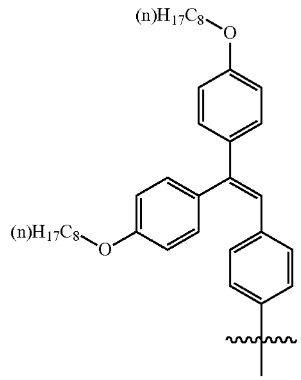 | 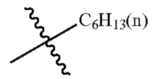 | H | 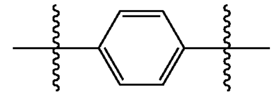 [SMILES: *c1ccc(*)cc1] | 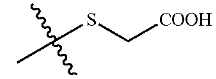 [SMILES: *SCC(=O)O] |
| 322 | 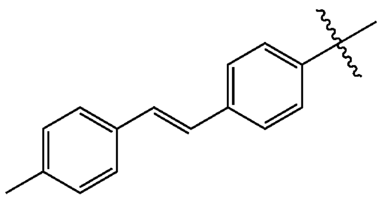 [SMILES: *c1ccc(/C=C/c2ccc(C)cc2)cc1] | 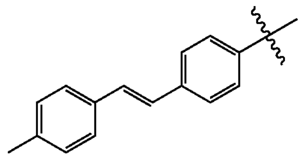 [SMILES: *c1ccc(/C=C/c2ccc(C)cc2)cc1] | 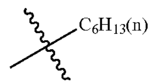 | H | 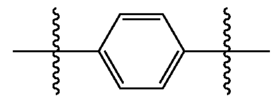 [SMILES: *c1ccc(*)cc1] | 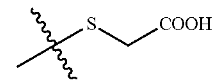 |
| 323 | 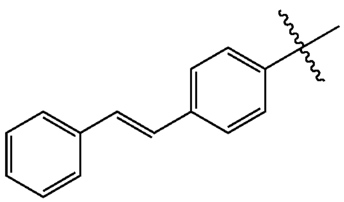 [SMILES: *c1ccc(/C=C/c2ccccc2)cc1] | 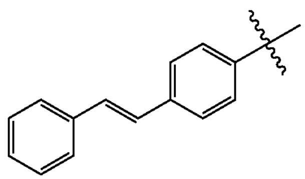 [SMILES: *c1ccc(/C=C/c2ccccc2)cc1] | 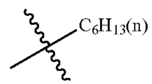 | H | 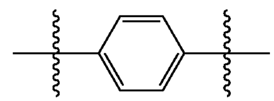 [SMILES: *c1ccc(*)cc1] | 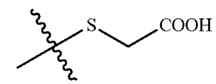 [SMILES: *SCC(=O)O] |
| 324 | 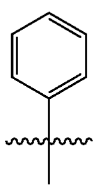 [SMILES: *c1ccccc1] | 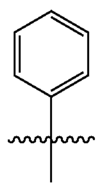 [SMILES: *c1ccccc1] | 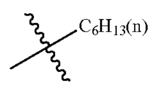 | H | 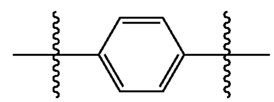 [SMILES: *c1ccc(*)cc1] | 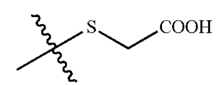 [SMILES: *SCC(=O)O] |

-continued
| | | | | | | |
|---|---|---|---|---|---|---|
| 325 | 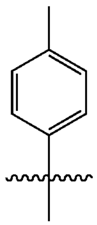 [SMILES: *c1ccc(C)cc1] | 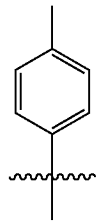 [SMILES: *c1ccc(C)cc1] | 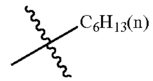 | H | 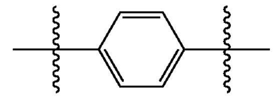 | 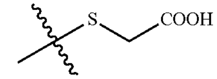 [SMILES: *SCC(=O)O] |
| 326 | 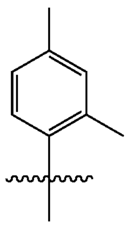 | 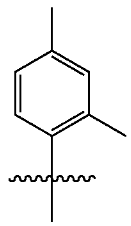 [SMILES: *c1ccc(C)cc1C] | 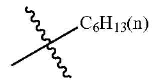 | H | 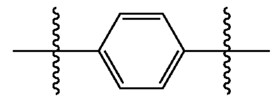 [SMILES: *c1ccc(*)cc1] | 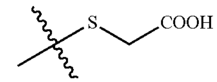 |
| 327 | 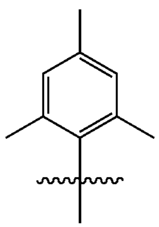 | 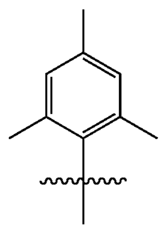 | 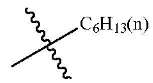 | H | 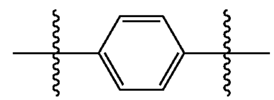 [SMILES: *c1ccc(*)cc1] | 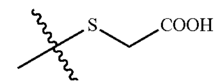 [SMILES: *SCC(=O)O] |
| 328 | 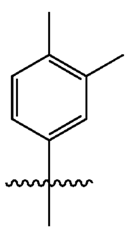 | 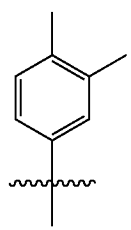 [SMILES: *c1ccc(C)c(C)c1] | 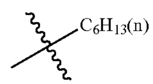 | H | 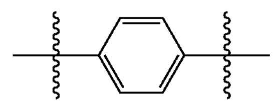 [SMILES: *c1ccc(*)cc1] | 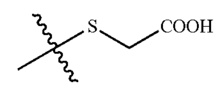 |

-continued
329
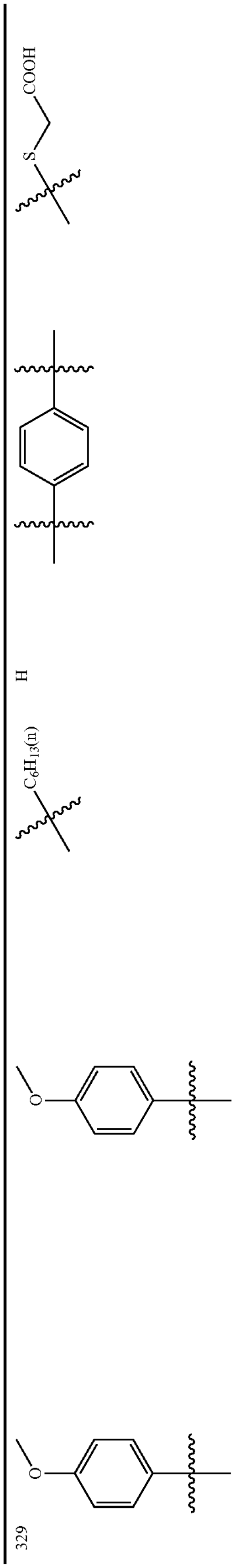
330
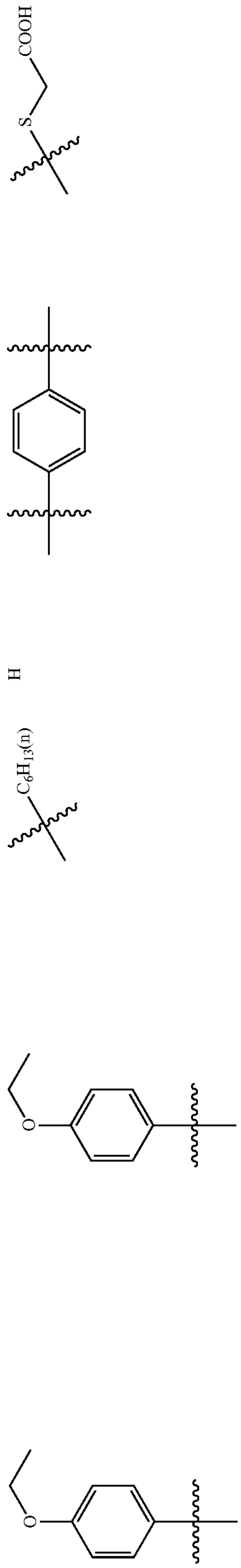
331
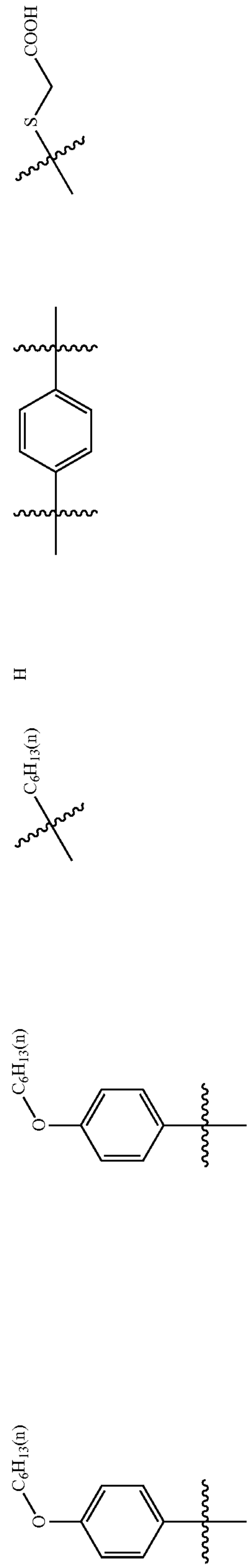
332
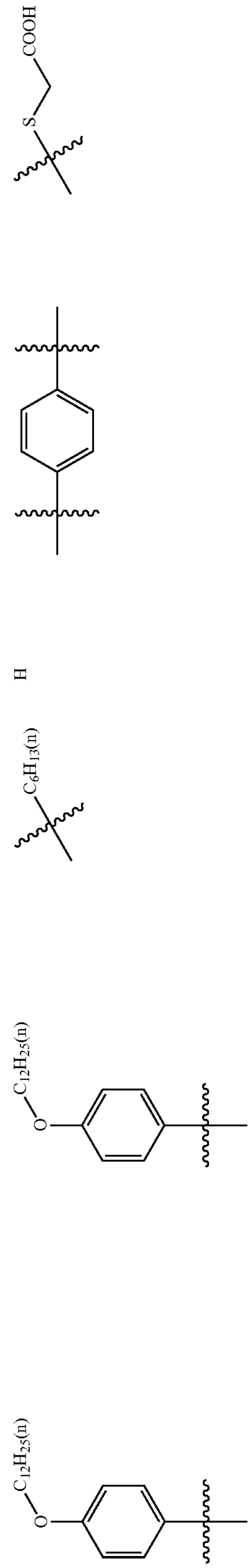

-continued
| | | | |
|---|---|---|---|
| 333 | 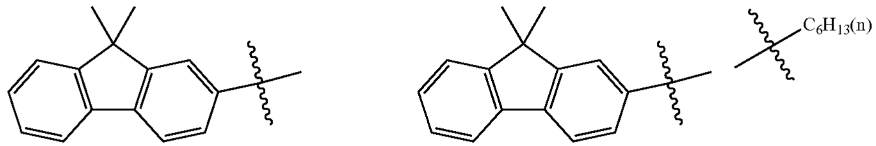 | H | 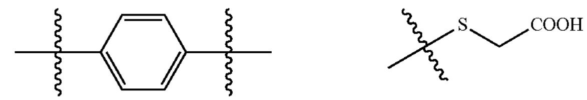 |
| 334 | 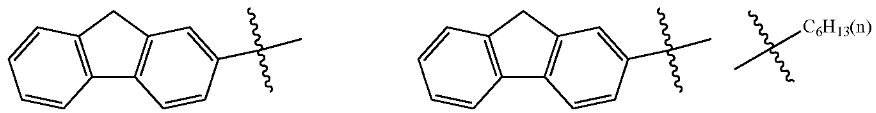 | H |  |
| 335 | 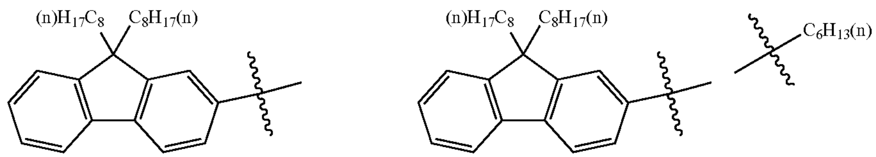 | H |  |
| 336 | 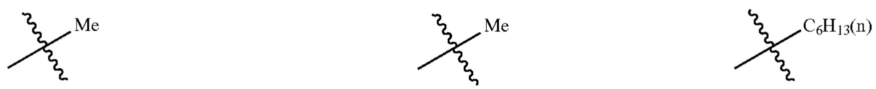 | H |  |
| 337 | 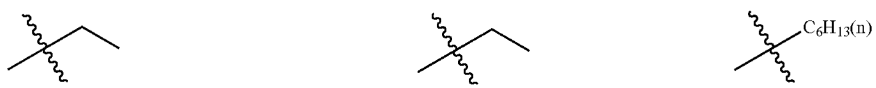 | H |  |
| 338 | 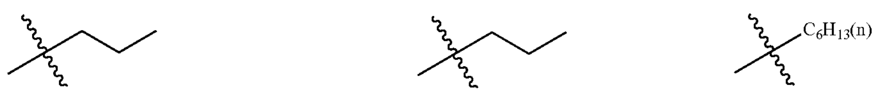 | H |  |
| 339 | 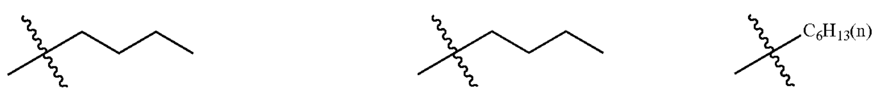 | H |  |
| 340 | 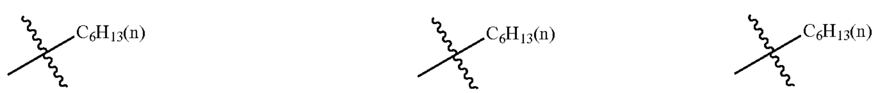 | H | 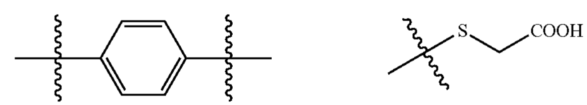 |
| 341 | 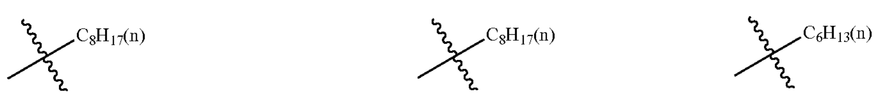 | H | 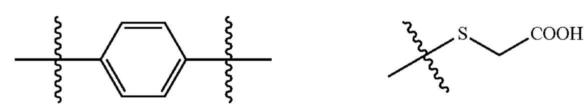 |

-continued
| | | | | | | |
|---|---|---|---|---|---|---|
| 342 | 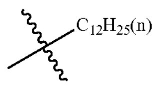 | 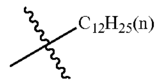 | 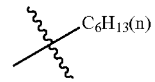 | H | 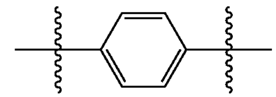 [SMILES: *c1ccc(*)cc1] | 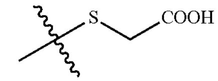 [SMILES: *SCC(=O)O] |
| 343 | 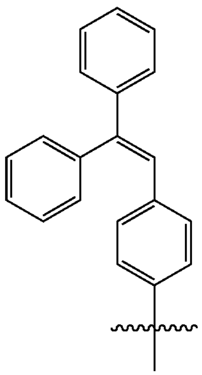 [SMILES: *c1ccc(C=C(c2ccccc2)c2ccccc2)cc1] | 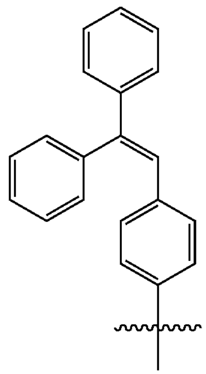 [SMILES: *c1ccc(C=C(c2ccccc2)c2ccccc2)cc1] | 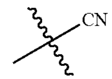 | H | 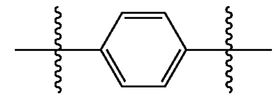 | 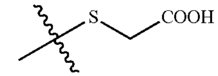 [SMILES: *SCC(=O)O] |
| 344 | 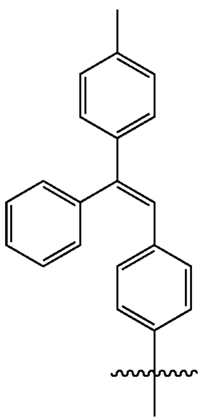 [SMILES: *c1ccc(/C=C(\c2ccccc2)c2ccc(C)cc2)cc1] | 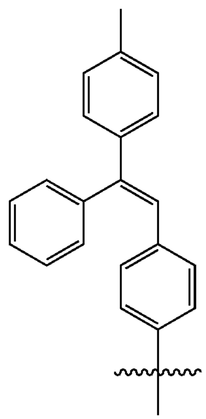 | 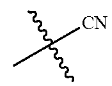 [SMILES: *C#N] | H | 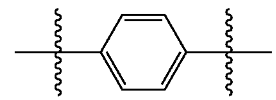 | 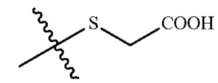 [SMILES: *SCC(=O)O] |

-continued
| | | | | | | |
|---|---|---|---|---|---|---|
| 345 | 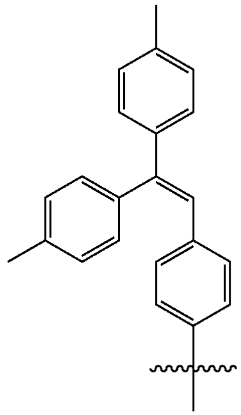 [SMILES: *c1ccc(C=C(c2ccc(C)cc2)c2ccc(C)cc2)cc1] | 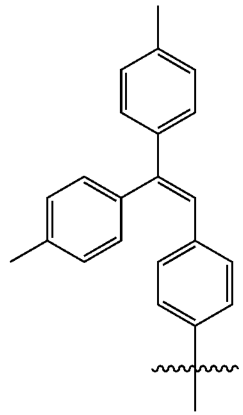 [SMILES: *c1ccc(C=C(c2ccc(C)cc2)c2ccc(C)cc2)cc1] | 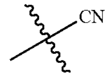 | H | 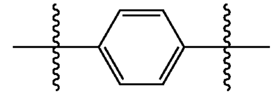 [SMILES: *c1ccc(*)cc1] | 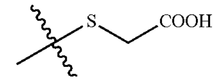 |
| 346 | 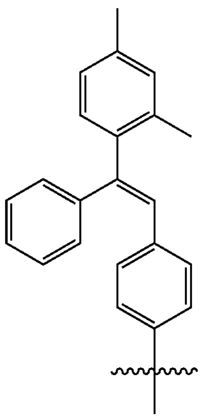 [SMILES: *c1ccc(/C=C(\c2ccccc2)c2ccc(C)cc2C)cc1] | 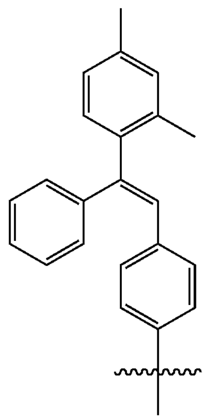 [SMILES: *c1ccc(/C=C(\c2ccccc2)c2ccc(C)cc2C)cc1] | 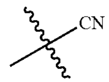 | H | 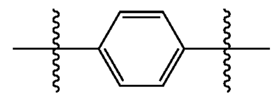 | 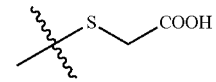 [SMILES: *SCC(=O)O] |

-continued
| | | | | | | |
|---|---|---|---|---|---|---|
| 347 | 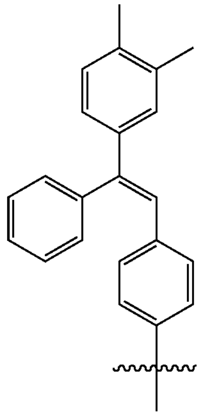 [SMILES: *c1ccc(/C=C(\c2ccccc2)c2ccc(C)c(C)c2)cc1] | 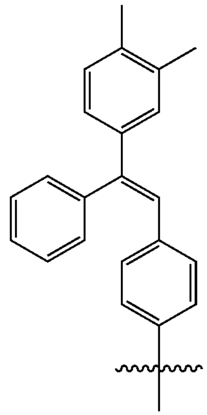 [SMILES: *c1ccc(/C=C(\c2ccccc2)c2ccc(C)c(C)c2)cc1] | 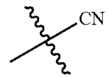 | H | 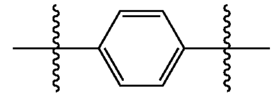 | 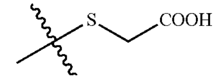 [SMILES: *SCC(=O)O] |
| 348 | 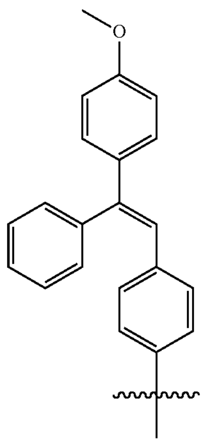 [SMILES: *c1ccc(/C=C(\c2ccccc2)c2ccc(OC)cc2)cc1] | 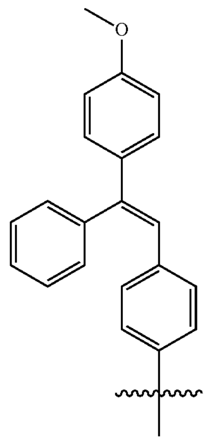 [SMILES: *c1ccc(/C=C(\c2ccccc2)c2ccc(OC)cc2)cc1] | 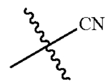 | H | 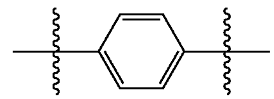 [SMILES: *c1ccc(*)cc1] | 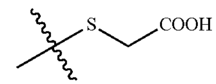 |

-continued
| | | | | | | |
|---|---|---|---|---|---|---|
| 349 | 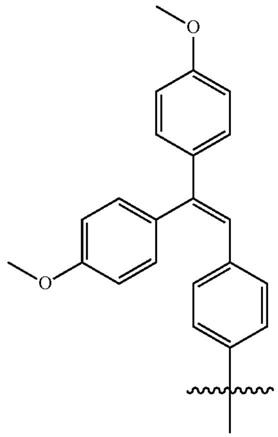 [SMILES: *c1ccc(C=C(c2ccc(OC)cc2)c2ccc(OC)cc2)cc1] | 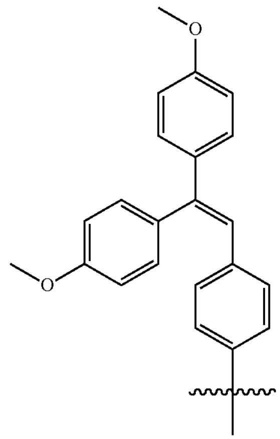 [SMILES: *c1ccc(C=C(c2ccc(OC)cc2)c2ccc(OC)cc2)cc1] | 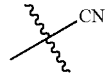 | H | 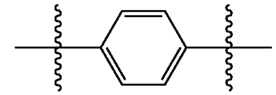 [SMILES: *c1ccc(*)cc1] | 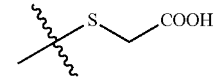 |
| 350 | 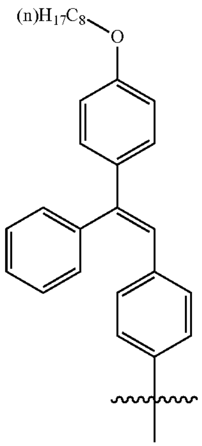 | 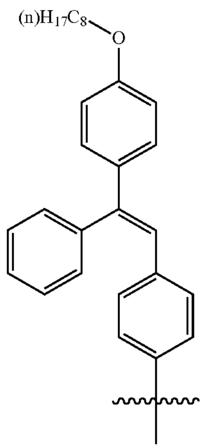 | 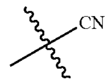 [SMILES: *C#N] | H | 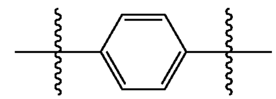 [SMILES: *c1ccc(*)cc1] | 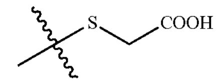 [SMILES: *SCC(=O)O] |

-continued
| | | | | | | |
|---|---|---|---|---|---|---|
| 351 | 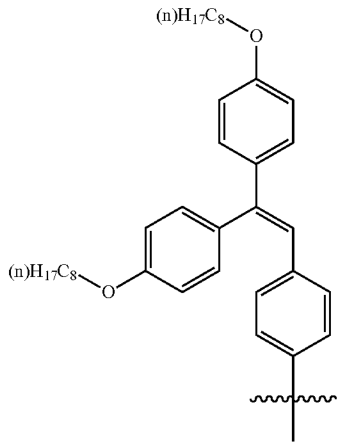 | 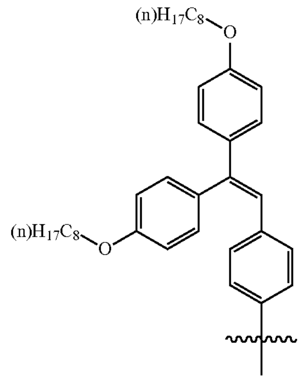 | 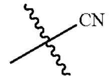 | H | 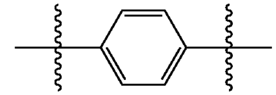 | 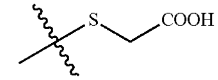 [SMILES: *SCC(=O)O] |
| 352 | 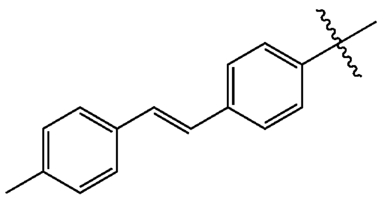 [SMILES: *c1ccc(/C=C/c2ccc(C)cc2)cc1] | 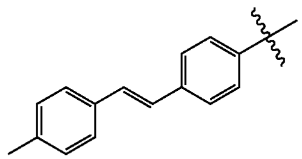 [SMILES: *c1ccc(/C=C/c2ccc(C)cc2)cc1] | 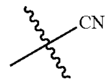 | H | 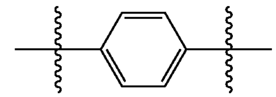 | 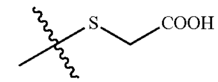 [SMILES: *SCC(=O)O] |
| 353 | 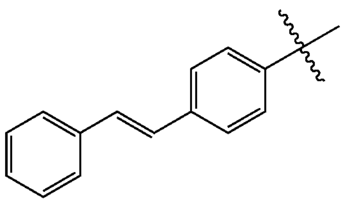 [SMILES: *c1ccc(/C=C/c2ccccc2)cc1] | 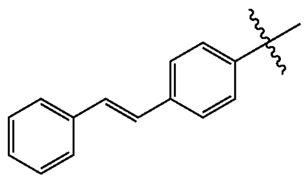 [SMILES: *c1ccc(/C=C/c2ccccc2)cc1] | 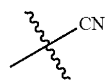 [SMILES: *C#N] | H | 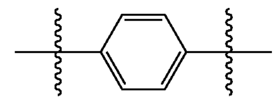 [SMILES: *c1ccc(*)cc1] | 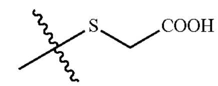 [SMILES: *SCC(=O)O] |
| 354 | 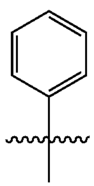 [SMILES: *c1ccccc1] | 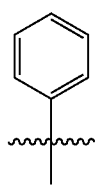 [SMILES: *c1ccccc1] | 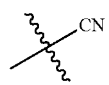 | H | 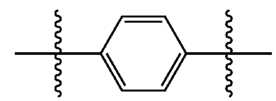 | 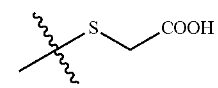 [SMILES: *SCC(=O)O] |

-continued
| | | | | | | |
|---|---|---|---|---|---|---|
| 355 | 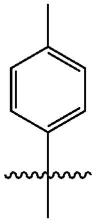 [SMILES: *c1ccc(C)cc1] | 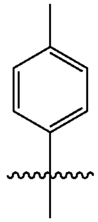 [SMILES: *c1ccc(C)cc1] | 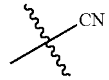 | H | 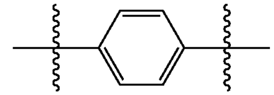 [SMILES: *c1ccc(*)cc1] | 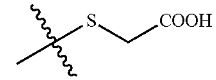 |
| 356 | 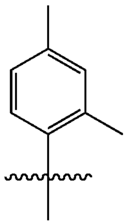 [SMILES: *c1ccc(C)cc1C] | 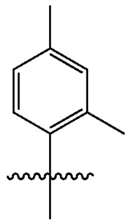 [SMILES: *c1ccc(C)cc1C] | 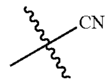 | H | 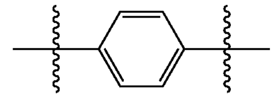 [SMILES: *c1ccc(*)cc1] | 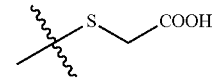 |
| 357 | 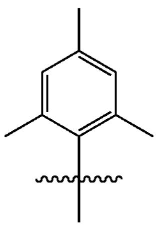 | 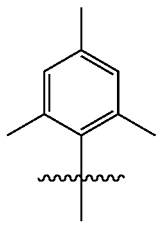 | 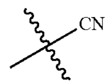 | H | 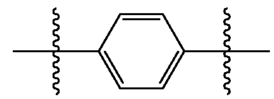 [SMILES: *c1ccc(*)cc1] | 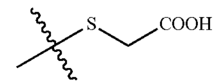 |
| 358 | 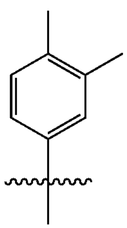 | 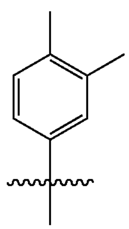 [SMILES: *c1ccc(C)c(C)c1] | 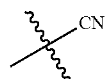 | H | 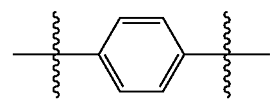 | 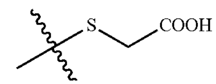 |

-continued
| | | | | | | |
|---|---|---|---|---|---|---|
| 359 | 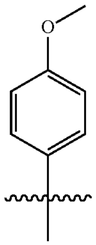 [SMILES: *c1ccc(OC)cc1] | 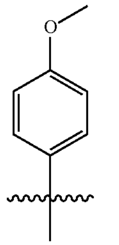 | 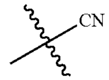 | H | 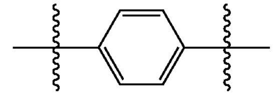 | 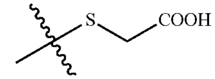 [SMILES: *SCC(=O)O] |
| 360 | 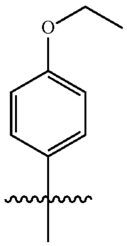 | 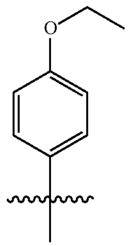 [SMILES: *c1ccc(OCC)cc1] | 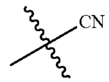 [SMILES: *C#N] | H | 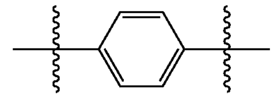 [SMILES: *c1ccc(*)cc1] | 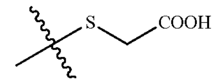 |
| 361 | 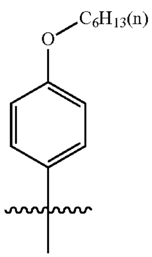 | 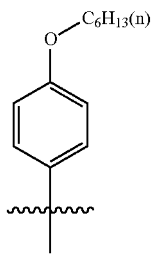 | 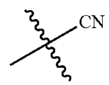 | H | 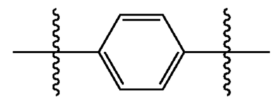 [SMILES: *c1ccc(*)cc1] | 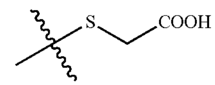 |
| 362 | 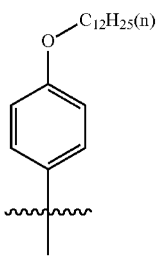 | 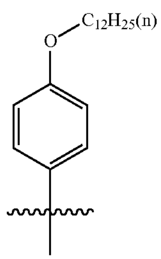 | 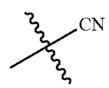 [SMILES: *C#N] | H | 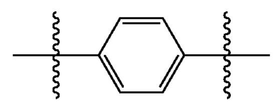 [SMILES: *c1ccc(*)cc1] | 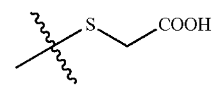 [SMILES: *SCC(=O)O] |

-continued
| | | | |
|---|---|---|---|
| 363 | 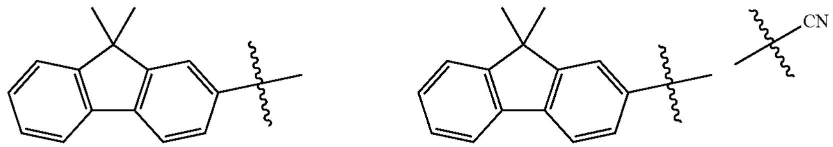 | H |  |
| 364 | 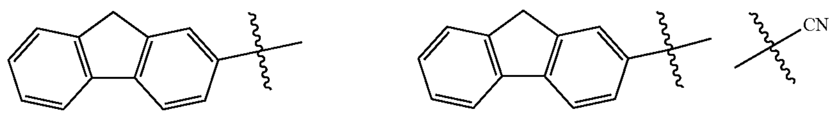 | H |  |
| 365 | 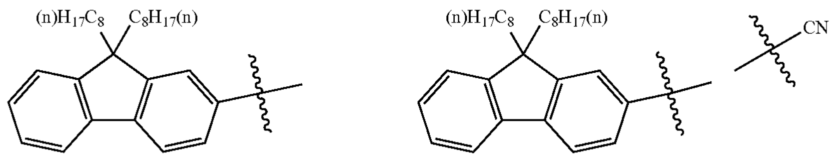 | H | 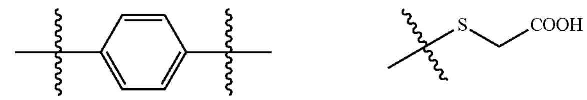 |
| 366 | 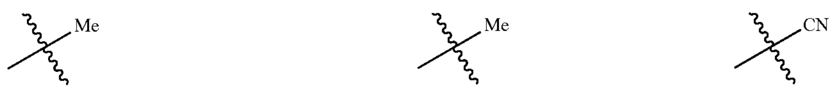 | H | 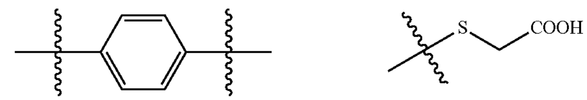 |
| 367 | 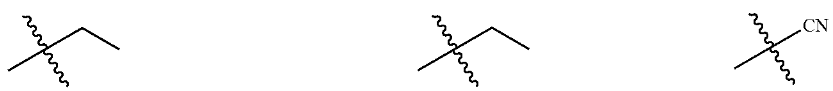 | H |  |
| 368 | 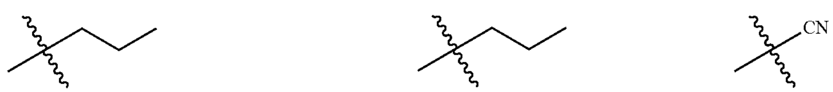 | H |  |
| 369 | 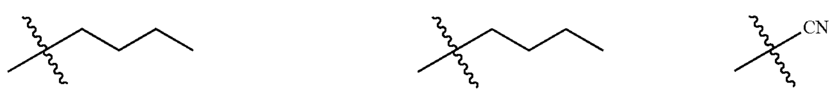 | H | 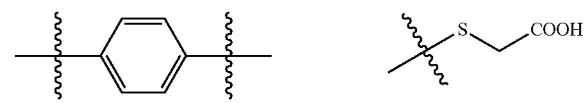 |
| 370 | 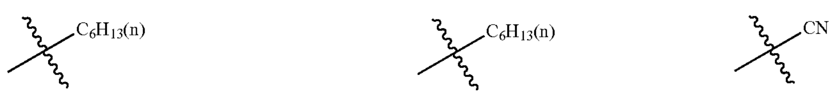 | H | 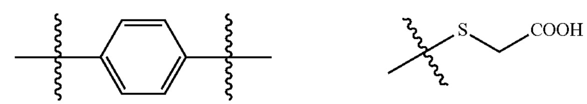 |
| 371 | 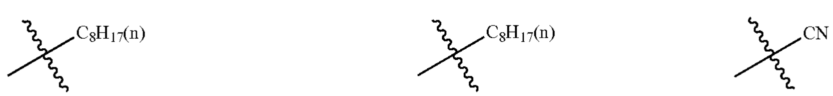 | H | 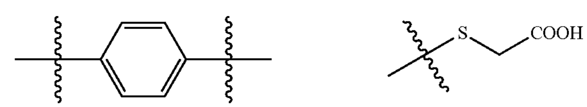 |

-continued
| | | | | | | |
|---|---|---|---|---|---|---|
| 372 | 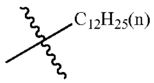 | 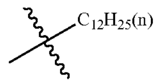 | 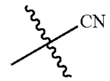 [SMILES: *C#N] | H | 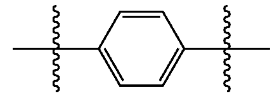 | 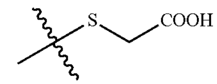 [SMILES: *SCC(=O)O] |
| 373 | 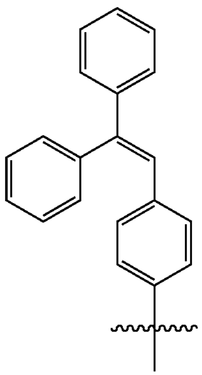 [SMILES: *c1ccc(C=C(c2ccccc2)c2ccccc2)cc1] | 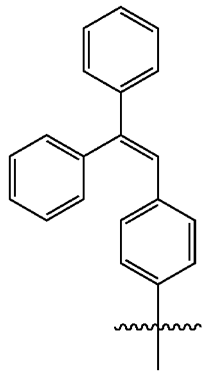 [SMILES: *c1ccc(C=C(c2ccccc2)c2ccccc2)cc1] | H | H | 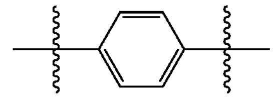 | 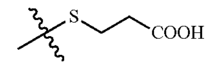 |
| 374 | 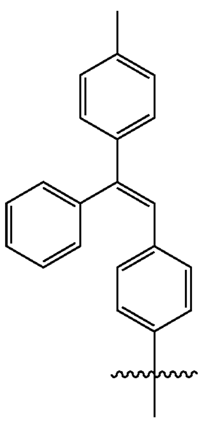 [SMILES: *c1ccc(/C=C(\c2ccccc2)c2ccc(C)cc2)cc1] | 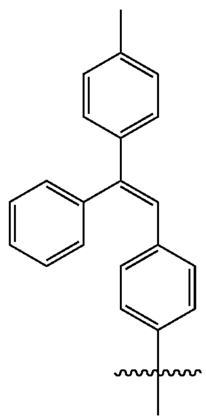 | H | H | 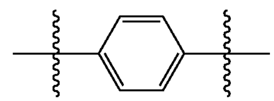 | 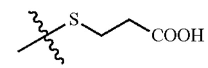 [SMILES: *SCCC(=O)O] |

-continued
| | | | | | | |
|---|---|---|---|---|---|---|
| 375 | 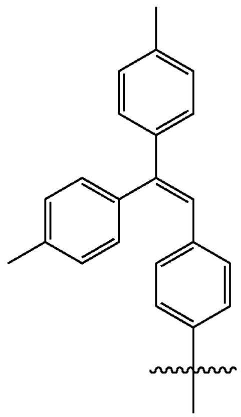 [SMILES: *c1ccc(C=C(c2ccc(C)cc2)c2ccc(C)cc2)cc1] | 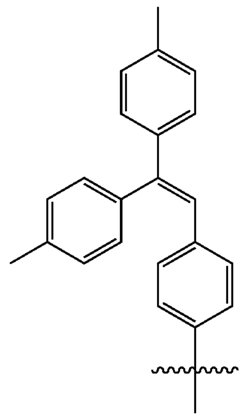 [SMILES: *c1ccc(C=C(c2ccc(C)cc2)c2ccc(C)cc2)cc1] | H | H | 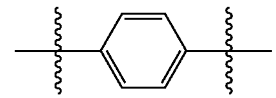 [SMILES: *c1ccc(*)cc1] | 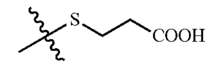 |
| 376 | 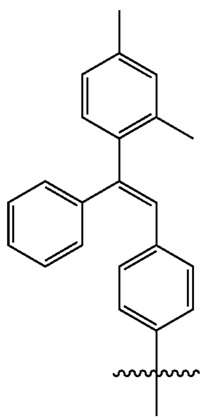 [SMILES: *c1ccc(/C=C(\c2ccccc2)c2ccc(C)cc2C)cc1] | 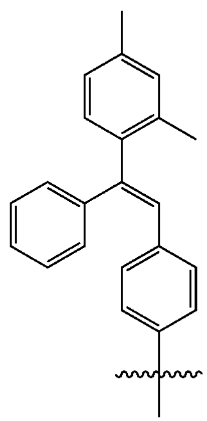 [SMILES: *c1ccc(/C=C(\c2ccccc2)c2ccc(C)cc2C)cc1] | H | H | 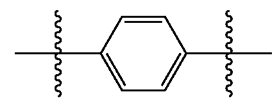 [SMILES: *c1ccc(*)cc1] | 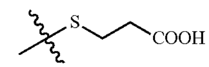 [SMILES: *SCCC(=O)O] |

-continued
| | | | | | | |
|---|---|---|---|---|---|---|
| 377 | 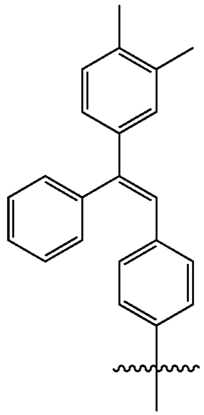 [SMILES: *c1ccc(/C=C(\c2ccccc2)c2ccc(C)c(C)c2)cc1] | 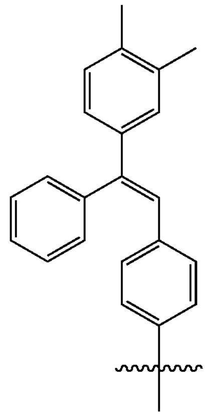 [SMILES: *c1ccc(/C=C(\c2ccccc2)c2ccc(C)c(C)c2)cc1] | H | H | 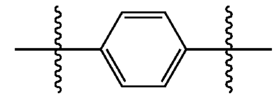 [SMILES: *c1ccc(*)cc1] | 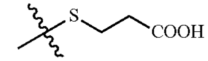 [SMILES: *SCCC(=O)O] |
| 378 | 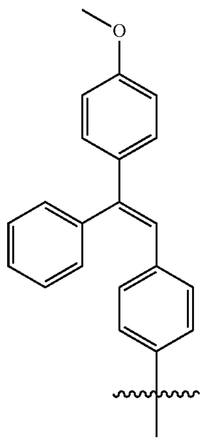 [SMILES: *c1ccc(/C=C(\c2ccccc2)c2ccc(OC)cc2)cc1] | 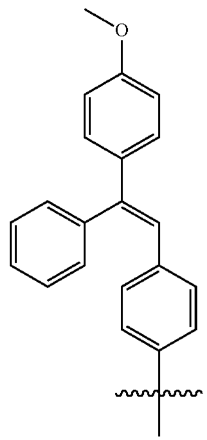 [SMILES: *c1ccc(/C=C(\c2ccccc2)c2ccc(OC)cc2)cc1] | H | H | 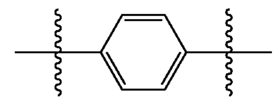 | 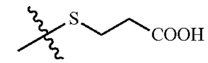 [SMILES: *SCCC(=O)O] |

-continued
| | | | | | | |
|---|---|---|---|---|---|---|
| 379 | 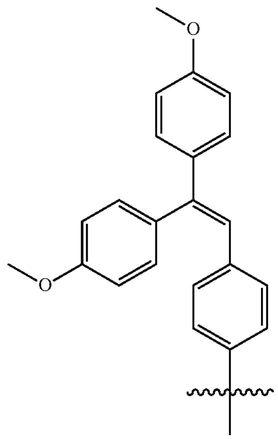 [SMILES: *c1ccc(C=C(c2ccc(OC)cc2)c2ccc(OC)cc2)cc1] | 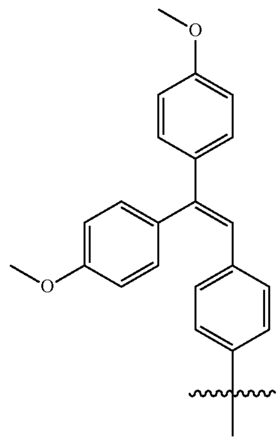 [SMILES: *c1ccc(C=C(c2ccc(OC)cc2)c2ccc(OC)cc2)cc1] | H | H | 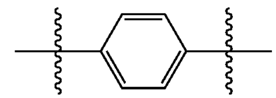 [SMILES: *c1ccc(*)cc1] | 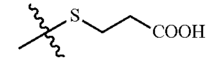 |
| 380 | 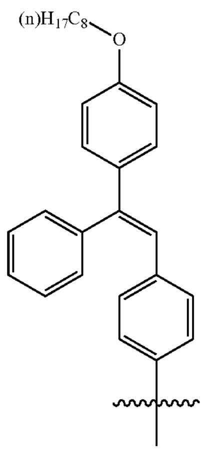 | 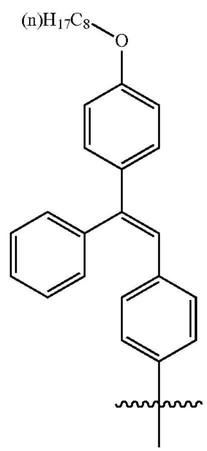 | H | H | 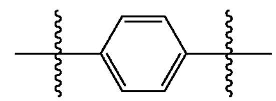 | 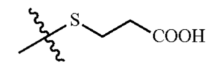 [SMILES: *SCCC(=O)O] |

-continued
| | | | | | | |
|---|---|---|---|---|---|---|
| 381 | 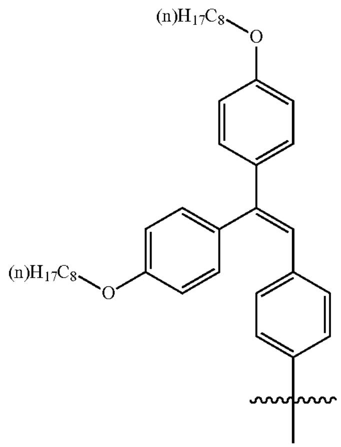 | 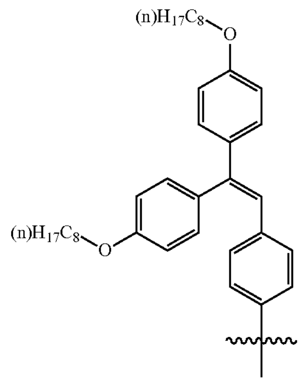 | H | H | 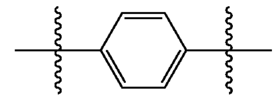 | 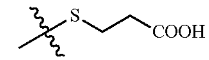 |
| 382 | 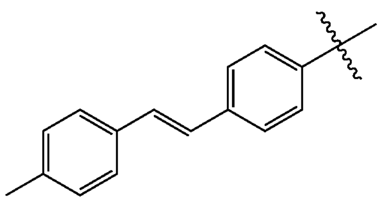 [SMILES: *c1ccc(/C=C/c2ccc(C)cc2)cc1] | 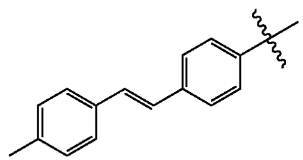 [SMILES: *c1ccc(/C=C/c2ccc(C)cc2)cc1] | H | H | 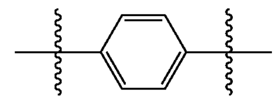 [SMILES: *c1ccc(*)cc1] | 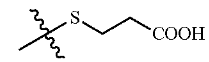 [SMILES: *SCCC(=O)O] |
| 383 | 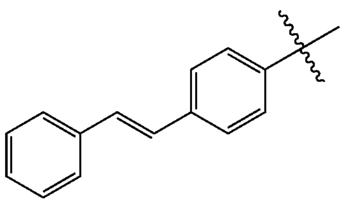 [SMILES: *c1ccc(/C=C/c2ccccc2)cc1] | 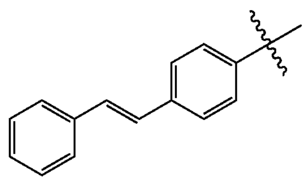 [SMILES: *c1ccc(/C=C/c2ccccc2)cc1] | H | H | 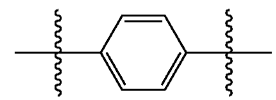 [SMILES: *c1ccc(*)cc1] | 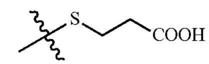 |
| 384 | 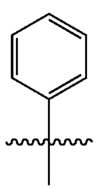 | 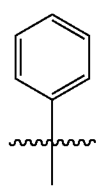 [SMILES: *c1ccccc1] | H | H | 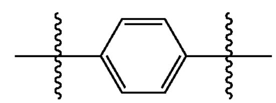 [SMILES: *c1ccc(*)cc1] | 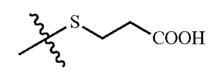 [SMILES: *SCCC(=O)O] |

-continued
| | | | | | | |
|---|---|---|---|---|---|---|
| 385 | 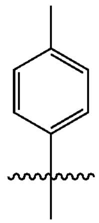 [SMILES: *c1ccc(C)cc1] | 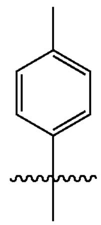 [SMILES: *c1ccc(C)cc1] | H | H | 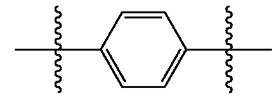 | 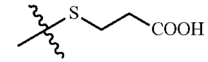 |
| 386 | 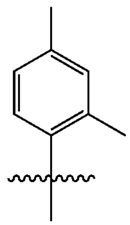 [SMILES: *c1ccc(C)cc1C] | 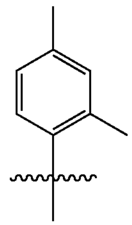 [SMILES: *c1ccc(C)cc1C] | H | H | 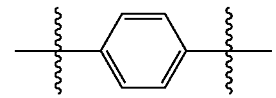 [SMILES: *c1ccc(*)cc1] | 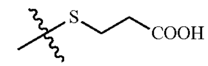 [SMILES: *SCCC(=O)O] |
| 387 | 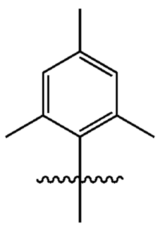 | 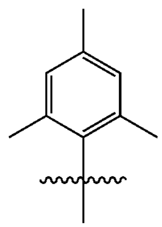 | H | H | 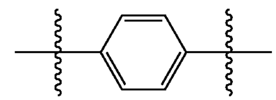 | 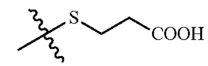 [SMILES: *SCCC(=O)O] |
| 388 | 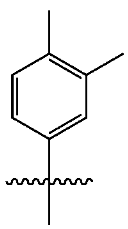 | 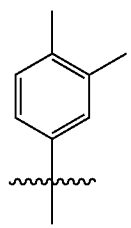 [SMILES: *c1ccc(C)c(C)c1] | H | H | 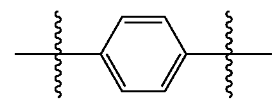 | 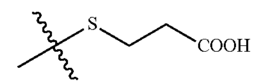 [SMILES: *SCCC(=O)O] |

-continued
| | | | | | | |
|---|---|---|---|---|---|---|
| 389 | 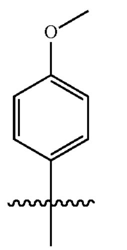 [SMILES: *c1ccc(OC)cc1] | 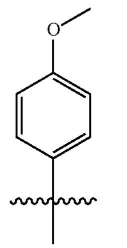 | H | H | 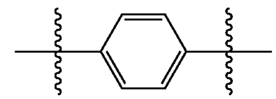 | 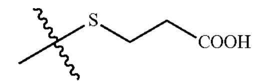 [SMILES: *SCCC(=O)O] |
| 390 | 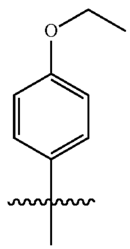 [SMILES: *c1ccc(OCC)cc1] | 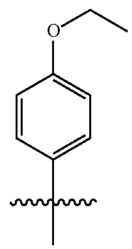 [SMILES: *c1ccc(OCC)cc1] | H | H | 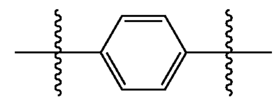 | 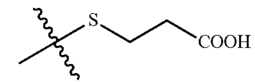 [SMILES: *SCCC(=O)O] |
| 391 | 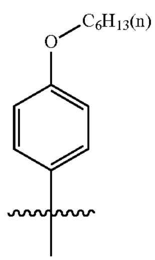 | 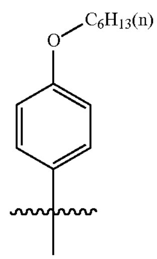 | H | H | 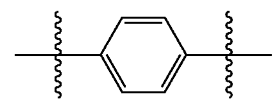 [SMILES: *c1ccc(*)cc1] | 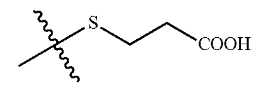 [SMILES: *SCCC(=O)O] |
| 392 | 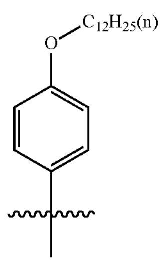 | 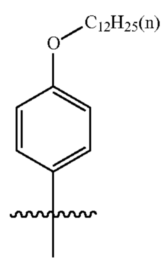 | H | H | 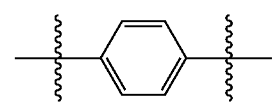 [SMILES: *c1ccc(*)cc1] | 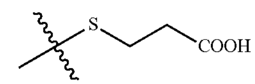 [SMILES: *SCCC(=O)O] |

-continued
| | | | | | | |
|---|---|---|---|---|---|---|
| 393 | 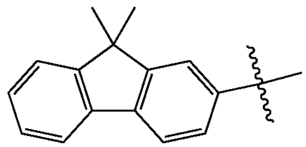 [SMILES: *c1ccc2c(c1)C(C)(C)c1ccccc1-2] | 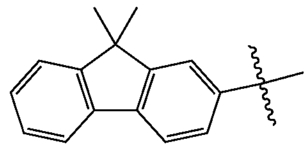 [SMILES: *c1ccc2c(c1)C(C)(C)c1ccccc1-2] | H | H | 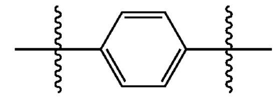 [SMILES: *c1ccc(*)cc1] | 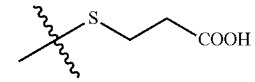 [SMILES: *SCCC(=O)O] |
| 394 | 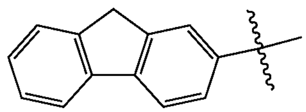 [SMILES: *c1ccc2c(c1)Cc1ccccc1-2] | 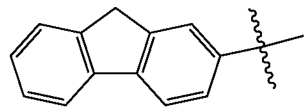 [SMILES: *c1ccc2c(c1)Cc1ccccc1-2] | H | H | 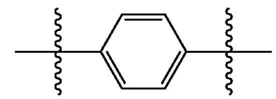 [SMILES: *c1ccc(*)cc1] | 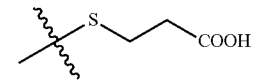 |
| 395 | 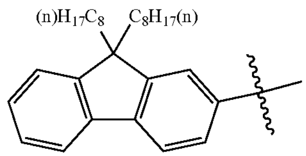 | 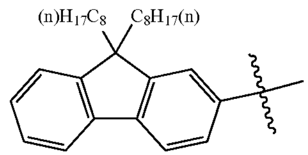 | H | H | 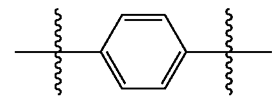 | 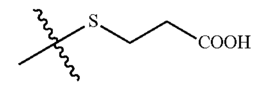 |
| 396 |  |  | H | H | 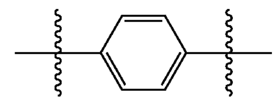 | 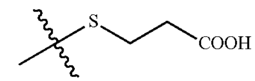 [SMILES: *SCCC(=O)O] |
| 397 | 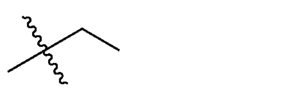 [SMILES: *CC] | 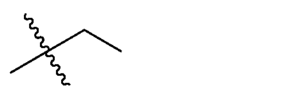 [SMILES: *CC] | H | H | 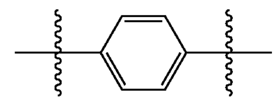 [SMILES: *c1ccc(*)cc1] | 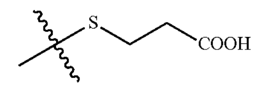 [SMILES: *SCCC(=O)O] |
| 398 | 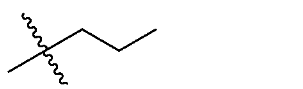 [SMILES: *CCC] | 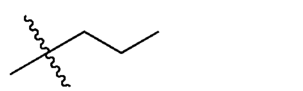 [SMILES: *CCC] | H | H | 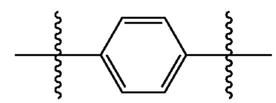 [SMILES: *c1ccc(*)cc1] | 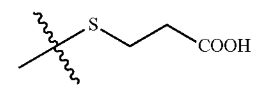 [SMILES: *SCCC(=O)O] |
| 399 | 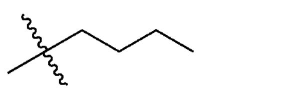 [SMILES: *CCCC] | 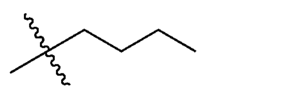 [SMILES: *CCCC] | H | H | 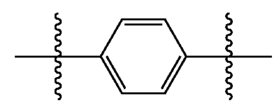 | 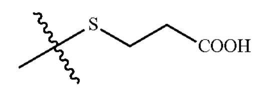 [SMILES: *SCCC(=O)O] |
| 400 | 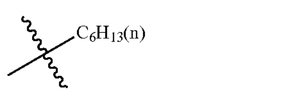 | 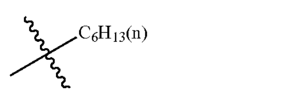 | H | H | 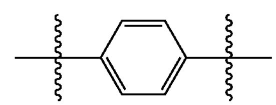 [SMILES: *c1ccc(*)cc1] | 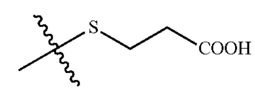 [SMILES: *SCCC(=O)O] |
| 401 | 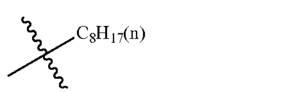 | 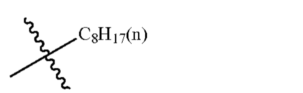 | H | H | 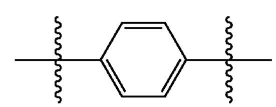 [SMILES: *c1ccc(*)cc1] | 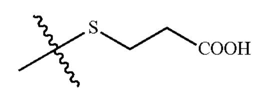 |

-continued
| | | | | | | |
|---|---|---|---|---|---|---|
| 402 | 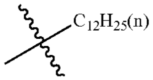 | 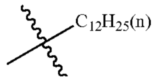 | H | H | 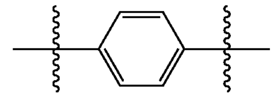 [SMILES: *c1ccc(*)cc1] | 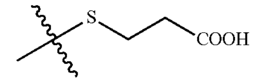 [SMILES: *SCCC(=O)O] |
| 403 | 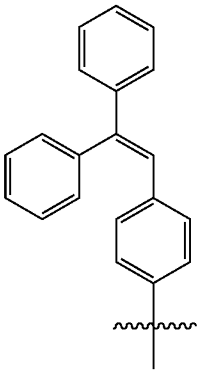 [SMILES: *c1ccc(C=C(c2ccccc2)c2ccccc2)cc1] | 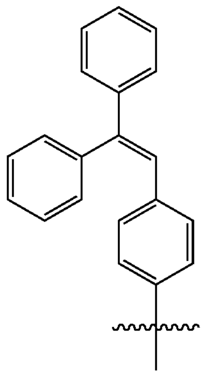 [SMILES: *c1ccc(C=C(c2ccccc2)c2ccccc2)cc1] | H | H | 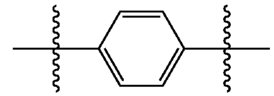 [SMILES: *c1ccc(*)cc1] | 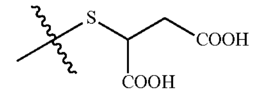 [SMILES: *SC(CC(=O)O)C(=O)O] |
| 404 | 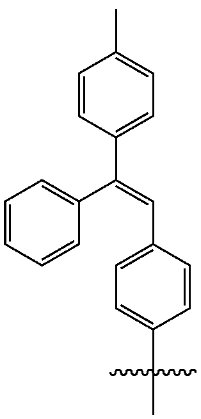 [SMILES: *c1ccc(/C=C(\c2ccccc2)c2ccc(C)cc2)cc1] | 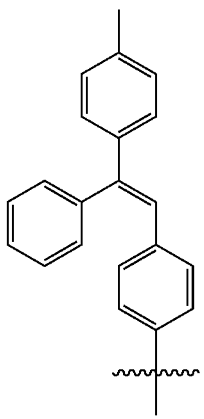 | H | H | 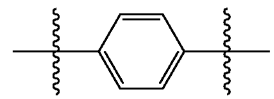 | 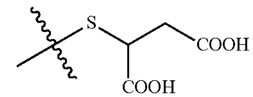 [SMILES: *SC(CC(=O)O)C(=O)O] |

-continued
| | | | | | | |
|---|---|---|---|---|---|---|
| 405 | 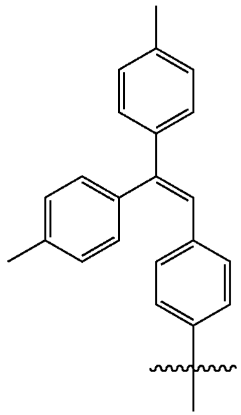 [SMILES: *c1ccc(C=C(c2ccc(C)cc2)c2ccc(C)cc2)cc1] | 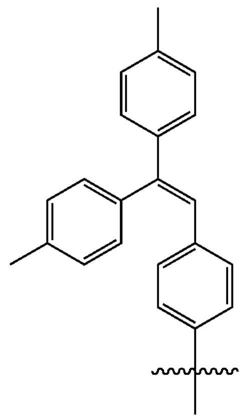 [SMILES: *c1ccc(C=C(c2ccc(C)cc2)c2ccc(C)cc2)cc1] | H | H | 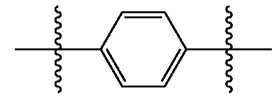 [SMILES: *c1ccc(*)cc1] | 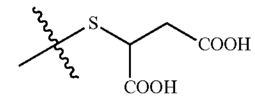 [SMILES: *SC(CC(=O)O)C(=O)O] |
| 406 | 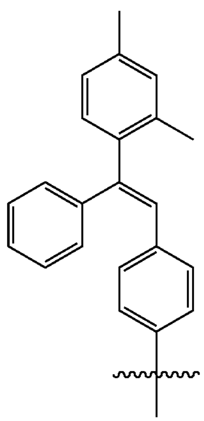 [SMILES: *c1ccc(/C=C(\c2ccccc2)c2ccc(C)cc2C)cc1] | 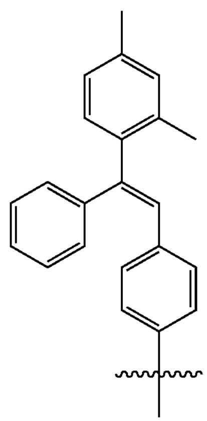 [SMILES: *c1ccc(/C=C(\c2ccccc2)c2ccc(C)cc2C)cc1] | H | H | 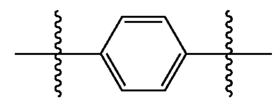 | 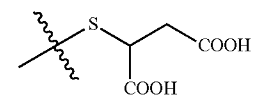 [SMILES: *SC(CC(=O)O)C(=O)O] |

-continued
| | | | | | | |
|---|---|---|---|---|---|---|
| 407 | 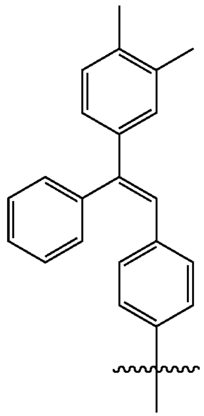 [SMILES: *c1ccc(/C=C(\c2ccccc2)c2ccc(C)c(C)c2)cc1] | 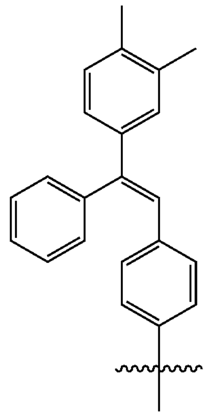 [SMILES: *c1ccc(/C=C(\c2ccccc2)c2ccc(C)c(C)c2)cc1] | H | H | 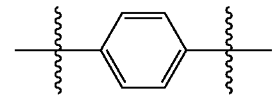 | 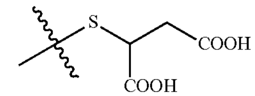 |
| 408 | 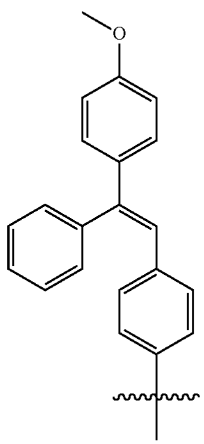 [SMILES: *c1ccc(/C=C(\c2ccccc2)c2ccc(OC)cc2)cc1] | 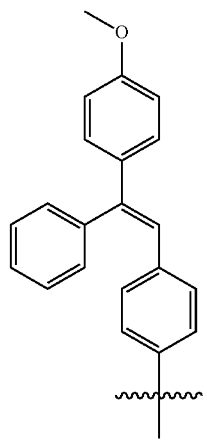 [SMILES: *c1ccc(/C=C(\c2ccccc2)c2ccc(OC)cc2)cc1] | H | H | 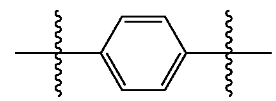 [SMILES: *c1ccc(*)cc1] | 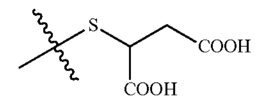 [SMILES: *SC(CC(=O)O)C(=O)O] |

-continued
| | | | | | | |
|---|---|---|---|---|---|---|
| 409 | 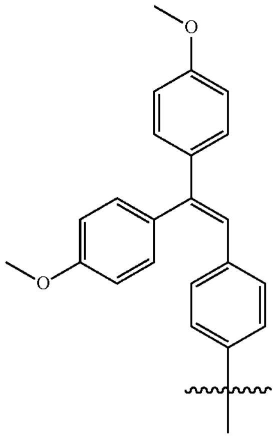 [SMILES: *c1ccc(C=C(c2ccc(OC)cc2)c2ccc(OC)cc2)cc1] | 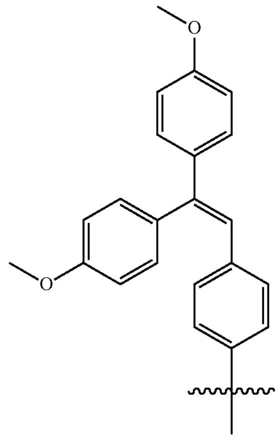 [SMILES: *c1ccc(C=C(c2ccc(OC)cc2)c2ccc(OC)cc2)cc1] | H | H | 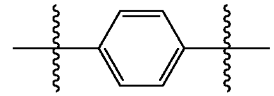 | 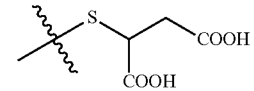 |
| 410 | 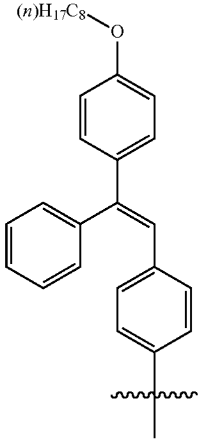 | 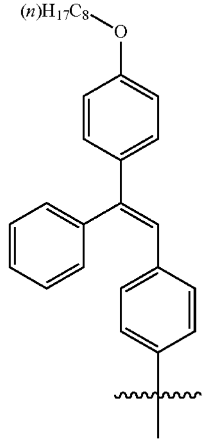 | H | H | 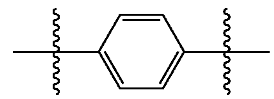 [SMILES: *c1ccc(*)cc1] | 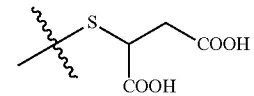 [SMILES: *SC(CC(=O)O)C(=O)O] |

-continued
| | | | | | |
|---|---|---|---|---|---|
| 411 | 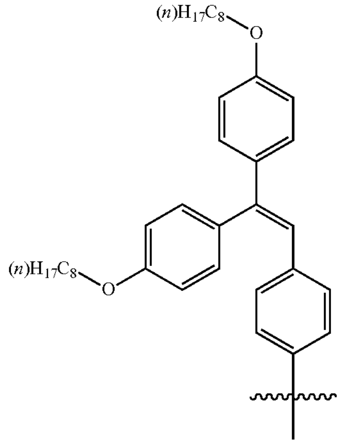 | 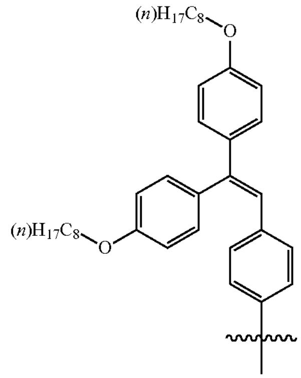 | H | H | 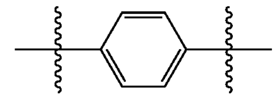 [SMILES: *c1ccc(*)cc1] 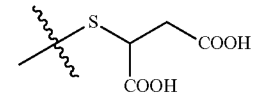 [SMILES: *SC(CC(=O)O)C(=O)O] |
| 412 | 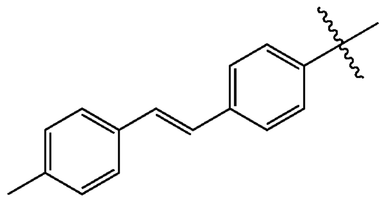 [SMILES: *c1ccc(/C=C/c2ccc(C)cc2)cc1] | 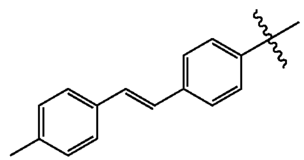 [SMILES: *c1ccc(/C=C/c2ccc(C)cc2)cc1] | H | H | 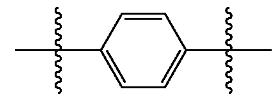 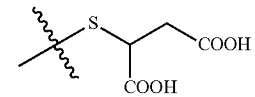 |
| 413 | 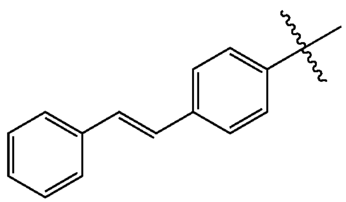 [SMILES: *c1ccc(/C=C/c2ccccc2)cc1] | 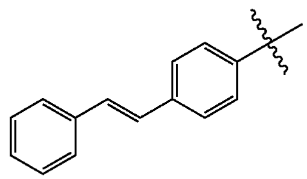 [SMILES: *c1ccc(/C=C/c2ccccc2)cc1] | H | H | 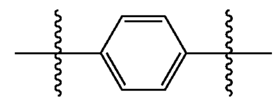 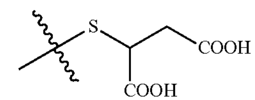 [SMILES: *SC(CC(=O)O)C(=O)O] |
| 414 | 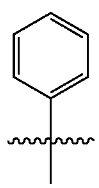 | 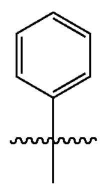 [SMILES: *c1ccccc1] | H | H | 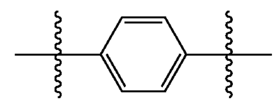 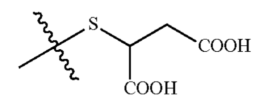 [SMILES: *SC(CC(=O)O)C(=O)O] |

-continued
| | | | | | | |
|---|---|---|---|---|---|---|
| 415 | 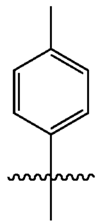 [SMILES: *c1ccc(C)cc1] | 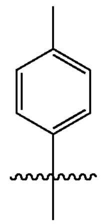 | H | H | 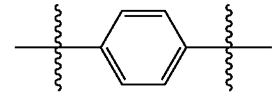 | 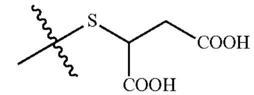 |
| 416 | 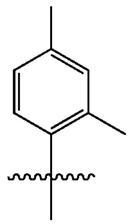 | 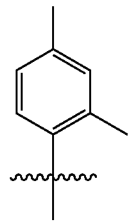 [SMILES: *c1ccc(C)cc1C] | H | H | 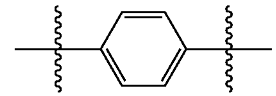 [SMILES: *c1ccc(*)cc1] | 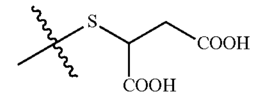 |
| 417 | 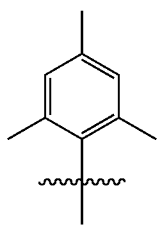 | 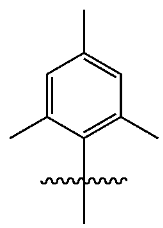 | H | H | 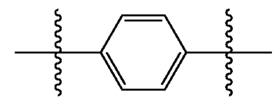 | 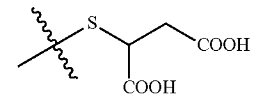 [SMILES: *SC(CC(=O)O)C(=O)O] |
| 418 | 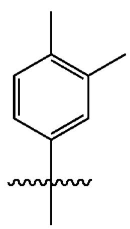 | 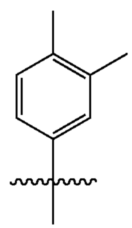 [SMILES: *c1ccc(C)c(C)c1] | H | H | 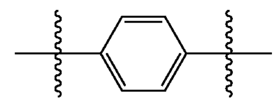 [SMILES: *c1ccc(*)cc1] | 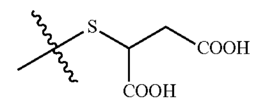 |

-continued
| | | | | | | |
|---|---|---|---|---|---|---|
| 419 | 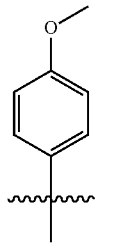 [SMILES: *c1ccc(OC)cc1] | 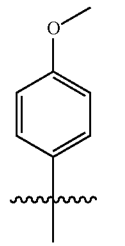 | H | H | 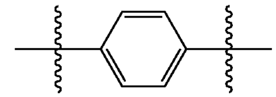 [SMILES: *c1ccc(*)cc1] | 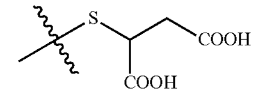 [SMILES: *SC(CC(=O)O)C(=O)O] |
| 420 | 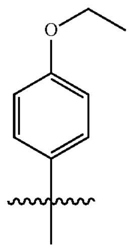 [SMILES: *c1ccc(OCC)cc1] | 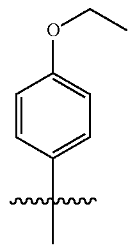 [SMILES: *c1ccc(OCC)cc1] | H | H | 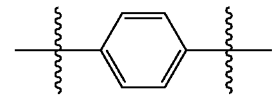 [SMILES: *c1ccc(*)cc1] | 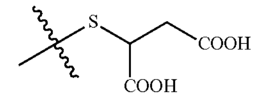 |
| 421 | 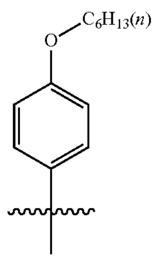 | 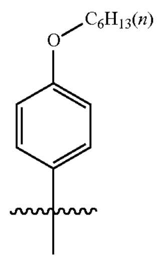 | H | H | 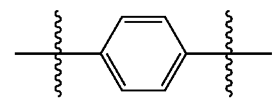 | 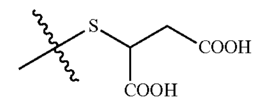 [SMILES: *SC(CC(=O)O)C(=O)O] |
| 422 | 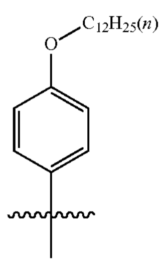 | 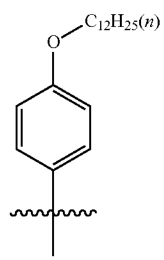 | H | H | 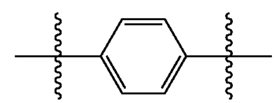 | 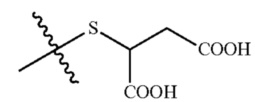 [SMILES: *SC(CC(=O)O)C(=O)O] |

-continued
| | | | | | | |
|---|---|---|---|---|---|---|
| 423 | 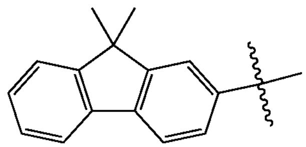 [SMILES: *c1ccc2c(c1)C(C)(C)c1ccccc1-2] | 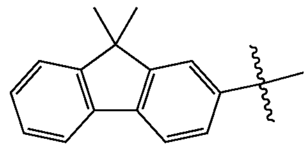 [SMILES: *c1ccc2c(c1)C(C)(C)c1ccccc1-2] | H | H | 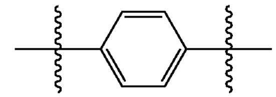 [SMILES: *c1ccc(*)cc1] | 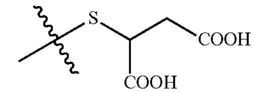 [SMILES: *SC(CC(=O)O)C(=O)O] |
| 424 | 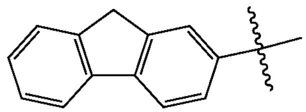 [SMILES: *c1ccc2c(c1)Cc1ccccc1-2] | 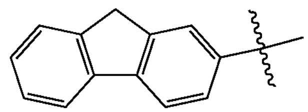 [SMILES: *c1ccc2c(c1)Cc1ccccc1-2] | H | H | 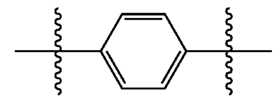 | 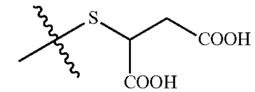 [SMILES: *SC(CC(=O)O)C(=O)O] |
| 425 | 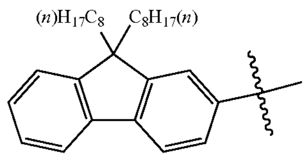 | 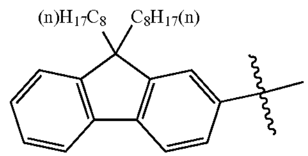 | H | H | 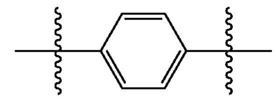 [SMILES: *c1ccc(*)cc1] | 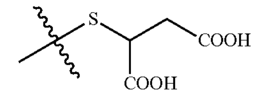 [SMILES: *SC(CC(=O)O)C(=O)O] |
| 426 | 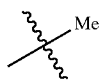 | 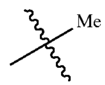 | H | H | 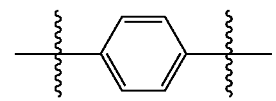 [SMILES: *c1ccc(*)cc1] | 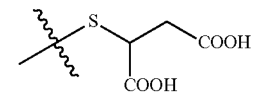 [SMILES: *SC(CC(=O)O)C(=O)O] |
| 427 | 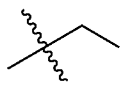 | 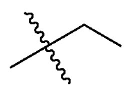 [SMILES: *CC] | H | H | 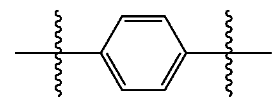 [SMILES: *c1ccc(*)cc1] | 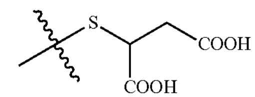 [SMILES: *SC(CC(=O)O)C(=O)O] |
| 428 | 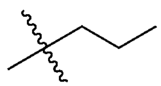 [SMILES: *CCC] | 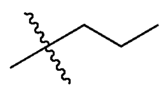 [SMILES: *CCC] | H | H | 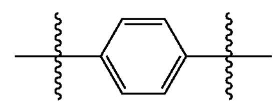 | 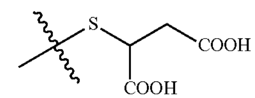 |
| 429 | 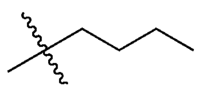 [SMILES: *CCCC] | 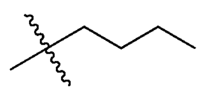 [SMILES: *CCCC] | H | H | 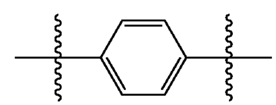 [SMILES: *c1ccc(*)cc1] | 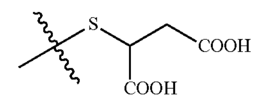 [SMILES: *SC(CC(=O)O)C(=O)O] |
| 430 | 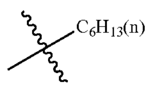 | 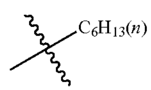 | H | H | 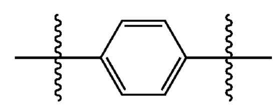 [SMILES: *c1ccc(*)cc1] | 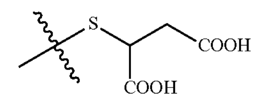 |

-continued
| | | | | | | |
|---|---|---|---|---|---|---|
| 431 | 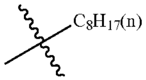 | 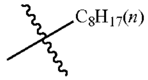 | H | H | 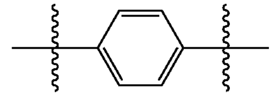 [SMILES: *c1ccc(*)cc1] | 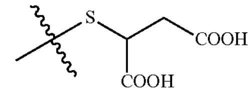 [SMILES: *SC(CC(=O)O)C(=O)O] |
| 432 | 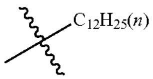 | 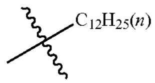 | H | H | 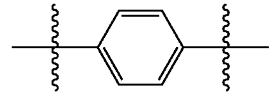 [SMILES: *c1ccc(*)cc1] | 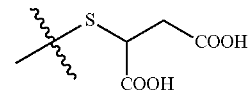 [SMILES: *SC(CC(=O)O)C(=O)O] |
| 433 | 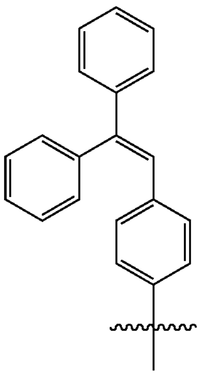 [SMILES: *c1ccc(C=C(c2ccccc2)c2ccccc2)cc1] | 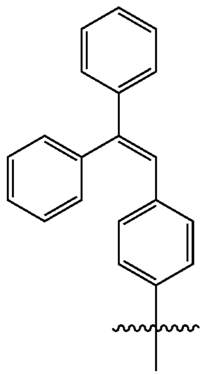 [SMILES: *c1ccc(C=C(c2ccccc2)c2ccccc2)cc1] | H | H | 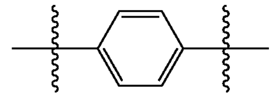 | 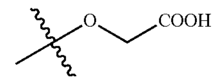 |
| 434 | 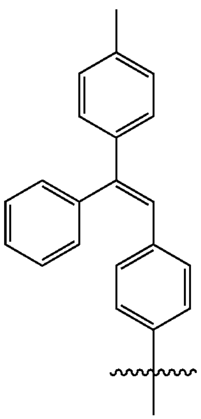 [SMILES: *c1ccc(/C=C(\c2ccccc2)c2ccc(C)cc2)cc1] | 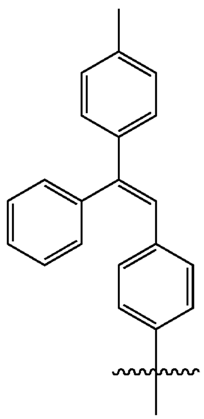 [SMILES: *c1ccc(/C=C(\c2ccccc2)c2ccc(C)cc2)cc1] | H | H | 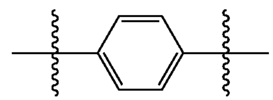 [SMILES: *c1ccc(*)cc1] | 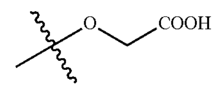 [SMILES: *OCC(=O)O] |

-continued
| | | | | | | |
|---|---|---|---|---|---|---|
| 435 | 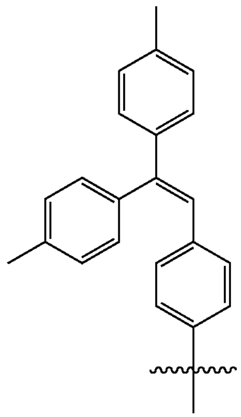 [SMILES: *c1ccc(C=C(c2ccc(C)cc2)c2ccc(C)cc2)cc1] | 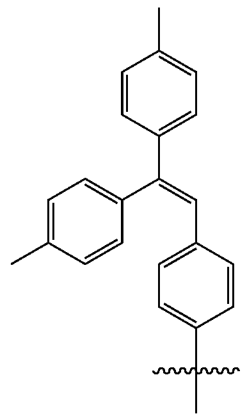 [SMILES: *c1ccc(C=C(c2ccc(C)cc2)c2ccc(C)cc2)cc1] | H | H | 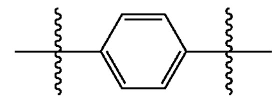 [SMILES: *c1ccc(*)cc1] | 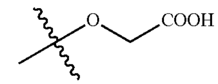 |
| 436 | 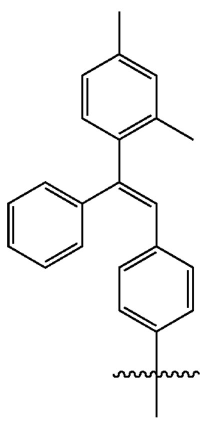 [SMILES: *c1ccc(/C=C(\c2ccccc2)c2ccc(C)cc2C)cc1] | 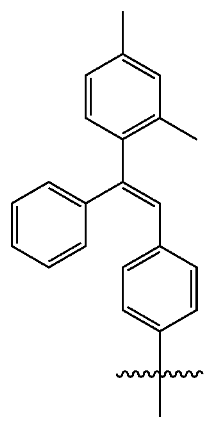 | H | H | 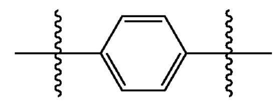 [SMILES: *c1ccc(*)cc1] | 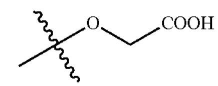 [SMILES: *OCC(=O)O] |

-continued
| | | | | | | |
|---|---|---|---|---|---|---|
| 437 | 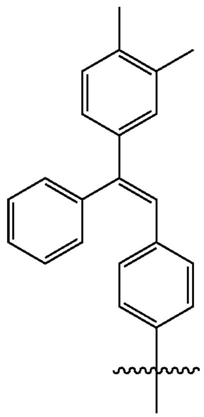 [SMILES: *c1ccc(/C=C(\c2ccccc2)c2ccc(C)c(C)c2)cc1] | 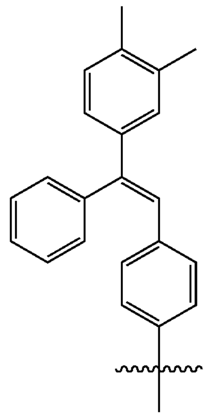 [SMILES: *c1ccc(/C=C(\c2ccccc2)c2ccc(C)c(C)c2)cc1] | H | H | 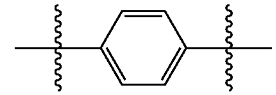 [SMILES: *c1ccc(*)cc1] | 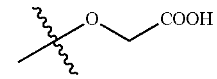 [SMILES: *OCC(=O)O] |
| 438 | 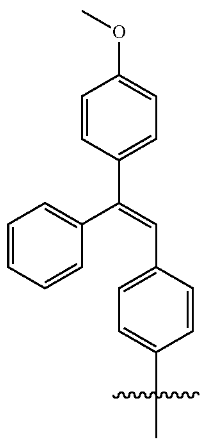 [SMILES: *c1ccc(/C=C(\c2ccccc2)c2ccc(OC)cc2)cc1] | 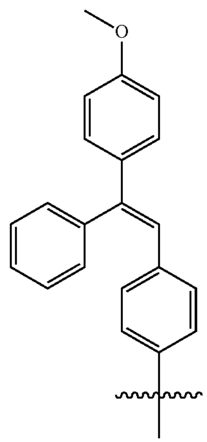 [SMILES: *c1ccc(/C=C(\c2ccccc2)c2ccc(OC)cc2)cc1] | H | H | 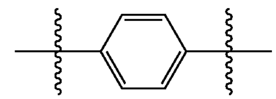 [SMILES: *c1ccc(*)cc1] | 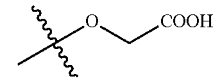 |

-continued
| | | | | | | |
|---|---|---|---|---|---|---|
| 439 | 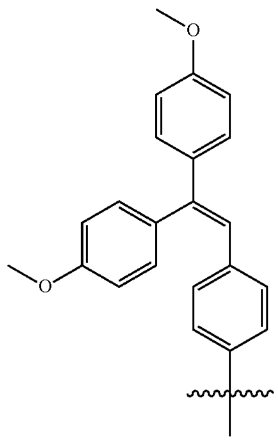 [SMILES: *c1ccc(C=C(c2ccc(OC)cc2)c2ccc(OC)cc2)cc1] | 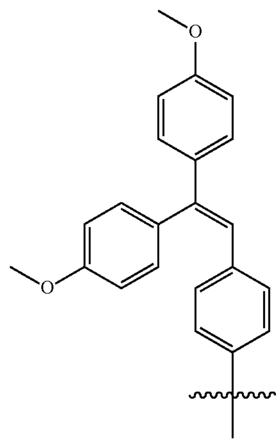 [SMILES: *c1ccc(C=C(c2ccc(OC)cc2)c2ccc(OC)cc2)cc1] | H | H | 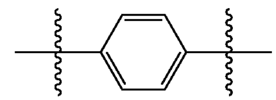 | 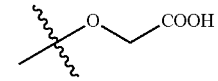 |
| 440 | 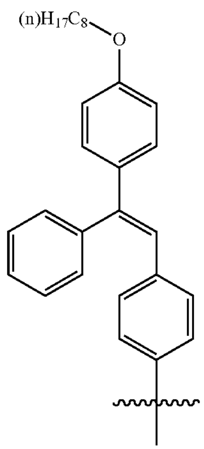 | 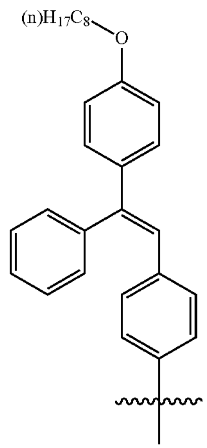 | H | H | 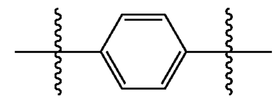 [SMILES: *c1ccc(*)cc1] | 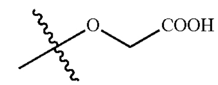 |

-continued
| | | | | | | |
|---|---|---|---|---|---|---|
| 441 | 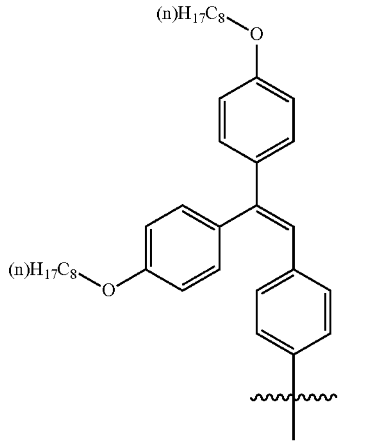 | 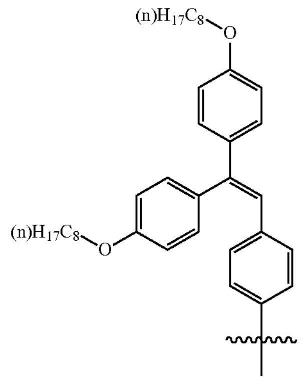 | H | H | 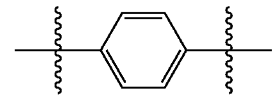 | 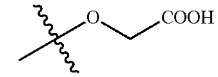 |
| 442 | 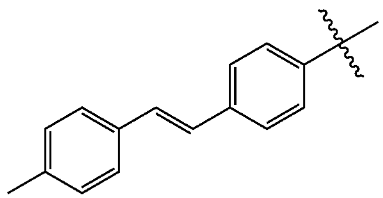 [SMILES: *c1ccc(/C=C/c2ccc(C)cc2)cc1] | 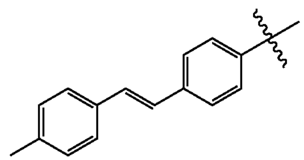 [SMILES: *c1ccc(/C=C/c2ccc(C)cc2)cc1] | H | H | 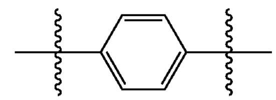 [SMILES: *c1ccc(*)cc1] | 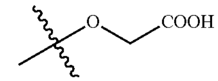 |
| 443 | 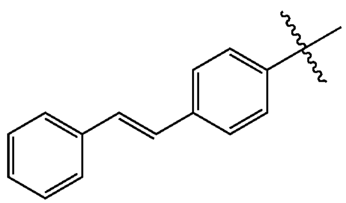 [SMILES: *c1ccc(/C=C/c2ccccc2)cc1] | 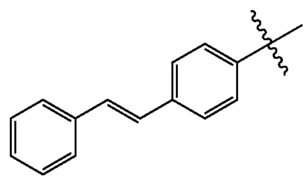 [SMILES: *c1ccc(/C=C/c2ccccc2)cc1] | H | H | 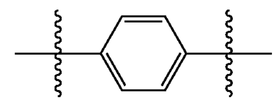 [SMILES: *c1ccc(*)cc1] | 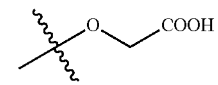 |
| 444 | 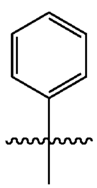 | 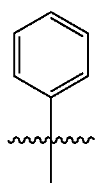 [SMILES: *c1ccccc1] | H | H | 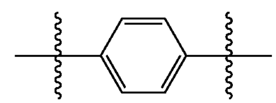 | 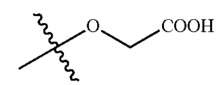 |

-continued
| | | | | | | |
|---|---|---|---|---|---|---|
| 445 | 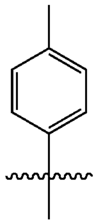 [SMILES: *c1ccc(C)cc1] | 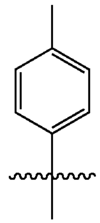 | H | H | 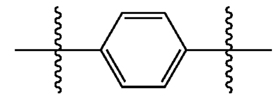 [SMILES: *c1ccc(*)cc1] | 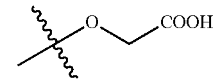 [SMILES: *OCC(=O)O] |
| 446 | 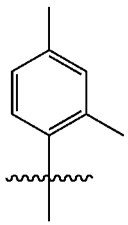 [SMILES: *c1ccc(C)cc1C] | 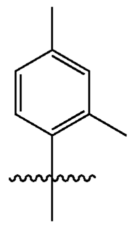 [SMILES: *c1ccc(C)cc1C] | H | H | 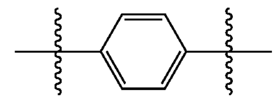 | 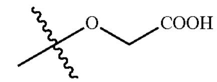 |
| 447 | 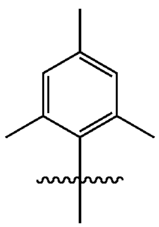 | 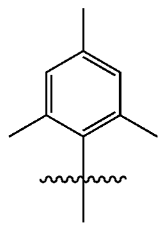 | H | H | 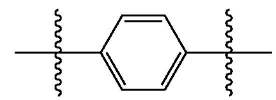 | 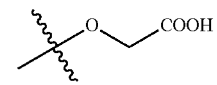 |
| 448 | 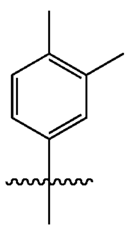 | 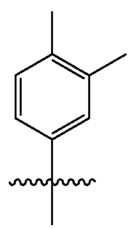 [SMILES: *c1ccc(C)c(C)c1] | H | H | 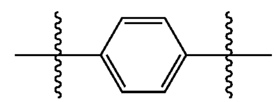 | 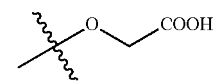 [SMILES: *OCC(=O)O] |

-continued
| | | | | | | |
|---|---|---|---|---|---|---|
| 449 | 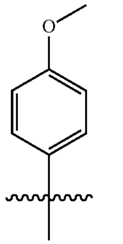 [SMILES: *c1ccc(OC)cc1] | 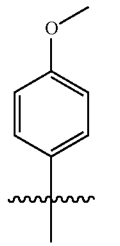 [SMILES: *c1ccc(OC)cc1] | H | H | 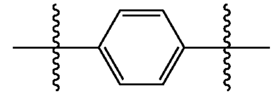 | 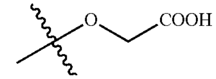 [SMILES: *OCC(=O)O] |
| 450 | 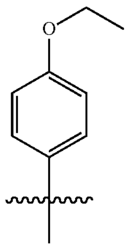 | 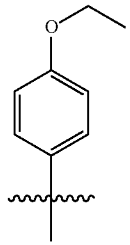 [SMILES: *c1ccc(OCC)cc1] | H | H | 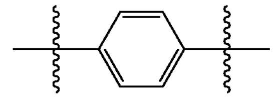 | 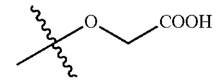 |
| 451 | 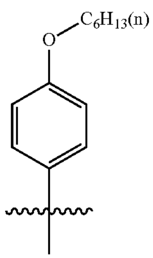 | 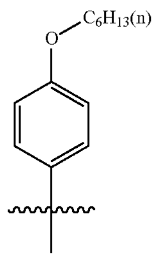 | H | H | 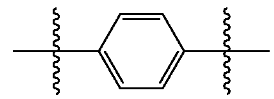 | 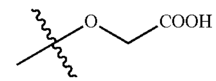 |
| 452 | 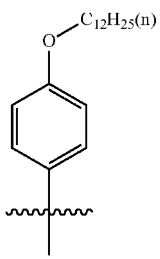 | 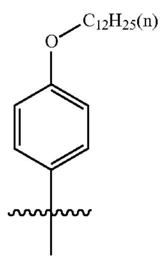 | H | H | 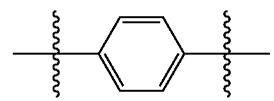 [SMILES: *c1ccc(*)cc1] | 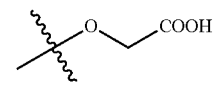 [SMILES: *OCC(=O)O] |

-continued
| | | | | | | |
|---|---|---|---|---|---|---|
| 453 | 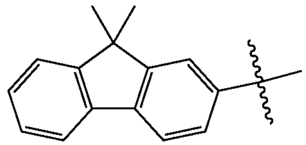 [SMILES: *c1ccc2c(c1)C(C)(C)c1ccccc1-2] | 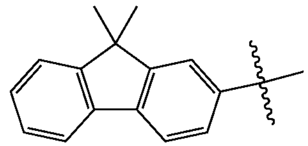 [SMILES: *c1ccc2c(c1)C(C)(C)c1ccccc1-2] | H | H | 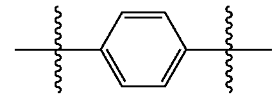 | 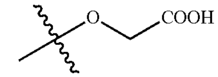 |
| 454 | 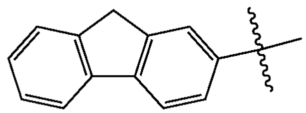 [SMILES: *c1ccc2c(c1)Cc1ccccc1-2] | 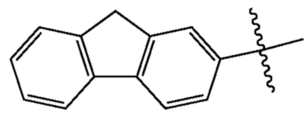 [SMILES: *c1ccc2c(c1)Cc1ccccc1-2] | H | H | 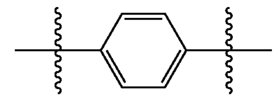 [SMILES: *c1ccc(*)cc1] | 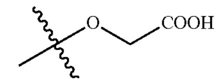 |
| 455 | 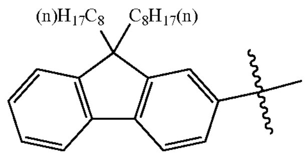 | 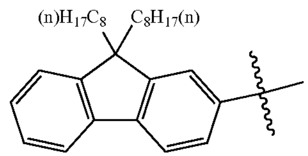 | H | H | 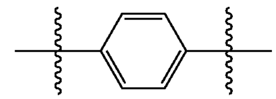 [SMILES: *c1ccc(*)cc1] | 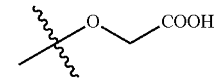 |
| 456 | 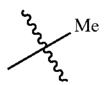 | 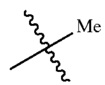 | H | H | 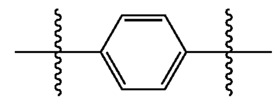 [SMILES: *c1ccc(*)cc1] | 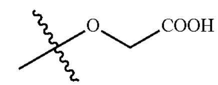 [SMILES: *OCC(=O)O] |
| 457 | 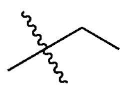 [SMILES: *CC] | 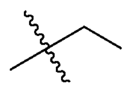 [SMILES: *CC] | H | H | 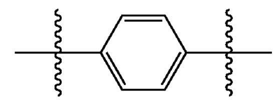 [SMILES: *c1ccc(*)cc1] | 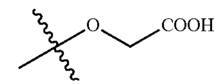 |
| 458 | 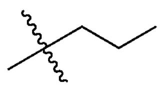 [SMILES: *CCC] | 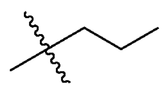 [SMILES: *CCC] | H | H | 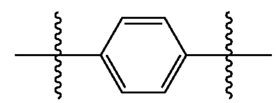 | 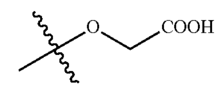 [SMILES: *OCC(=O)O] |
| 459 | 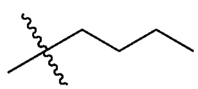 [SMILES: *CCCC] | 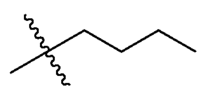 [SMILES: *CCCC] | H | H | 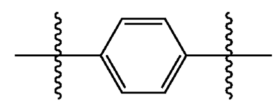 [SMILES: *c1ccc(*)cc1] | 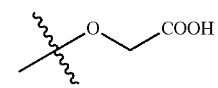 |
| 460 | 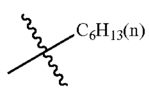 | 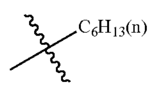 | H | H | 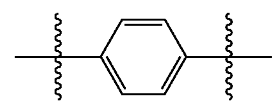 | 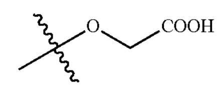 |
| 461 | 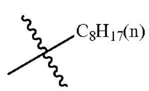 | 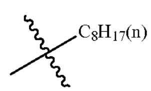 | H | H | 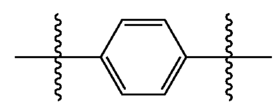 [SMILES: *c1ccc(*)cc1] | 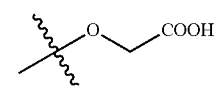 [SMILES: *OCC(=O)O] |

-continued
| | | | | | | |
|---|---|---|---|---|---|---|
| 462 | 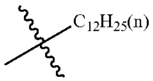 | 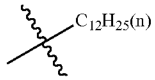 | H | H | 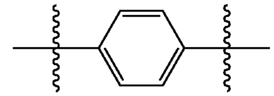 [SMILES: *c1ccc(*)cc1] | 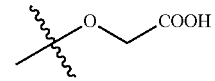 |
| 463 | 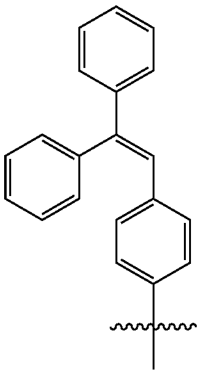 [SMILES: *c1ccc(C=C(c2ccccc2)c2ccccc2)cc1] | 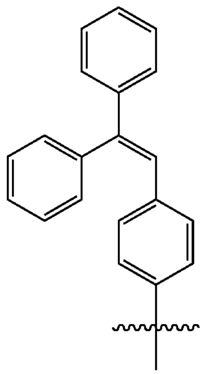 [SMILES: *c1ccc(C=C(c2ccccc2)c2ccccc2)cc1] | H | H | 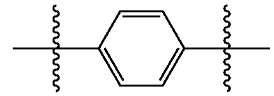 | 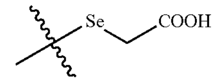 |
| 464 | 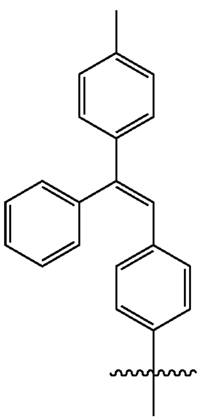 [SMILES: *c1ccc(/C=C(\c2ccccc2)c2ccc(C)cc2)cc1] | 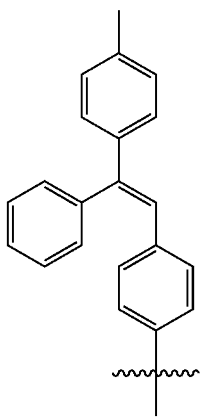 | H | H | 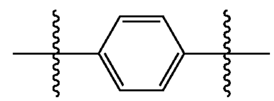 | 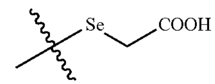 |

-continued
| | | | | | | |
|---|---|---|---|---|---|---|
| 465 | 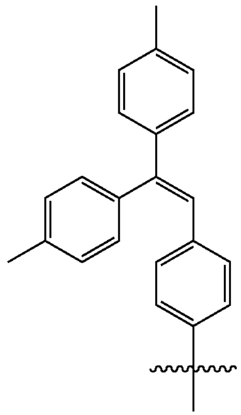 [SMILES: *c1ccc(C=C(c2ccc(C)cc2)c2ccc(C)cc2)cc1] | 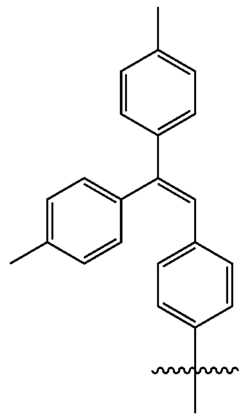 [SMILES: *c1ccc(C=C(c2ccc(C)cc2)c2ccc(C)cc2)cc1] | H | H | 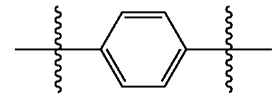 | 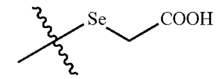 |
| 466 | 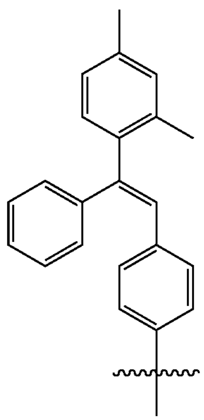 [SMILES: *c1ccc(/C=C(\c2ccccc2)c2ccc(C)cc2C)cc1] | 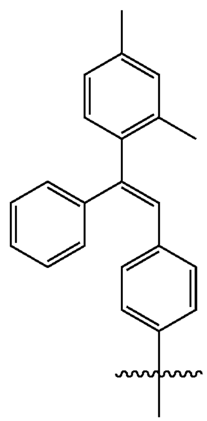 [SMILES: *c1ccc(/C=C(\c2ccccc2)c2ccc(C)cc2C)cc1] | H | H | 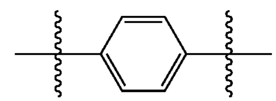 [SMILES: *c1ccc(*)cc1] | 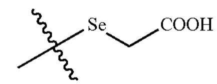 |

-continued
| | | | | | | |
|---|---|---|---|---|---|---|
| 467 | 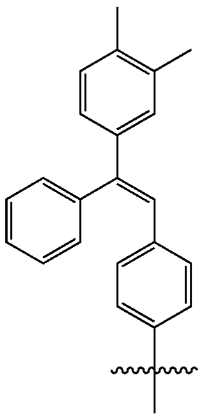 [SMILES: *c1ccc(/C=C(\c2ccccc2)c2ccc(C)c(C)c2)cc1] | 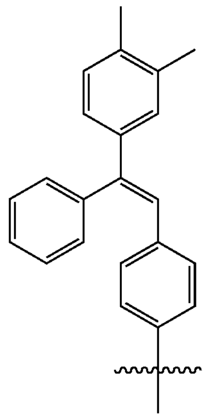 [SMILES: *c1ccc(/C=C(\c2ccccc2)c2ccc(C)c(C)c2)cc1] | H | H | 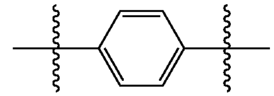 | 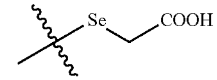 |
| 468 | 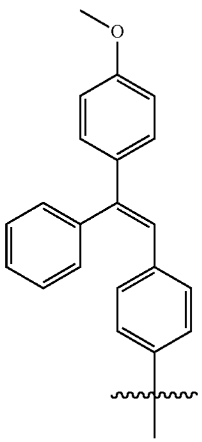 [SMILES: *c1ccc(/C=C(\c2ccccc2)c2ccc(OC)cc2)cc1] | 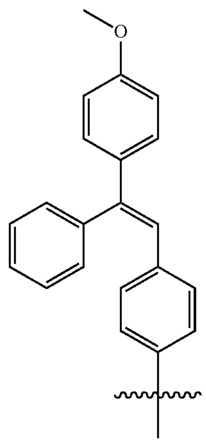 [SMILES: *c1ccc(/C=C(\c2ccccc2)c2ccc(OC)cc2)cc1] | H | H | 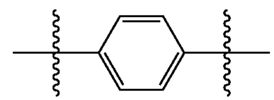 [SMILES: *c1ccc(*)cc1] | 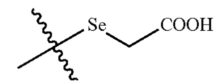 |

-continued
| | | | | | | |
|---|---|---|---|---|---|---|
| 469 | 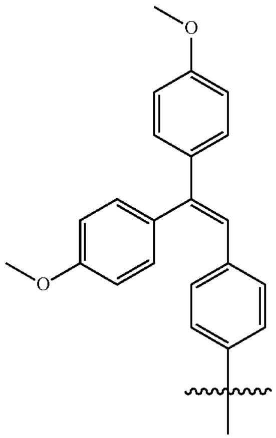 [SMILES: *c1ccc(C=C(c2ccc(OC)cc2)c2ccc(OC)cc2)cc1] | 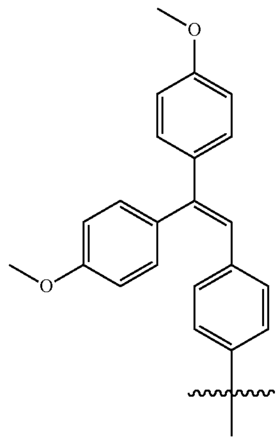 [SMILES: *c1ccc(C=C(c2ccc(OC)cc2)c2ccc(OC)cc2)cc1] | H | H | 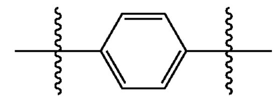 [SMILES: *c1ccc(*)cc1] | 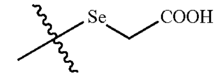 |
| 470 | 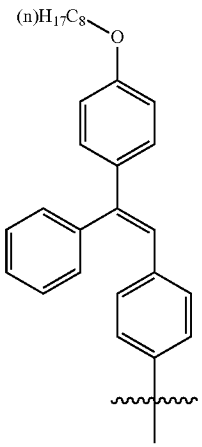 | 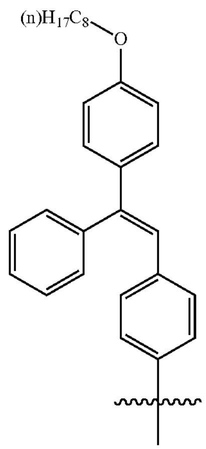 | H | H | 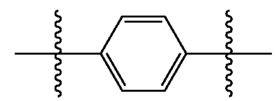 [SMILES: *c1ccc(*)cc1] | 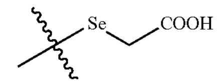 [SMILES: *[Se]CC(=O)O] |

-continued
| | | | | | | |
|---|---|---|---|---|---|---|
| 471 | 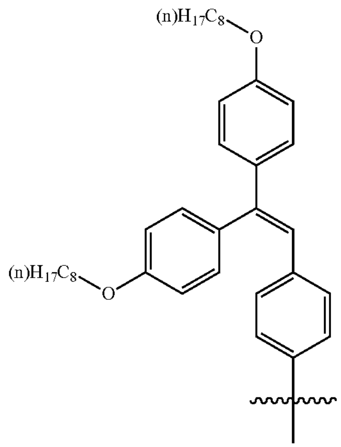 | 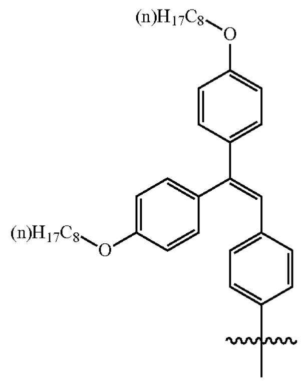 | H | H | 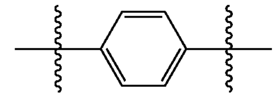 | 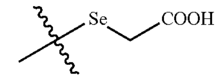 [SMILES: *[Se]CC(=O)O] |
| 472 | 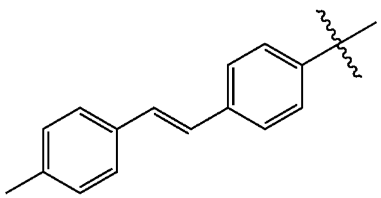 [SMILES: *c1ccc(/C=C/c2ccc(C)cc2)cc1] | 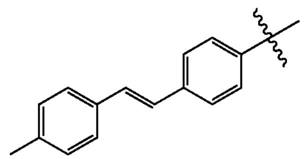 [SMILES: *c1ccc(/C=C/c2ccc(C)cc2)cc1] | H | H | 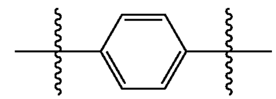 | 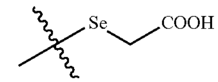 |
| 473 | 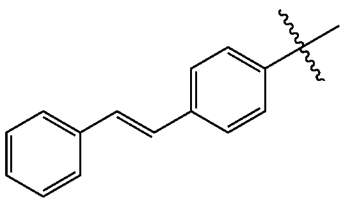 [SMILES: *c1ccc(/C=C/c2ccccc2)cc1] | 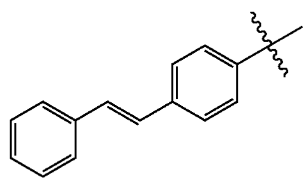 [SMILES: *c1ccc(/C=C/c2ccccc2)cc1] | H | H | 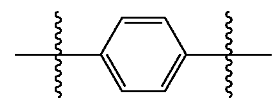 [SMILES: *c1ccc(*)cc1] | 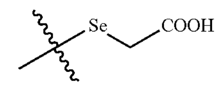 |
| 474 | 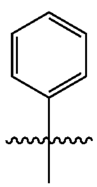 [SMILES: *c1ccccc1] | 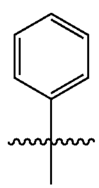 | H | H | 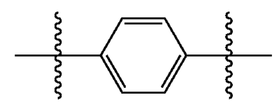 | 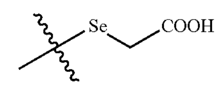 [SMILES: *[Se]CC(=O)O] |

-continued
| | | | | | | |
|---|---|---|---|---|---|---|
| 475 | 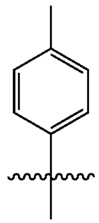 [SMILES: *c1ccc(C)cc1] | 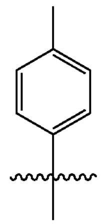 [SMILES: *c1ccc(C)cc1] | H | H | 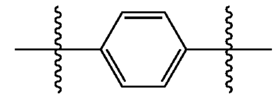 | 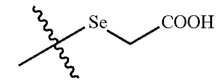 [SMILES: *[Se]CC(=O)O] |
| 476 | 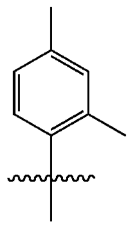 | 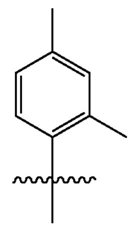 [SMILES: *c1ccc(C)cc1C] | H | H | 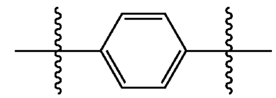 [SMILES: *c1ccc(*)cc1] | 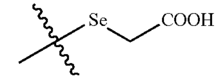 |
| 477 | 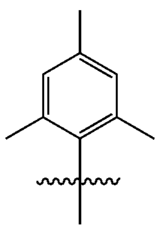 | 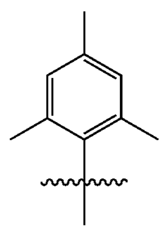 | H | H | 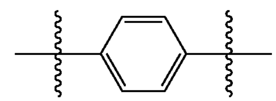 | 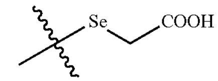 [SMILES: *[Se]CC(=O)O] |
| 478 | 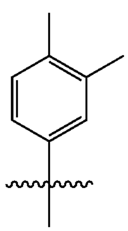 | 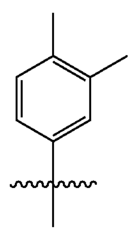 [SMILES: *c1ccc(C)c(C)c1] | H | H | 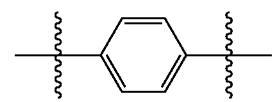 | 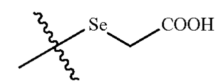 |

-continued
| | | | | | | |
|---|---|---|---|---|---|---|
| 479 | 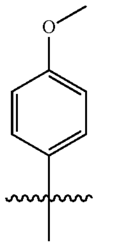 [SMILES: *c1ccc(OC)cc1] | 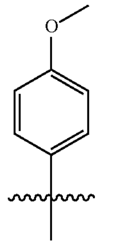 | H | H | 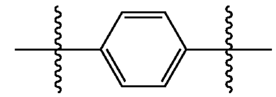 | 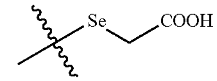 [SMILES: *[Se]CC(=O)O] |
| 480 | 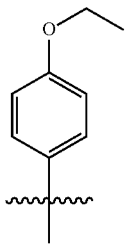 | 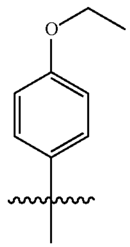 [SMILES: *c1ccc(OCC)cc1] | H | H | 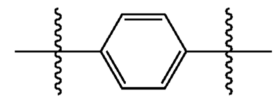 | 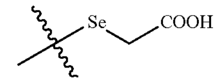 |
| 481 | 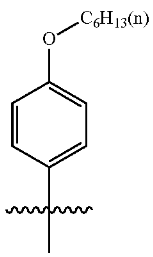 | 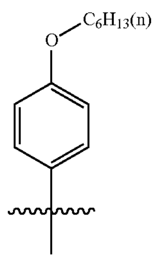 | H | H | 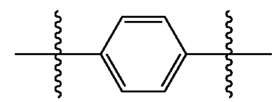 [SMILES: *c1ccc(*)cc1] | 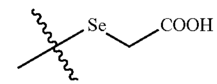 |
| 482 | 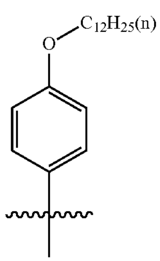 | 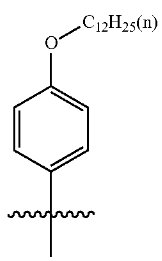 | H | H | 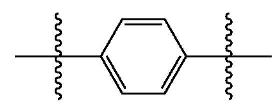 [SMILES: *c1ccc(*)cc1] | 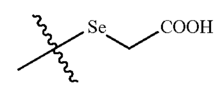 [SMILES: *[Se]CC(=O)O] |

-continued
| | | | | | | |
|---|---|---|---|---|---|---|
| 483 | 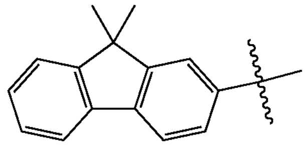 [SMILES: *c1ccc2c(c1)C(C)(C)c1ccccc1-2] | 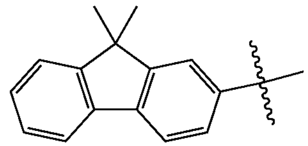 [SMILES: *c1ccc2c(c1)C(C)(C)c1ccccc1-2] | H | H | 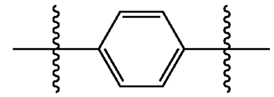 [SMILES: *c1ccc(*)cc1] | 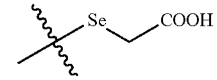 [SMILES: *[Se]CC(=O)O] |
| 484 | 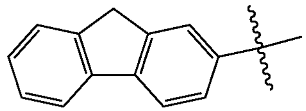 [SMILES: *c1ccc2c(c1)Cc1ccccc1-2] | 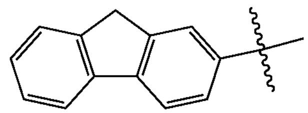 [SMILES: *c1ccc2c(c1)Cc1ccccc1-2] | H | H | 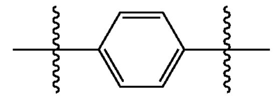 [SMILES: *c1ccc(*)cc1] | 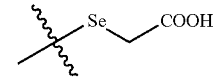 [SMILES: *[Se]CC(=O)O] |
| 485 | 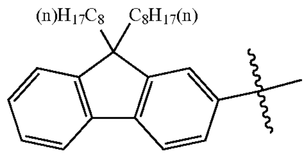 | 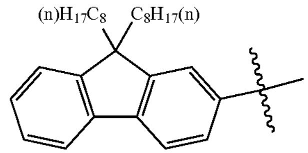 | H | H | 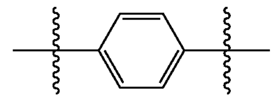 [SMILES: *c1ccc(*)cc1] | 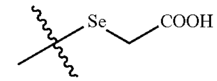 [SMILES: *[Se]CC(=O)O] |
| 486 | 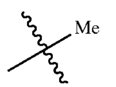 | 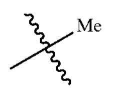 | H | H | 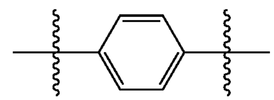 [SMILES: *c1ccc(*)cc1] | 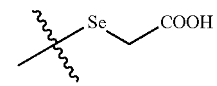 |
| 487 | 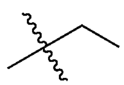 [SMILES: *CC] | 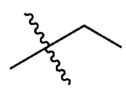 [SMILES: *CC] | H | H | 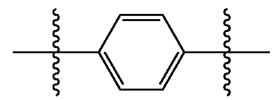 | 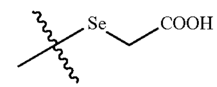 |
| 488 | 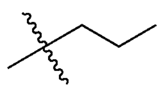 [SMILES: *CCC] | 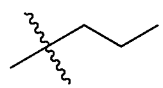 [SMILES: *CCC] | H | H | 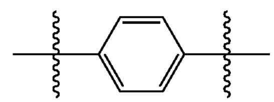 [SMILES: *c1ccc(*)cc1] | 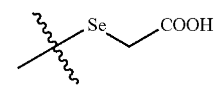 |
| 489 | 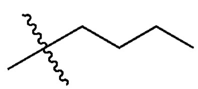 [SMILES: *CCCC] | 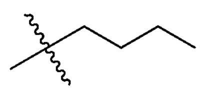 [SMILES: *CCCC] | H | H | 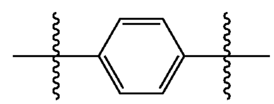 [SMILES: *c1ccc(*)cc1] | 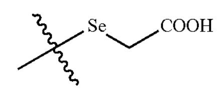 |
| 490 | 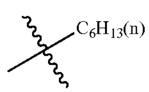 | 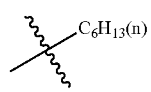 | H | H | 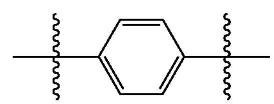 [SMILES: *c1ccc(*)cc1] | 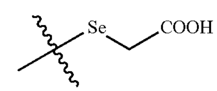 |
| 491 | 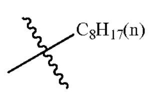 | 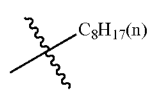 | H | H | 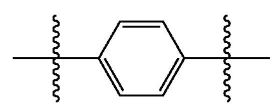 | 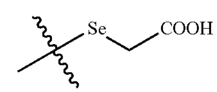 |

-continued
| | | | | | | |
|---|---|---|---|---|---|---|
| 492 | 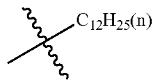 | 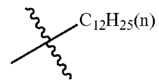 | H | H | 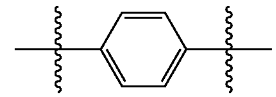 [SMILES: *c1ccc(*)cc1] | 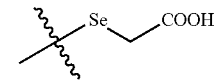 |
| 493 | 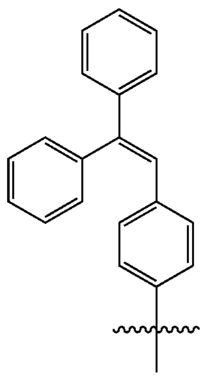 [SMILES: *c1ccc(C=C(c2ccccc2)c2ccccc2)cc1] | 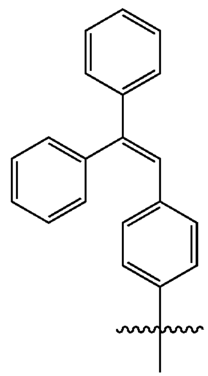 [SMILES: *c1ccc(C=C(c2ccccc2)c2ccccc2)cc1] | H | H | 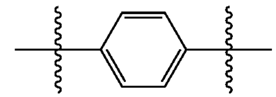 | 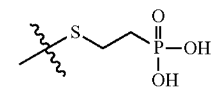 [SMILES: *SCCP(=O)(O)O] |
| 494 | 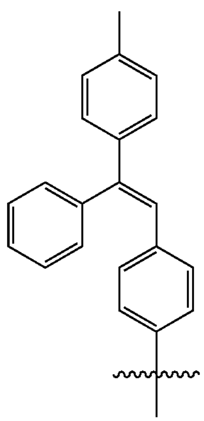 [SMILES: *c1ccc(/C=C(\c2ccccc2)c2ccc(C)cc2)cc1] | 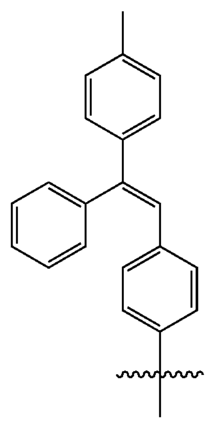 | H | H | 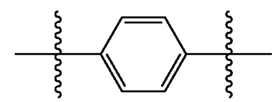 [SMILES: *c1ccc(*)cc1] | 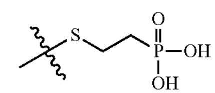 [SMILES: *SCCP(=O)(O)O] |

-continued
| | | | | | | |
|---|---|---|---|---|---|---|
| 495 | 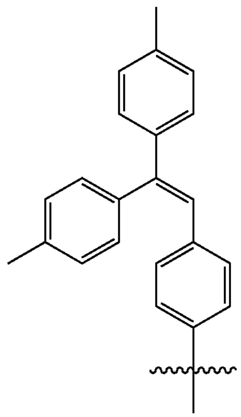 [SMILES: *c1ccc(C=C(c2ccc(C)cc2)c2ccc(C)cc2)cc1] | 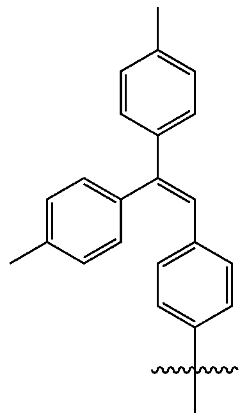 [SMILES: *c1ccc(C=C(c2ccc(C)cc2)c2ccc(C)cc2)cc1] | H | H | 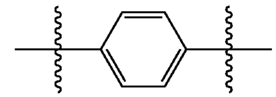 [SMILES: *c1ccc(*)cc1] | 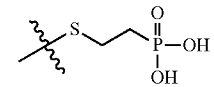 [SMILES: *SCCP(=O)(O)O] |
| 496 | 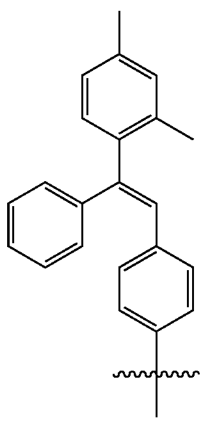 [SMILES: *c1ccc(/C=C(\c2ccccc2)c2ccc(C)cc2C)cc1] | 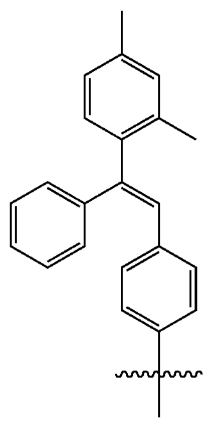 [SMILES: *c1ccc(/C=C(\c2ccccc2)c2ccc(C)cc2C)cc1] | H | H | 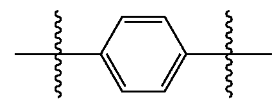 | 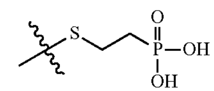 |

-continued
| | | | | | | |
|---|---|---|---|---|---|---|
| 497 | 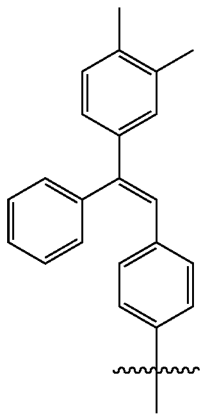 [SMILES: *c1ccc(/C=C(\c2ccccc2)c2ccc(C)c(C)c2)cc1] | 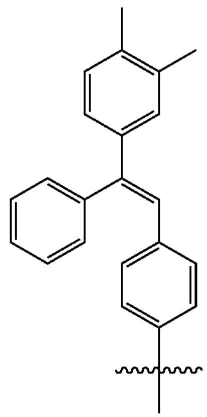 [SMILES: *c1ccc(/C=C(\c2ccccc2)c2ccc(C)c(C)c2)cc1] | H | H | 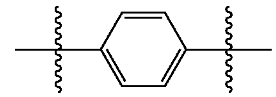 | 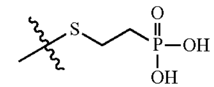 [SMILES: *SCCP(=O)(O)O] |
| 498 | 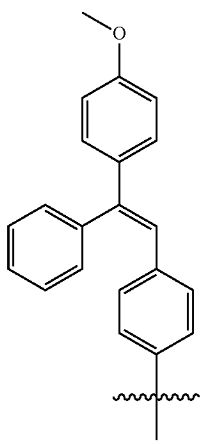 [SMILES: *c1ccc(/C=C(\c2ccccc2)c2ccc(OC)cc2)cc1] | 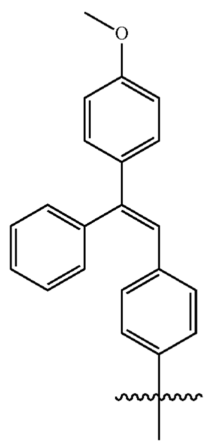 [SMILES: *c1ccc(/C=C(\c2ccccc2)c2ccc(OC)cc2)cc1] | H | H | 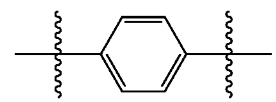 [SMILES: *c1ccc(*)cc1] | 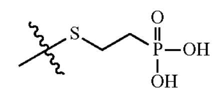 |

-continued
| | | | | | | |
|---|---|---|---|---|---|---|
| 499 | 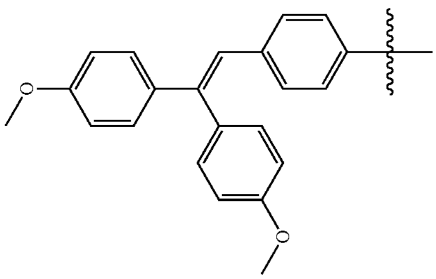 | 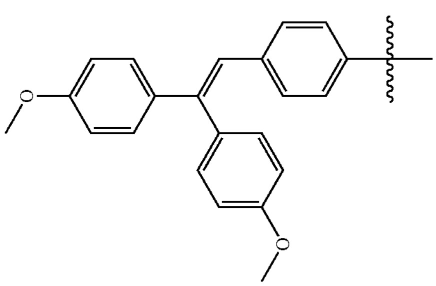 | H | H | 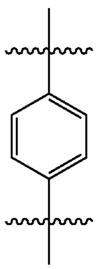 | 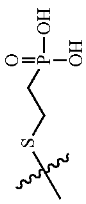 |
| 500 | 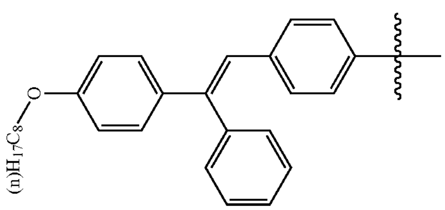 | 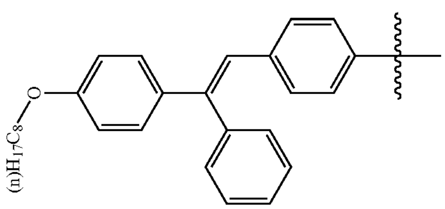 | H | H | 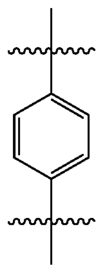 | 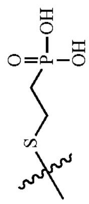 |

-continued
| | | | | | | |
|---|---|---|---|---|---|---|
| 501 | 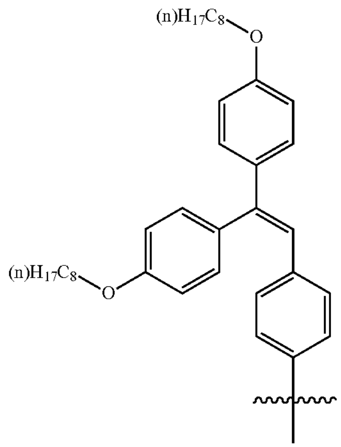 | 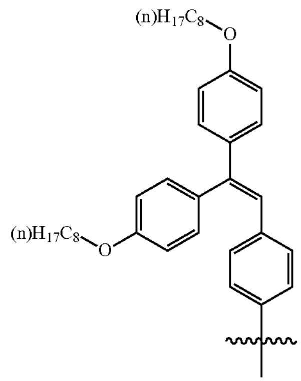 | H | H | 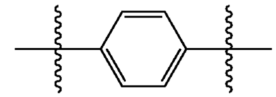 [SMILES: *c1ccc(*)cc1] | 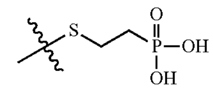 [SMILES: *SCCP(=O)(O)O] |
| 502 | 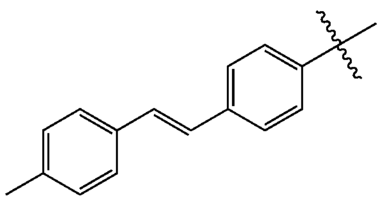 [SMILES: *c1ccc(/C=C/c2ccc(C)cc2)cc1] | 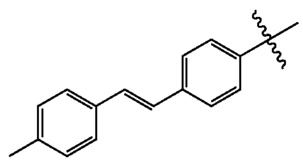 [SMILES: *c1ccc(/C=C/c2ccc(C)cc2)cc1] | H | H | 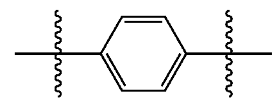 [SMILES: *c1ccc(*)cc1] | 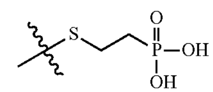 |
| 503 | 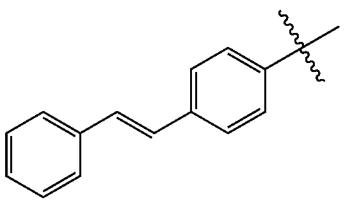 [SMILES: *c1ccc(/C=C/c2ccccc2)cc1] | 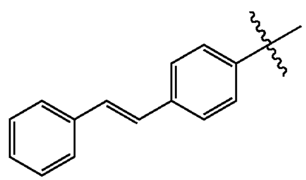 [SMILES: *c1ccc(/C=C/c2ccccc2)cc1] | H | H | 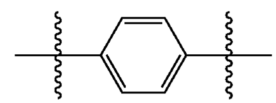 | 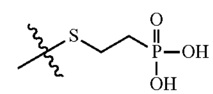 |
| 504 | 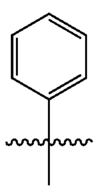 [SMILES: *c1ccccc1] | 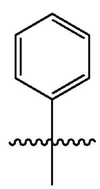 [SMILES: *c1ccccc1] | H | H | 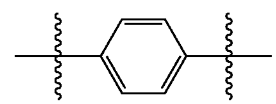 [SMILES: *c1ccc(*)cc1] | 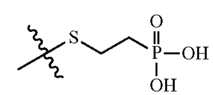 |

-continued
| | | | | | | |
|---|---|---|---|---|---|---|
| 505 | 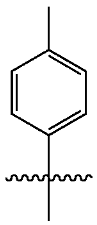 [SMILES: *c1ccc(C)cc1] | 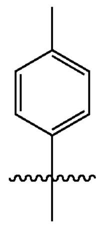 [SMILES: *c1ccc(C)cc1] | H | H | 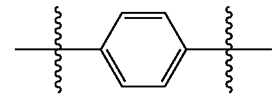 | 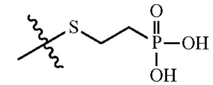 |
| 506 | 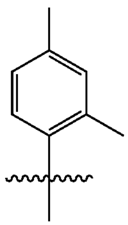 | 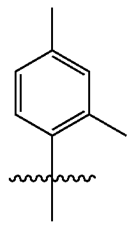 [SMILES: *c1ccc(C)cc1C] | H | H | 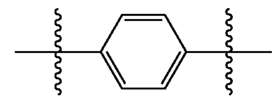 [SMILES: *c1ccc(*)cc1] | 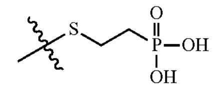 |
| 507 | 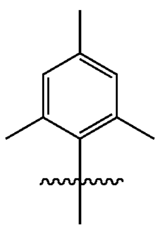 | 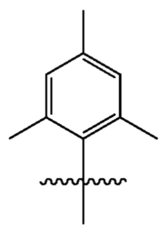 | H | H | 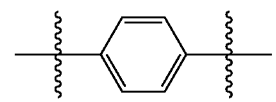 | 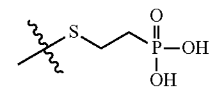 |
| 508 | 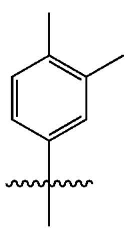 | 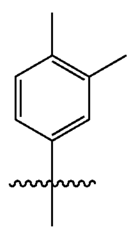 [SMILES: *c1ccc(C)c(C)c1] | H | H | 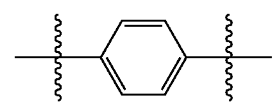 [SMILES: *c1ccc(*)cc1] | 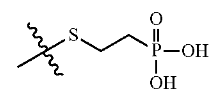 [SMILES: *SCCP(=O)(O)O] |

-continued
| | | | | | | |
|---|---|---|---|---|---|---|
| 509 | 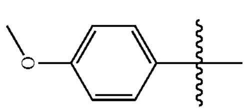 | 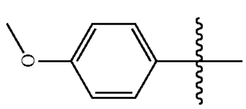 | H | H | 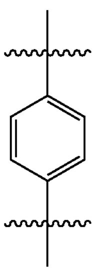 | 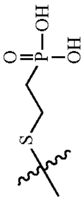 |
| 510 | 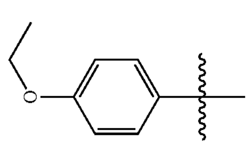 | 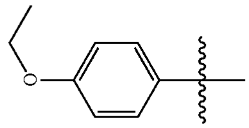 | H | H | 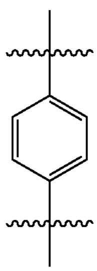 | 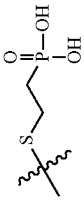 |
| 511 | 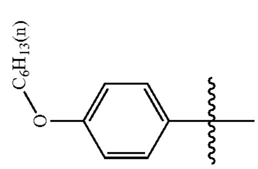 | 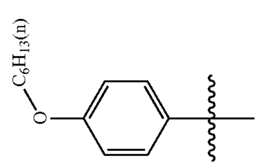 | H | H | 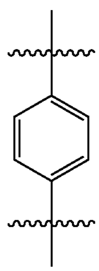 | 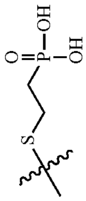 |
| 512 | 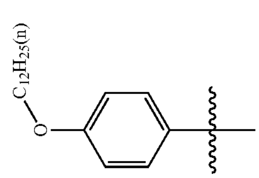 | 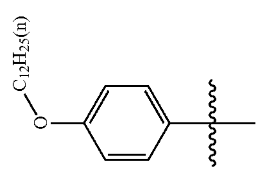 | H | H | 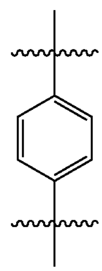 | 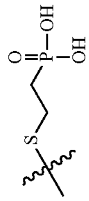 |

-continued
| | | | | | | |
|---|---|---|---|---|---|---|
| 513 | 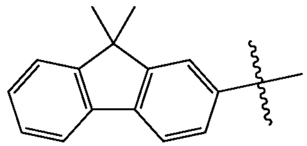 [SMILES: *c1ccc2c(c1)C(C)(C)c1ccccc1-2] | 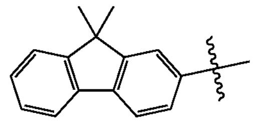 [SMILES: *c1ccc2c(c1)C(C)(C)c1ccccc1-2] | H | H | 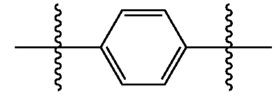 [SMILES: *c1ccc(*)cc1] | 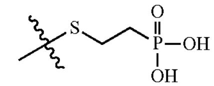 [SMILES: *SCCP(=O)(O)O] |
| 514 | 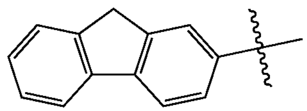 [SMILES: *c1ccc2c(c1)Cc1ccccc1-2] | 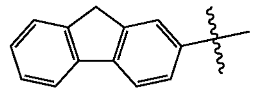 [SMILES: *c1ccc2c(c1)Cc1ccccc1-2] | H | H | 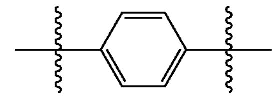 [SMILES: *c1ccc(*)cc1] | 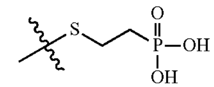 [SMILES: *SCCP(=O)(O)O] |
| 515 | 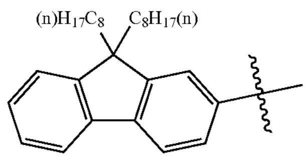 | 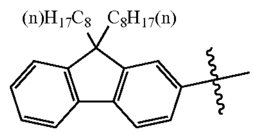 | H | H | 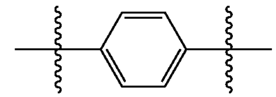 | 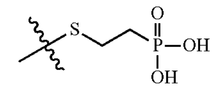 [SMILES: *SCCP(=O)(O)O] |
| 516 | 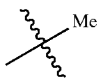 | 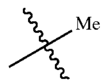 | H | H | 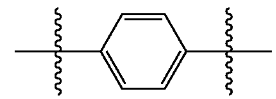 [SMILES: *c1ccc(*)cc1] | 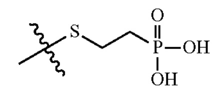 |
| 517 | 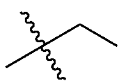 [SMILES: *CC] | 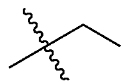 [SMILES: *CC] | H | H | 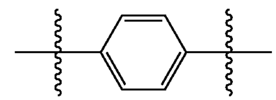 | 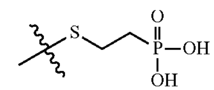 |
| 518 | 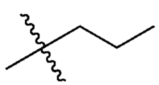 [SMILES: *CCC] | 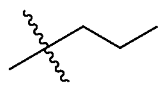 [SMILES: *CCC] | H | H | 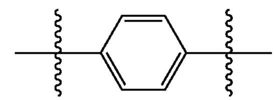 [SMILES: *c1ccc(*)cc1] | 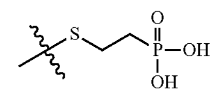 [SMILES: *SCCP(=O)(O)O] |
| 519 | 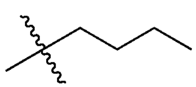 [SMILES: *CCCC] | 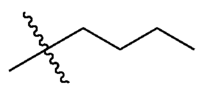 [SMILES: *CCCC] | H | H | 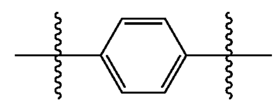 [SMILES: *c1ccc(*)cc1] | 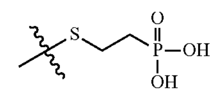 [SMILES: *SCCP(=O)(O)O] |
| 520 | 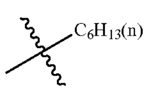 | 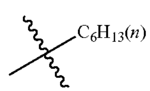 | H | H | 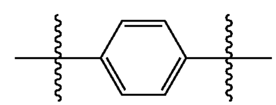 [SMILES: *c1ccc(*)cc1] | 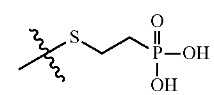 [SMILES: *SCCP(=O)(O)O] |

-continued
| | | | | | | |
|---|---|---|---|---|---|---|
| 521 | 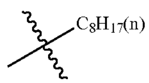 | 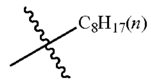 | H | H | 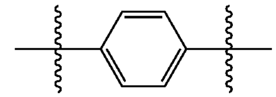 | 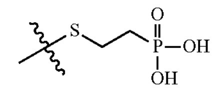 |
| 522 | 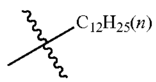 | 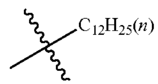 | H | H | 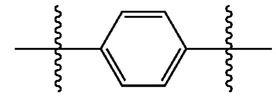 | 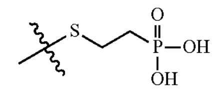 |
| 523 | 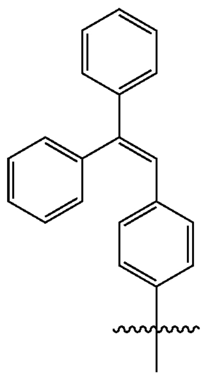 [SMILES: *c1ccc(C=C(c2ccccc2)c2ccccc2)cc1] | 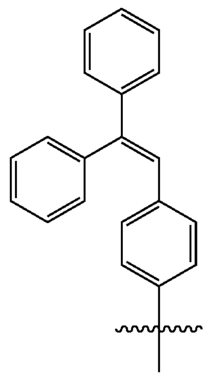 [SMILES: *c1ccc(C=C(c2ccccc2)c2ccccc2)cc1] | H | H | 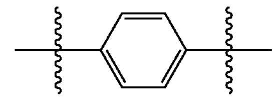 | 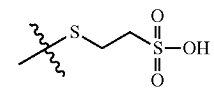 [SMILES: *SCCS(=O)(=O)O] |
| 524 | 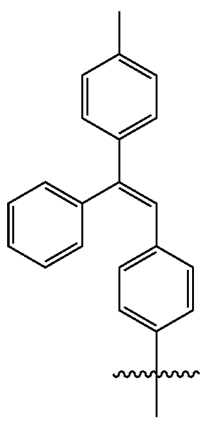 [SMILES: *c1ccc(/C=C(\c2ccccc2)c2ccc(C)cc2)cc1] | 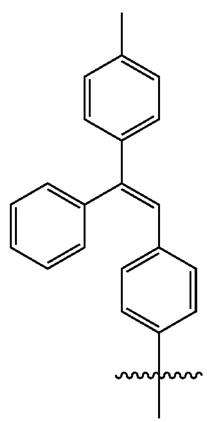 [SMILES: *c1ccc(/C=C(\c2ccccc2)c2ccc(C)cc2)cc1] | H | H | 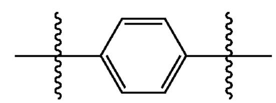 | 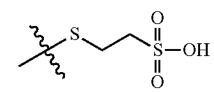 |

-continued
| | | | | | | |
|---|---|---|---|---|---|---|
| 525 | 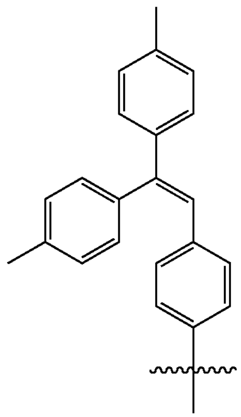 [SMILES: *c1ccc(C=C(c2ccc(C)cc2)c2ccc(C)cc2)cc1] | 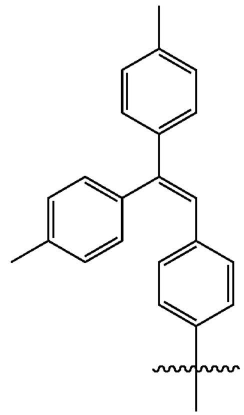 [SMILES: *c1ccc(C=C(c2ccc(C)cc2)c2ccc(C)cc2)cc1] | H | H | 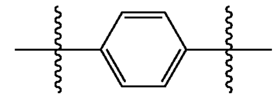 | 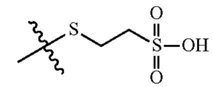 |
| 526 | 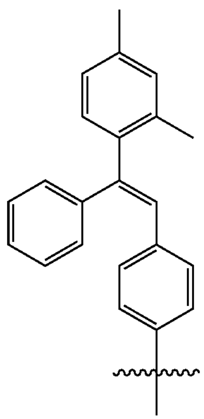 [SMILES: *c1ccc(/C=C(\c2ccccc2)c2ccc(C)cc2C)cc1] | 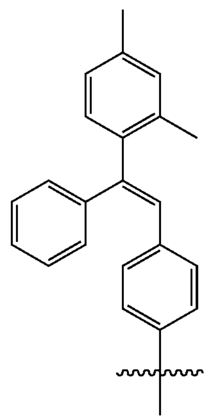 [SMILES: *c1ccc(/C=C(\c2ccccc2)c2ccc(C)cc2C)cc1] | H | H | 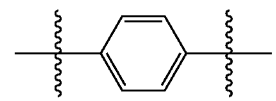 | 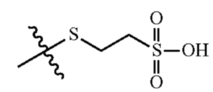 |

-continued
| | | | | | | |
|---|---|---|---|---|---|---|
| 527 | 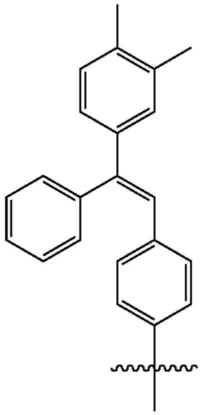 [SMILES: *c1ccc(/C=C(\c2ccccc2)c2ccc(C)c(C)c2)cc1] | 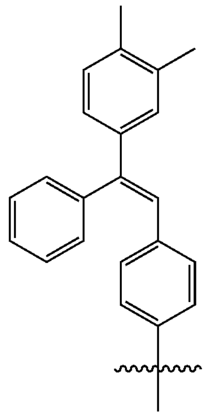 [SMILES: *c1ccc(/C=C(\c2ccccc2)c2ccc(C)c(C)c2)cc1] | H | H | 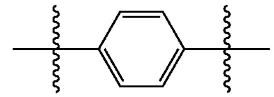 [SMILES: *c1ccc(*)cc1] | 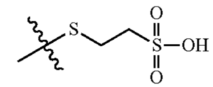 |
| 528 | 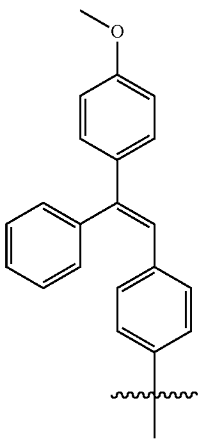 [SMILES: *c1ccc(/C=C(\c2ccccc2)c2ccc(OC)cc2)cc1] | 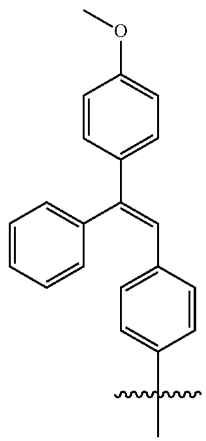 [SMILES: *c1ccc(/C=C(\c2ccccc2)c2ccc(OC)cc2)cc1] | H | H | 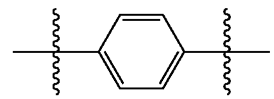 | 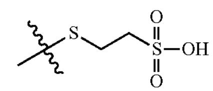 |

-continued
| | | | | | | |
|---|---|---|---|---|---|---|
| 529 | 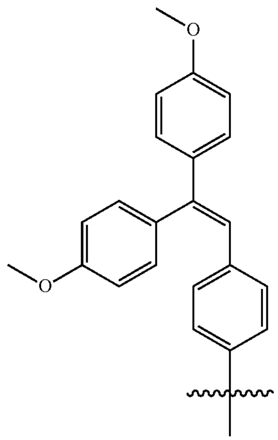 [SMILES: *c1ccc(C=C(c2ccc(OC)cc2)c2ccc(OC)cc2)cc1] | 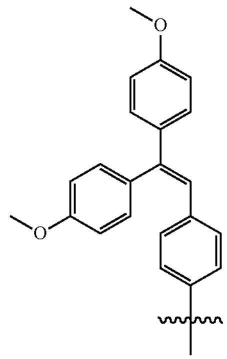 [SMILES: *c1ccc(C=C(c2ccc(OC)cc2)c2ccc(OC)cc2)cc1] | H | H | 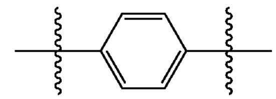 [SMILES: *c1ccc(*)cc1] | 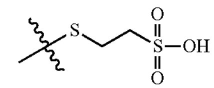 [SMILES: *SCCS(=O)(=O)O] |
| 530 | 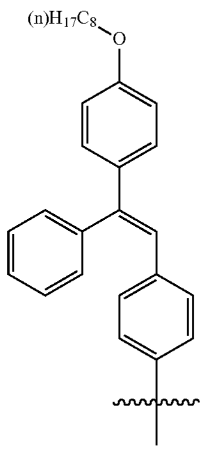 | 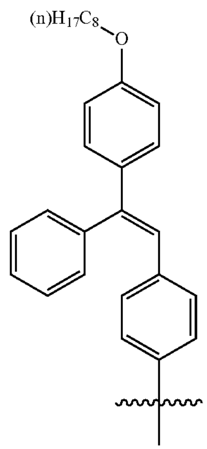 | H | H | 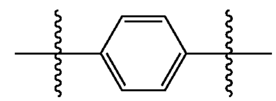 | 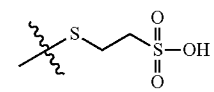 |

-continued
| | | | | | | |
|---|---|---|---|---|---|---|
| 531 | 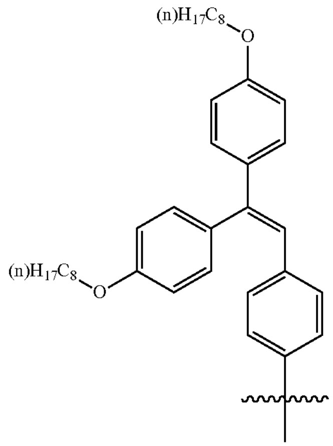 | 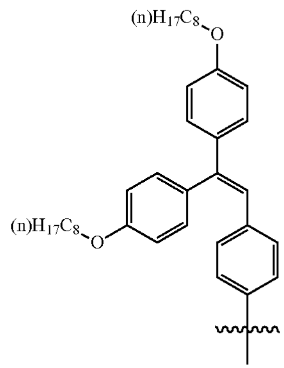 | H | H | 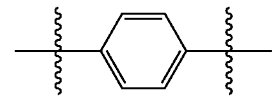 [SMILES: *c1ccc(*)cc1] | 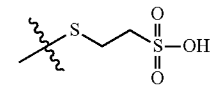 [SMILES: *SCCS(=O)(=O)O] |
| 532 | 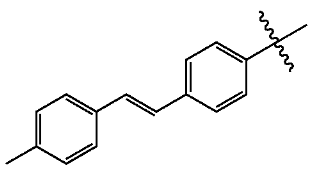 [SMILES: *c1ccc(/C=C/c2ccc(C)cc2)cc1] | 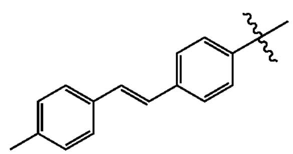 [SMILES: *c1ccc(/C=C/c2ccc(C)cc2)cc1] | H | H | 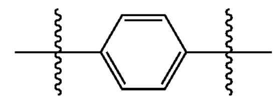 | 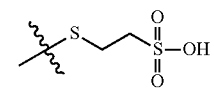 |
| 533 | 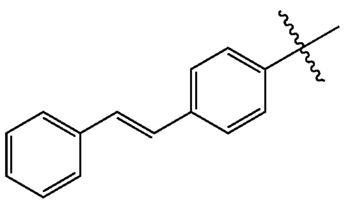 [SMILES: *c1ccc(/C=C/c2ccccc2)cc1] | 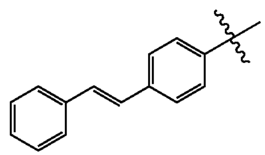 [SMILES: *c1ccc(/C=C/c2ccccc2)cc1] | H | H | 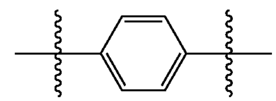 [SMILES: *c1ccc(*)cc1] | 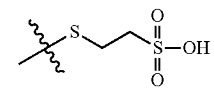 [SMILES: *SCCS(=O)(=O)O] |
| 534 | 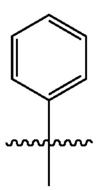 [SMILES: *c1ccccc1] | 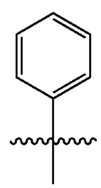 [SMILES: *c1ccccc1] | H | H | 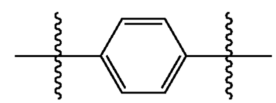 | 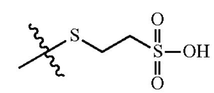 |

-continued
| | | | | | | |
|---|---|---|---|---|---|---|
| 535 | 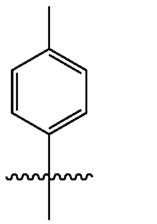 [SMILES: *c1ccc(C)cc1] | 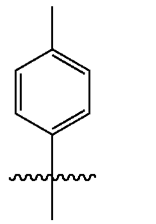 | H | H | 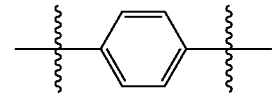 [SMILES: *c1ccc(*)cc1] | 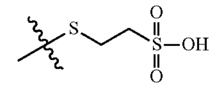 |
| 536 | 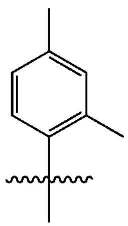 | 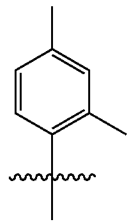 [SMILES: *c1ccc(C)cc1C] | H | H | 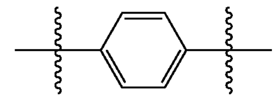 [SMILES: *c1ccc(*)cc1] | 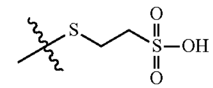 |
| 537 | 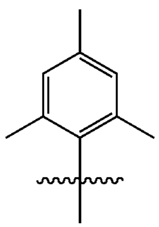 | 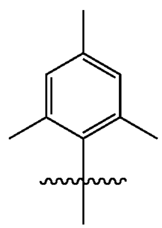 | H | H | 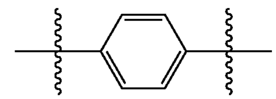 | 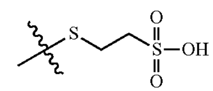 |
| 538 | 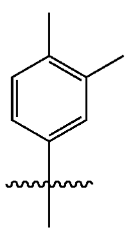 [SMILES: *c1ccc(C)c(C)c1] | 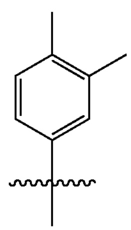 [SMILES: *c1ccc(C)c(C)c1] | H | H | 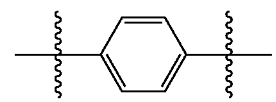 | 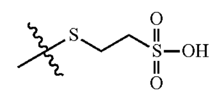 [SMILES: *SCCS(=O)(=O)O] |

-continued
| | | | | | | |
|---|---|---|---|---|---|---|
| 539 | 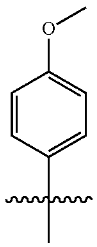 [SMILES: *c1ccc(OC)cc1] | 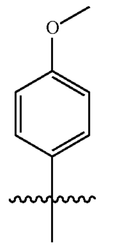 [SMILES: *c1ccc(OC)cc1] | H | H | 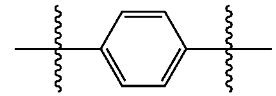 [SMILES: *c1ccc(*)cc1] | 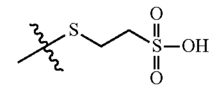 [SMILES: *SCCS(=O)(=O)O] |
| 540 | 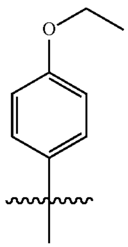 | 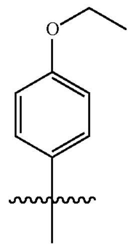 [SMILES: *c1ccc(OCC)cc1] | H | H | 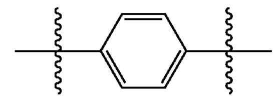 | 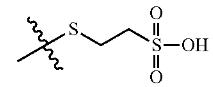 [SMILES: *SCCS(=O)(=O)O] |
| 541 | 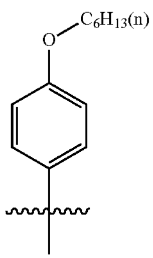 | 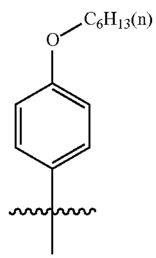 | H | H | 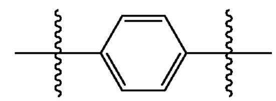 [SMILES: *c1ccc(*)cc1] | 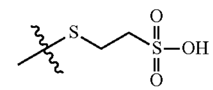 |
| 542 | 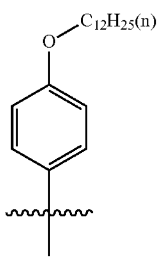 | 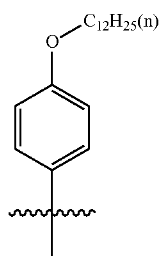 | H | H | 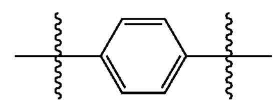 | 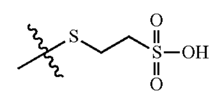 |

-continued
| | | | | | | |
|---|---|---|---|---|---|---|
| 543 | 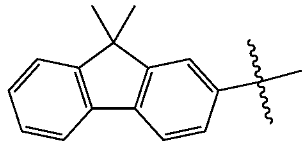 [SMILES: *c1ccc2c(c1)C(C)(C)c1ccccc1-2] | 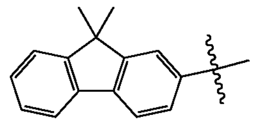 [SMILES: *c1ccc2c(c1)C(C)(C)c1ccccc1-2] | H | H | 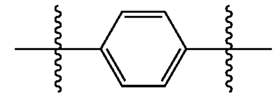 [SMILES: *c1ccc(*)cc1] | 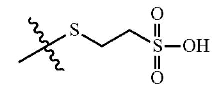 |
| 544 | 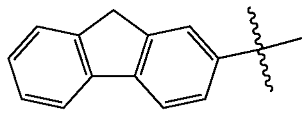 | 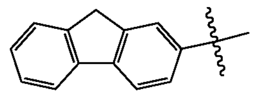 | H | H | 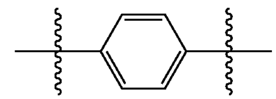 | 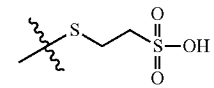 [SMILES: *SCCS(=O)(=O)O] |
| 545 | 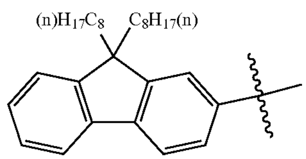 | 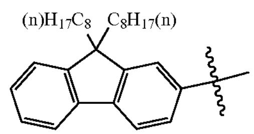 | H | H | 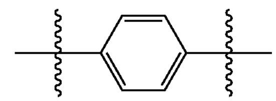 [SMILES: *c1ccc(*)cc1] | 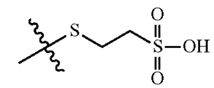 |
| 546 | 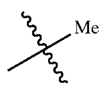 | 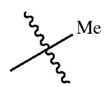 | H | H | 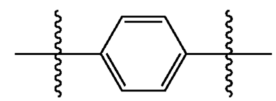 [SMILES: *c1ccc(*)cc1] | 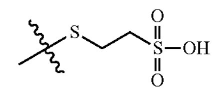 |
| 547 | 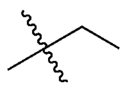 [SMILES: *CC] | 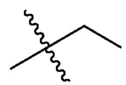 [SMILES: *CC] | H | H | 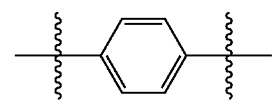 [SMILES: *c1ccc(*)cc1] | 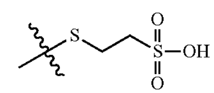 |
| 548 | 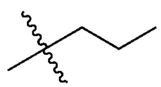 [SMILES: *CCC] | 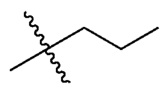 [SMILES: *CCC] | H | H | 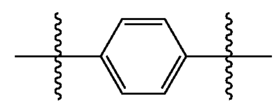 | 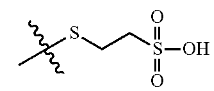 |
| 549 | 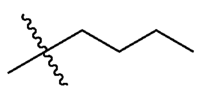 [SMILES: *CCCC] | 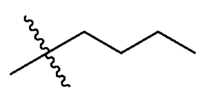 [SMILES: *CCCC] | H | H | 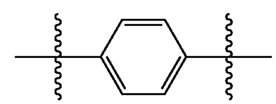 | 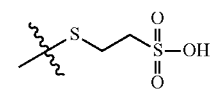 |
| 550 | 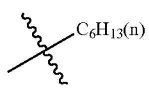 | 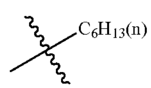 | H | H | 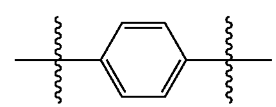 [SMILES: *c1ccc(*)cc1] | 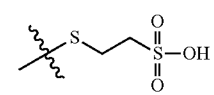 |

-continued
| | | | | | | |
|---|---|---|---|---|---|---|
| 551 | 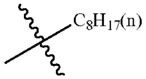 | 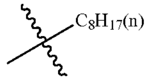 | H | H | 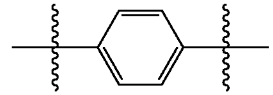 | 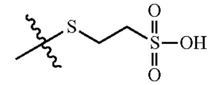 [SMILES: *SCCS(=O)(=O)O] |
| 552 | 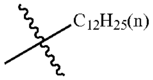 | 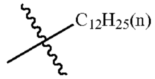 | H | H | 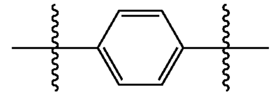 [SMILES: *c1ccc(*)cc1] | 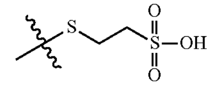 |
| Dye | 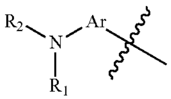 | $R_3$ | $R_4$ | | | 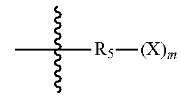 |
| 601 | 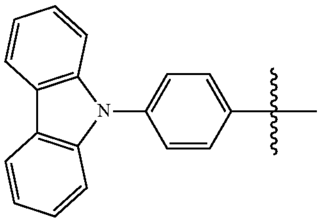 [SMILES: *c1ccc(-n2c3ccccc3c3ccccc32)cc1] | H | H | | | 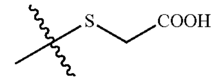 [SMILES: *SCC(=O)O] |
| 602 | 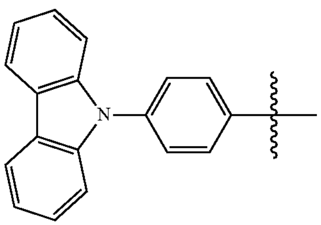 [SMILES: *c1ccc(-n2c3ccccc3c3ccccc32)cc1] | 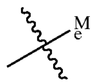 | H | | | 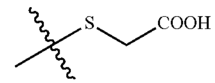 |
| 603 | 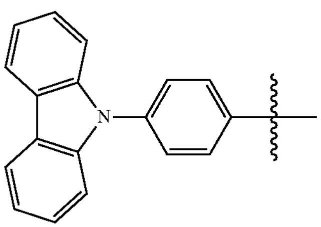 [SMILES: *c1ccc(-n2c3ccccc3c3ccccc32)cc1] | H | 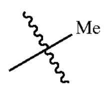 | | | 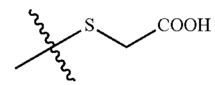 [SMILES: *SCC(=O)O] |

-continued
| | | | | |
|---|---|---|---|---|
| 604 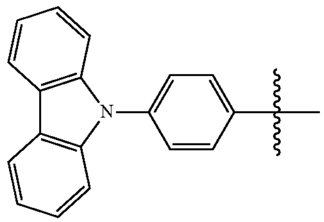 [SMILES: *c1ccc(-n2c3ccccc3c3ccccc32)cc1] | 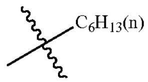 | 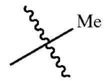 | 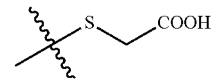 |
| 605 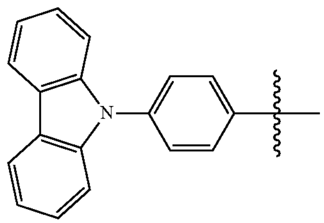 [SMILES: *c1ccc(-n2c3ccccc3c3ccccc32)cc1] | 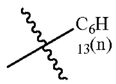 | H | 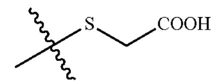 |
| 606 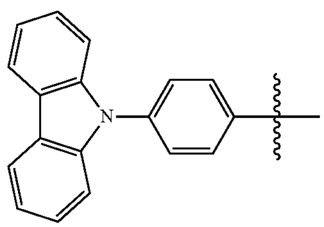 [SMILES: *c1ccc(-n2c3ccccc3c3ccccc32)cc1] | 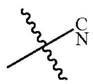 [SMILES: *C#N] | H | 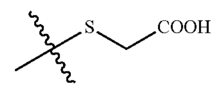 [SMILES: *SCC(=O)O] |
| 607 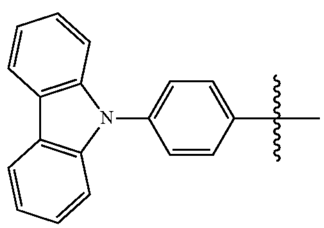 [SMILES: *c1ccc(-n2c3ccccc3c3ccccc32)cc1] | H | H | 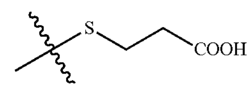 [SMILES: *SCCC(=O)O] |

-continued
| | | | | |
|---|---|---|---|---|
| 608 | 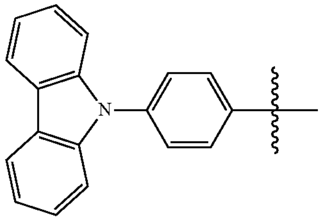 [SMILES: *c1ccc(-n2c3ccccc3c3ccccc32)cc1] | H | H | 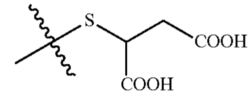 [SMILES: *SC(CC(=O)O)C(=O)O] |
| 609 | 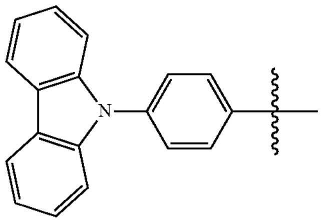 [SMILES: *c1ccc(-n2c3ccccc3c3ccccc32)cc1] | H | H | 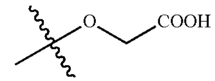 |
| 610 | 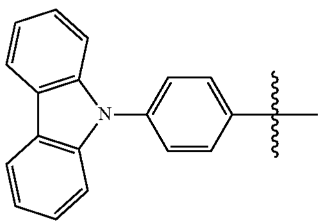 [SMILES: *c1ccc(-n2c3ccccc3c3ccccc32)cc1] | H | H | 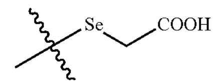 [SMILES: *[Se]CC(=O)O] |
| 611 | 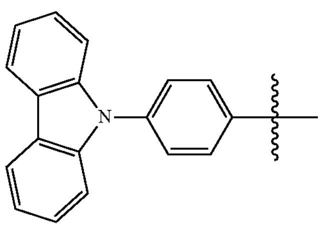 [SMILES: *c1ccc(-n2c3ccccc3c3ccccc32)cc1] | H | H | 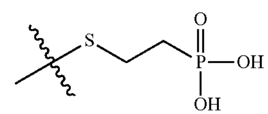 [SMILES: *SCCP(=O)(O)O] |

-continued
| | | | | |
|---|---|---|---|---|
| 612 | 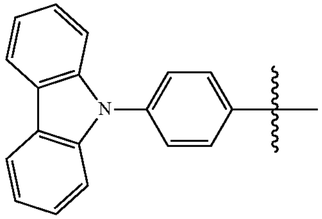 [SMILES: *c1ccc(-n2c3ccccc3c3ccccc32)cc1] | H | H | 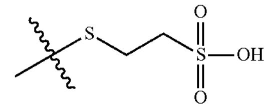 [SMILES: *SCCS(=O)(=O)O] |
| 613 | 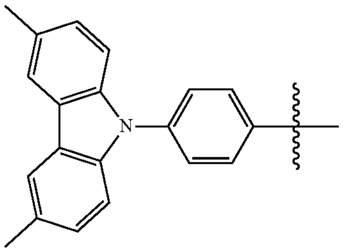 [SMILES: *c1ccc(-n2c3ccc(C)cc3c3cc(C)ccc32)cc1] | H | H | 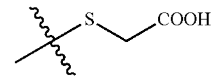 [SMILES: *SCC(=O)O] |
| 614 | 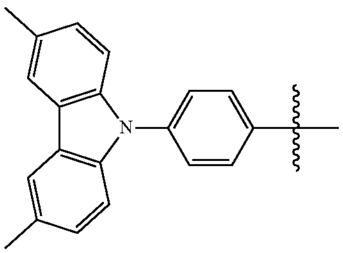 [SMILES: *c1ccc(-n2c3ccc(C)cc3c3cc(C)ccc32)cc1] |  | H | 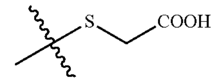 [SMILES: *SCC(=O)O] |
| 615 | 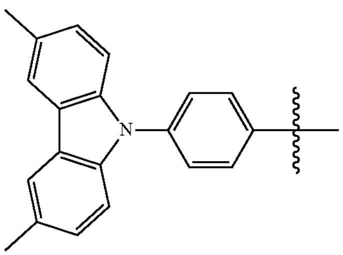 [SMILES: *c1ccc(-n2c3ccc(C)cc3c3cc(C)ccc32)cc1] | H | 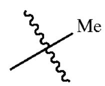 | 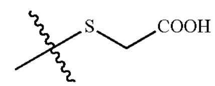 [SMILES: *SCC(=O)O] |

-continued
| | | | | |
|---|---|---|---|---|
| 616 | 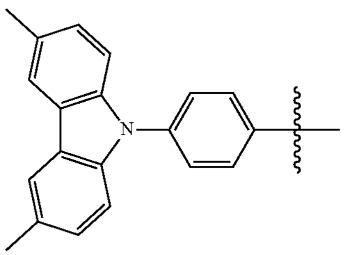 [SMILES: *c1ccc(-n2c3ccc(C)cc3c3cc(C)ccc32)cc1] |  | 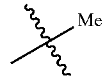 | 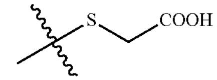 |
| 617 | 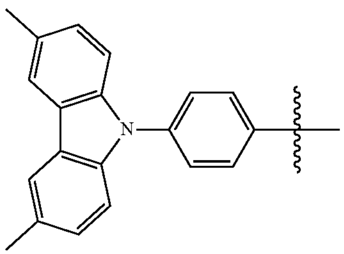 [SMILES: *c1ccc(-n2c3ccc(C)cc3c3cc(C)ccc32)cc1] | 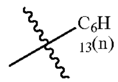 | H | 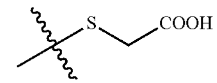 |
| 618 | 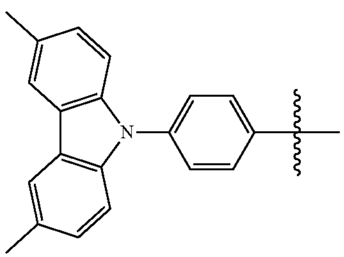 [SMILES: *c1ccc(-n2c3ccc(C)cc3c3cc(C)ccc32)cc1] | 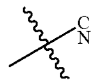 | H | 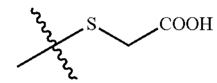 [SMILES: *SCC(=O)O] |
| 619 | 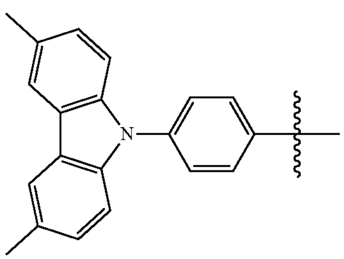 [SMILES: *c1ccc(-n2c3ccc(C)cc3c3cc(C)ccc32)cc1] | H | H | 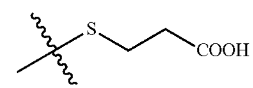 [SMILES: *SCCC(=O)O] |

-continued
| | | | | |
|---|---|---|---|---|
| 620 | 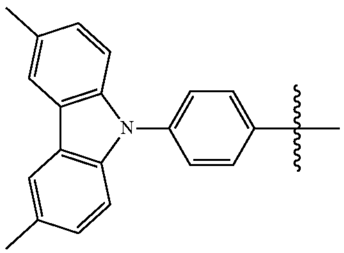 [SMILES: *c1ccc(-n2c3ccc(C)cc3c3cc(C)ccc32)cc1] | H | H | 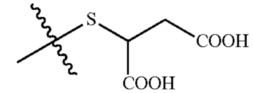 [SMILES: *SC(CC(=O)O)C(=O)O] |
| 621 | 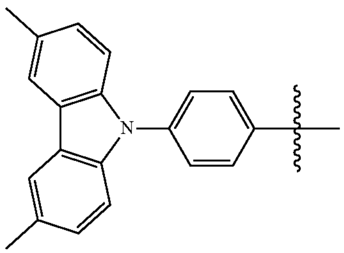 [SMILES: *c1ccc(-n2c3ccc(C)cc3c3cc(C)ccc32)cc1] | H | H | 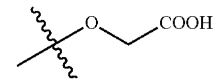 |
| 622 | 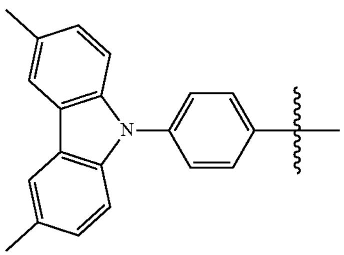 [SMILES: *c1ccc(-n2c3ccc(C)cc3c3cc(C)ccc32)cc1] | H | H | 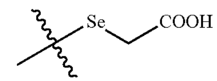 |
| 623 | 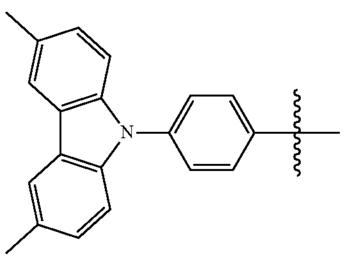 [SMILES: *c1ccc(-n2c3ccc(C)cc3c3cc(C)ccc32)cc1] | H | H | 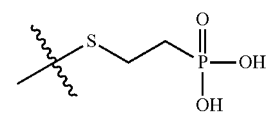 |

-continued
| | | | | |
|---|---|---|---|---|
| 624 | 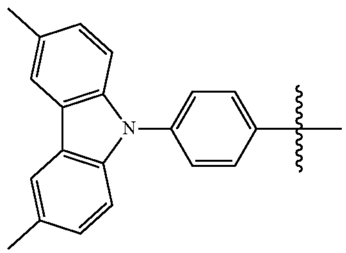 [SMILES: *c1ccc(-n2c3ccc(C)cc3c3cc(C)ccc32)cc1] | H | H | 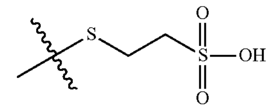 |
| 625 | 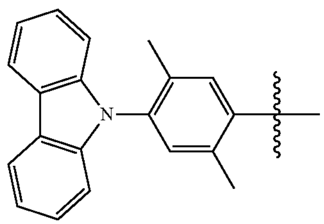 [SMILES: *c1cc(C)c(-n2c3ccccc3c3ccccc32)cc1C] | H | H | 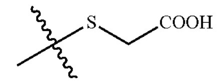 [SMILES: *SCC(=O)O] |
| 626 | 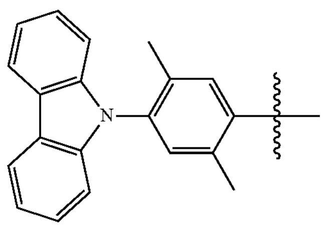 [SMILES: *c1cc(C)c(-n2c3ccccc3c3ccccc32)cc1C] |  | H | 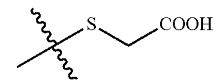 [SMILES: *SCC(=O)O] |
| 627 | 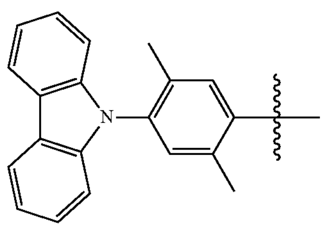 [SMILES: *c1cc(C)c(-n2c3ccccc3c3ccccc32)cc1C] | H | 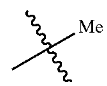 | 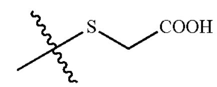 |

-continued
| | | | | |
|---|---|---|---|---|
| 629 | 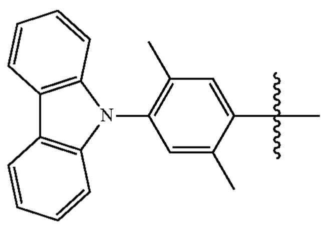 [SMILES: *c1cc(C)c(-n2c3ccccc3c3ccccc32)cc1C] | 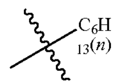 | H | 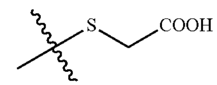 [SMILES: *SCC(=O)O] |
| 630 | 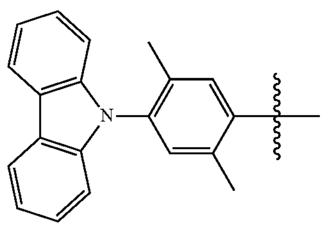 [SMILES: *c1cc(C)c(-n2c3ccccc3c3ccccc32)cc1C] | 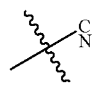 | H | 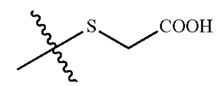 [SMILES: *SCC(=O)O] |
| 631 | 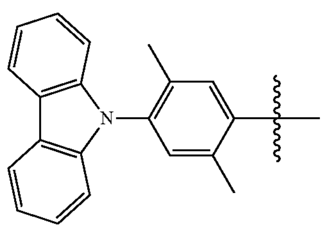 [SMILES: *c1cc(C)c(-n2c3ccccc3c3ccccc32)cc1C] | H | H | 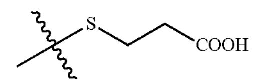 [SMILES: *SCCC(=O)O] |

-continued
| | | | | |
|---|---|---|---|---|
| 632 | 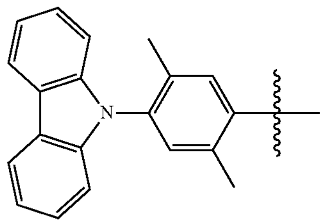 [SMILES: *c1cc(C)c(-n2c3ccccc3c3ccccc32)cc1C] | H | H | 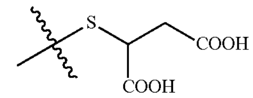 |
| 633 | 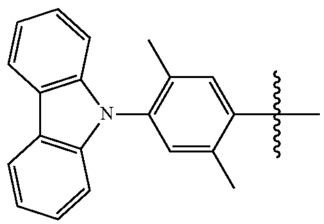 [SMILES: *c1cc(C)c(-n2c3ccccc3c3ccccc32)cc1C] | H | H | 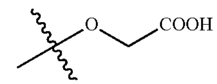 |
| 634 | 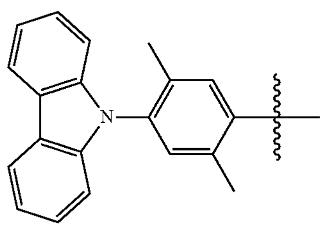 [SMILES: *c1cc(C)c(-n2c3ccccc3c3ccccc32)cc1C] | H | H | 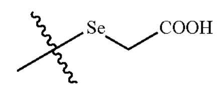 |
| 635 | 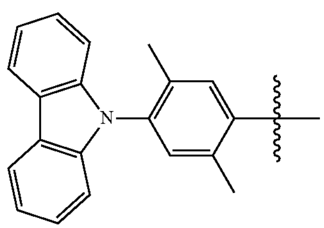 [SMILES: *c1cc(C)c(-n2c3ccccc3c3ccccc32)cc1C] | H | H | 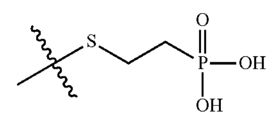 |

-continued
| | | | |
|---|---|---|---|
| 636 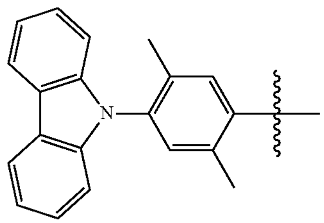 [SMILES: *c1cc(C)c(-n2c3ccccc3c3ccccc32)cc1C] | H | H | 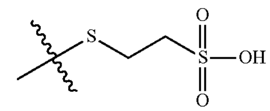 [SMILES: *SCCS(=O)(=O)O] |
| 637 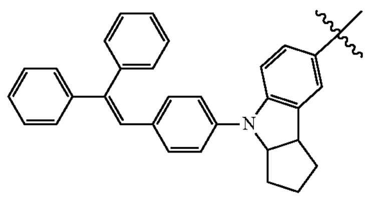 [SMILES: *c1ccc2c(c1)C1CCCC1N2c1ccc(C=C(c2ccccc2)c2ccccc2)cc1] | H | H | 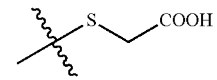 [SMILES: *SCC(=O)O] |
| 637 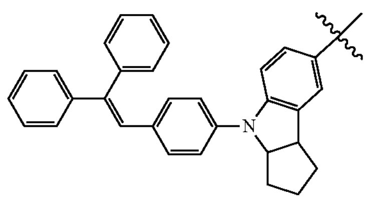 [SMILES: *c1ccc2c(c1)C1CCCC1N2c1ccc(C=C(c2ccccc2)c2ccccc2)cc1] | 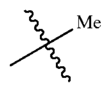 | H | 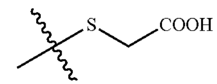 [SMILES: *SCC(=O)O] |
| 639 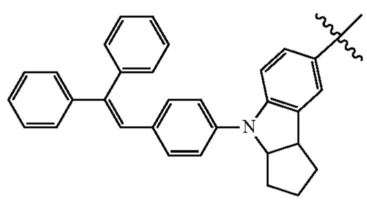 | H | 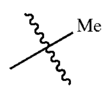 | 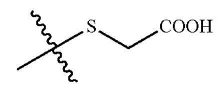 |
| 640 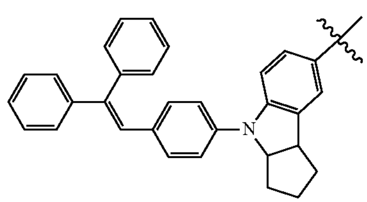 [SMILES: *c1ccc2c(c1)C1CCCC1N2c1ccc(C=C(c2ccccc2)c2ccccc2)cc1] | 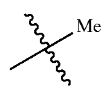 | 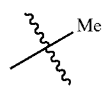 | 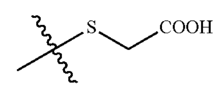 [SMILES: *SCC(=O)O] |

-continued
| | | | | |
|---|---|---|---|---|
| 641 | 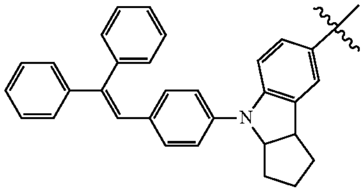 [SMILES: *c1ccc2c(c1)C1CCCC1N2c1ccc(C=C(c2ccccc2)c2ccccc2)cc1] | 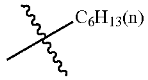 | H | 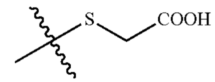 |
| 642 | 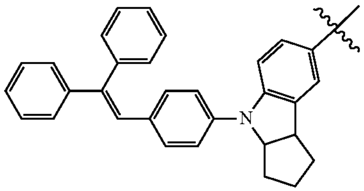 [SMILES: *c1ccc2c(c1)C1CCCC1N2c1ccc(C=C(c2ccccc2)c2ccccc2)cc1] | 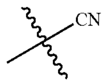 | H | 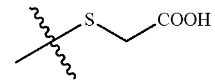 |
| 643 | 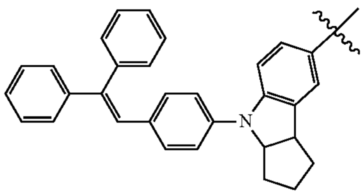 [SMILES: *c1ccc2c(c1)C1CCCC1N2c1ccc(C=C(c2ccccc2)c2ccccc2)cc1] | H | H | 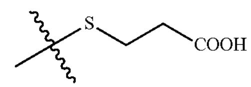 [SMILES: *SCCC(=O)O] |
| 644 | 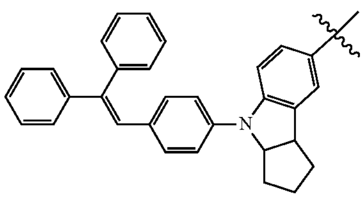 [SMILES: *c1ccc2c(c1)C1CCCC1N2c1ccc(C=C(c2ccccc2)c2ccccc2)cc1] | H | H |  |
| 645 | 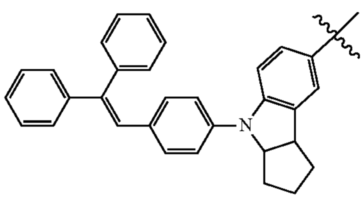 [SMILES: *c1ccc2c(c1)C1CCCC1N2c1ccc(C=C(c2ccccc2)c2ccccc2)cc1] | H | H | 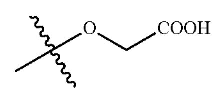 |

-continued
| | | | | |
|---|---|---|---|---|
| 646 | 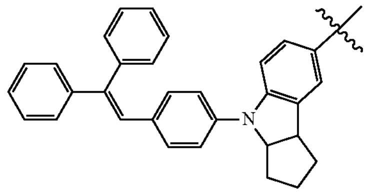 [SMILES: *c1ccc2c(c1)C1CCCC1N2c1ccc(C=C(c2ccccc2)c2ccccc2)cc1] | H | H | 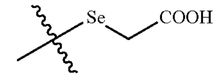 |
| 647 | 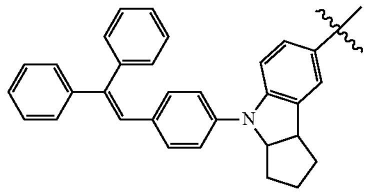 [SMILES: *c1ccc2c(c1)C1CCCC1N2c1ccc(C=C(c2ccccc2)c2ccccc2)cc1] | H | H | 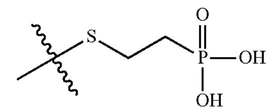 |
| 648 | 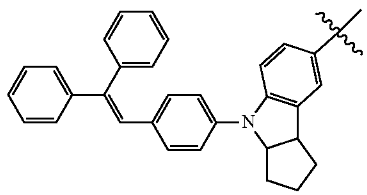 [SMILES: *c1ccc2c(c1)C1CCCC1N2c1ccc(C=C(c2ccccc2)c2ccccc2)cc1] | H | H | 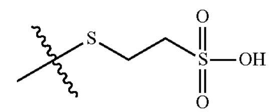 |
| 649 | 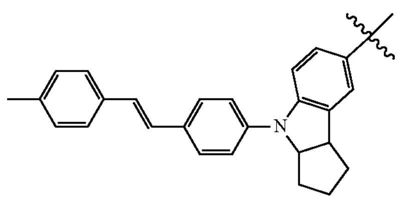 [SMILES: *c1ccc2c(c1)C1CCCC1N2c1ccc(/C=C/c2ccc(C)cc2)cc1] | H | H | 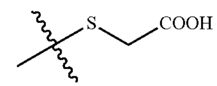 |
| 650 | 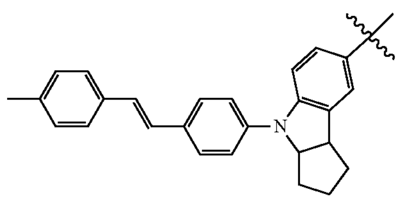 [SMILES: *c1ccc2c(c1)C1CCCC1N2c1ccc(/C=C/c2ccc(C)cc2)cc1] | 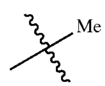 | H | 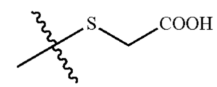 [SMILES: *SCC(=O)O] |

-continued
| | | | |
|---|---|---|---|
| 651 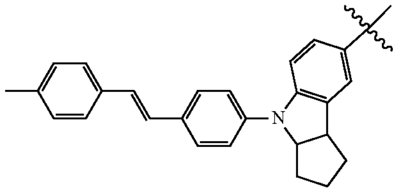 [SMILES: *c1ccc2c(c1)C1CCCC1N2c1ccc(/C=C/c2ccc(C)cc2)cc1] | H | 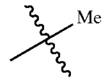 | 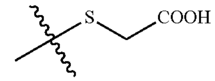 [SMILES: *SCC(=O)O] |
| 652 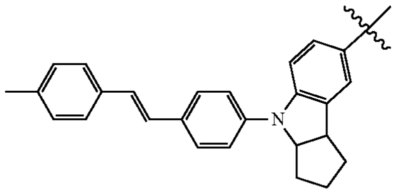 [SMILES: *c1ccc2c(c1)C1CCCC1N2c1ccc(/C=C/c2ccc(C)cc2)cc1] | 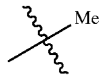 | 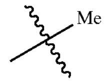 | 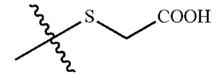 [SMILES: *SCC(=O)O] |
| 653 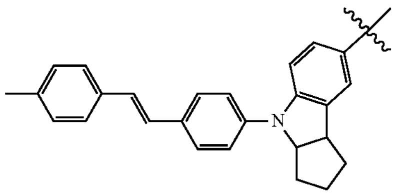 [SMILES: *c1ccc2c(c1)C1CCCC1N2c1ccc(/C=C/c2ccc(C)cc2)cc1] | 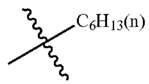 | H | 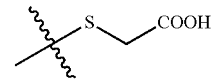 |
| 654 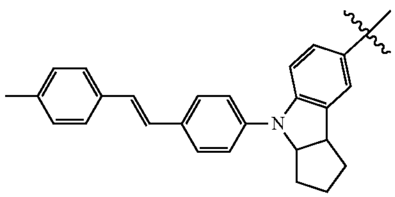 [SMILES: *c1ccc2c(c1)C1CCCC1N2c1ccc(/C=C/c2ccc(C)cc2)cc1] | 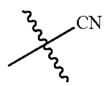 [SMILES: *C#N] | H | 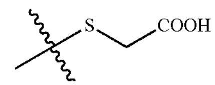 |
| 655 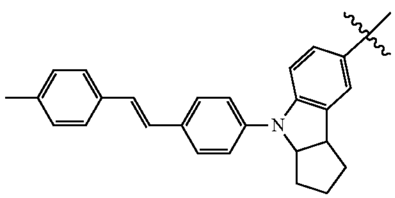 [SMILES: *c1ccc2c(c1)C1CCCC1N2c1ccc(/C=C/c2ccc(C)cc2)cc1] | H | H | 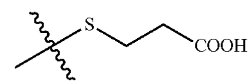 [SMILES: *SCCC(=O)O] |

-continued
| | | | | |
|---|---|---|---|---|
| 656 | 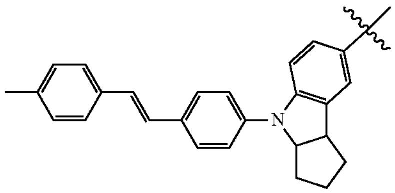 [SMILES: *c1ccc2c(c1)C1CCCC1N2c1ccc(/C=C/c2ccc(C)cc2)cc1] | H | H | 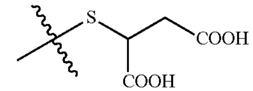 [SMILES: *SC(CC(=O)O)C(=O)O] |
| 657 | 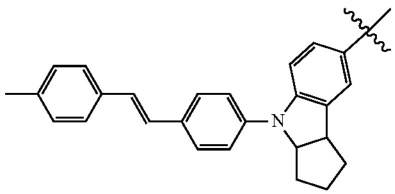 [SMILES: *c1ccc2c(c1)C1CCCC1N2c1ccc(/C=C/c2ccc(C)cc2)cc1] | H | H | 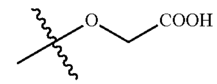 |
| 658 | 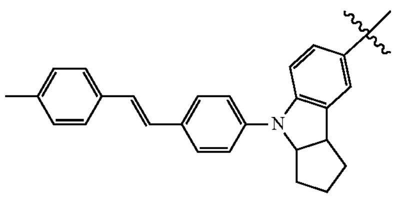 [SMILES: *c1ccc2c(c1)C1CCCC1N2c1ccc(/C=C/c2ccc(C)cc2)cc1] | H | H | 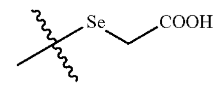 |
| 659 | 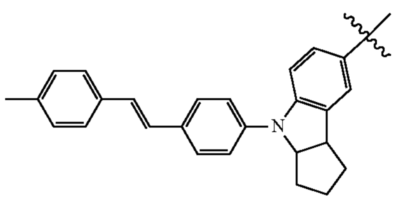 [SMILES: *c1ccc2c(c1)C1CCCC1N2c1ccc(/C=C/c2ccc(C)cc2)cc1] | H | H | 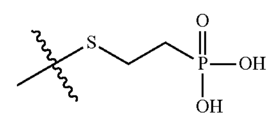 [SMILES: *SCCP(=O)(O)O] |
| 660 | 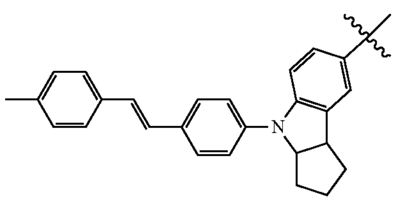 [SMILES: *c1ccc2c(c1)C1CCCC1N2c1ccc(/C=C/c2ccc(C)cc2)cc1] | H | H | 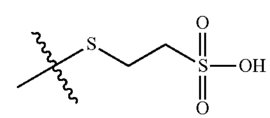 |

-continued
| | | | | |
|---|---|---|---|---|
| 661 | 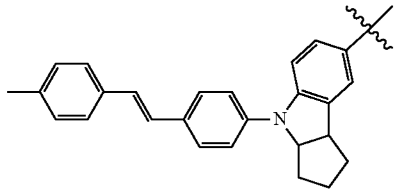 [SMILES: *c1ccc2c(c1)C1CCCC1N2c1ccc(/C=C/c2ccc(C)cc2)cc1] | H | H | 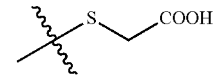 |
| 662 | 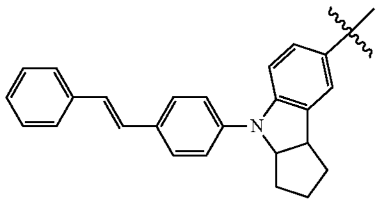 [SMILES: *c1ccc2c(c1)C1CCCC1N2c1ccc(/C=C/c2ccccc2)cc1] | 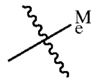 | H | 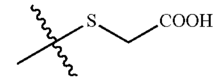 |
| 663 | 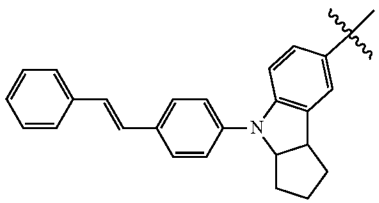 [SMILES: *c1ccc2c(c1)C1CCCC1N2c1ccc(/C=C/c2ccccc2)cc1] | H | 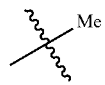 | 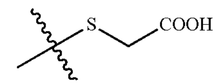 [SMILES: *SCC(=O)O] |
| 664 | 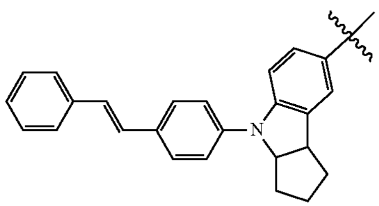 [SMILES: *c1ccc2c(c1)C1CCCC1N2c1ccc(/C=C/c2ccccc2)cc1] | 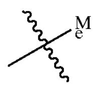 | 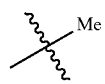 | 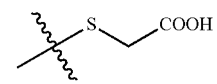 [SMILES: *SCC(=O)O] |
| 665 | 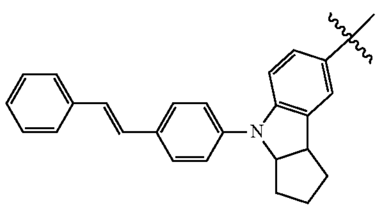 [SMILES: *c1ccc2c(c1)C1CCCC1N2c1ccc(/C=C/c2ccccc2)cc1] | 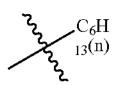 | H | 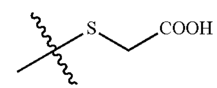 |

-continued
| | | | | |
|---|---|---|---|---|
| 666 | 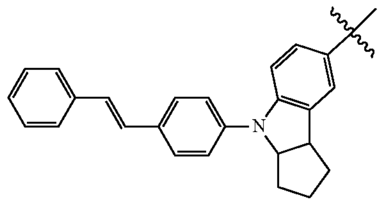 [SMILES: *c1ccc2c(c1)C1CCCC1N2c1ccc(/C=C/c2ccccc2)cc1] |  | H | 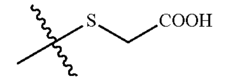 [SMILES: *SCC(=O)O] |
| 667 | 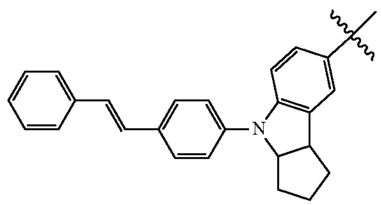 [SMILES: *c1ccc2c(c1)C1CCCC1N2c1ccc(/C=C/c2ccccc2)cc1] | H | H | 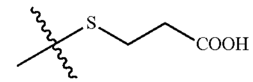 [SMILES: *SCCC(=O)O] |
| 668 | 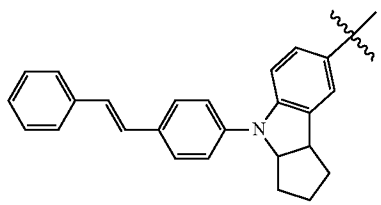 [SMILES: *c1ccc2c(c1)C1CCCC1N2c1ccc(/C=C/c2ccccc2)cc1] | H | H | 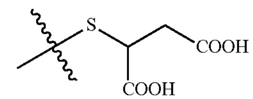 [SMILES: *SC(CC(=O)O)C(=O)O] |
| 669 | 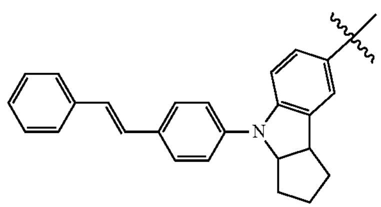 [SMILES: *c1ccc2c(c1)C1CCCC1N2c1ccc(/C=C/c2ccccc2)cc1] | H | H | 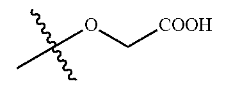 |
| 670 | 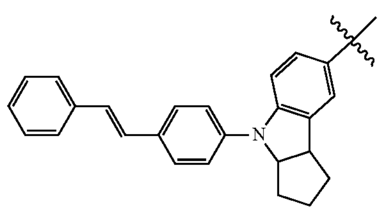 [SMILES: *c1ccc2c(c1)C1CCCC1N2c1ccc(/C=C/c2ccccc2)cc1] | H | H | 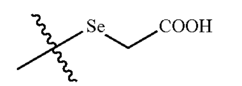 [SMILES: *[Se]CC(=O)O] |

-continued
| | | | | |
|---|---|---|---|---|
| 671 | 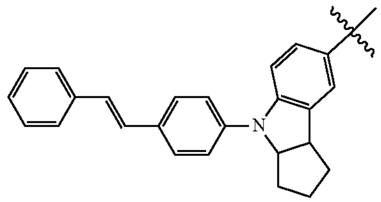 [SMILES: *c1ccc2c(c1)C1CCCC1N2c1ccc(/C=C/c2ccccc2)cc1] | H | H | 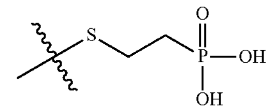 [SMILES: *SCCP(=O)(O)O] |
| 672 | 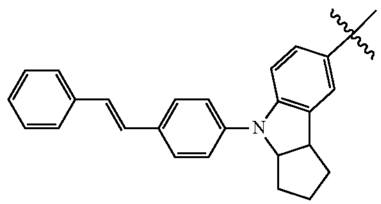 [SMILES: *c1ccc2c(c1)C1CCCC1N2c1ccc(/C=C/c2ccccc2)cc1] | H | H | 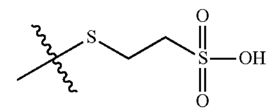 [SMILES: *SCCS(=O)(=O)O] |
| 673 | 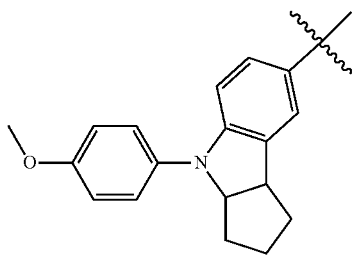 [SMILES: *c1ccc2c(c1)C1CCCC1N2c1ccc(OC)cc1] | H | H | 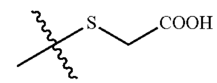 |
| 674 | 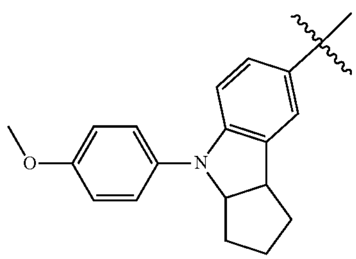 [SMILES: *c1ccc2c(c1)C1CCCC1N2c1ccc(OC)cc1] | 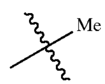 | H | 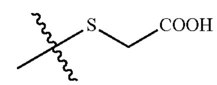 |

-continued
| | | | | |
|---|---|---|---|---|
| 675 | 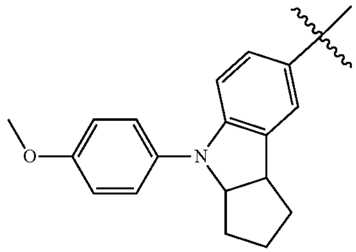 [SMILES: *c1ccc2c(c1)C1CCCC1N2c1ccc(OC)cc1] | H |  | 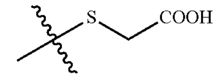 |
| 676 | 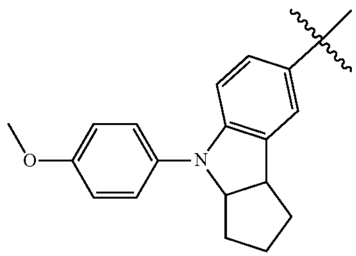 [SMILES: *c1ccc2c(c1)C1CCCC1N2c1ccc(OC)cc1] | 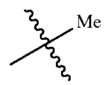 | 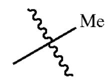 | 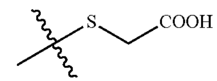 |
| 677 | 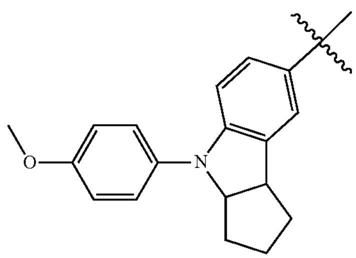 [SMILES: *c1ccc2c(c1)C1CCCC1N2c1ccc(OC)cc1] | 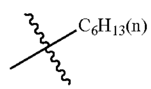 | H | 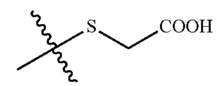 [SMILES: *SCC(=O)O] |
| 678 | 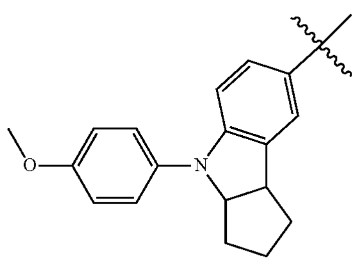 [SMILES: *c1ccc2c(c1)C1CCCC1N2c1ccc(OC)cc1] | 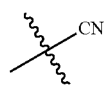 | H | 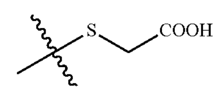 |

-continued
| | | | | |
|---|---|---|---|---|
| 679 | 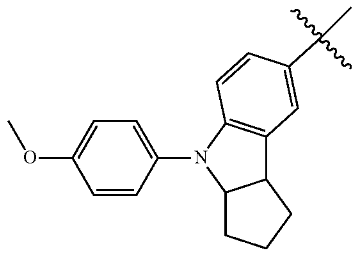 [SMILES: *c1ccc2c(c1)C1CCCC1N2c1ccc(OC)cc1] | H | H | 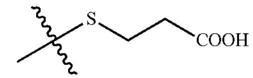 [SMILES: *SCCC(=O)O] |
| 680 | 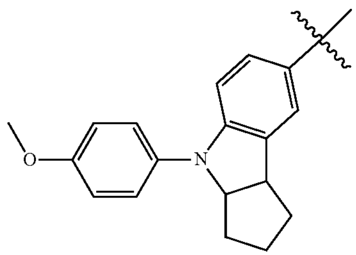 [SMILES: *c1ccc2c(c1)C1CCCC1N2c1ccc(OC)cc1] | H | H | 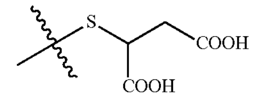 [SMILES: *SC(CC(=O)O)C(=O)O] |
| 681 | 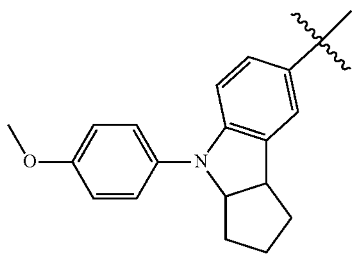 [SMILES: *c1ccc2c(c1)C1CCCC1N2c1ccc(OC)cc1] | H | H | 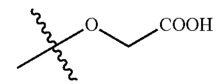 |
| 682 | 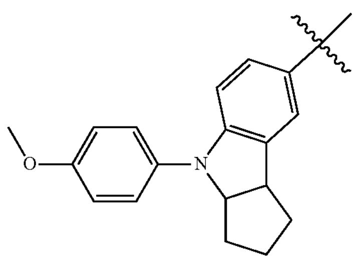 [SMILES: *c1ccc2c(c1)C1CCCC1N2c1ccc(OC)cc1] | H | H | 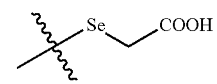 [SMILES: *[Se]CC(=O)O] |

-continued
| | | | | |
|---|---|---|---|---|
| 683 | 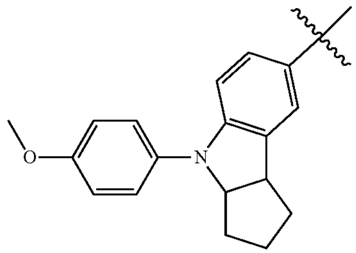 [SMILES: *c1ccc2c(c1)C1CCCC1N2c1ccc(OC)cc1] | H | H | 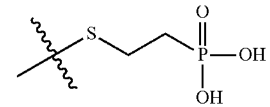 [SMILES: *SCCP(=O)(O)O] |
| 684 | 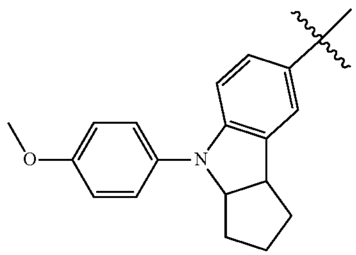 [SMILES: *c1ccc2c(c1)C1CCCC1N2c1ccc(OC)cc1] | H | H | 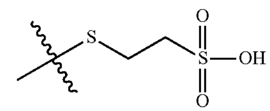 [SMILES: *SCCS(=O)(=O)O] |
| 685 | 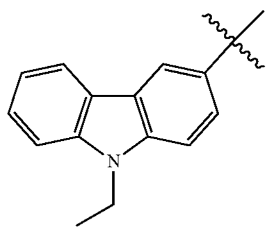 [SMILES: *c1ccc2c(c1)c1ccccc1n2CC] | H | H | 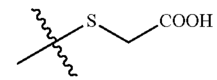 |
| 686 | 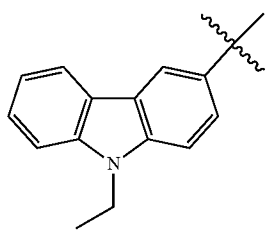 [SMILES: *c1ccc2c(c1)c1ccccc1n2CC] | 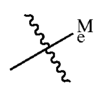 | H | 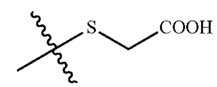 |

-continued
| | | | | |
|---|---|---|---|---|
| 687 | 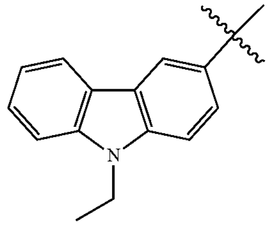 [SMILES: *c1ccc2c(c1)c1ccccc1n2CC] | H | 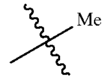 | 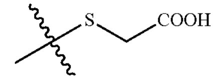 [SMILES: *SCC(=O)O] |
| 688 | 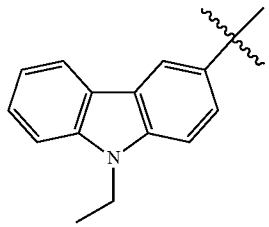 [SMILES: *c1ccc2c(c1)c1ccccc1n2CC] | 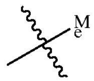 | 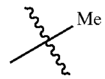 | 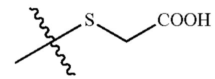 [SMILES: *SCC(=O)O] |
| 689 | 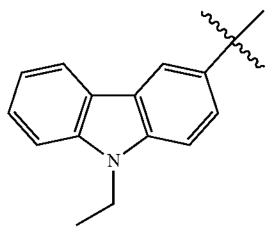 [SMILES: *c1ccc2c(c1)c1ccccc1n2CC] | 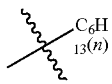 | H | 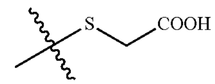 |
| 690 | 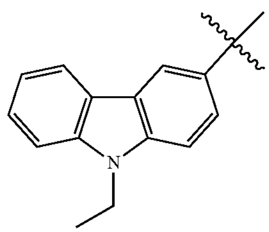 [SMILES: *c1ccc2c(c1)c1ccccc1n2CC] | 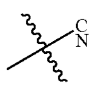 | H | 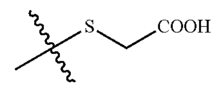 [SMILES: *SCC(=O)O] |

-continued
| | | | | |
|---|---|---|---|---|
| 691 | 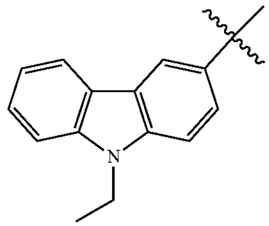 [SMILES: *c1ccc2c(c1)c1ccccc1n2CC] | H | H | 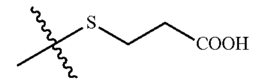 [SMILES: *SCCC(=O)O] |
| 692 | 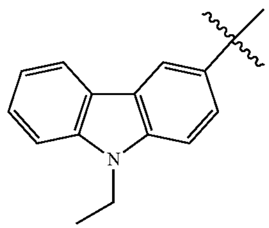 [SMILES: *c1ccc2c(c1)c1ccccc1n2CC] | H | H | 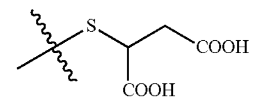 [SMILES: *SC(CC(=O)O)C(=O)O] |
| 693 | 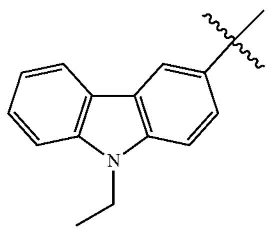 [SMILES: *c1ccc2c(c1)c1ccccc1n2CC] | H | H | 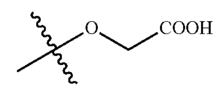 |
| 694 | 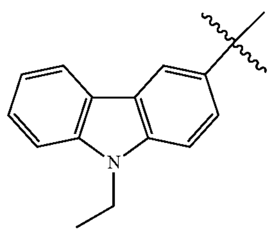 [SMILES: *c1ccc2c(c1)c1ccccc1n2CC] | H | H | 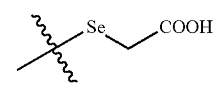 |

-continued
| | | | | |
|---|---|---|---|---|
| 695 | 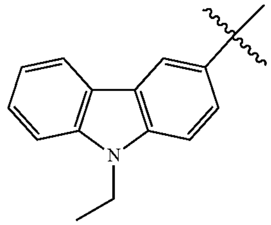 [SMILES: *c1ccc2c(c1)c1ccccc1n2CC] | H | H | 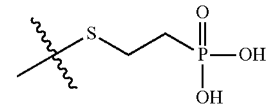 [SMILES: *SCCP(=O)(O)O] |
| 696 | 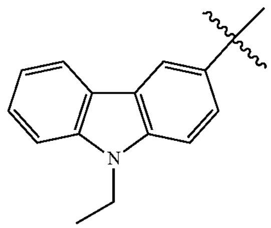 [SMILES: *c1ccc2c(c1)c1ccccc1n2CC] | H | H | 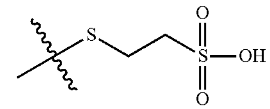 |
| 697 | 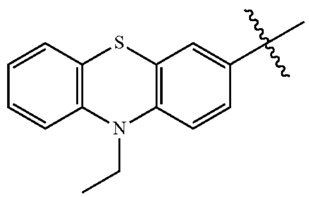 [SMILES: *c1ccc2c(c1)Sc1ccccc1N2CC] | H | H | 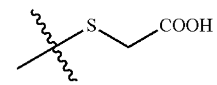 [SMILES: *SCC(=O)O] |
| 698 | 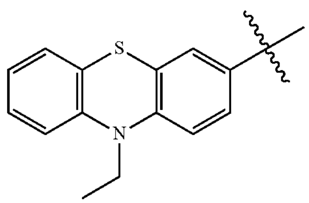 [SMILES: *c1ccc2c(c1)Sc1ccccc1N2CC] | 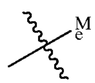 | H | 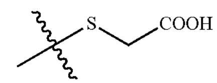 [SMILES: *SCC(=O)O] |
| 699 | 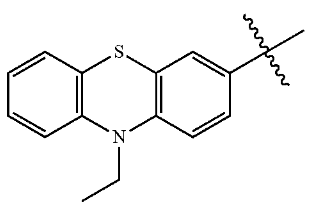 [SMILES: *c1ccc2c(c1)Sc1ccccc1N2CC] | H | 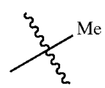 | 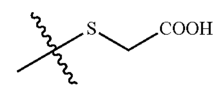 [SMILES: *SCC(=O)O] |

-continued
| | | | | |
|---|---|---|---|---|
| 700 | 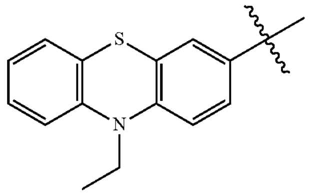 [SMILES: *c1ccc2c(c1)Sc1ccccc1N2CC] |  | 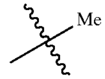 | 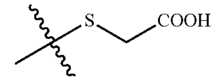 [SMILES: *SCC(=O)O] |
| 701 | 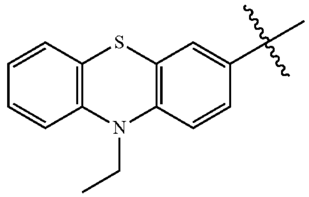 [SMILES: *c1ccc2c(c1)Sc1ccccc1N2CC] | 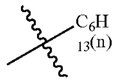 | H | 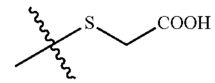 |
| 702 | 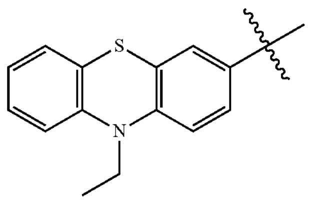 [SMILES: *c1ccc2c(c1)Sc1ccccc1N2CC] | 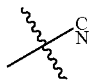 | H | 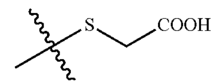 [SMILES: *SCC(=O)O] |
| 703 | 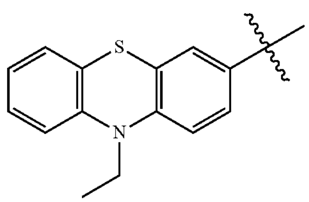 [SMILES: *c1ccc2c(c1)Sc1ccccc1N2CC] | H | H | 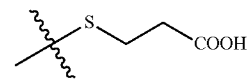 [SMILES: *SCCC(=O)O] |
| 704 | 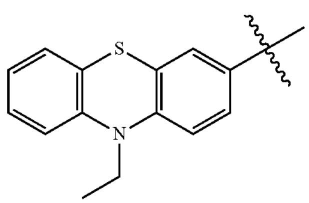 [SMILES: *c1ccc2c(c1)Sc1ccccc1N2CC] | H | H | 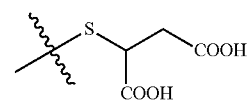 [SMILES: *SC(CC(=O)O)C(=O)O] |

-continued
| | | | | |
|---|---|---|---|---|
| 705 | 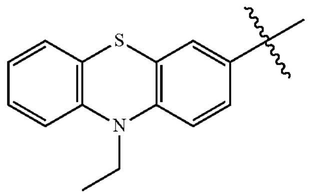 [SMILES: *c1ccc2c(c1)Sc1ccccc1N2CC] | H | H | 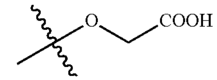 [SMILES: *OCC(=O)O] |
| 706 | 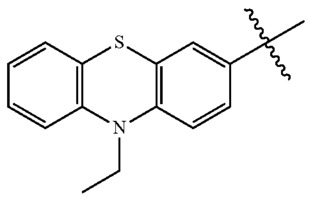 [SMILES: *c1ccc2c(c1)Sc1ccccc1N2CC] | H | H | 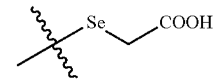 [SMILES: *[Se]CC(=O)O] |
| 707 | 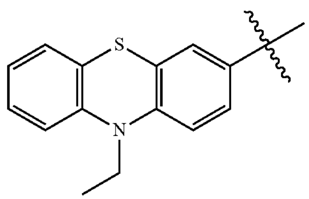 [SMILES: *c1ccc2c(c1)Sc1ccccc1N2CC] | H | H | 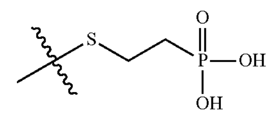 |
| 708 | 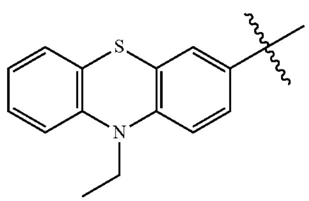 [SMILES: *c1ccc2c(c1)Sc1ccccc1N2CC] | H | H | 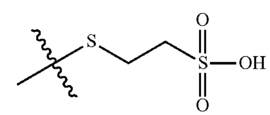 |
| 709 | 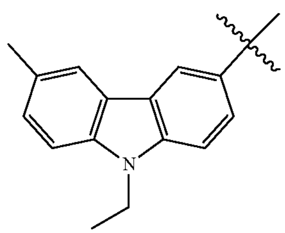 [SMILES: *c1ccc2c(c1)c1cc(C)ccc1n2CC] | H | H | 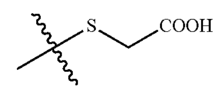 [SMILES: *SCC(=O)O] |

-continued
| | | | | |
|---|---|---|---|---|
| 710 | 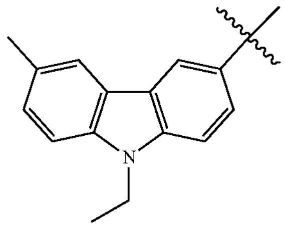 [SMILES: *c1ccc2c(c1)c1cc(C)ccc1n2CC] |  | H | 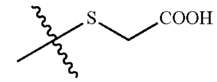 |
| 711 | 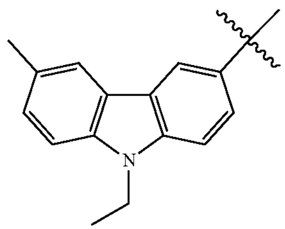 [SMILES: *c1ccc2c(c1)c1cc(C)ccc1n2CC] | H | 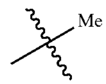 | 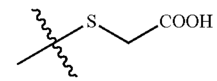 [SMILES: *SCC(=O)O] |
| 712 | 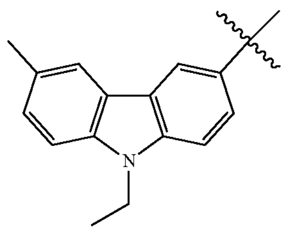 [SMILES: *c1ccc2c(c1)c1cc(C)ccc1n2CC] | 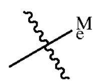 | 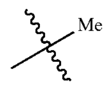 | 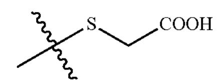 |
| 713 | 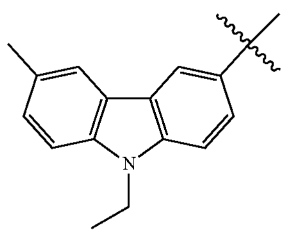 [SMILES: *c1ccc2c(c1)c1cc(C)ccc1n2CC] | 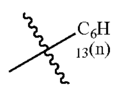 | H | 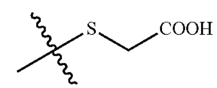 [SMILES: *SCC(=O)O] |

-continued
| | | | | |
|---|---|---|---|---|
| 714 | 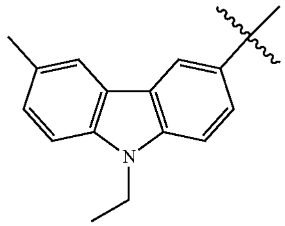 [SMILES: *c1ccc2c(c1)c1cc(C)ccc1n2CC] | 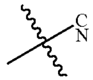 | H | 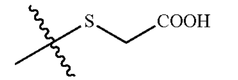 [SMILES: *SCC(=O)O] |
| 715 | 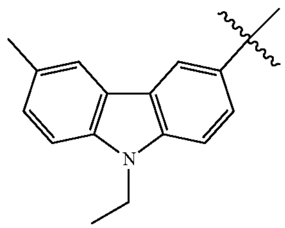 [SMILES: *c1ccc2c(c1)c1cc(C)ccc1n2CC] | H | H | 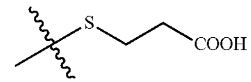 [SMILES: *SCCC(=O)O] |
| 716 | 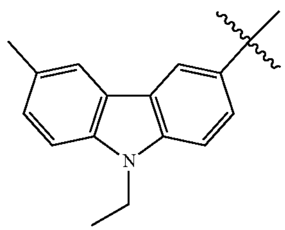 [SMILES: *c1ccc2c(c1)c1cc(C)ccc1n2CC] | H | H | 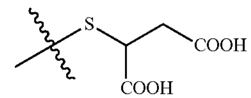 [SMILES: *SC(CC(=O)O)C(=O)O] |
| 717 | 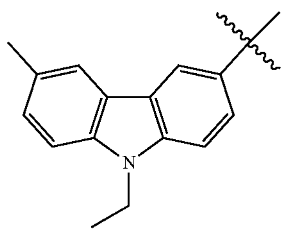 [SMILES: *c1ccc2c(c1)c1cc(C)ccc1n2CC] | H | H | 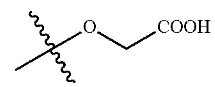 |

-continued
| | | | | |
|---|---|---|---|---|
| 718 | 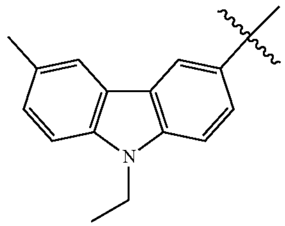 [SMILES: *c1ccc2c(c1)c1cc(C)ccc1n2CC] | H | H | 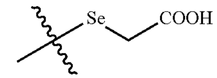 |
| 719 | 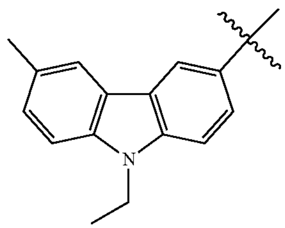 [SMILES: *c1ccc2c(c1)c1cc(C)ccc1n2CC] | H | H | 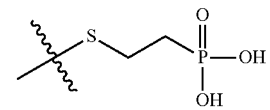 |
| 720 | 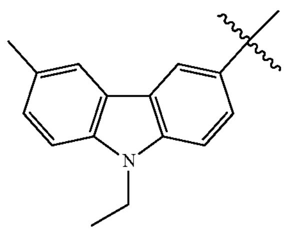 [SMILES: *c1ccc2c(c1)c1cc(C)ccc1n2CC] | H | H | 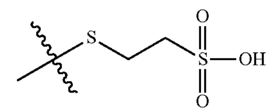 |
| 721 | 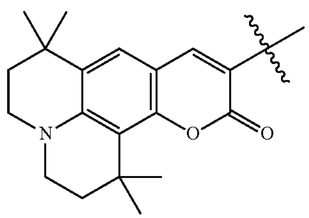 [SMILES: *c1cc2cc3c4c(c2oc1=O)C(C)(C)CCN4CCC3(C)C] | H | H | 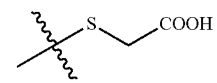 [SMILES: *SCC(=O)O] |

-continued
| | | | | |
|---|---|---|---|---|
| 722 | 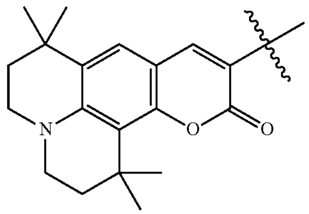 [SMILES: *c1cc2cc3c4c(c2oc1=O)C(C)(C)CCN4CCC3(C)C] |  | H | 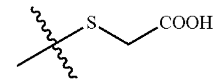 [SMILES: *SCC(=O)O] |
| 732 | 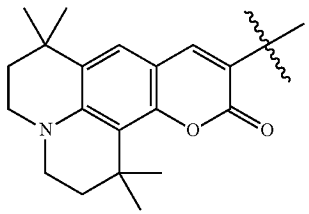 [SMILES: *c1cc2cc3c4c(c2oc1=O)C(C)(C)CCN4CCC3(C)C] | H | 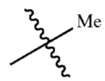 | 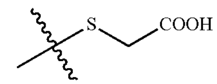 |
| 724 | 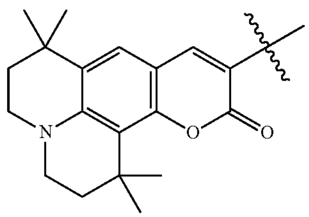 [SMILES: *c1cc2cc3c4c(c2oc1=O)C(C)(C)CCN4CCC3(C)C] | 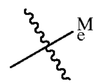 | 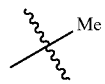 | 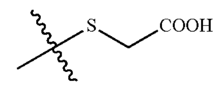 |
| 725 | 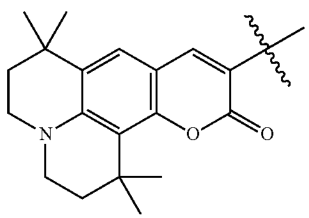 [SMILES: *c1cc2cc3c4c(c2oc1=O)C(C)(C)CCN4CCC3(C)C] | 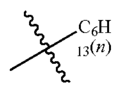 | H | 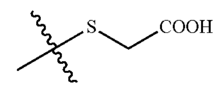 [SMILES: *SCC(=O)O] |
| 726 | 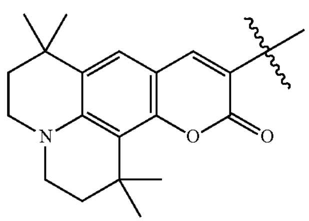 [SMILES: *c1cc2cc3c4c(c2oc1=O)C(C)(C)CCN4CCC3(C)C] | 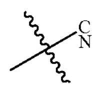 [SMILES: *C#N] | H | 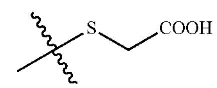 |

-continued
| | | | | |
|---|---|---|---|---|
| 727 | 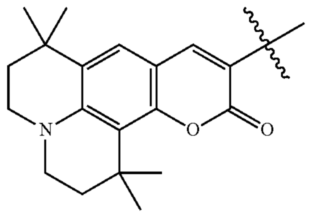 [SMILES: *c1cc2cc3c4c(c2oc1=O)C(C)(C)CCN4CCC3(C)C] | H | H | 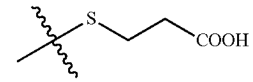 [SMILES: *SCCC(=O)O] |
| 728 | 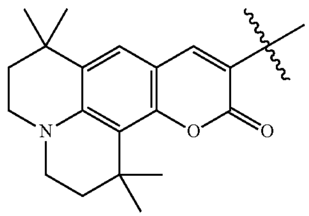 [SMILES: *c1cc2cc3c4c(c2oc1=O)C(C)(C)CCN4CCC3(C)C] | H | H | 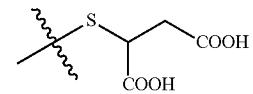 [SMILES: *SC(CC(=O)O)C(=O)O] |
| 729 | 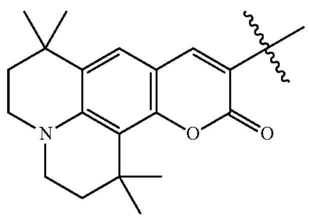 [SMILES: *c1cc2cc3c4c(c2oc1=O)C(C)(C)CCN4CCC3(C)C] | H | H | 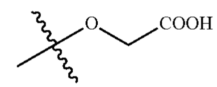 |
| 730 | 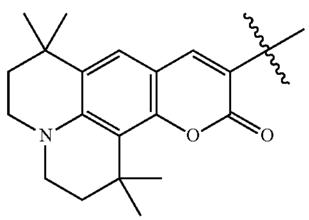 [SMILES: *c1cc2cc3c4c(c2oc1=O)C(C)(C)CCN4CCC3(C)C] | H | H | 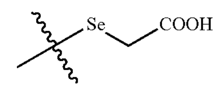 [SMILES: *[Se]CC(=O)O] |

-continued
| | | | | |
|---|---|---|---|---|
| 731 | 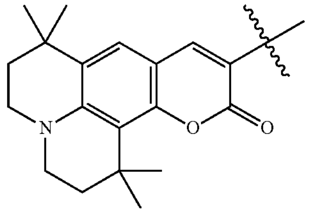 [SMILES: *c1cc2cc3c4c(c2oc1=O)C(C)(C)CCN4CCC3(C)C] | H | H | 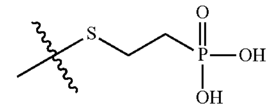 |
| 732 | 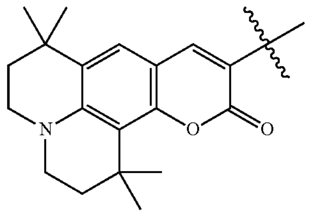 [SMILES: *c1cc2cc3c4c(c2oc1=O)C(C)(C)CCN4CCC3(C)C] | H | H | 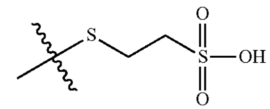 [SMILES: *SCCS(=O)(=O)O] |
| 733 | 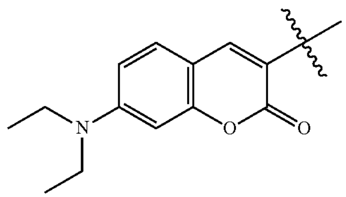 [SMILES: *c1cc2ccc(N(CC)CC)cc2oc1=O] | H | H | 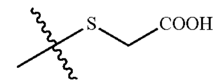 [SMILES: *SCC(=O)O] |
| 734 | 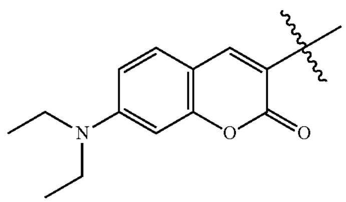 [SMILES: *c1cc2ccc(N(CC)CC)cc2oc1=O] | 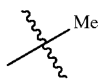 | H | 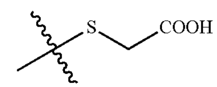 |
| 735 | 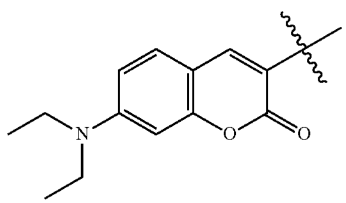 [SMILES: *c1cc2ccc(N(CC)CC)cc2oc1=O] | H | 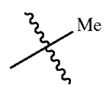 | 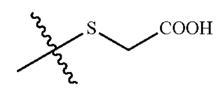 |

-continued
| | | | | |
|---|---|---|---|---|
| 736 | 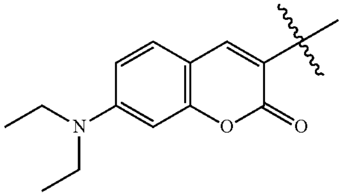 [SMILES: *c1cc2ccc(N(CC)CC)cc2oc1=O] | 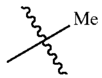 | 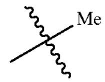 | 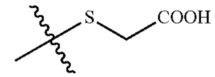 |
| 737 | 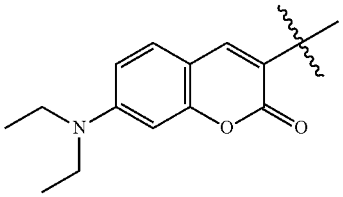 [SMILES: *c1cc2ccc(N(CC)CC)cc2oc1=O] | 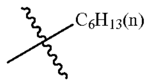 | H | 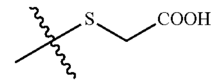 |
| 738 | 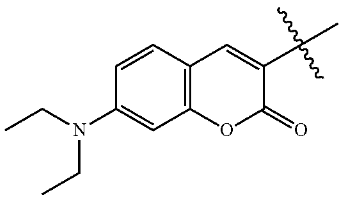 [SMILES: *c1cc2ccc(N(CC)CC)cc2oc1=O] | 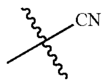 [SMILES: *C#N] | H | 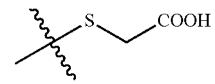 |
| 739 | 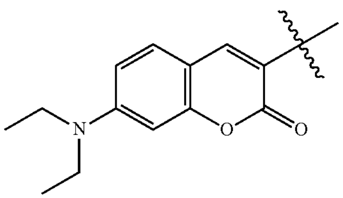 [SMILES: *c1cc2ccc(N(CC)CC)cc2oc1=O] | H | H | 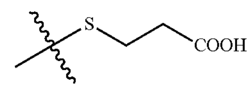 [SMILES: *SCCC(=O)O] |
| 740 | 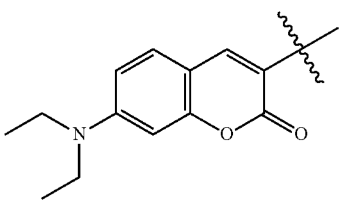 [SMILES: *c1cc2ccc(N(CC)CC)cc2oc1=O] | H | H | 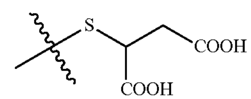 |

-continued
| | | | | |
|---|---|---|---|---|
| 741 | 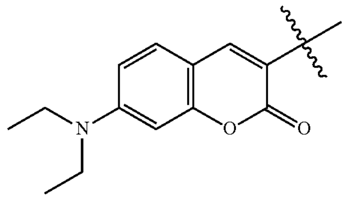 [SMILES: *c1cc2ccc(N(CC)CC)cc2oc1=O] | H | H | 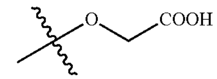 [SMILES: *OCC(=O)O] |
| 742 | 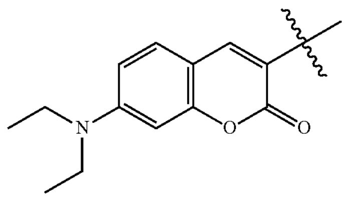 [SMILES: *c1cc2ccc(N(CC)CC)cc2oc1=O] | H | H | 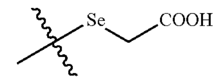 [SMILES: *[Se]CC(=O)O] |
| 743 | 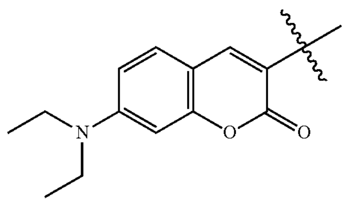 [SMILES: *c1cc2ccc(N(CC)CC)cc2oc1=O] | H | H | 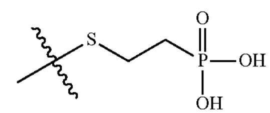 [SMILES: *SCCP(=O)(O)O] |
| 744 | 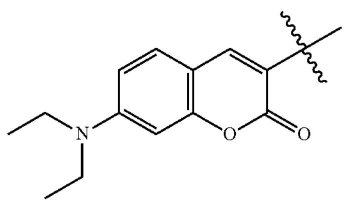 [SMILES: *c1cc2ccc(N(CC)CC)cc2oc1=O] | H | H | 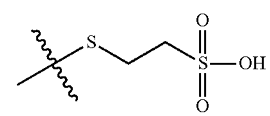 |

-continued
| | | | | |
|---|---|---|---|---|
| 745 | 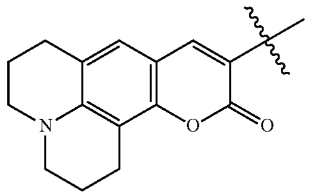 [SMILES: *c1cc2cc3c4c(c2oc1=O)CCCN4CCC3] | H | H | 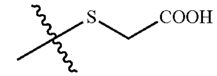 [SMILES: *SCC(=O)O] |
| 746 | 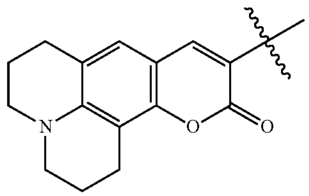 [SMILES: *c1cc2cc3c4c(c2oc1=O)CCCN4CCC3] | 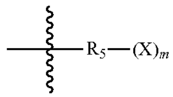 | H | 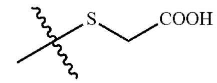 |
| 747 | 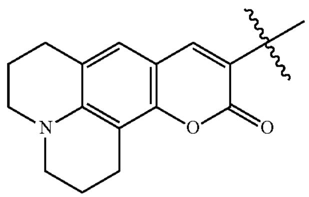 [SMILES: *c1cc2cc3c4c(c2oc1=O)CCCN4CCC3] | H | 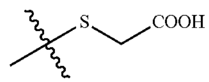 [SMILES: *SCC(=O)O] | 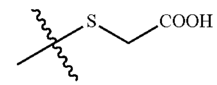 |
| 748 | 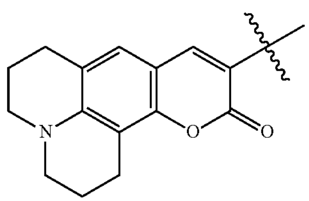 [SMILES: *c1cc2cc3c4c(c2oc1=O)CCCN4CCC3] | 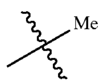 | 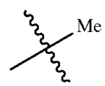 | 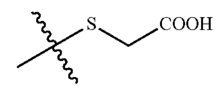 |
| 749 | 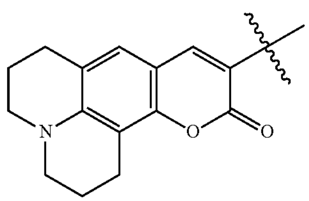 [SMILES: *c1cc2cc3c4c(c2oc1=O)CCCN4CCC3] | 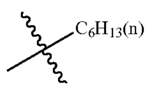 | H | 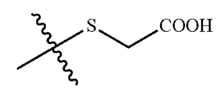 |

-continued
| | | | |
|---|---|---|---|
| 750 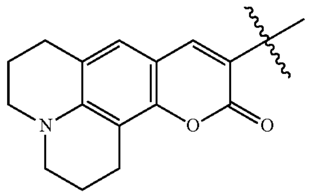 [SMILES: *c1cc2cc3c4c(c2oc1=O)CCCN4CCC3]  | 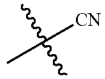 [SMILES: *C#N]  | H | 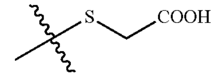  |
| 751 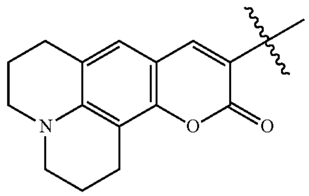 [SMILES: *c1cc2cc3c4c(c2oc1=O)CCCN4CCC3]  | H | H | 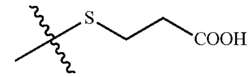 [SMILES: *SCCC(=O)O]  |
| 752 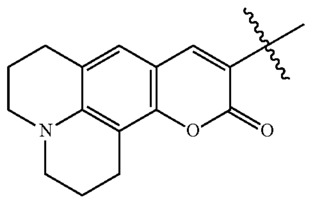 [SMILES: *c1cc2cc3c4c(c2oc1=O)CCCN4CCC3]  | H | H | 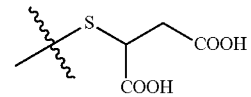  |
| 753 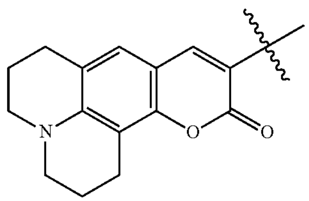 [SMILES: *c1cc2cc3c4c(c2oc1=O)CCCN4CCC3]  | H | H | 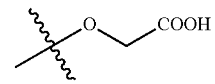 [SMILES: *OCC(=O)O]  |
| 754 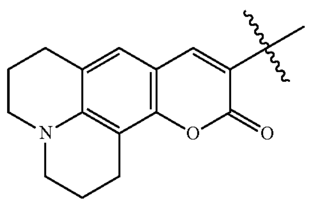 [SMILES: *c1cc2cc3c4c(c2oc1=O)CCCN4CCC3]  | H | H | 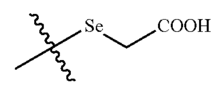 [SMILES: *[Se]CC(=O)O]  |

-continued
| | | | | | | |
|---|---|---|---|---|---|---|
| 755 | 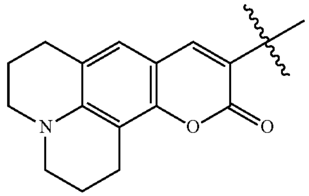 [SMILES: *c1cc2cc3c4c(c2oc1=O)CCCN4CCC3] | H | H | | | 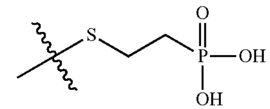 [SMILES: *SCCP(=O)(O)O] |
| 756 | 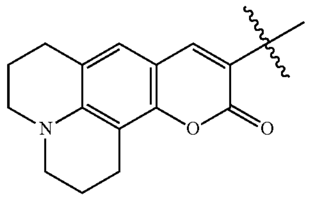 [SMILES: *c1cc2cc3c4c(c2oc1=O)CCCN4CCC3] | H | H | | | 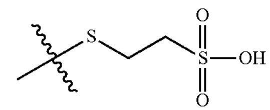 [SMILES: *SCCS(=O)(=O)O] |
| Dye | $R_1$ | $R_2$ | $R_3$ | $R_4$ | Ar | 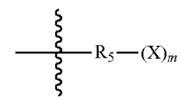 |
| 757 | 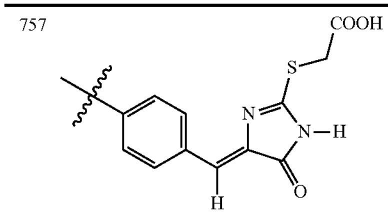 | 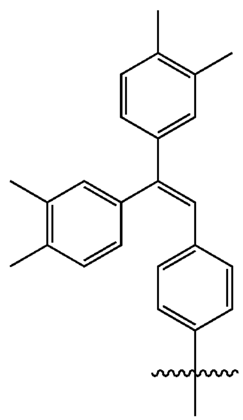 | H | H | 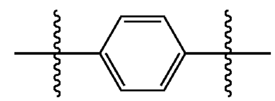 | 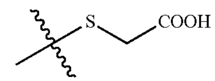 |

-continued
| | | | | | |
|---|---|---|---|---|---|
| 758 | 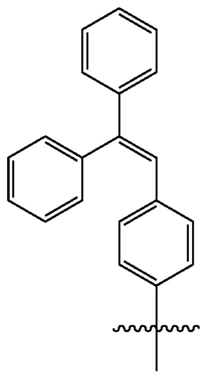 [SMILES: *c1ccc(C=C(c2ccccc2)c2ccccc2)cc1] | 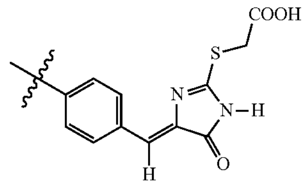 [SMILES: *c1ccc(/C=C2\N=C(SCC(=O)O)NC2=O)cc1] | H | H | 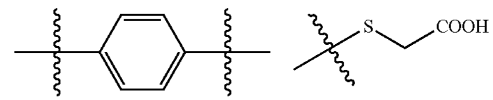 |
| 759 | 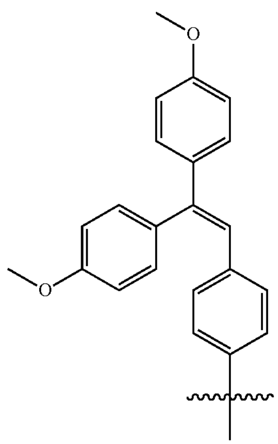 [SMILES: *c1ccc(C=C(c2ccc(OC)cc2)c2ccc(OC)cc2)cc1] | 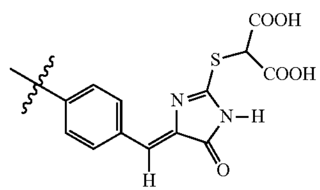 [SMILES: *c1ccc(/C=C2\N=C(SC(C(=O)O)C(=O)O)NC2=O)cc1] | H | H | 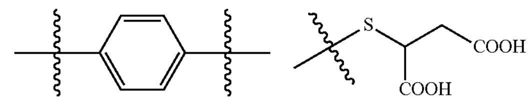 |

The compounds represented by Formulas (1) to (7) (hereafter, they may be called as the dyes of the present invention) can be synthesized with a conventional preparation method. In particular, they can be synthesized with the methods disclosed in JP-A Nos. 7-5709 and 7-5706.

SYNTHETIC EXAMPLE

Synthetic Example 1(Synthesis of Dye 1)

One molar equivalent of aldehyde (Compound A shown below) was added to a DMF solution containing 2.5 molar equivalents of diethylbenzhydryl phosponate and 3 molar equivalents of potassium tert-butoxide. Then the mixture was stirred at 120° C. for 1 hour. After adding water to the reaction mixture, the reaction product was extracted with ethyl acetate followed by washing with water. After drying the ethyl acetate solution with magnesium sulfate, the solution was concentrated to dry with a rotary evaporator. The obtained raw product was treated with silica column chromatography to yield Compound B shown below.

To a toluene solution containing one molar equivalent of Compound B were added 1.5 molar equivalents of oxyphosphorous chloride and 3 molar equivalents of DMF, then the mixture was stirred at 60° C. for at 1 hour. After adding water to the reaction mixture, the reaction product was extracted with ethyl acetate followed by washing with water. After drying the ethyl acetate solution with magnesium sulfate, the solution was concentrated to dry with a rotary evaporator. The obtained raw product was treated with silica column chromatography to yield Compound C shown below.

An ethyl acetate solution containing one molar equivalent of Compound C, 1.2 molar equivalents of thiohydantoin and 3 molar equivalents of ammonium acetate was stirred at 70° C. for at 1 hour. After adding water to the reaction mixture, the reaction product was extracted with ethyl acetate followed by washing with water. After drying the ethyl acetate solution with magnesium sulfate, the solution was concentrated to dry with a rotary evaporator. The obtained raw product was treated with silica column chromatography to yield Compound D shown below.

To an ethanol solution containing one molar equivalent of Compound D were added 1.05 molar equivalents of bromoacetic acid and 3 molar equivalents of sodium hydroxide, then the mixture was stirred at 70° C. for at 1 hour. After concentrating the solution to dry with a rotary evaporator, water and ethyl acetate were added. And the organic layer was eliminated using a separating funnel. To an aqueous layer was added a sufficient amount of 1 mol/L drochloric acid and the mixture was stirred for 5 minutes. The reaction product was extracted with ethyl acetate followed by washing with water. After drying the ethyl acetate solution with magnesium sulfate, the solution was concentrated to dry with a rotary evaporator. The obtained raw product was treated with silica column chromatography to yield exemplified compound Dye 1 shown below.

The structure of Dye 1 was confirmed with a nuclear magnetic resonance spectrum and a mass spectrum.

Compound A

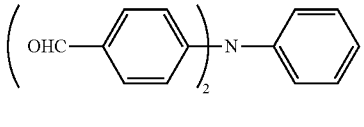

-continued

Compound B

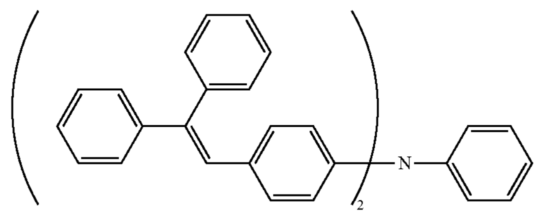

Compound C

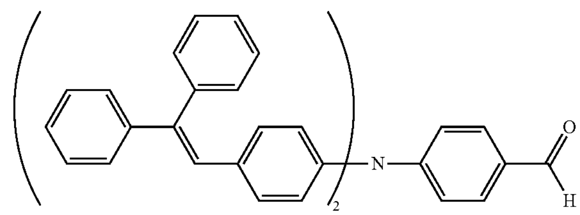

Compound D

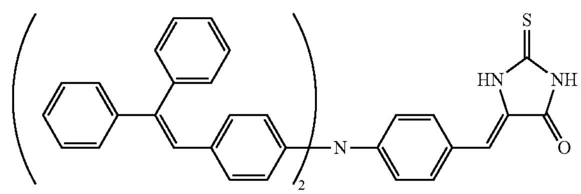

Dye 1

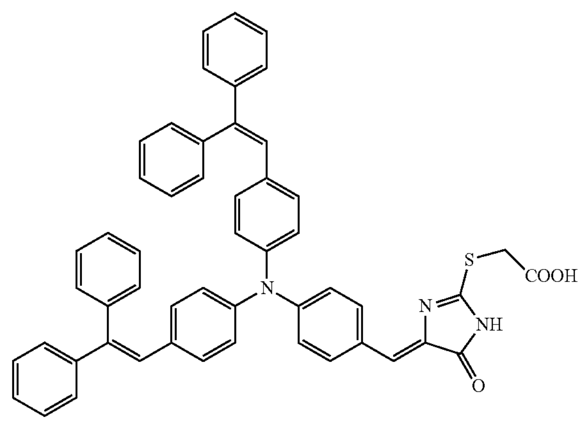

The other dyes of the present invention can be prepared in the same manner as preparation of the above-described Dye 1.

(Sensitization Treatment of Semiconductor)

The total amount of supported dye of the present invention per 1 $m^2$ of semiconductor is preferably from 0.01 to 100 millimoles, it is more preferably from 0.1 to 50 millimoles, and it is specifically preferably from 0.5 to 20 millimoles.

When performing a sensitization treatment using the dye of the present invention, a dye may be used singly or a plurality of dyes may be used in combination. Moreover, it can be used by mixing with other compounds. Examples of the other compounds which can be mixed are described in, for example, U.S. Pat. Nos. 4,684,537, 4,927,721, 5,084,365, 5,350,644, 5,463,057, and 5,525,440; JP-A Nos. 7-249790, and 2000-150007.

Especially when the application of the photoelectric conversion element of the present invention is a solar cell which will be mentioned later, it is desirable to mix and use two or more kinds of dyes in which absorption wavelengths differ so that the wavelength band of photoelectric conversion element may be expanded as much as possible and natural sunlight can be used effectively.

In order to make a semiconductor support the dye of the present invention, it is common to use the way of immersing a well dried semiconductor for a long period of time in a suitable solvents (ethanol etc.) in which the dye is dissolved.

When using together two or more sorts of dyes of the present invention, or using other dyes together and carrying out a sensitization treatment, it is possible to prepare and use the mixed solution of the dyes. Further, it is possible to prepare separate solutions for each dye, and the semiconductor can be immersed in each solution in order, and the dyes can be supported to the semiconductor.

By using the method in which separate dye solutions are prepared, and the sensitization is immersed in each solution in order, the effects of the present invention can be acquired regardless the order of incorporating a dye to a semiconductor.

Moreover, it is possible to produce a sensitized semiconductor by mixing the particles of the semiconductor to which the above-mentioned dye was made to stick independently.

Moreover, in the case of a semiconductor having a high porous ratio, it is preferable to complete adsorption treatment of a dye to the semiconductor before water or water vapor stick to the void on the semiconductor film and inside of the semiconductor film.

The sensitization treatment of the semiconductor is carried out by immersing a substrate burned with the foregoing semiconductor into a solution prepared after dissolving a sensitizing dye in a suitable solvent as described before.

In this case, bubbles in the layer are preferably removed by conducting a reduced pressure treatment or a heat treatment for a substrate on which a semiconductor layer (referred to also as a semiconductor film) is formed via calcination. Through such the treatment, a sensitizing dye can easily be penetrated deeply into the inside of the semiconductor layer (semiconductor film), and such the treatment is specifically preferable when the semiconductor layer (semiconductor film) possesses a porous structure film.

The solvent to dissolve the foregoing sensitizing dye in the present invention is not specifically limited as long as the solvent can dissolve the foregoing compound, and neither dissolve the semiconductor nor react with the semiconductor.

However, the solvent is preferably subjected to deaeration and purification via distillation to prevent penetration of moisture and gas dissolved in the solvent into the semiconductor layer so as to avoid the sensitization treatment such as adsorption of the foregoing compound.

Examples of preferably usable solvents to dissolve the foregoing compound include: a nitrile based compound such as acetonitrile; an alcohol based solvent such as methanol, ethanol, or n-propanol; a ketone type solvent such as acetone, or methyl ethyl ketone; an ether based solvent such as diethyl ether, diisopropyl ether, tetrahydrofuran, or 1,4-dioxane; and a halogenated hydrocarbon solvent such as methylene chloride, or 1,1,2-trichloroethane. A plurality of solvents may be mixed. Specifically preferred are: acetonitrile, a mixed solvent of acetonitrile and methanol, methanol, ethanol, acetone, methyl ethyl ketone, tetrahydrofuran, and methylene chloride.

(Temperature and Time for Sensitization Treatment)

As to time to immerse a substrate on which the semiconductor layer is formed via calcination in a solution containing a sensitizing dye of the present invention, it is preferable to sufficiently sensitize the semiconductor by sufficiently making progress of adsorption by penetrating deeply into the semiconductor layer (semiconductor film).

The time is preferably 3 to 48 hours, and more preferably 4 to 24 hours at 25° C. in order to inhibit the decomposed products produced via decomposition of a sensitizing dye in a solution from obstructing adsorption of the sensitizing dye.

This effect is remarkable when the semiconductor film is specifically a porous structure film.

However, the above-indicated immersion time is a value at 25° C. and it is not always applied when the temperature is varied.

During the immersion, a solution containing a sensitizing dye employed in the present invention may be heated up to the temperature of no boiling, as long as the foregoing sensitizing dye is not decomposed. The temperature range is preferably 5 to 100° C., and more preferably 25 to 80° C., as long as the solution is not boiled in the foregoing temperature range.

(Second Electrode)

Any conductive material is optionally usable for the second electrode. Even an insulating material can be usable as long as a conductive material layer is provided on the side facing the hole transport layer.

It is preferable that the materials has a good contacting ability with the hole transport layer. Further, it is preferable that it has a small difference of work function with respect to the hole transport layer, and it is preferable that it is chemically stable. As such materials, there can be cited: a metal thin film of gold, silver, cupper, aluminium, or platinum, carbon black, an organic conductive material such as conductive polymer.

(Solar Cell)

The solar cell of the present invention is provided with the photoelectric conversion element of the present invention as described above.

The solar cell of the present invention is provided with the photoelectric conversion element of the present invention and it is designed to be optimized for circuit design to solar light, and possesses a structure capable of pet forming optimum photoelectric conversion when solar light is utilized as a light source.

That is, the solar cell possesses a structure in which a dye-sensitized semiconductor can be exposed to solar light. When a solar cell of the present invention is prepared, the foregoing photoelectric conversion layer, hole transport layer and second electrodes are preferably stored in a case and sealed, or they are preferably sealed entirely with a resin.

When the solar cell of the present invention is exposed to solar light or electromagnetic waves identical to solar light, the foregoing sensitizing dye carried by a semiconductor absorbs exposure light or exposure electromagnetic waves, and is exited.

Electrons are generated via excitation, generated electrons are moved to the semiconductor and subsequently to the opposite electrode via a conductive support to reduce a redox electrolyte in a charge transfer layer.

On the other hand, a sensitizing dye of the present invention by which electrons are moved to the semiconductor becomes an oxidized body, but electrons are supplied from the opposite electrode via the redox electrolyte in the electrolyte layer to conduct reducing, and returned to the original state. The redox electrolyte in the charge transfer layer is simultaneously oxidized so as to be returned to a state where it is reduced again by electrons supplied from the opposite electrode.

The electrons can be moved by the mechanism as described, and a solar cell of the present invention can be constituted by using a photoelectric conversion element.

EXAMPLE

The present invention will be described with reference to examples, but the present invention is not limited to these examples.

Example (Preparation of Photoelectric Conversion Element 1: Present Invention)

A fluorine-doped tin oxide conductive glass substrate (hereinafter, referred to also as FTO) having a sheet resistance of 20 Ω/□ was used as a first electrode. Onto this substrate was dropped a solution containing 1.2 ml of tetrakis(isopropoxy)titanium and 0.8 ml of acetyl acetone dissolved in 18 nil of ethanol, then a film was prepared using a spin coat method. Then it was heated at 450° C. for 8 minutes. Thus it was formed a barrier layer made of titanium oxide having a thickness of 30 to 50 nm on the transparent conductive film (F10).

On this barrier film formed on the FTO glass substrate was coated a titanium oxide paste (anatase type having a primary average particle diameter of 18 nm, observed with a microscope, and dispersed in ethyl cellulose) with a screen printing method. Then, the paste was heated at 200° C. for 10 minutes and subsequently at 500° C. for 15 minutes to obtain a titanium oxide thin film having a thickness of 3.5μ. Dye 1 of the present invention was dissolved in a mixed solvent of acetonitrile and t-butyl alcohol (1:1) to prepare a $5\times10^{-4}$ mol/l of dye solution. The FTO glass substrate on which titanium oxide paste was coated and heated was immersed in this solution at room temperature for 3 hours to conduct an adsorption treatment of the dye to prepare an oxide semiconductor electrode.

The above-described semiconductor electrode was immersed in an acetonitrile solution (electrolytic polymerizable solution) containing $1\times10^{-2}$mol/l of 3,4-ethyelenedioxythiophene dimer and 0.1 mol/l of $Li[(CF_3SO_2)_2N]$. The above-described semiconductor electrode was used as a working electrode, a platinum wire was used as a counter electrode and $Ag/Ag^{+(AgNO_3}$:0.01 M) was used as a reference electrode. The hold voltage was set to be −0.16 V. While irradiating with light from the direction of the semiconductor layer (using Xenon lamp: light strength of 22 mW/cm$^2$, wavelength less than 430 nm was cut), the voltage was kept for 30 minutes to form a hole transport layer on the aforesaid semiconductor electrode surface. The obtained semiconductor electrode and hole transport layer were washed with acetonitrile and dried.

Here, the obtained hole transport layer was a polymer film insoluble in a solvent.

Afterward, it was immersed in an acetonitrile solution containing $15\times10^{-3}$ mol/l of $Li[(CF_3SO_2)_2N]$ and $50\times10^{-3}$mol/l of tert-butylpyridine for 15 minutes.

After naturally drying the semiconductor electrode and the hole transport layer, gold was vapor deposited to have a thickness of 60 nm to form a second electrode. Thus Photoelectric conversion element 1 was obtained.

(Preparation of Photoelectric Conversion Elements 2 to 14: Present Invention)

Photoelectric conversion elements 2 to 14 were prepared in the same manner as preparation of Photoelectric conversion element 1, except that Dye 1 was replaced with the dye of the present invention shown in Table 1.

(Preparation of Photoelectric Conversion Element 15: Comparative Example)

Photoelectric conversion element 15 was prepared in the same manner as preparation of photoelectric conversion element 1, except that the dye was replaced with Dye 801 shown below.

Dye 801

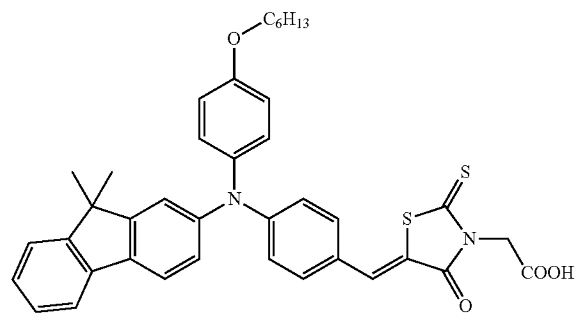

(Evaluation of Photoelectric Conversion Element)

The evaluation of the prepared photoelectric conversion elements was done by irradiating with an artificial sunlight produced though a xenon lamp fitted with an AM filter (AM-1.5) with 100 mW/cm$^2$ and 10 mW/cm$^2$using Solar simulator (made by Eiko Seiki Co., Ltd.).

The evaluation was made by measuring an electric current—voltage property at room temperature using an I-V tester to obtain Short-circuit current density (Jsc), Open-circuit voltage (Voc), and Form factor (F. F.). Photoelectric conversion efficiency (η(%)) was obtained using these values. Here, the photoelectric conversion efficiency (η(%)) was obtained based on the following Scheme (A)

Scheme (A):

$$\eta=100\times(Voc\times Jsc\times F.F.)/P$$

Wherein, P is an incident light strength in mW·cm$^{-2}$, Voc is an open-circuit voltage in V, Jsc is a short-circuit current density in mA·cm$^{-2}$, and F. F. is a form factor.

(Measurement of Photoelectric Conversion Efficiency After Light Irradiation Fatigue Test)

At the condition of open circuit, to each sample was irradiated with Xenon lamp having a light strength of 100 mW·cm$^{-2}$ for 3 hours. Then Photoelectric conversion efficiency (η(%) was obtained and a ratio (%) with respect to the initial photoelectric conversion efficiency was calculated.

The property evaluation results of each photoelectric conversion element are shown in Table 1.

TABLE 1

| | | Initial Properties | | | Properties after Fatigue test | | | | |
|---|---|---|---|---|---|---|---|---|---|
| Photoelectric conversion element No. | Dye | Open-circuit voltage (Voc) (mV) | Short-circuit current density (Jsc) (mW · cm$^{-2}$) | Photoelectric conversion efficiency (η) (%) | Open-circuit voltage (Voc) (mV) | Short-circuit current density (Jsc) (mW · cm$^{-2}$) | Photoelectric conversion efficiency (η) (%) | (*) (%) | Remarks |
| 1 | 1 | 781 | 9.35 | 4.60 | 735 | 9.2 | 4.24 | 92 | Invention |
| 2 | 70 | 769 | 8.85 | 4.15 | 738 | 8.7 | 3.92 | 94 | Invention |

TABLE 1-continued

| | | Initial Properties | | | Properties after Fatigue test | | | | |
|---|---|---|---|---|---|---|---|---|---|
| Photoelectric conversion element No. | Dye | Open-circuit voltage (Voc) (mV) | Short-circuit current density (Jsc) ($mW \cdot cm^{-2}$) | Photoelectric conversion efficiency ($\eta$) (%) | Open-circuit voltage (Voc) (mV) | Short-circuit current density (Jsc) ($mW \cdot cm^{-2}$) | Photoelectric conversion efficiency ($\eta$) (%) | (*) (%) | Remarks |
| 3 | 101 | 775 | 7.95 | 3.82 | 743 | 7.8 | 3.59 | 94 | Invention |
| 4 | 133 | 770 | 8.20 | 3.85 | 748 | 8.1 | 3.70 | 96 | Invention |
| 5 | 153 | 779 | 8.65 | 4.04 | 739 | 8.5 | 3.75 | 93 | Invention |
| 6 | 183 | 778 | 9.25 | 4.39 | 740 | 9.1 | 4.11 | 94 | Invention |
| 7 | 213 | 779 | 9.05 | 4.51 | 764 | 9.0 | 4.38 | 97 | Invention |
| 8 | 232 | 766 | 9.25 | 4.25 | 736 | 9.1 | 4.02 | 95 | Invention |
| 9 | 283 | 780 | 8.45 | 4.09 | 750 | 8.4 | 3.88 | 95 | Invention |
| 10 | 375 | 780 | 9.05 | 4.38 | 738 | 8.9 | 4.07 | 93 | Invention |
| 11 | 637 | 774 | 8.85 | 4.11 | 749 | 8.7 | 3.89 | 95 | Invention |
| 12 | 757 | 769 | 8.70 | 4.21 | 741 | 8.6 | 4.01 | 95 | Invention |
| 13 | 758 | 785 | 8.95 | 4.22 | 754 | 8.9 | 4.00 | 95 | Invention |
| 14 | 759 | 772 | 8.75 | 4.12 | 745 | 8.7 | 3.96 | 96 | Invention |
| 15 | 801 | 701 | 7.15 | 2.74 | 658 | 5.6 | 2.01 | 74 | Comparison |

(*) The ratio of the photoelectric conversion efficiency after fatigue test to the initial photoelectric conversion efficiency From the results shown in Table 1, it was found that photoelectric conversion elements 1 to 14 using a dye represented by Formula (1) of the present invention exhibited high photoelectric conversion efficiency and excellent in stability. On the other hand, it was found that photoelectric conversion element 15 prepared as a comparative sample exhibited very low photoelectric conversion efficiency and poor in stability.

What is claimed is:

1. A photoelectric conversion element comprising at least:

a semiconductor layer containing a semiconductor and a dye which is supported by the semiconductor; and a hole transport layer containing a hole transport compound, wherein the dye is a compound represented by Formula (1), and the hole transport compound is a polymer made from 3,4-ethylenedioxythiophene:

Formula (1)

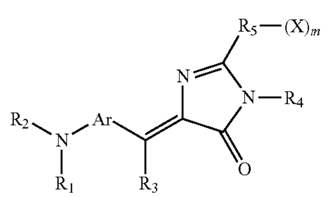

wherein, Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ and $R_4$ each independently represents a hydrogen atom, a cyano group, a substituted or unsubstituted alkyl, alkenyl, alkynyl, aryl, amino, or heterocyclic group; $R_5$ represents a substituted or unsubstituted alkyl, alkenyl, alkynyl, alkoxy, alkylthio, alkylseleno, amino, aryl or heterocyclic group, provided that $R_5$ is substituted with X; X is an acid group; m represents an integer of 1 or more, provided that when m≥2, a plurality of Xs may be the same or different; provided that a cis form and a trans form with respect to a carbon to carbon double bond are included in Formula (1).

2. The photoelectric conversion element of claim 1, wherein at least one of $R_1$ and $R_2$ in a compound represented by Formula (1) is further represented by Formula (2):

Formula (2)

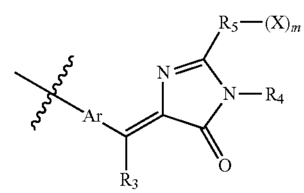

wherein, Ar represents a substituted or unsubstituted arylene or heterocyclic group; $R_3$ and $R_4$ each independently represents a hydrogen atom, a cyano group, a substituted or unsubstituted alkyl, alkenyl, alkynyl, aryl, amino, or heterocyclic group; $R_5$ represents a substituted or unsubstituted alkyl, alkenyl, alkynyl, alkoxy, alkylthio, alkylseleno, amino, aryl or heterocyclic group, provided that $R_5$ is substituted with X; X is an acid group; m represents an integer of 1 or more, provided that when m≥2, a plurality of Xs may be the same or different; provided that a cis form and a trans form with respect to a carbon to carbon double bond are included in Formula (2).

3. The photoelectric conversion element of claim 1, wherein a compound represented by Formula (1) is further represented by Formula (3):

Formula (3)

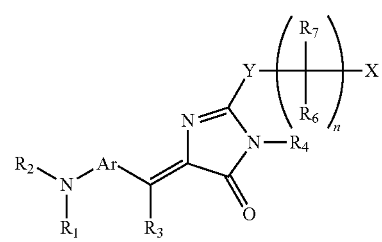

wherein, Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ and $R_4$ each independently represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; Y represents a sulfur atom, an oxygen atom or a selenium atom; X is an acid group; provided that a cis form and a trans form with respect to a carbon to carbon double bond are included in Formula (3).

4. The photoelectric conversion element of claim 3, wherein a compound represented by Formula (3) is further represented by Formula (4):

Formula (4)

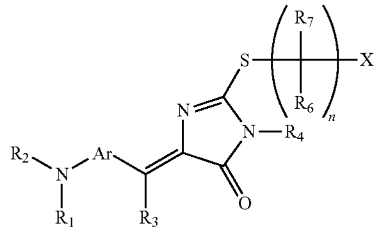

wherein, Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ and $R_4$ each independently represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (4).

5. The photoelectric conversion element of claim 4, wherein a compound represented by Formula (4) is further represented by Formula (5):

Formula (5)

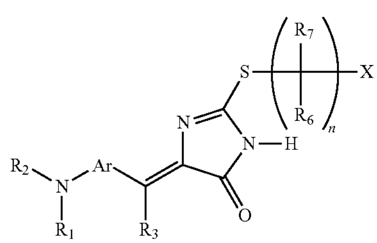

wherein, Ar represents a substituted or unsubstituted arylene or heterocyclic group; $R_1$ and $R_2$ each independently represents a substituted or unsubstituted alkyl, alkenyl, alkynyl, aryl or heterocyclic group, provided that $R_1$, $R_2$ and Ar may be combined to form a ring; $R_3$ represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n is an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (5).

6. The photoelectric conversion element of claim 5, wherein a compound represented by Formula (5) is further represented by Formula (6):

Formula (6)

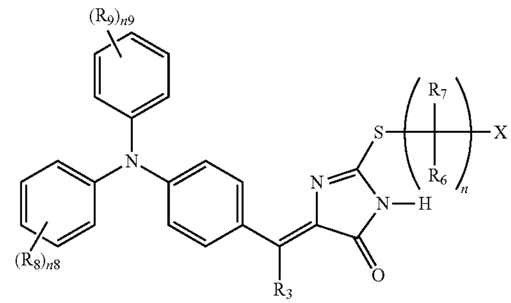

wherein, $R_8$ and $R_9$ each independently represents a halogen atom, a substituted or unsubstituted alkyl, alkenyl, alkynyl, alkoxy, alkylthio, alkylseleno, aryl or heterocyclic group, n8 and n9 each represents an integer of 1 to 5, provided that when n8≥2, and n9≥2, a plurality of $R_8$s and a plurality of $R_9$s each may be the same or different; R3 represents a hydrogen atom, a cyano group, a substituted or unsubstituted alkyl, alkenyl, alkynyl, aryl, amino, or heterocyclic group; R6 and R7 each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of $R_7$s each may be the same or different; X is an acid group; provided that a cis form and a trans form with respect to a carbon to carbon double bond are included in Formula (6).

7. The photoelectric conversion element of claim 5, wherein a compound represented by Formula (5) is further represented by Formula (7):

Formula (7)

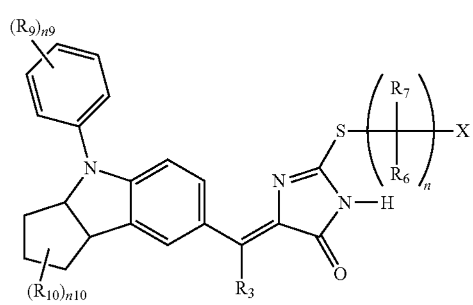

wherein, $R_9$ and $R_{10}$ each independently represents a halogen atom, a substituted or unsubstituted alkyl, alkenyl, alkynyl, alkoxy, alkylthio, alkylseleno, aryl or heterocyclic group, n9 and n10 each respectively represents an integer of 1 to 5 and an integer of 1 to 8, provided that when n9≥2, and n10≥2, a plurality of $R_9$s and a plurality of $R_{10}$s each may be the same or different; $R_3$ represents a hydrogen atom, a cyano group, a substituted or unsubstituted alkyl, alkenyl, alkynyl, aryl, amino, or heterocyclic group; $R_6$ and $R_7$ each independently represents a hydrogen atom, a halogen atom, a hydroxyl group, a thiol group, a cyano group, a substituted or unsubstituted alkyl, alkenyl, alkynyl, alkoxy, amino, aryl or heterocyclic group, provided that $R_6$ and $R_7$ may be combined to form a ring; n represents an integer of 0 or more, provided that when n≥2, a plurality of $R_6$s and a plurality of Res each may be the same or different; X is an acid group; provided that a cis form and a trans form with respect to a carbon to carbon double bond are included in Formula (7).

8. The photoelectric conversion element of claim 1, wherein the semiconductor contained in the semiconductor layer is titanium oxide.

9. A solar cell containing the photoelectric conversion element of claim 1.

* * * * *